United States Patent
Burak et al.

(10) Patent No.: US 12,451,860 B2
(45) Date of Patent: Oct. 21, 2025

(54) STRUCTURES, ACOUSTIC WAVE RESONATORS, DEVICES AND SYSTEMS

(71) Applicant: QXONIX, INC., Irvine, CA (US)

(72) Inventors: Dariusz Burak, Fort Collins, CO (US); Kevin J. Grannen, Thornton, CO (US); Jack Lenell, Fort Collins, CO (US)

(73) Assignee: QXONIX INC., Irvine, CA (US)

( * ) Notice: Subject to any disclaimer, the term of this patent is extended or adjusted under 35 U.S.C. 154(b) by 967 days.

(21) Appl. No.: 17/564,824

(22) Filed: Dec. 29, 2021

(65) Prior Publication Data

US 2022/0140806 A1    May 5, 2022

Related U.S. Application Data

(63) Continuation-in-part of application No. 17/380,011, filed on Jul. 20, 2021, now Pat. No. 11,863,153, and
(Continued)

(51) Int. Cl.
| | | |
|---|---|---|
| *H03H 9/13* | (2006.01) | |
| *H03H 9/02* | (2006.01) | |
| *H03H 9/205* | (2006.01) | |

(52) U.S. Cl.
CPC .... *H03H 9/02259* (2013.01); *H03H 9/02015* (2013.01); *H03H 9/0207* (2013.01);
(Continued)

(58) Field of Classification Search
CPC ... H03H 9/0211; H03H 9/205; H03H 9/02015
See application file for complete search history.

(56) References Cited

U.S. PATENT DOCUMENTS

| | | |
|---|---|---|
| 5,929,555 A | 7/1999 | Sugimoto et al. |
| 5,945,770 A | 8/1999 | Hanafy |
| | (Continued) | |

FOREIGN PATENT DOCUMENTS

| | | |
|---|---|---|
| JP | 2007036915 A1 | 8/2007 |
| WO | WO2018022757 | 2/2018 |
| | (Continued) | |

OTHER PUBLICATIONS

Moyer, "The Search for 5G MmWave Filters", https://semiengineering.com/the-search-for-5g-mmwave-filers, Aug. 12, 2021.
(Continued)

*Primary Examiner* — Bryan P Gordon

(57) ABSTRACT

Techniques for improving Bulk Acoustic Wave (BAW) reflector and resonator structures are disclosed, including filters, oscillators and systems that may include such devices. A bulk acoustic wave (BAW) resonator may comprise a substrate and a first layer of piezoelectric material having a first piezoelectric axis orientation. The bulk acoustic wave (BAW) resonator may comprise a multi-layer acoustic reflector, e.g., a multi-layer metal top acoustic reflector electrode, including a first pair of top metal electrode layers. The first pair of top metal electrode layers may be electrically and acoustically coupled with the first layer of piezoelectric material to excite a piezoelectrically excitable resonance mode at a resonant frequency of the BAW resonator.

32 Claims, 38 Drawing Sheets

Related U.S. Application Data a continuation of application No. PCT/US2020/043762, filed on Jul. 27, 2020, said application No. 17/380,011 is a continuation of application No. 16/940,172, filed on Jul. 27, 2020, now Pat. No. 11,101,783.

(60) Provisional application No. 62/881,074, filed on Jul. 31, 2019, provisional application No. 62/881,091, filed on Jul. 31, 2019, provisional application No. 62/881,087, filed on Jul. 31, 2019, provisional application No. 62/881,085, filed on Jul. 31, 2019, provisional application No. 62/881,061, filed on Jul. 31, 2019, provisional application No. 62/881,094, filed on Jul. 31, 2019, provisional application No. 62/881,077, filed on Jul. 31, 2019.

(52) U.S. Cl.
CPC ...... *H03H 9/02102* (2013.01); *H03H 9/0211* (2013.01); *H03H 9/02157* (2013.01); *H03H 9/131* (2013.01); *H03H 9/205* (2013.01); *H03H 2009/02165* (2013.01)

(56) References Cited

U.S. PATENT DOCUMENTS

| | | |
|---|---|---|
| 6,927,651 B2 | 8/2005 | Larson, III et al. |
| 6,975,183 B2 | 12/2005 | Aigner et al. |
| 7,385,334 B1 | 6/2008 | Olsson et al. |
| 7,964,144 B1 | 6/2011 | Nordin et al. |
| 8,346,482 B2 | 1/2013 | Fernandez |
| 8,673,121 B2 | 3/2014 | Larson, III et al. |
| 8,796,904 B2 | 8/2014 | Burak et al. |
| 9,065,421 B2 | 6/2015 | Feng et al. |
| 9,243,316 B2 | 1/2016 | Larson, III et al. |
| 9,401,692 B2 | 7/2016 | Burak et al. |
| 9,679,765 B2 | 6/2017 | Larson, III et al. |
| 10,153,750 B2 | 12/2018 | Hurwitz |
| 2002/0093398 A1 | 7/2002 | Ella et al. |
| 2002/0121945 A1 | 9/2002 | Ruby et al. |
| 2004/0140869 A1 | 7/2004 | Marksteiner et al. |
| 2004/0183400 A1 | 9/2004 | Aigner et al. |
| 2004/0195937 A1 | 10/2004 | Matsubara et al. |
| 2004/0233019 A1 | 11/2004 | Inoue et al. |
| 2005/0012568 A1 | 1/2005 | Aigner et al. |
| 2005/0070232 A1 | 3/2005 | Mages |
| 2005/0148065 A1 | 7/2005 | Zhang et al. |
| 2006/0094374 A1 | 5/2006 | Olip |
| 2006/0119230 A1 | 6/2006 | Umead et al. |
| 2006/0197411 A1 | 9/2006 | Hoen et al. |
| 2006/0287195 A1 | 12/2006 | Jerome et al. |
| 2007/0120625 A1 | 5/2007 | Larson et al. |
| 2007/0210349 A1 | 9/2007 | Iimura et al. |
| 2007/0222336 A1 | 9/2007 | Grannen et al. |
| 2007/0296513 A1 | 12/2007 | Ruile et al. |
| 2009/0045704 A1 | 2/2009 | Barber et al. |
| 2009/0096550 A1 | 4/2009 | Handtmann et al. |
| 2009/0256740 A1 | 10/2009 | Teshirogi et al. |
| 2010/0073106 A1 | 3/2010 | Stuebing et al. |
| 2010/0167416 A1 | 7/2010 | Kaliban et al. |
| 2010/0327701 A1 | 12/2010 | Grannen et al. |
| 2011/0043081 A1 | 2/2011 | Safari et al. |
| 2011/0121689 A1 | 5/2011 | Grannen et al. |
| 2011/0121916 A1 | 5/2011 | Barbet et al. |
| 2011/0309899 A1 | 12/2011 | Leiba et al. |
| 2012/0051976 A1 | 3/2012 | Lu et al. |
| 2012/0096697 A1 | 4/2012 | Grannen et al. |
| 2012/0154074 A1 | 6/2012 | Ruby et al. |
| 2012/0201174 A1 | 8/2012 | Jian et al. |
| 2012/0218057 A1 | 8/2012 | Burak et al. |
| 2012/0218058 A1 | 8/2012 | Burak et al. |
| 2012/0218059 A1 | 8/2012 | Burak et al. |
| 2012/0218060 A1 | 8/2012 | Burak et al. |
| 2012/0248941 A1 | 10/2012 | Saito et al. |
| 2012/0280767 A1 | 11/2012 | Burak et al. |
| 2012/0293278 A1 | 11/2012 | Burak et al. |
| 2012/0319530 A1 | 12/2012 | Burak et al. |
| 2012/0319534 A1 | 12/2012 | Shiwakawa et al. |
| 2013/0038408 A1 | 2/2013 | Burak et al. |
| 2013/0063226 A1 | 3/2013 | Burak et al. |
| 2013/0063227 A1 | 3/2013 | Burak et al. |
| 2013/0092547 A1 | 4/2013 | Li et al. |
| 2013/0106248 A1 | 5/2013 | Burak et al. |
| 2013/0106534 A1 | 5/2013 | Burak et al. |
| 2013/0193808 A1 | 8/2013 | Feng et al. |
| 2013/0314177 A1 | 11/2013 | Burak et al. |
| 2014/0111288 A1 | 4/2014 | Nikkel et al. |
| 2014/0118087 A1 | 5/2014 | Burak et al. |
| 2014/0118088 A1 | 5/2014 | Burak et al. |
| 2014/0118089 A1 | 5/2014 | Bradley et al. |
| 2014/0118090 A1 | 5/2014 | Grannen et al. |
| 2014/0118091 A1 | 5/2014 | Burak et al. |
| 2014/0118092 A1 | 5/2014 | Burak et al. |
| 2014/0125202 A1 | 5/2014 | Choy et al. |
| 2014/0125203 A1 | 5/2014 | Choy et al. |
| 2014/0132117 A1 | 5/2014 | Ella et al. |
| 2014/0137815 A1 | 5/2014 | Bi et al. |
| 2014/0152152 A1 | 6/2014 | Burak et al. |
| 2014/0154697 A1 | 6/2014 | Johal et al. |
| 2014/0159548 A1 | 6/2014 | Burak et al. |
| 2014/0174908 A1 | 6/2014 | Feng et al. |
| 2014/0175950 A1 | 6/2014 | Zou et al. |
| 2014/0176261 A1 | 6/2014 | Burak et al. |
| 2014/0193830 A1 | 7/2014 | Schimidt et al. |
| 2014/0225682 A1 | 8/2014 | Burak et al. |
| 2014/0225683 A1 | 8/2014 | Burak et al. |
| 2014/0232486 A1* | 8/2014 | Burak ............... H03H 9/02118 333/187 |
| 2014/0246305 A1 | 9/2014 | Larson, III |
| 2014/0340172 A1 | 11/2014 | Bradley et al. |
| 2014/0354109 A1 | 12/2014 | Grannen et al. |
| 2014/0354115 A1 | 12/2014 | Burak et al. |
| 2015/0133339 A1 | 5/2015 | Prindle |
| 2015/0240349 A1 | 8/2015 | Grannen |
| 2015/0244346 A1 | 8/2015 | Feng et al. |
| 2015/0244347 A1 | 8/2015 | Lv et al. |
| 2015/0270826 A1 | 9/2015 | Burak |
| 2015/0280100 A1 | 10/2015 | Burak et al. |
| 2015/0280687 A1 | 10/2015 | Burak et al. |
| 2015/0308996 A1 | 10/2015 | Kim et al. |
| 2015/0311046 A1 | 10/2015 | Yeh et al. |
| 2015/0318461 A1 | 11/2015 | Jacobsen et al. |
| 2015/0318837 A1* | 11/2015 | Zou ............... H03H 9/02086 333/187 |
| 2015/0326200 A1 | 11/2015 | Grannen et al. |
| 2015/0341015 A1 | 11/2015 | Grannen et al. |
| 2015/0349743 A1 | 12/2015 | Burak et al. |
| 2015/0349747 A1* | 12/2015 | Burak ............... H03H 9/54 333/187 |
| 2015/0377834 A1 | 12/2015 | Salvati et al. |
| 2016/0007893 A1 | 1/2016 | Roberts |
| 2016/0079958 A1 | 3/2016 | Burak |
| 2016/0087186 A1 | 3/2016 | Burak |
| 2016/0087187 A1 | 3/2016 | Burak |
| 2016/0118957 A1 | 4/2016 | Burak et al. |
| 2016/0118958 A1 | 4/2016 | Burak |
| 2016/0126930 A1 | 5/2016 | Giovannini |
| 2016/0182011 A1 | 6/2016 | Burak et al. |
| 2016/0301437 A1 | 10/2016 | Pehlke |
| 2016/0308509 A1 | 10/2016 | Burak et al. |
| 2016/0349088 A1 | 12/2016 | Patel |
| 2017/0047907 A1 | 2/2017 | Burak et al. |
| 2017/0063339 A1 | 3/2017 | Burak et al. |
| 2017/0117871 A1 | 4/2017 | Rivas et al. |
| 2017/0120242 A1 | 5/2017 | Rivas |
| 2017/0122911 A1 | 5/2017 | McCarran et al. |
| 2017/0122936 A1 | 5/2017 | Rivas et al. |
| 2017/0134001 A1 | 5/2017 | Belsick et al. |
| 2017/0134002 A1 | 5/2017 | Rivas et al. |
| 2017/0168017 A1 | 6/2017 | Rivas et al. |
| 2017/0168018 A1 | 6/2017 | Morton et al. |
| 2017/0214387 A1 | 7/2017 | Burak et al. |

(56) References Cited

U.S. PATENT DOCUMENTS

| | | |
|---|---|---|
| 2017/0227497 A1 | 8/2017 | Rivas et al. |
| 2017/0261503 A1 | 9/2017 | Murdock et al. |
| 2017/0276670 A1 | 9/2017 | Salvati et al. |
| 2017/0288121 A1 | 10/2017 | Burak et al. |
| 2017/0288628 A1 | 10/2017 | Grannen et al. |
| 2017/0292950 A1 | 10/2017 | Grinsven |
| 2017/0310304 A1 | 10/2017 | Burak et al. |
| 2017/0347925 A1 | 12/2017 | Wang et al. |
| 2018/0034438 A1 | 2/2018 | Ryder et al. |
| 2018/0085787 A1* | 3/2018 | Burak ............... H03H 9/02118 |
| 2018/0097499 A1 | 4/2018 | Rinaldi et al. |
| 2018/0138893 A1 | 5/2018 | Caron |
| 2018/0204996 A1 | 7/2018 | Zou et al. |
| 2018/0309425 A1 | 10/2018 | Shealy et al. |
| 2019/0081192 A1 | 3/2019 | Horng et al. |
| 2019/0103853 A1 | 4/2019 | Burak et al. |
| 2019/0152995 A1 | 5/2019 | Gunasekaran et al. |
| 2019/0187105 A1 | 6/2019 | Ram et al. |
| 2019/0234907 A1 | 8/2019 | Edwards et al. |
| 2019/0250198 A1 | 8/2019 | Kenumba et al. |
| 2019/0256806 A1 | 8/2019 | Nietfeld |
| 2019/0326873 A1* | 10/2019 | Bradley ............... H03H 9/0211 |
| 2020/0124625 A1 | 4/2020 | Dunlop et al. |

FOREIGN PATENT DOCUMENTS

| | | |
|---|---|---|
| WO | 2018111532 A1 | 6/2018 |
| WO | WO 2021/021719 | 2/2021 |
| WO | WO 2021/021723 | 2/2021 |
| WO | WO 2021/021730 | 2/2021 |
| WO | WO 2021/021732 | 2/2021 |
| WO | WO 2021/021736 | 2/2021 |
| WO | WO 2021/021739 | 2/2021 |
| WO | WO 2021/021743 | 2/2021 |
| WO | WO 2021/021745 | 2/2021 |
| WO | WO 2021/021747 | 2/2021 |
| WO | WO 2021/021748 | 2/2021 |

OTHER PUBLICATIONS

International Search Report and Written Opinion for PCT/US2020/043716 mailed Oct. 20, 2020.
International Search Report and Written Opinion for PCT/US2020/043720 mailed Oct. 20, 2020.
International Search Report and Written Opinion for PCT/US2020/043740 mailed Oct. 28, 2020.
International Search Report and Written Opinion for PCT/US2020/043746 mailed Oct. 28, 2020.
International Search Report and Written Opinion for PCT/US2020/043752 mailed Oct. 27, 2020.
International Search Report and Written Opinion for PCT/US2020/043762 mailed Oct. 21, 2020.
International Search Report and Written Opinion for PCT/US2020/043760 mailed Dec. 17, 2020.
International Search Report and Written Opinion for PCT/US2020/043733 mailed Dec. 17, 2020.
International Search Report and Written Opinion for PCT/US2020/043755 mailed Dec. 18, 2020.
International Search Report and Written Opinion for PCT/US2020/043730 mailed Feb. 1, 2021.

* cited by examiner

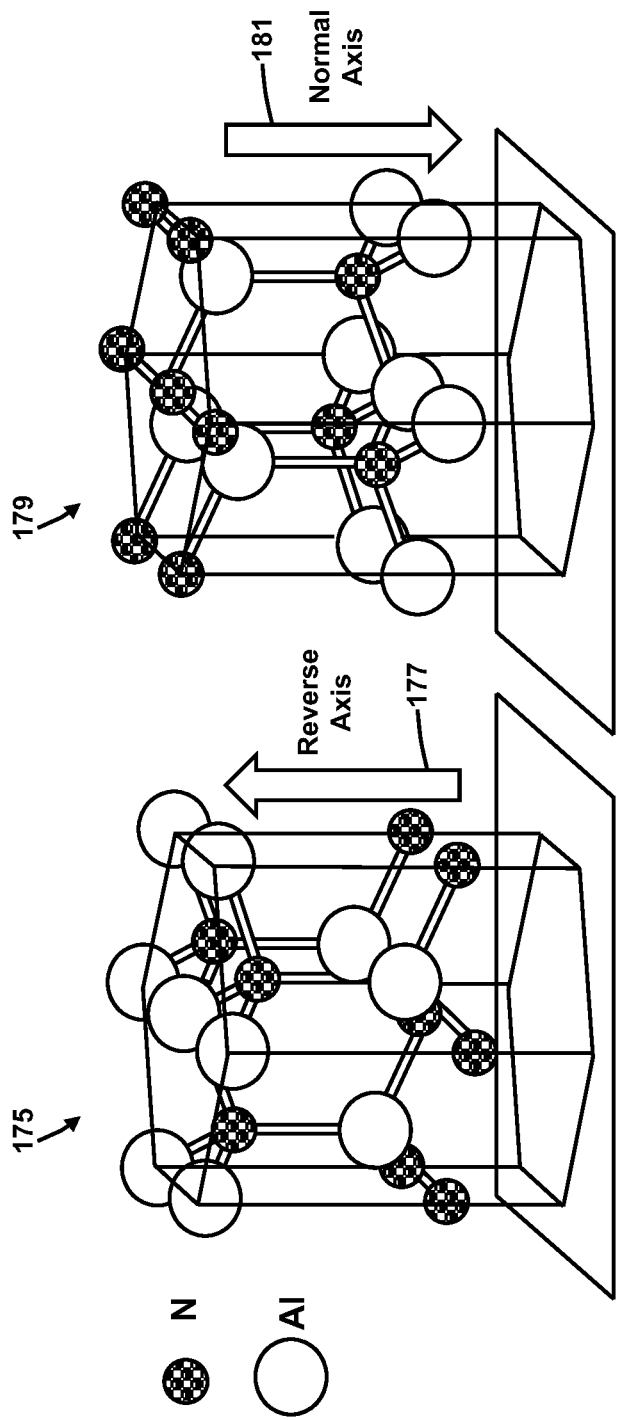

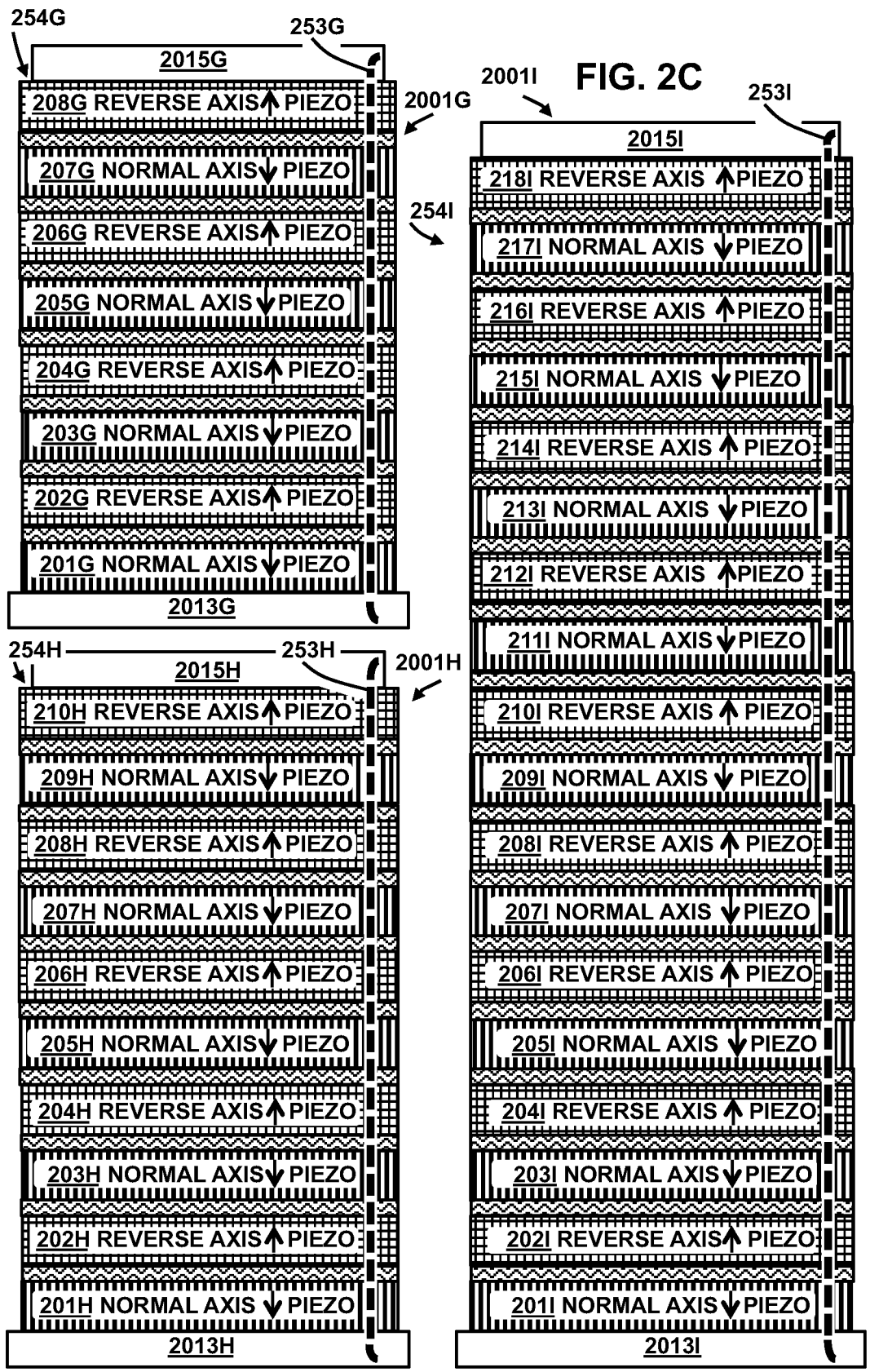

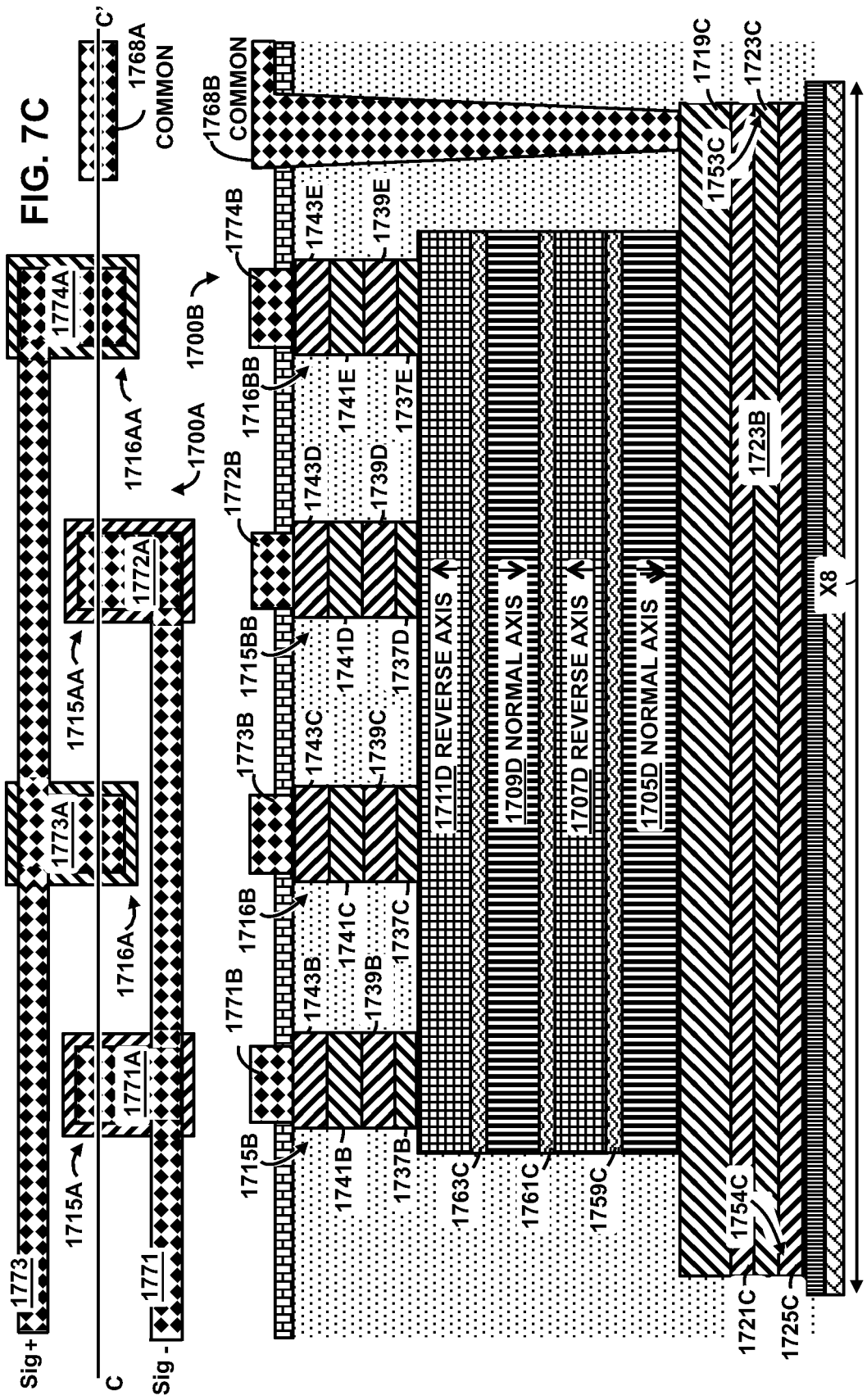

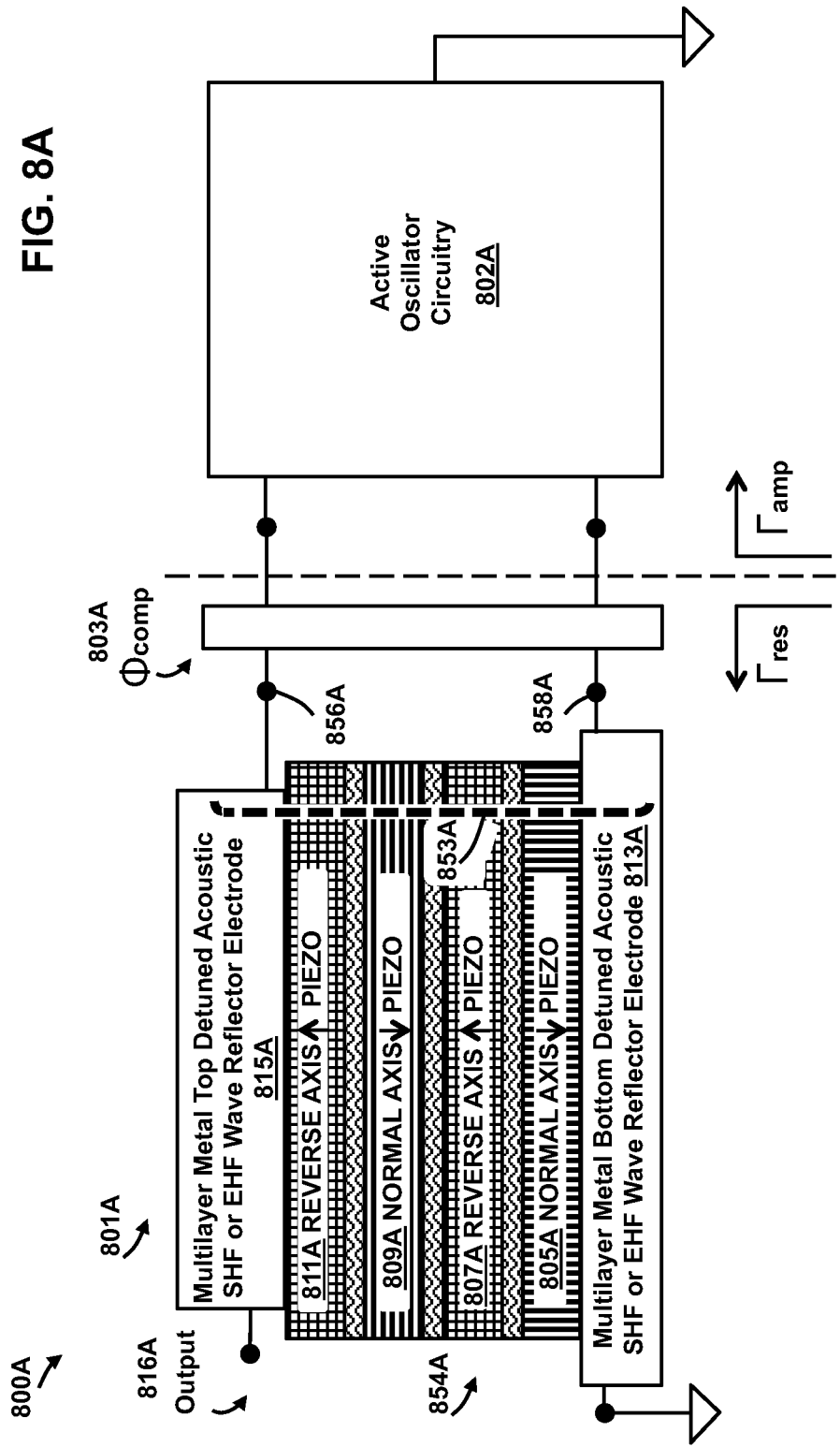

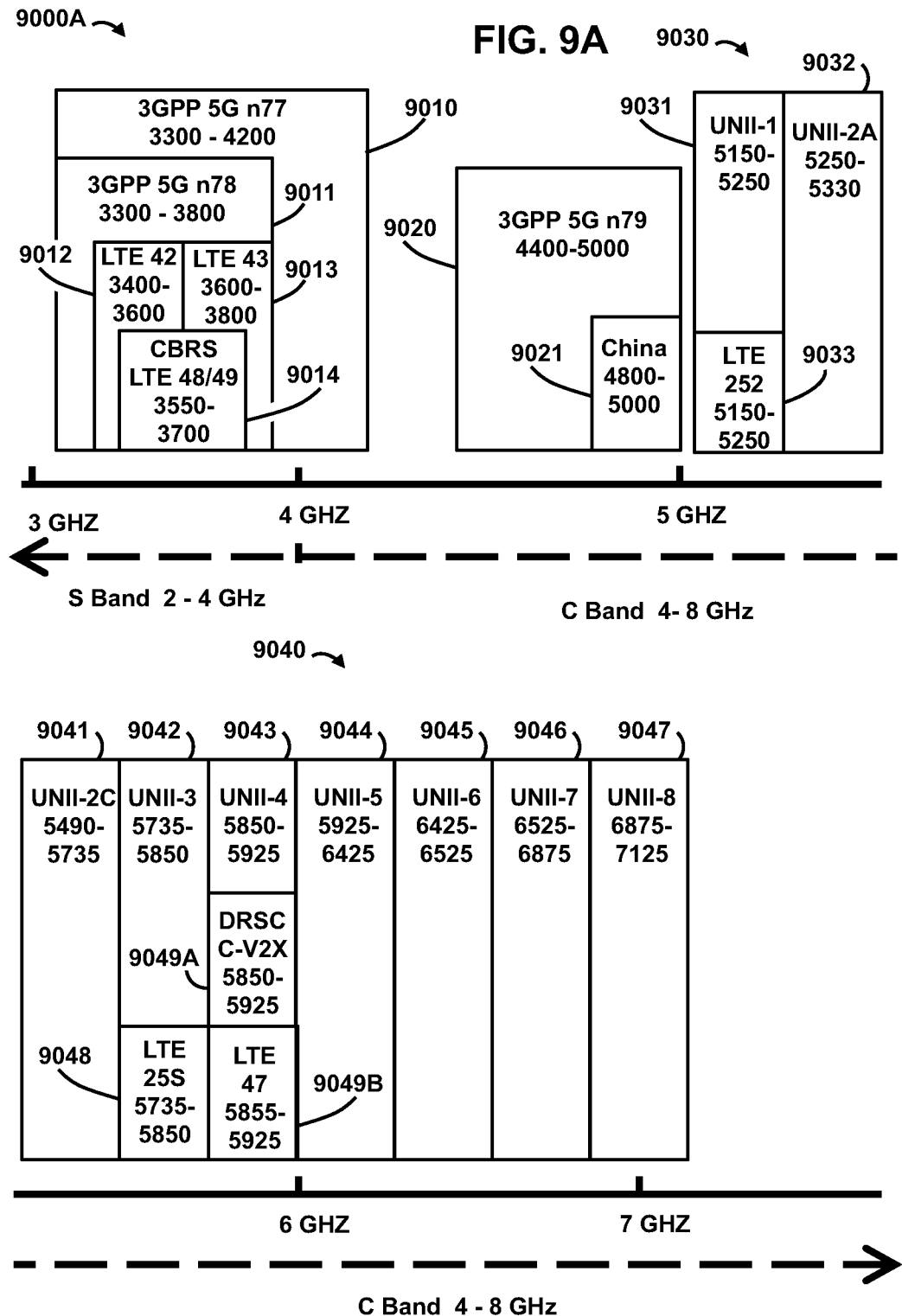

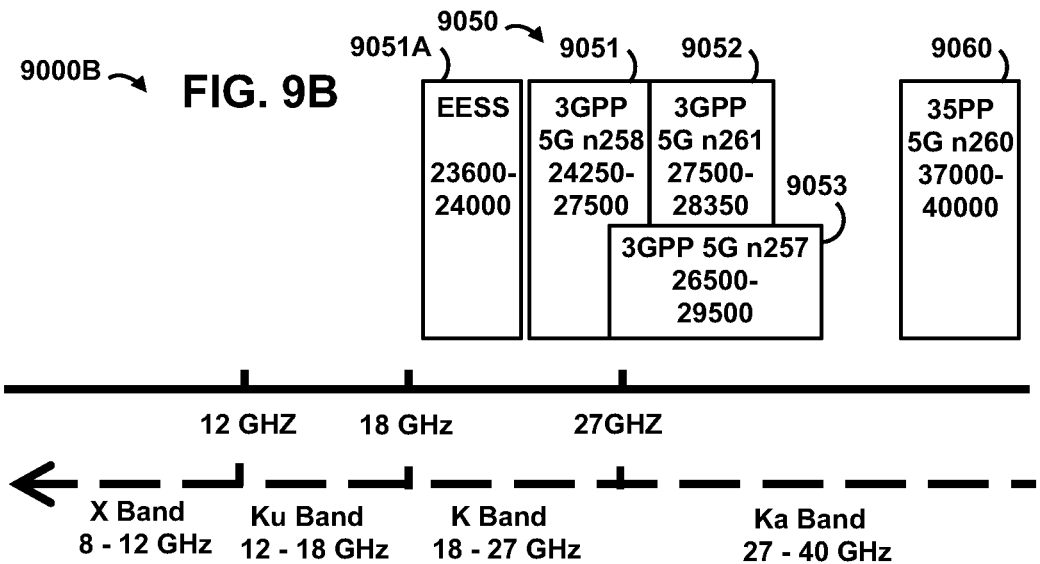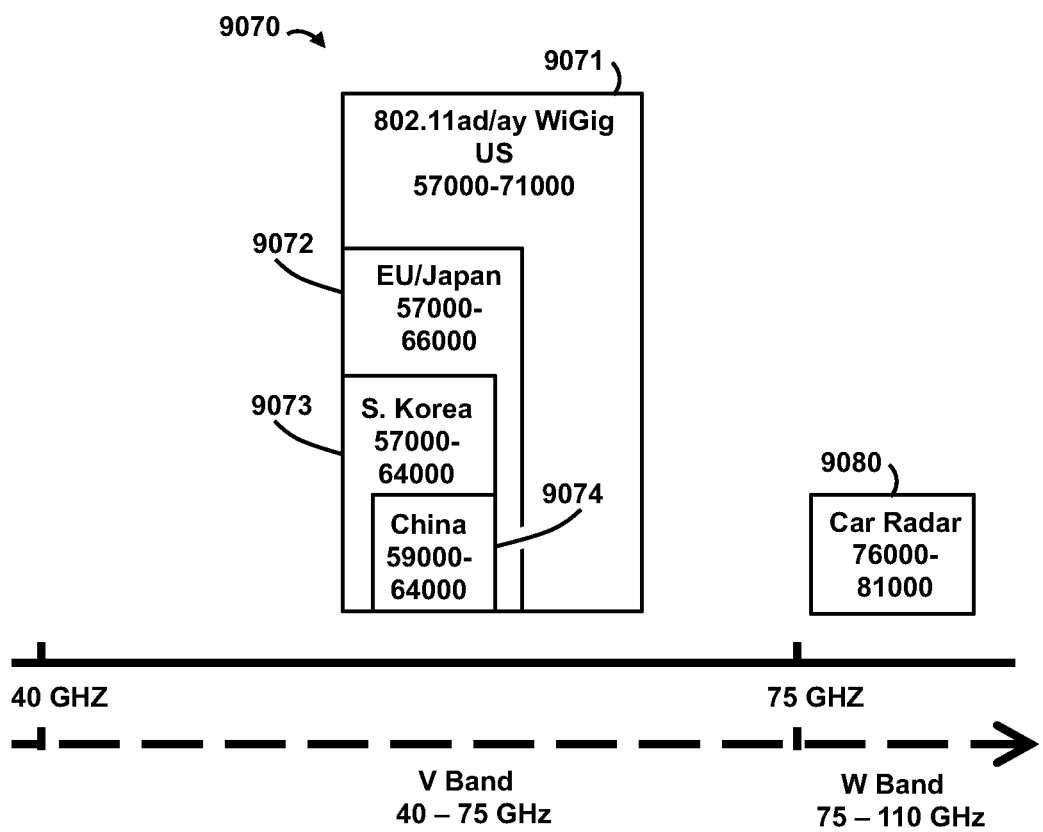

STRUCTURES, ACOUSTIC WAVE RESONATORS, DEVICES AND SYSTEMS

PRIORITY CLAIM

This application is a continuation of PCT Application No. PCTUS2020043762 filed Jul. 27, 2020, titled "STRUCTURES, ACOUSTIC WAVE RESONATORS, DEVICES AND SYSTEMS", which claims priority to the following provisional patent applications:

U.S. Provisional Patent Application Ser. No. 62/881,061, entitled "BULK ACOUSTIC WAVE (BAW) RESONATOR STRUCTURES, DEVICES AND SYSTEMS" and filed on Jul. 31, 2019;

U.S. Provisional Patent Application Ser. No. 62/881,074, entitled "ACOUSTIC DEVICE STRUCTURES, DEVICES AND SYSTEMS" and filed on Jul. 31, 2019;

U.S. Provisional Patent Application Ser. No. 62/881,077, entitled "DOPED BULK ACOUSTIC WAVE (BAW) RESONATOR STRUCTURES, DEVICES AND SYSTEMS" and filed on Jul. 31, 2019;

U.S. Provisional Patent Application Ser. No. 62/881,085, entitled "BULK ACOUSTIC WAVE (BAW) RESONATOR WITH PATTERNED LAYER STRUCTURES, DEVICES AND SYSTEMS" and filed on Jul. 31, 2019;

U.S. Provisional Patent Application Ser. No. 62/881,087, entitled "BULK ACOUSTIC WAVE (BAW) REFLECTOR AND RESONATOR STRUCTURES, DEVICES AND SYSTEMS" and filed on Jul. 31, 2019;

U.S. Provisional Patent Application Ser. No. 62/881,091, entitled "MASS LOADED BULK ACOUSTIC WAVE (BAW) RESONATOR STRUCTURES, DEVICES AND SYSTEMS" and filed on Jul. 31, 2019; and U.S. Provisional Patent Application Ser. No. 62/881,094, entitled "TEMPERATURE COMPENSATING BULK ACOUSTIC WAVE (BAW) RESONATOR STRUCTURES, DEVICES AND SYSTEMS" and filed on Jul. 31, 2019.

This patent is also a continuation in part of U.S. patent application Ser. No. 17/380,011 filed Jul. 20, 2021, entitled "STRUCTURES, ACOUSTIC WAVE RESONATORS, DEVICES AND SYSTEMS TO SENSE A TARGET VARIABLE", which in turn is a continuation of U.S. patent application Ser. No. 16/940,172 filed Jul. 27, 2020 (issued as U.S. Pat. No. 11,101,783 on Aug. 24, 2021), entitled "STRUCTURES, ACOUSTIC WAVE RESONATORS, DEVICES AND SYSTEMS TO SENSE A TARGET VARIABLE, INCLUDING AS A NON-LIMITING EXAMPLE CORONAVIRUSES", which in turn claims priority to the U.S. Provisional Patent Applications:

U.S. Provisional Patent Application Ser. No. 62/881,061, entitled "BULK ACOUSTIC WAVE (BAW) RESONATOR STRUCTURES, DEVICES AND SYSTEMS" and filed on Jul. 31, 2019;

U.S. Provisional Patent Application Ser. No. 62/881,074, entitled "ACOUSTIC DEVICE STRUCTURES, DEVICES AND SYSTEMS" and filed on Jul. 31, 2019;

U.S. Provisional Patent Application Ser. No. 62/881,077, entitled "DOPED BULK ACOUSTIC WAVE (BAW) RESONATOR STRUCTURES, DEVICES AND SYSTEMS" and filed on Jul. 31, 2019;

U.S. Provisional Patent Application Ser. No. 62/881,085, entitled "BULK ACOUSTIC WAVE (BAW) RESONATOR WITH PATTERNED LAYER STRUCTURES, DEVICES AND SYSTEMS" and filed on Jul. 31, 2019;

U.S. Provisional Patent Application Ser. No. 62/881,087, entitled "BULK ACOUSTIC WAVE (BAW) REFLECTOR AND RESONATOR STRUCTURES, DEVICES AND SYSTEMS" and filed on Jul. 31, 2019;

U.S. Provisional Patent Application Ser. No. 62/881,091, entitled "MASS LOADED BULK ACOUSTIC WAVE (BAW) RESONATOR STRUCTURES, DEVICES AND SYSTEMS" and filed on Jul. 31, 2019; and U.S. Provisional Patent Application Ser. No. 62/881,094, entitled "TEMPERATURE COMPENSATING BULK ACOUSTIC WAVE (BAW) RESONATOR STRUCTURES, DEVICES AND SYSTEMS" and filed on Jul. 31, 2019.

Each of the applications identified above are hereby incorporated by reference in their entirety.

TECHNICAL FIELD

The present disclosure relates to acoustic resonators and to devices and to systems comprising acoustic resonators.

BACKGROUND

Bulk Acoustic Wave (BAW) resonators have enjoyed commercial success in filter applications. For example, 4G cellular phones that operate on fourth generation broadband cellular networks typically include a large number of BAW filters for various different frequency bands of the 4G network. In addition to BAW resonators and filters, also included in 4G phones are filters using Surface Acoustic Wave (SAW) resonators, typically for lower frequency band filters. SAW based resonators and filters are generally easier to fabricate than BAW based filters and resonators. However, performance of SAW based resonators and filters may decline if attempts are made to use them for higher 4G frequency bands. Accordingly, even though BAW based filters and resonators are relatively more difficult to fabricate than SAW based filters and resonators, they may be included in 4G cellular phones to provide better performance in higher 4G frequency bands what is provided by SAW based filters and resonators.

5G cellular phones may operate on newer, fifth generation broadband cellular networks. 5G frequencies include some frequencies that are much higher frequency than 4G frequencies. Such relatively higher 5G frequencies may transport data at relatively faster speeds than what may be provided over relatively lower 4G frequencies. However, previously known SAW and BAW based resonators and filters have encountered performance problems when attempts were made to use them at relatively higher 5G frequencies. Many learned engineering scholars have studied these problems, but have not found solutions. For example, performance problems cited for previously known SAW and BAW based resonators and filters include scaling issues and significant increases in acoustic losses at high frequencies.

From the above, it is seen that techniques for improving Bulk Acoustic Wave (BAW) resonator structures are highly desirable, for example for operation over frequencies higher than 4G frequencies, in particular for filters, oscillators and systems that may include such devices.

BRIEF DESCRIPTION OF THE DRAWINGS

FIG. 1D is a perspective view of an illustrative model of a crystal structure of MN in piezoelectric material of layers in FIG. 1A having reverse axis orientation of negative polarization.

FIG. 1E is a perspective view of an illustrative model of a crystal structure of MN in piezoelectric material of layers in FIG. 1A having normal axis orientation of positive polarization.

FIG. 2C shows additional alternative bulk acoustic wave resonator structures with additional numbers of alternating axis piezoelectric layers.

FIG. 7C shows a simplified top view of an example Contour Mode Resonator (CMR) and also shows a simplified cross section view of the Contour Mode Resonator (CMR) shown in the simplified top view.

FIG. 8A shows an example oscillator using the bulk acoustic wave resonator structure of FIG. 1A.

FIGS. 9A and 9B are simplified diagrams of a frequency spectrum illustrating application frequencies and application frequency bands of the example bulk acoustic wave resonators shown in FIG. 1A and FIGS. 4A through 4G, and the example filters shown in FIGS. 5 through 7, and the example oscillators shown in FIGS. 8A and 8B.

DETAILED DESCRIPTION

Figure 1:
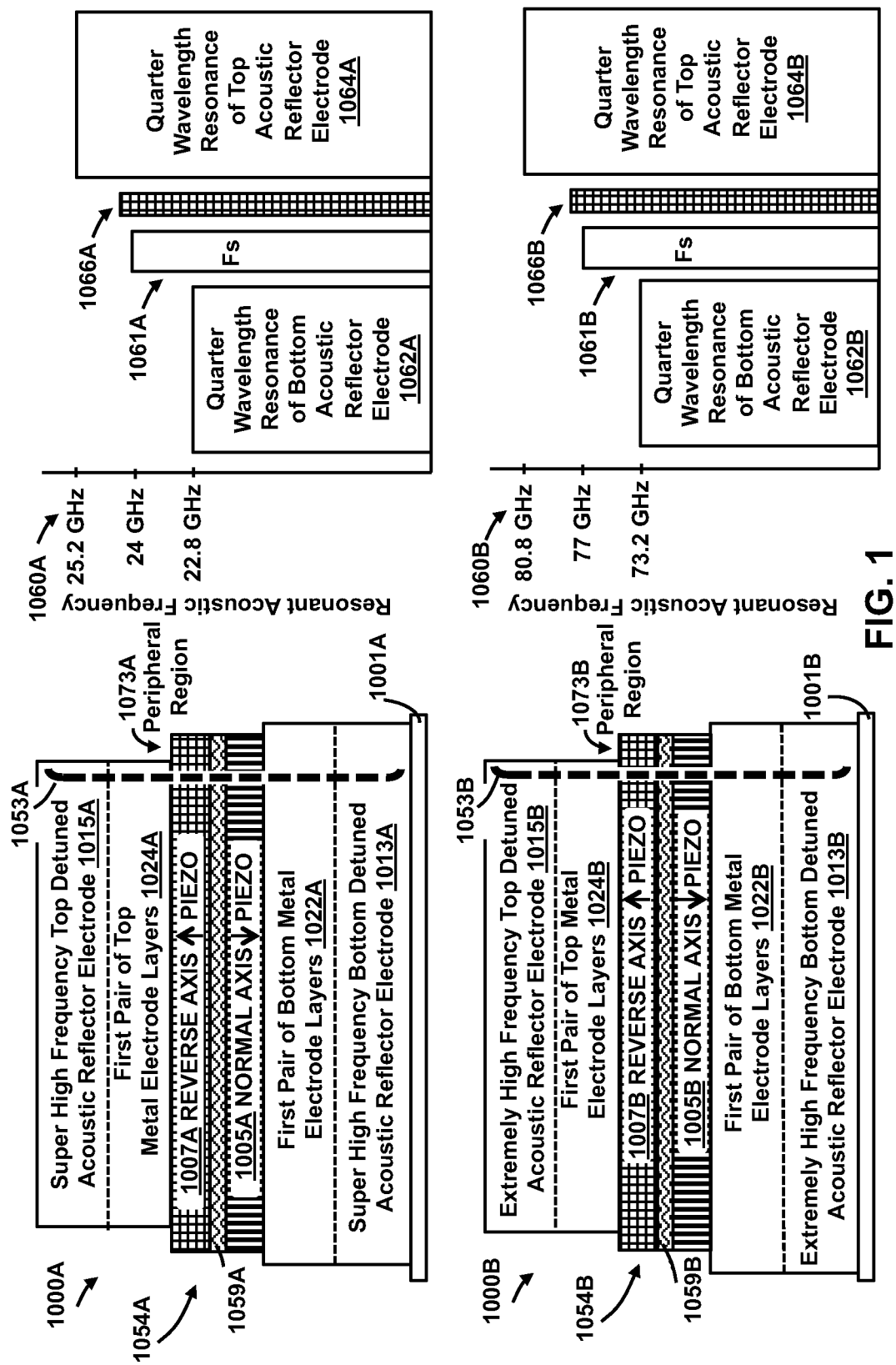
FIG. 1 shows two simplified diagrams of bulk acoustic wave resonator structures, which may include de-tuned acoustic reflector electrodes and corresponding bar charts showing resonant acoustic frequency for various resonator structures de-tuned as expected from simulation.

Non-limiting embodiments will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment shown where illustration is not necessary to allow understanding by those of ordinary skill in the art. In the specification, as well as in the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively. Further, relative terms, such as "above," "below," "top," "bottom," "upper"

and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element. The term "compensating" is to be understood as including "substantially compensating". The terms "oppose", "opposes" and "opposing" are to be understood as including "substantially oppose", "substantially opposes" and "substantially opposing" respectively. Further, as used in the specification and appended claims, and in addition to their ordinary meanings, the terms "substantial" or "substantially" mean to within acceptable limits or degree. For example, "substantially canceled" means that one skilled in the art would consider the cancellation to be acceptable. As used in the specification and the appended claims and in addition to its ordinary meaning, the term "approximately" or "about" means to within an acceptable limit or amount to one of ordinary skill in the art. For example, "approximately the same" means that one of ordinary skill in the art would consider the items being compared to be the same. As used in the specification and appended claims, the terms "a", "an" and "the" include both singular and plural referents, unless the context clearly dictates otherwise. Thus, for example, "a device" includes one device and plural devices. As used herein, the International Telecommunication Union (ITU) defines Super High Frequency (SHF) as extending between three Gigahertz (3 GHz) and thirty Gigahertz (30 GHz). The ITU defines Extremely High Frequency (EHF) as extending between thirty Gigahertz (30 GHz) and three hundred Gigahertz (300 GHz).

FIG. 1 shows two simplified diagrams of bulk acoustic wave resonator structures 1000A, 1000B, which may include acoustic reflector electrodes 1013A, 1015A, 1013B, 1015B arranged over a substrate 1001A, 1001B (e.g., silicon substrate 1001A, 1001B) and corresponding bar charts 1060A, 1060B showing resonant acoustic frequency for various resonator structures de-tuned as expected from simulation. As shown in FIG. 1, first mesa structures corresponding to the respective stacks of piezoelectric material layers (e.g., stacks of normal axis piezoelectric layer 1005A, 1005B, and reverse axis piezoelectric layer 1007A, 1007B) may extend laterally between (e.g., may be formed between) etched edge regions 1053A, 1053B and laterally opposing etched edge region 1055A, 1053B. Second mesa structures corresponding to SHF or EHF bottom de-tuned acoustic reflector electrode 1013A, 1013B may extend laterally between (e.g., may be formed between) etched edge regions 1053A, 1053B (vertically highlighted in FIG. 1 using vertical heavy dashed lines) and laterally opposing etched edge region 1054A, 1054B. Third mesa structures corresponding to SHF or EHF top de-tuned acoustic reflector electrode 1015A, 1015B may extend laterally between (e.g., may be formed between) etched edge regions 1053A, 1053B (vertically highlighted in FIG. 1 using vertical heavy dashed lines) and laterally opposing etched edge region 1054A, 1054B.

For example, in FIG. 1, respective acoustic reflectors 1013A, 1015A, 1013B, 1015B (e.g., respective acoustic reflector electrodes 1013A, 1015A, 1013B, 1015B) may be respective multi-layer acoustic reflectors 1013A, 1015A, 1013B, 1015B (e.g., may be respective multi-layer acoustic reflector electrodes 1013A, 1015A, 1013B, 1015B). For example, respective multi-layer acoustic reflectors 1013A, 1015A, 1013B, 1015B (e.g., respective multi-layer acoustic reflector electrodes 1013A, 1015A, 1013B, 1015B) may approximate respective distributed Bragg reflectors 1013A, 1015A, 1013B, 1015B. For example, respective multi-layer acoustic reflectors 1013A, 1015A, 1013B, 1015B (e.g., respective multi-layer acoustic reflector electrodes 1013A, 1015A, 1013B, 1015B) may include respective acoustic layers 1022A, 1022B, 1024A, 1024B (e.g., respective metal electrode layers 1022A, 1022B, 1024A, 1024B).

For example, in FIG. 1, respective acoustic reflectors 1013A, 1015A, 1013B, 1015B (e.g., respective acoustic reflector electrodes 1013A, 1015A, 1013B, 1015B) may be acoustically de-tuned from respective resonant frequencies of the respective BAW resonators 1000A, 1000B. For example, respective acoustic reflectors 1013A, 1015A, 1013B, 1015B (e.g., respective acoustic reflector electrodes 1013A, 1015A, 1013B, 1015B) may approximate respective distributed Bragg reflectors 1013A, 1015A, 1013B, 1015B, having respective quarter wavelength resonances which may be acoustically de-tuned from respective resonant frequencies of the respective BAW resonators 1000A, 1000B. For example, respective acoustic layers (e.g., top acoustic layers 1024A, 1024B, e.g., bottom acoustic layers 1022A, 1022B) of the respective de-tuned multi-layer acoustic reflectors 1013A, 1015A, 1013B, 1015B may have respective layer thicknesses selected so that the respective de-tuned multi-layer acoustic reflectors 1013A, 1015A, 1013B, 1015B, may have respective quarter wavelength resonances at respective frequencies that may be acoustically de-tuned from the respective resonant frequencies of the respective BAW resonators 1000A, 1000B. For example, respective metal electrode layers (e.g., top metal electrode layers 1024A, 1024B, e.g., bottom metal electrode layers 1022A, 1022B) of the respective de-tuned multi-layer metal reflector electrodes 1013A, 1015A, 1013B, 1015B may have respective layer thicknesses selected so that the respective de-tuned multi-layer acoustic reflectors 1013A, 1015A, 1013B, 1015B, may have respective quarter wavelength resonances at respective frequencies that may be acoustically de-tuned from the respective resonant frequencies of the respective BAW resonators 1000A, 1000B. As will be discussed in greater detail subsequently herein, acoustic reflector de-tuning may facilitate suppressing parasitic (e.g., undesired) lateral resonances, for example, in respective BAW resonators 1000A, 1000B.

The stacks of piezoelectric material layers (e.g., stacks of normal axis piezoelectric layer 1005A, 1005B, and reverse axis piezoelectric layer 1007A, 1007B) may have respective active regions where the SHF or EHF top de-tuned acoustic reflector electrodes 1015A, 1015B may respectively overlap SHF or EHF bottom de-tuned acoustic reflector electrodes 1013A, 1013B. For example, in operation of BAW resonators 1000A, 1000B, an oscillating electric field may be applied via SHF or EHF top de-tuned acoustic reflector electrodes 1015A, 1015B and SHF or EHF bottom de-tuned acoustic reflector electrodes 1013A, 1013B, so as to activate responsive piezoelectric acoustic oscillations in the respective active regions of the stacks of piezoelectric material layers (e.g., stacks of normal axis piezoelectric layer 1005A, 1005B, and reverse axis piezoelectric layer 1007A, 1007B), where the SHF or EHF top de-tuned acoustic reflector electrodes 1015A, 1015B may respectively overlap SHF or EHF bottom de-tuned acoustic reflector electrodes 1013A, 1013B. Further, FIG. 1 particularly shows respective peripheral regions 1073A, 1073B of the stacks of piezoelectric material layers (e.g., stacks of normal axis piezoelectric layer 1005A, 1005B, and reverse axis piezoelectric layer 1007A, 1007B) where the SHF or EHF top de-tuned acoustic reflector electrodes 1015A, 1015B may avoid overlapping the SHF or EHF bottom de-tuned acoustic reflector electrodes 1013A, 1013B The peripheral regions 1073A, 1073B of the stacks of piezoelectric material layers (e.g., stacks of normal axis piezoelectric layer 1005A, 1005B, and reverse axis piezoelectric layer 1007A, 1007B) may be relatively inactive (e.g., relatively inactive regions 1073A, 1073B), relative to the active piezoelectric regions where the SHF or EHF top de-tuned acoustic reflector electrodes 1015A, 1015B may respectively overlap SHF or EHF bottom de-tuned acoustic reflector electrodes 1013A, 1013B. The peripheral regions 1073A, 1073B of the stacks of piezoelectric material layers (e.g., stacks of normal axis piezoelectric layer 1005A, 1005B, and reverse axis piezoelectric layer 1007A, 1007B) may be remainder regions 1073A, 1073B of the stacks of piezoelectric material layers (e.g., stacks of normal axis piezoelectric layer 1005A, 1005B, and reverse axis piezoelectric layer 1007A, 1007B). The peripheral regions 1073A, 1073B of the stacks of piezoelectric material layers (e.g., stacks of normal axis piezoelectric layer 1005A, 1005B, and reverse axis piezoelectric layer 1007A, 1007B) may be extremity regions 1073A, 1073B of the stacks of piezoelectric material layers (e.g., stacks of normal axis piezoelectric layer 1005A, 1005B, and reverse axis piezoelectric layer 1007A, 1007B). The peripheral regions 1073A, 1073B of the stacks of piezoelectric material layers (e.g., stacks of normal axis piezoelectric layer 1005A, 1005B, and reverse axis piezoelectric layer 1007A, 1007B) may be lateral fringing electric field regions 1073A, 1073B, since there may be lateral fringing electric fields extending into extremities of the stacks of piezoelectric material layers in operation of the BAW resonators 1001A, 100B, e.g., the lateral fringing electric fields may extend laterally from SHF or EHF top de-tuned acoustic reflector electrodes 1015A, 1015B, when the oscillating electric field may be applied thereto.

Bulk acoustic Super High Frequency (SHF) wave resonator 1000A may include the normal axis piezoelectric layer 1005A (e.g., normal piezoelectric axis Aluminum Nitride piezoelectric layer 1005A) and the reverse axis piezoelectric layer 1007A (e.g., reverse piezoelectric axis Aluminum Nitride piezoelectric layer 1007A) arranged in a two piezoelectric layer alternating stack arrangement sandwiched between multi-layer metal acoustic Super High frequency (SHF) bottom de-tuned acoustic reflector electrode 1013A and multi-layer metal acoustic Super High frequency (SHF) bottom acoustic de-tuned reflector electrode 1015A. The normal axis piezoelectric layer 1005A has the normal piezoelectric axis orientation, and the reverse axis piezoelectric layer 1007A has the reverse piezoelectric axis orientation that opposes the normal piezoelectric axis orientation of the normal axis piezoelectric layer 1005A. The normal axis piezoelectric layer 1005A and the reverse axis piezoelectric layer 1007A may be acoustically coupled with one another to have a piezoelectrically excitable resonance mode. An interposer layer 1059A (e.g., dielectric interposer layer 1059A, e.g., metal interposer layer 1059A) may be interposed between normal axis piezoelectric layer 1005A and reverse axis piezoelectric layer 1007A. The Super High frequency (SHF) bottom acoustic de-tuned reflector electrode 1013A may include a first pair of bottom metal electrode layers 1022A. The Super High frequency (SHF) top acoustic de-tuned reflector electrode 1015A may include a first pair of top metal electrode layers 1024A. The first pair of bottom metal electrode layers 1022A of the Super High frequency (SHF) bottom acoustic de-tuned reflector electrode 1013A and the first pair of top metal electrode layers 1024A of the Super High frequency (SHF) top acoustic de-tuned reflector electrode 1015A may be coupled (e.g., electrically coupled, e.g., acoustically coupled) with the normal axis piezoelectric layer 1005A and the reverse axis piezoelectric layer 1007A to excite the piezoelectrically excitable resonance mode at a resonant frequency of the bulk acoustic Super High Frequency (SHF) wave resonator 1000A in the Super High Frequency (SHF) wave band (e.g., 24 GHz main resonant frequency). For example, thicknesses of the normal axis piezoelectric layer 1005A and the reverse axis piezoelectric layer 1007A may be selected to determine the main resonant frequency of bulk acoustic Super High Frequency (SHF) wave resonator 1000A in the Super High Frequency (SHF) wave band (e.g., twenty-four Gigahertz, 24 GHz main resonant frequency). Similarly, layer thicknesses of Super High Frequency (SHF) acoustic de-tuned reflector electrode layers (e.g., layer thicknesses of members of the first pair of bottom metal electrode layers 1022A of Super High frequency (SHF) bottom acoustic de-tuned reflector electrode 1013A, e.g., layer thickness of members of the first pair of top metal electrode layers 1024A of Super High frequency (SHF) top acoustic de-tuned reflector electrode 1015A) may be selected to determine respective quarter wavelength resonance of such SHF acoustic de-tuned reflector electrodes at a frequency, e.g., quarter wavelength resonant frequency, within the Super High Frequency (SHF) wave band. For example, layer thickness of members of the first pair of top metal electrode layers 1024A of Super High frequency (SHF) top acoustic de-tuned reflector electrode 1015A may be selected to determine quarter wavelength resonance of such SHF acoustic de-tuned reflector electrodes at a frequency, e.g., quarter wavelength resonant frequency of about twenty-five and two tenths Gigahertz, 25.2 GHz, within the Super High Frequency (SHF) wave band. For example, a quarter wavelength resonant frequency for an approximation of an acoustic distributed Bragg reflector (or an approximation of a de-tuned acoustic distributed Bragg reflector) may be an acoustic frequency corresponding to a quarter wavelength resonance of such structure. For example, layer thickness of members of the first pair of bottom metal electrode layers 1022A of Super High frequency (SHF) bottom acoustic de-tuned reflector electrode 1013A may be selected to determine quarter wavelength resonance of such SHF acoustic de-tuned reflector electrodes at a frequency, e.g., quarter wavelength resonant frequency, of about twenty-two and eight tenths Gigahertz, 22.8 GHz, within the Super High Frequency (SHF) wave band. The Super High Frequency (SHF) wave band may include: 1) quarter wavelength resonant frequency (e.g., about twenty-five and two tenths Gigahertz, 25.2 GHz) of the Super High Frequency (SHF) acoustic de-tuned reflector electrode layers (e.g., layer thicknesses of members of the first pair of top metal electrode layers 1024A of the Super High frequency (SHF) top acoustic de-tuned reflector electrode 1015A); quarter wavelength resonant frequency (e.g., about twenty-two and eight tenths Gigahertz, 22.8 GHz) of the Super High Frequency (SHF) acoustic de-tuned reflector electrode layers e.g., layer thicknesses of members of the first pair of bottom metal electrode layers 1022A of the Super High frequency (SHF) bottom acoustic de-tuned reflector electrode 1013A, and 3) the main resonant frequency of bulk acoustic the Super High Frequency (SHF) wave resonator 1000A (e.g., twenty-four Gigahertz, 24 GHz main resonant frequency).

For example, corresponding to the Super High Frequency (SHF) wave resonator 1000A having the main resonant frequency (e.g., main series resonant frequency, Fs) in the SHF wave band (e.g., twenty-four Gigahertz, 24 GHz main resonant frequency) shown in the top left quadrant of FIG. 1 is a first bar chart 1060A in the top right quadrant of FIG. 1 showing resonant acoustic frequency for various resonator structures de-tuned, as predicted by simulation. The first bar chart 1060A shows a quarter wavelength resonance of bottom acoustic reflector electrode 1062A of about twenty-two and eight tenths Gigahertz, 22.8 GHz. This corresponds to the Super High frequency (SHF) bottom acoustic de-tuned reflector electrode 1013A of BAW resonator 1000A. The first bar chart 1060A shows a quarter wavelength resonance of top acoustic reflector electrode 1064A of about twenty-five and two tenths Gigahertz, 25.2 GHz. This corresponds to the Super High frequency (SHF) top acoustic de-tuned reflector electrode 1015A of BAW resonator 1000A. Also shown in first bar chart 1060A is the main resonant frequency 1061A (e.g., main series resonant frequency, Fs 1061A) of about twenty-four Gigahertz, 24 GHz main resonant frequency of the Super High Frequency (SHF) wave resonator 1000A. The quarter wavelength resonance of bottom acoustic reflector electrode 1062A of about twenty-two and eight tenths Gigahertz, 22.8 GHz is de-tuned (e.g., tuned down) from the twenty-four Gigahertz, 24 GHz main resonant frequency of the Super High Frequency (SHF) wave resonator 1000A. The quarter wavelength resonance of top acoustic reflector electrode 1064A of about twenty-five and two tenths Gigahertz, 25.2 GHz is de-tuned (e.g., tuned up) from the twenty-four Gigahertz, 24 GHz main resonant frequency of the Super High Frequency (SHF) wave resonator 1000A. It is theorized that de-tuning of the quarter wavelength resonance of top acoustic reflector electrode 1064A by this amount may facilitate suppression of parasitic lateral resonances (e.g., may be optimal de-tuning, as predicted by simulation, to facilitate suppression of parasitic lateral resonances). It is theorized that de-tuning of the quarter wavelength resonance of top acoustic reflector electrode 1064A may facilitate a mechanical resonance of the peripheral region 1066A to be about, twenty-four and three tenths Gigahertz, 24.3 GHz, and near (e.g., approximately matching) the main resonant frequency 1061A (e.g., main series resonant frequency, Fs 1061A) of about twenty-four Gigahertz, 24 GHz main resonant frequency of the Super High Frequency (SHF) wave resonator 1000A. It is theorized that this nearness (e.g., approximately matching) may in turn facilitate suppression of parasitic lateral resonances.

As another example, bulk acoustic Extremely High Frequency (EHF) wave resonator 1000B may include a normal axis piezoelectric layer 1005B (e.g., normal piezoelectric axis Aluminum Nitride piezoelectric layer 1005B) and a reverse axis piezoelectric layer 1007B (e.g., reverse piezoelectric axis Aluminum Nitride piezoelectric layer 1007B) arranged in a two piezoelectric layer alternating stack arrangement sandwiched between Extremely High Frequency (EHF) top acoustic de-tuned reflector electrode 1015B and Extremely High Frequency (EHF) bottom acoustic de-tuned reflector electrode 1013B. The normal axis piezoelectric layer 1005B has the normal piezoelectric axis orientation, and the reverse axis piezoelectric layer 1007B has the reverse piezoelectric axis orientation that opposes the normal piezoelectric axis orientation of the normal axis piezoelectric layer 1005B. The normal axis piezoelectric layer 1005B and the reverse axis piezoelectric layer 1007B may be acoustically coupled with one another to have a piezoelectrically excitable resonance mode. An interposer layer 1059B (e.g., dielectric interposer layer 1059B, e.g., metal interposer layer 1059B) may be interposed between normal axis piezoelectric layer 1005B and reverse axis piezoelectric layer 1007B. The Extremely High Frequency (EHF) bottom acoustic de-tuned reflector electrode 1013B may include a first pair of bottom metal electrode layers 1022B. The Extremely High Frequency (EHF) top acoustic de-tuned reflector electrode 1015B may include a first pair of top metal electrode layers 1024B. The first pair of bottom metal electrode layers 1022B of the Extremely High Frequency (EHF) bottom acoustic de-tuned reflector electrode 1013B and the first pair of top metal electrode layers 1024B of the Extremely High Frequency (EHF) top acoustic de-tuned reflector electrode 1015B may be coupled (e.g., electrically coupled, e.g., acoustically coupled) with the normal axis piezoelectric layer 1005B and the reverse axis piezoelectric layer 1007B to excite the piezoelectrically excitable resonance mode at a resonant frequency of the bulk acoustic Extremely High Frequency (EHF) wave resonator 1000B in the Extremely High Frequency (EHF) wave band (e.g., 77 GHz main resonant frequency). For example, thicknesses of the normal axis piezoelectric layer 1005B and the reverse axis piezoelectric layer 1007B may be selected to determine the main resonant frequency of bulk acoustic Extremely High Frequency (EHF) wave resonator 1000B in the Extremely High Frequency (EHF) wave band (e.g., seventy-seven Gigahertz, 77 GHz main resonant frequency). Similarly, layer thicknesses of Extremely High Frequency (EHF) acoustic de-tuned reflector electrode layers (e.g., layer thicknesses of members of the first pair of bottom metal electrode layers 1022B of Extremely High frequency (EHF) bottom acoustic de-tuned reflector electrode 1013B, e.g., layer thickness of members of the first pair of top metal electrode layers 1024B of Extremely High frequency (EHF) top acoustic de-tuned reflector electrode 1015B) may be selected to determine respective quarter wavelength resonance of such EHF acoustic de-tuned reflector electrodes at a frequency, e.g., quarter wavelength resonant frequency, within the Extremely High Frequency (EHF) wave band. For example, layer thickness of members of the first pair of top metal electrode layers 1024B of Extremely High frequency (EHF) top acoustic de-tuned reflector electrode 1015B may be selected to determine quarter wavelength resonance of such EHF acoustic de-tuned reflector electrodes at a frequency, e.g., quarter wavelength resonant frequency of about eighty and eight tenths Gigahertz, 80.8 GHz, within the Extremely High Frequency (EHF) wave band. For example, layer thickness of members of the first pair of bottom metal electrode layers 1022B of Extremely High frequency (EHF) bottom acoustic de-tuned reflector electrode 1013B may be selected to determine quarter wavelength resonance of such EHF acoustic de-tuned reflector electrodes at a frequency, e.g., quarter wavelength resonant frequency, of about seventy-three and two tenths Gigahertz, 73.2 GHz, within the Extremely High Frequency (EHF) wave band. The Extremely High Frequency (EHF) wave band may include: 1) quarter wavelength resonant frequency (e.g., about eighty and eight tenths Gigahertz, 80.8 GHz) of the Extremely High Frequency (EHF) acoustic de-tuned reflector electrode layers (e.g., layer thickness of members of the first pair of top metal electrode layers 1024B of the Extremely High frequency (SHF) top acoustic de-tuned reflector electrode 1015B); quarter wavelength resonant frequency (e.g., about seventy-three and two tenths Gigahertz, 73.2 GHz) of the Extremely High Frequency (EHF) acoustic de-tuned reflector electrode layers e.g., layer thicknesses of members of the first pair of bottom metal electrode layers 1022B of the Extremely High frequency (EHF) bottom acoustic de-tuned reflector electrode 1013B, and 3) the main resonant frequency of bulk acoustic the Extremely High Frequency (EHF) wave resonator 1000B (e.g., seventy-seven Gigahertz, 77 GHz main resonant frequency).

For example, corresponding to the Extremely High Frequency (EHF) wave resonator 1000B having the main resonant frequency (e.g., main series resonant frequency, Fs) in the EHF wave band (e.g., seventy-seven Gigahertz, 77 GHz main resonant frequency) shown in the bottom left quadrant of FIG. 1 is a second bar chart 1060B in the bottom right quadrant of FIG. 1 showing resonant acoustic frequency for various resonator structures, as predicted by simulation. The second bar chart 1060B shows a quarter wavelength resonance of bottom acoustic reflector electrode 1062B of about seventy-three and two tenths Gigahertz, 73.2 GHz. This corresponds to the Extremely High frequency (EHF) bottom acoustic de-tuned reflector electrode 1013B of BAW resonator 1000B. The second bar chart 1060B shows a quarter wavelength resonance of top acoustic reflector electrode 1064B of about eighty and eight tenths Gigahertz, 80.8 GHz. This corresponds to the Extremely High frequency (EHF) top acoustic de-tuned reflector electrode 1015B of BAW resonator 1000B. Also shown in second bar chart 1060B is the main resonant frequency 1061B (e.g., main series resonant frequency, Fs 1061B) of about seventy-seven Gigahertz, 77 GHz main resonant frequency of the Extremely High Frequency (EHF) wave resonator 1000B. The quarter wavelength resonance of bottom acoustic reflector electrode 1062B of about seventy-three and two tenths Gigahertz, 73.2 GHz is de-tuned (e.g., tuned down) from the seventy-seven Gigahertz, 77 GHz main resonant frequency of the Extremely High Frequency (EHF) wave resonator 1000B. The quarter wavelength resonance of top acoustic reflector electrode 1064B of about eighty and eight tenths Gigahertz, 80.8 GHz is de-tuned (e.g., tuned up) from the seventy-seven Gigahertz, 77 GHz main resonant frequency of the Extremely High Frequency (EHF) wave resonator 1000B. It is theorized that de-tuning of the quarter wavelength resonance of top acoustic reflector electrode 1064B by this amount may facilitate suppression of parasitic lateral resonances (e.g., may be optimal de-tuning, as predicted by simulation, to facilitate suppression of parasitic lateral resonances). It is theorized that de-tuning of the quarter wavelength resonance of top acoustic reflector electrode 1064B may facilitate a mechanical resonance of the peripheral region 1066B to be about, seventy-eight Gigahertz, 78 GHz, and near (e.g., approximately matching) the main resonant frequency 1061B (e.g., main series resonant frequency, Fs 1061B) of about seventy-seven Gigahertz, 77 GHz main resonant frequency of the Extremely High Frequency (EHF) wave resonator 1000B. It is theorized that this nearness (e.g., approximately matching) may in turn facilitate suppression of parasitic lateral resonances.

Thicknesses of member layers of the acoustic de-tuned reflector electrodes may be related to resonator resonant frequency. Member layers of the acoustic de-tuned reflector electrodes may be made thinner as resonators are made to extend to higher resonant frequencies, and as acoustic de-tuned reflector electrodes are made to extend to higher quarter wavelength resonant frequencies. In accordance with teachings of this disclosure, to compensate for this member layer thinning, number of member layers of the acoustic reflector electrodes may be increased in designs extending to higher resonant frequencies, to facilitate thermal conductivity through acoustic reflector electrodes, and to facilitate electrical conductivity through acoustic reflectivity at higher resonant frequencies. Operation of the example bulk acoustic wave resonators 1000A, 1000B at a resonant Super High Frequency (SHF) or resonant Extremely High Frequency (EHF) may generate heat to be removed from bulk acoustic wave resonators 1000A, 1000B through the acoustic reflector electrodes. The acoustic reflector electrodes (e.g., Super High Frequency (SHF) bottom acoustic reflector electrode 1013A, e.g., Super High Frequency (SHF) top acoustic reflector electrode 1015B, e.g., Extremely High Frequency (EHF) bottom acoustic reflector electrode 1013B, e.g., Extremely High Frequency (EHF) top acoustic reflector electrode 1015B) may have thermal resistance of three thousand degrees Kelvin per Watt or less at the given frequency (e.g., at the resonant frequency of the BAW resonator in the Super High Frequency (SHF) band or the Extremely High Frequency (EHF) band, e.g., at the quarter wavelength resonant frequency of the acoustic reflector electrode in the super high frequency band or the extremely high frequency band). For example, a sufficient number of member layers may be employed to provide for this thermal resistance at the given frequency (e.g., at the resonant frequency of the BAW resonator in the super high frequency band or the extremely high frequency band, e.g., at the quarter wavelength resonant frequency of the acoustic reflector electrode in the super high frequency band or the extremely high frequency band).

Throughout this disclosure, the respective quarter wavelength resonances, or stated longer, the respective quarter wavelength acoustic resonances (e.g., of the multi-layer metal top acoustic reflector electrode, e.g., of the first pair of top metal electrode layers, e.g., of the multi-layer metal bottom acoustic reflector electrode, e.g., of the first pair of bottom metal electrode layers) may respectively be effective quarter wavelength acoustic resonances (e.g., of the multi-layer metal top acoustic reflector electrode, e.g., of the first pair of top metal electrode layers, e.g., of the multi-layer metal bottom acoustic reflector electrode, e.g., of the first pair of bottom metal electrode layers). Respectively, the effective quarter wavelength acoustic resonances may be weighted averages of respective quarter wave acoustic resonances of respective metal electrode layers (e.g., of the multi-layer metal top acoustic reflector electrode, e.g., of the first pair of top metal electrode layers, e.g., of the multi-layer metal bottom acoustic reflector electrode, e.g., of the first pair of bottom metal electrode layers). A weighting fraction may be, for example, determined by acoustic energy distribution through the multi-layer metal acoustic reflector electrode. For example, such weighted averages may weigh a quarter wavelength acoustic resonance of the first member of the first pair of metal electrode layers relatively more heavily than other metal electrode layer(s) (e.g., exponentially more heavily than the second member of the first pair of metal electrode layers, e.g., exponentially more heavily than other metal electrode layers of the multi-layer metal acoustic reflector electrode). It is theorized that such weighting may be warranted because the first member of the first pair of metal electrode layers, being nearer to the first piezoelectric layer (e.g., nearer to the stack of piezoelectric layers) than other top metal electrode layer(s) (e.g., nearer than the second member of the first pair of metal electrode layers, e.g., nearer than other metal electrode layers of the multi-layer metal acoustic reflector electrode) may include exponentially larger amount of acoustic energy than any other member of the multi-layer metal acoustic reflector electrode, and therefore the first member of the first pair of metal electrode layers may have greater affect on the quarter wavelength acoustic resonance (e.g., of the multi-layer metal acoustic reflector electrode, e.g., of the first pair of metal electrode layers). Further, rather than being a weighted average, simulation may determine the effective quarter wavelength acoustic resonance (e.g., of the multi-layer metal top acoustic reflector electrode, e.g., of the first pair of top metal electrode layers, e.g., of the multi-layer metal bottom acoustic reflector electrode, e.g., of the first pair of bottom metal electrode layers), appropriately taking into account the relatively greater affect of the first member of the first pair of top metal electrode layers on the effective quarter wavelength acoustic resonance (e.g., of the multi-layer metal top acoustic reflector electrode, e.g., of the first pair of top metal electrode layers, e.g., of the multi-layer metal bottom acoustic reflector electrode, e.g., of the first pair of bottom metal electrode layers).

Throughout this disclosure, the respective quarter wavelength resonant frequency, or stated longer, the respective quarter wavelength acoustic resonant frequency (e.g., of the multi-layer metal top acoustic reflector electrode, e.g., of the first pair of top metal electrode layers, e.g., of the multi-layer metal bottom acoustic reflector electrode, e.g., of the first pair of bottom metal electrode layers) may respectively be an effective quarter wavelength acoustic resonant frequency (e.g., of the multi-layer metal top acoustic reflector electrode, e.g., of the first pair of top metal electrode layers, e.g., of the multi-layer metal bottom acoustic reflector electrode, e.g., of the first pair of bottom metal electrode layers). Respectively, the effective quarter wavelength acoustic resonant frequency (e.g., of the multi-layer metal top acoustic reflector electrode, e.g., of the first pair of top metal electrode layers, e.g., of the multi-layer metal bottom acoustic reflector electrode, e.g., of the first pair of bottom metal electrode layers) correspond to a respective frequency for the effective quarter wavelength acoustic resonance (e.g., of the multi-layer metal top acoustic reflector electrode, e.g., of the first pair of top metal electrode layers, e.g., of the multi-layer metal bottom acoustic reflector electrode, e.g., of the first pair of bottom metal electrode layers).

Further, quality factor (Q factor) is a figure of merit for bulk acoustic wave resonators that may be related, in part, to acoustic reflector electrode conductivity. In accordance with the teachings of this disclosure, without an offsetting compensation that increases number of member layers, member layer thinning with increasing frequency may otherwise diminish acoustic reflector electrode conductivity, and may otherwise diminish quality factor (Q factor) of bulk acoustic wave resonators. In accordance with the teachings of this disclosure, number of member layers of the acoustic reflector electrodes may be increased in designs extending to higher resonant frequencies, to facilitate electrical conductivity through acoustic reflector electrodes. The acoustic reflector electrodes (e.g., Super High Frequency (SHF) bottom acoustic reflector electrode 1013A, e.g., Super High Frequency (SHF) top acoustic reflector electrode 1015B, e.g., Extremely High Frequency (EHF) bottom acoustic reflector electrode 1013B, e.g., Extremely High Frequency (EHF) top acoustic reflector electrode 1015B) may have sheet resistance of less than one Ohm per square at the given frequency (e.g., at the resonant frequency of the BAW resonator in the super high frequency band or the extremely high frequency band, e.g., at the quarter wavelength resonant frequency of the acoustic reflector electrode in the super high frequency band or the extremely high frequency band). For example, a sufficient number of member layers may be employed to provide for this sheet resistance at the given frequency (e.g., at the resonant frequency of the BAW resonator in the super high frequency band or the extremely high frequency band, e.g., at the quarter wavelength resonant frequency of the acoustic reflector electrode in the super high frequency band or the extremely high frequency band). This may, but need not, facilitate enhancing quality factor (Q factor) to a quality factor (Q factor) that is above a desired one thousand (1000).

Figure 1A:
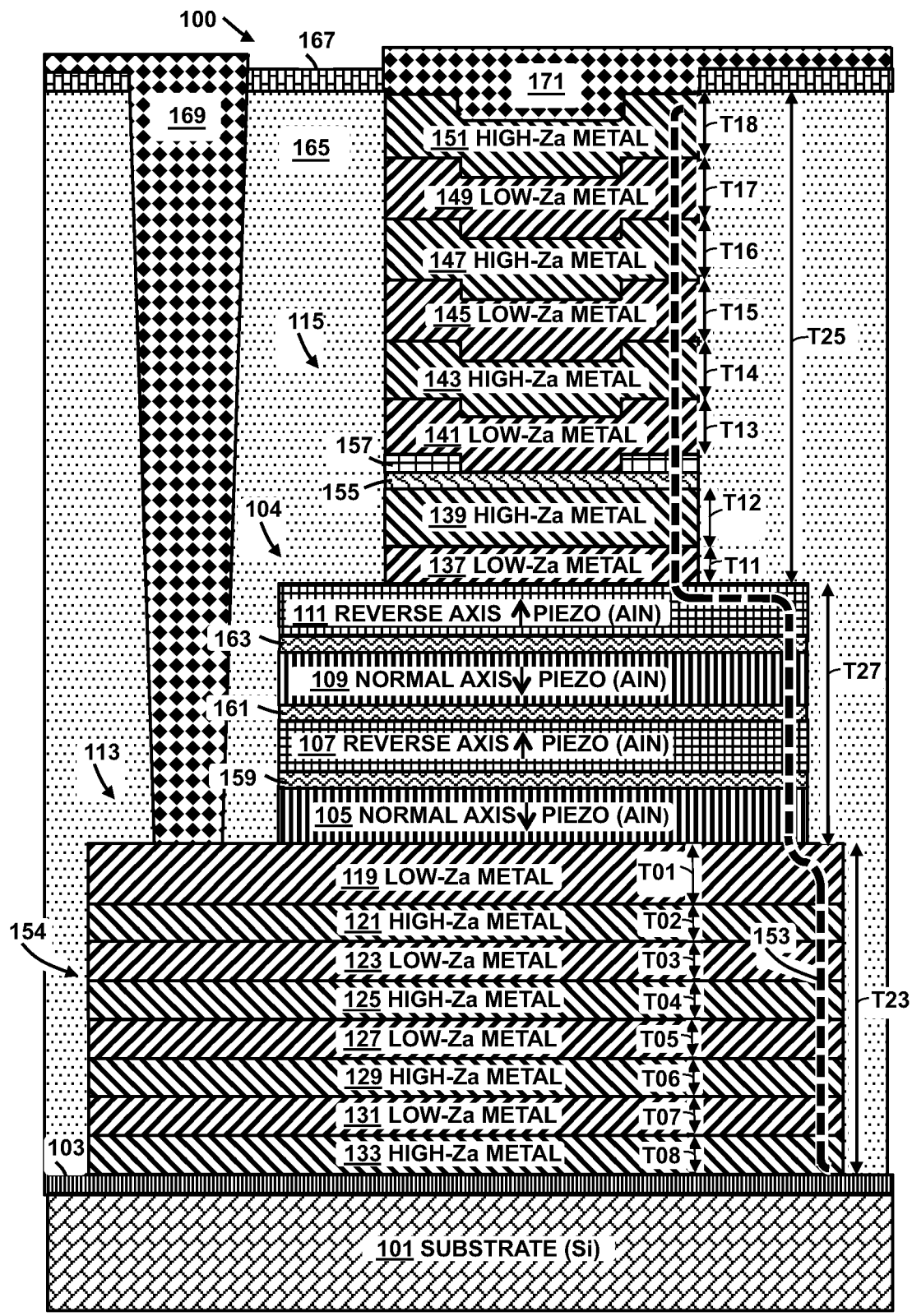
FIG. 1A is a diagram that illustrates an example bulk acoustic wave resonator structure.

FIG. 1A is a diagram that illustrates an example bulk acoustic wave resonator structure 100. FIGS. 4A through 4G show alternative example bulk acoustic wave resonators, 400A through 400G, to the example bulk acoustic wave resonator structure 100 shown in FIG. 1A. The foregoing are shown in simplified cross sectional views. The resonator structures are formed over a substrate 101, 401A through 401G (e.g., silicon substrate 101, 401A, 401B, 401D through 401F, e.g., silicon carbide substrate 401C). In some examples, the substrate may further comprise a seed layer 103, 403A, 403B, 403D through 403F, formed of, for example, aluminum nitride (AlN), or another suitable material (e.g., silicon dioxide ($SiO_2$), aluminum oxide ($Al_2O_3$), silicon nitride ($Si_3N_4$), amorphous silicon (a-Si), silicon carbide (SiC)), having an example thickness in a range from approximately 100 A to approximately 1 um on the silicon substrate. In some other examples, the seed layer 103, 403A, 403B, 403D through 403F may also be at least partially formed of electrical conductivity enhancing material such as Aluminum (Al) or Gold (Au).

The example resonators 100, 400A through 400G, include a respective stack 104, 404A through 404G, of an example four layers of piezoelectric material, for example, four layers of Aluminum Nitride (AlN) having a wurtzite structure. For example, FIG. 1A and FIGS. 4A through 4G show a bottom piezoelectric layer 105, 405A through 405G, a first middle piezoelectric layer 107, 407A through 407G, a second middle piezoelectric layer 109, 409A through 409G, and a top piezoelectric layer 111, 411A through 411G. A mesa structure 104, 404A through 404G (e.g., first mesa structure 104, 404A through 404G) may comprise the respective stack 104, 404A through 404G, of the example four layers of piezoelectric material. The mesa structure 104, 404A through 404G (e.g., first mesa structure 104, 404A through 404G) may comprise bottom piezoelectric layer 105, 405A through 405G. The mesa structure 104, 404A through 404G (e.g., first mesa structure 104, 404A through 404G) may comprise first middle piezoelectric layer 107, 407A through 407G. The mesa structure 104, 404A through 404G (e.g., first mesa structure 104, 404A through 404G) may comprise second middle piezoelectric layer 109, 409A through 409G. The mesa structure 104, 404A through 404G (e.g., first mesa structure 104, 404A through 404G) may comprise top piezoelectric layer 111, 411A through 411G. Although piezoelectric aluminum nitride may be used, alternative examples may comprise alternative piezoelectric materials, e.g., doped aluminum nitride, e.g., zinc oxide, e.g., lithium niobate, e.g., lithium tantalate.

The four layers of piezoelectric material in the respective stack 104, 404A through 404G of FIG. 1A and FIGS. 4A through 4G may have an alternating axis arrangement in the respective stack 104, 404A through 404G. For example the bottom piezoelectric layer 105, 405A through 405G may have a normal axis orientation, which is depicted in the figures using a downward directed arrow. Next in the alternating axis arrangement of the respective stack 104, 404A through 404G, the first middle piezoelectric layer 107, 407A through 407G may have a reverse axis orientation, which is depicted in the figures using an upward directed arrow. Next in the alternating axis arrangement of the respective stack 104, 404A through 404G, the second middle piezoelectric layer 109, 409A through 409G may have the normal axis orientation, which is depicted in the figures using the downward directed arrow. Next in the alternating axis arrangement of the respective stack 104, 404A through 404G, the top piezoelectric layer 111, 411A through 411G may have the reverse axis orientation, which is depicted in the figures using the upward directed arrow.

For example, polycrystalline thin film MN may be grown in a crystallographic c-axis negative polarization, or normal axis orientation perpendicular relative to the substrate surface using reactive magnetron sputtering of an Aluminum target in a nitrogen atmosphere. However, as will be discussed in greater detail subsequently herein, changing sputtering conditions, for example by adding oxygen, may reverse the axis to a crystallographic c-axis positive polarization, or reverse axis, orientation perpendicular relative to the substrate surface.

In the example resonators 100, 400A through 400G, of FIG. 1A and FIGS. 4A through 4G, the bottom piezoelectric layer 105, 405A through 405G, may have a piezoelectrically excitable resonance mode (e.g., main resonance mode) at a resonant frequency (e.g., main resonant frequency) of the example resonators. Similarly, the first middle piezoelectric layer 107, 407A through 407G, may have its piezoelectrically excitable resonance mode (e.g., main resonance mode) at the resonant frequency (e.g., main resonant frequency) of the example resonators. Similarly, the second middle piezoelectric layer 109, 409A through 409G, may have its piezoelectrically excitable resonance mode (e.g., main resonance mode) at the resonant frequency (e.g., main resonant frequency) of the example resonators. Similarly, the top piezoelectric layer 111, 411A through 411G, may have its piezoelectrically excitable main resonance mode (e.g., main resonance mode) at the resonant frequency (e.g., main resonant frequency) of the example resonators. Accordingly, the top piezoelectric layer 111, 411A through 411G, may have its piezoelectrically excitable main resonance mode (e.g., main resonance mode) at the resonant frequency (e.g., main resonant frequency) with the bottom piezoelectric layer 105, 405A through 405G, the first middle piezoelectric layer 107, 407A through 407G, and the second middle piezoelectric layer 109, 409A through 409G.

The bottom piezoelectric layer 105, 405A through 405G, may be acoustically coupled with the first middle piezoelectric layer 107, 407A through 407G, in the piezoelectrically excitable resonance mode (e.g., main resonance mode) at the resonant frequency (e.g., main resonant frequency) of the example resonators 100, 400A through 400G. The normal axis of bottom piezoelectric layer 105, 405A through 405G, in opposing the reverse axis of the first middle piezoelectric layer 107, 407A through 407G, may cooperate for the piezoelectrically excitable resonance mode (e.g., main resonance mode) at the resonant frequency (e.g., main resonant frequency) of the example resonators. The first middle piezoelectric layer 107, 407A through 407G, may be sandwiched between the bottom piezoelectric layer 105, 405A through 405G, and the second middle piezoelectric layer 109, 409A through 409G, for example, in the alternating axis arrangement in the respective stack 104, 404A through 404G. For example, the reverse axis of the first middle piezoelectric layer 107, 407A through 407G, may oppose the normal axis of the bottom piezoelectric layer 105, 405A through 405G, and the normal axis of the second middle piezoelectric layer 109, 409A-409G. In opposing the normal axis of the bottom piezoelectric layer 105, 405A through 405G, and the normal axis of the second middle piezoelectric layer 109, 409A through 409G, the reverse axis of the first middle piezoelectric layer 107, 407A through 407G, may cooperate for the piezoelectrically excitable resonance mode (e.g., main resonance mode) at the resonant frequency (e.g., main resonant frequency) of the example resonators.

The second middle piezoelectric layer 109, 409A through 409G, may be sandwiched between the first middle piezoelectric layer 107, 407A through 407G, and the top piezoelectric layer 111, 411A through 411G, for example, in the alternating axis arrangement in the respective stack 104, 404A through 404G. For example, the normal axis of the second middle piezoelectric layer 109, 409A through 409G, may oppose the reverse axis of the first middle piezoelectric layer 107, 407A through 407G, and the reverse axis of the top piezoelectric layer 111, 411A through 411G. In opposing the reverse axis of the first middle piezoelectric layer 107, 407A through 407G, and the reverse axis of the top piezoelectric layer 111, 411A through 411G, the normal axis of the second middle piezoelectric layer 109, 409A through 409G, may cooperate for the piezoelectrically excitable resonance mode (e.g., main resonance mode) at the resonant frequency (e.g., main resonant frequency) of the example resonators. Similarly, the alternating axis arrangement of the bottom piezoelectric layer 105, 405A through 405G, and the first middle piezoelectric layer 107, 407A through 407G, and the second middle piezoelectric layer 109, 409A through 409G, and the top piezoelectric layer 111, 411A-411G, in the respective stack 104, 404A through 404G may cooperate for the piezoelectrically excitable resonance mode (e.g., main resonance mode) at the resonant frequency (e.g., main resonant frequency) of the example resonators. Despite differing in their alternating axis arrangement in the respective stack 104, 404A through 404G, the bottom piezoelectric layer 105, 405A through 405G and the first middle piezoelectric layer 107, 407A through 407G, and the second middle piezoelectric layer 109, 409A through 409G, and the top piezoelectric layer 111, 411A through 411G, may all be made of the same piezoelectric material, e.g., Aluminum Nitride (AlN).

Respective layers of piezoelectric material in the stack 104, 404A through 404G, of FIG. 1A and FIGS. 4A through 4G may have respective layer thicknesses of about one half wavelength (e.g., one half acoustic wavelength) of the main resonant frequency of the example resonators. For example, respective layers of piezoelectric material in the stack 104, 404A through 404G, of FIG. 1A and FIGS. 4A through 4G may have respective layer thicknesses so that (e.g., selected so that) the respective bulk acoustic wave resonators 100, 400A through 400G may have respective resonant frequencies that are in a Super High Frequency (SHF) band or an Extremely High Frequency (EHF) band (e.g., respective resonant frequencies that are in a Super High Frequency (SHF) band, e.g., respective resonant frequencies that are in an Extremely High Frequency (EHF) band. For example, respective layers of piezoelectric material in the stack 104, 404A through 404G, of FIG. 1A and FIGS. 4A through 4G may have respective layer thicknesses so that (e.g., selected so that) the respective bulk acoustic wave resonators 100, 400A through 400G may have respective resonant frequencies that are in a millimeter wave band. For example, for a twenty-four gigahertz (e.g., 24 GHz) main resonant frequency of the example resonators, the bottom piezoelectric layer 105, 405A through 405G, may have a layer thickness corresponding to about one half of a wavelength (e.g., about one half of an acoustic wavelength) of the main resonant frequency, and may be about two thousand Angstroms (2000 A). Similarly, the first middle piezoelectric layer 107, 407A through 407G, may have a layer thickness corresponding the one half of the wavelength (e.g., one half of the acoustic wavelength) of the main resonant frequency; the second middle piezoelectric layer 109, 409A through 409G, may have a layer thickness corresponding the one half of the wavelength (e.g., one half of the acoustic wavelength) of the main resonant frequency; and the top piezoelectric layer 111, 411A through 411G, may have a layer thickness corresponding the one half of the wavelength (e.g., one half of the acoustic wavelength) of the main resonant frequency. Piezoelectric layer thickness may be scaled up or down to determine main resonant frequency.

The example resonators 100, 400A through 400G, of FIG. 1A and FIGS. 4A through 4G may comprise: a bottom acoustic reflector 113, 413A through 413G (e.g., multi-layer bottom acoustic reflector 113, 413A through 413G, e.g., multi-layer metal bottom acoustic reflector electrode 113, 413A through 413G), e.g., including an acoustically reflective bottom electrode stack of a plurality of bottom metal electrode layers; and a top acoustic reflector 115, 415A through 415G (e.g., multi-layer top acoustic reflector 115, 415A through 415G, multi-layer metal top acoustic reflector electrode 115, 415A through 415G), e.g., including an acoustically reflective bottom electrode stack of a plurality of top metal electrode layers. Accordingly, the bottom acoustic reflector 113, 413A through 413G, may be a bottom multi-layer acoustic reflector, and the top acoustic reflector 115, 415A through 415G, may be a top multi-layer acoustic reflector. The piezoelectric layer stack 104, 404A through 404G, may be sandwiched between the plurality of bottom metal electrode layers of the bottom acoustic reflector 113, 413A through 413G, and the plurality of top metal electrode layers of the top acoustic reflector 115, 415A through 415G. The piezoelectric layer stack 104, 404A through 404G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency). For example, such excitation may be done by using the plurality of bottom metal electrode layers of the bottom acoustic reflector 113, 413A through 413G and the plurality of top metal electrode layers of the top acoustic reflector 115, 415A through 415G to apply an oscillating electric field having a frequency corresponding to the resonant frequency (e.g., main resonant frequency) of the piezoelectric layer stack 104, 404A through 404G, and of the example resonators 100, 400A through 400G. For example, the piezoelectric layer stack 104, 404A through 404G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency.

For example, the bottom piezoelectric layer 105, 405A through 405G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency) of the bottom piezoelectric layer 105, 405A through 405G. Further, the bottom piezoelectric layer 105, 405A through 405G and the first middle piezoelectric layer 107, 407A through 407G, may be electrically and acoustically coupled with the plurality of bottom metal electrode layers of the bottom acoustic reflector 113, 413A through 413G, and the plurality of top metal electrode layers of the top acoustic reflector 115, 415A through 415G, to excite the piezoelectrically excitable resonance mode (e.g., main resonance mode) at the resonant frequency (e.g., main resonant frequency) of the bottom piezoelectric layer 105, 405A through 405G, acoustically coupled with the first middle piezoelectric layer 107, 407A through 407G. Additionally, the first middle piezoelectric layer 107, 407A-407G, may be sandwiched between the bottom piezoelectric layer 105, 405A through 405G and the second middle piezoelectric layer 109, 409A through 409G, and may be electrically and acoustically coupled with the plurality of bottom metal electrode layers of the bottom acoustic reflector 113, 413A through 413G, and the plurality of top metal electrode layers of the top acoustic reflector 115, 415A through 415G, to excite the piezoelectrically excitable resonance mode (e.g., main resonance mode) at the resonant frequency (e.g., main resonant frequency) of the first middle piezoelectric layer 107, 407A through 407G, sandwiched between the bottom piezoelectric layer 105, 405A through 405G, and the second middle piezoelectric layer 109, 409A through 409G.

The acoustically reflective bottom electrode stack of the plurality of bottom metal electrode layers of the bottom acoustic reflector 113, 413A through 413G, may have an alternating arrangement of low acoustic impedance metal layer and high acoustic impedance metal layer. The acoustically reflective bottom electrode stack of the plurality of bottom metal electrode layers of the bottom acoustic reflector 113, 413A through 413G may approximate a distributed Bragg acoustic reflector, e.g. a metal distributed Bragg acoustic reflector. The plurality of metal bottom electrode layers of the bottom acoustic reflector may be electrically coupled (e.g., electrically interconnected) with one another. The acoustically reflective bottom electrode stack of the plurality of bottom metal electrode layers may operate together as a multi-layer (e.g., bi-layer, e.g., multiple layer) bottom electrode for the bottom acoustic reflector 113, 413A through 413G.

In the alternating arrangement of low acoustic impedance metal layer and high acoustic impedance metal layer of the acoustically reflective bottom electrode stack, may be a first pair of bottom metal electrode layers 119, 419A through 419G and 121, 421A through 421G. A first member 119, 419A through 419G, of the first pair of bottom metal electrode layers may comprise a relatively low acoustic impedance metal, for example, Titanium having an acoustic impedance of about 27 MegaRayls, or for example, Aluminum having an acoustic impedance of about 18 MegaRayls. A second member 121, 421A through 421G, of the first pair of bottom metal electrode layers may comprise the relatively high acoustic impedance metal, for example, Tungsten or Molybdenum. Accordingly, the first pair of bottom metal electrode layers 119, 419A through 419G, and 121, 421A through 421G, of the bottom acoustic reflector 113, 413A through 413G, may be different metals, and may have respective acoustic impedances that are different from one another so as to provide a reflective acoustic impedance mismatch at the resonant frequency (e.g., main resonant frequency). Similarly, the first member of the first pair of bottom metal electrode layers 119, 419A through 419G, of the bottom acoustic reflector 113, 413A through 413G, may be different metals, and may have respective acoustic impedances that are different from one another so as to provide a reflective acoustic impedance mismatch at the resonant frequency (e.g., main resonant frequency).

Next in the alternating arrangement of low acoustic impedance metal layer and high acoustic impedance metal layer of the acoustically reflective bottom electrode stack, a second pair of bottom metal electrode layers 123, 423A through 423G, and 125, 425A through 425G, may respectively comprise the relatively low acoustic impedance metal and the relatively high acoustic impedance metal. Accordingly, members of the first and second pairs of bottom metal electrode layers 119, 419A through 419G, 121, 421A through 421G, 123, 423A through 423G, 125, 425A through 425G, may have respective acoustic impedances in the alternating arrangement to provide a corresponding plurality of reflective acoustic impedance mismatches.

Next in the alternating arrangement of low acoustic impedance metal layer and high acoustic impedance metal layer of the acoustically reflective bottom electrode stack, a third pair of bottom metal electrode layers 127, 427D, 129, 429D may respectively comprise the relatively low acoustic impedance metal and the relatively high acoustic impedance metal. Next in the alternating arrangement of low acoustic impedance metal layer and high acoustic impedance metal layer of the acoustically reflective bottom electrode stack, a fourth pair of bottom metal electrode layers 131, 431D and 133, 433D may respectively comprise the relatively low acoustic impedance metal and the relatively high acoustic impedance metal.

Respective thicknesses of the bottom metal electrode layers may be related to wavelength (e.g., acoustic wavelength) for the main resonant frequency of the example bulk acoustic wave resonators, 100, 400A through 400G. Further, various embodiments for resonators having relatively higher resonant frequency (higher main resonant frequency) may have relatively thinner bottom metal electrode thicknesses, e.g., scaled thinner with relatively higher resonant frequency (e.g., higher main resonant frequency). Similarly, various alternative embodiments for resonators having relatively lower resonant frequency (e.g., lower main resonant frequency) may have relatively thicker bottom metal electrode layer thicknesses, e.g., scaled thicker with relatively lower resonant frequency (e.g., lower main resonant frequency).

Further, the bottom acoustic reflectors 113, 413A through 413G may be acoustically de-tuned from respective resonant frequencies of the respective BAW resonators 100, 400A through 400G. For example, respective multi-layer bottom acoustic reflectors 113, 413A through 413G (e.g., respective multi-layer bottom acoustic reflector electrodes 113, 413A through 413G, e.g., respective multi-layer metal bottom acoustic reflector electrodes 113, 413A through 413G) may approximate respective distributed Bragg reflectors 113, 413A through 413G, (e.g., respective metal distributed Bragg reflectors 113, 413A through 413G), which may be acoustically de-tuned from respective resonant frequencies of the respective BAW resonators 100, 400A through 400G. For example, respective bottom acoustic layers of the respective de-tuned multi-layer bottom acoustic reflectors 113, 413A through 413G may have respective layer thicknesses selected so that the respective de-tuned multi-layer acoustic reflectors 113, 413A through 413G may have respective quarter wavelength resonant frequencies that may be acoustically de-tuned from the respective resonant frequencies of the respective BAW resonators 100, 400A through 400G. For example, bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427D, 129, 429D, fourth pair of bottom metal electrode layers 131, 431D, 133, 433D) may have respective layer thicknesses selected so that the respective de-tuned multi-layer acoustic reflectors 113, 413A through 413G may have respective quarter wavelength resonant frequencies that may be acoustically de-tuned to be below the respective resonant frequencies of the respective BAW resonators 100, 400A through 400G. For example, for a 24 GHz resonator, (e.g., resonator having a main resonant frequency of about 24 GHz) bottom metal electrode layers may have respective layer thicknesses selected so that the respective de-tuned multi-layer bottom acoustic reflectors 113, 413A through 413G may have respective quarter wavelength resonant frequencies that may be acoustically de-tuned to be below (e.g., 2 GHz below) the respective resonant frequencies of the respective BAW resonators 100, 400A through 400G, e.g., acoustically de-tuned to about 22 GHz. As will be discussed in greater detail subsequently herein, bottom acoustic reflector de-tuning may facilitate suppressing parasitic (e.g., undesired) lateral resonances in acoustic resonators, for example, in respective BAW resonators 100, 400A through 400G.

In various differing examples, multi-layer bottom acoustic reflectors (e.g., the multi-layer bottom acoustic reflectors 113, 413A through 413G) may be de-tuned (e.g. tuned down in frequency) by various differing amounts from the resonant frequency (e.g. main resonant frequency) of the BAW resonator. As discussed in greater detail subsequently herein, in examples having about one or two piezoelectric layers in an alternating piezoelectric axis stack arrangement, the de-tuned multi-layer bottom acoustic reflector (e.g., the multi-layer metal bottom acoustic reflector electrode) may be acoustically de-tuned (e.g. tuned down in frequency) from the resonant frequency (e.g. main resonant frequency) of the BAW resonator by about up to about 5% of the resonant frequency (e.g. main resonant frequency) of the BAW resonator. It is theorized that this de-tuning by up to about 5% may facilitate suppression of parasitic later modes for resonators comprising about one or two piezoelectric layers. In examples having about three piezoelectric layers to about six piezoelectric layers in an alternating piezoelectric axis stack arrangement, the multi-layer bottom acoustic reflector (e.g., the multi-layer metal bottom acoustic reflector electrode) may be acoustically de-tuned (e.g. tuned down in frequency) from the resonant frequency (e.g. main resonant frequency) of the BAW resonator by up to about 12% of the resonant frequency (e.g. main resonant frequency) of the BAW resonator. It is theorized that this de-tuning by up to about 12% may facilitate suppression of parasitic later modes for resonators comprising the about three piezoelectric layers to about six piezoelectric layers. In examples having about seven piezoelectric layers to about eighteen piezoelectric layers, in an alternating piezoelectric axis stack arrangement, the multi-layer bottom acoustic reflector (e.g., the multi-layer metal bottom acoustic reflector electrode) may be acoustically de-tuned (e.g. tuned down in frequency) from the resonant frequency (e.g. main resonant frequency) of the BAW resonator by up to about 36% of the resonant frequency (e.g. main resonant frequency) of the BAW resonator. It is theorized that this de-tuning by up to about 36% may facilitate suppression of parasitic later modes for resonators comprising the about seven piezoelectric layers to about eighteen piezoelectric layers. In examples having greater than about eighteen piezoelectric layers, in an alternating piezoelectric axis stack arrangement, the multi-layer bottom acoustic reflector (e.g., the multi-layer metal bottom acoustic reflector electrode) may be acoustically de-tuned (e.g. tuned down in frequency) from the resonant frequency (e.g. main resonant frequency) of the BAW resonator by greater than about 36% of the resonant frequency (e.g. main resonant frequency) of the BAW resonator. It is theorized that this de-tuning by greater than 36% may facilitate suppression of parasitic later modes for resonators comprising greater than eighteen piezoelectric layers.

For example in the figures, the first member of the first pair of bottom metal electrode layers 119, 419A through 419G, of the bottom acoustic reflector 113, 413A through 413G, is depicted as relatively thicker (e.g., thickness T01 of the first member of the first pair of bottom metal electrode layers 119, 419A through 419G is depicted as relatively thicker) than thickness of remainder bottom acoustic layers (e.g., than thicknesses T02 through T08 of remainder bottom metal electrode layers). For example, a thickness T01 may be about 9% greater, e.g., substantially greater, than an odd multiple (e.g., 1×, 3×, etc.) of a quarter of a wavelength (e.g., 9% greater than one quarter of the acoustic wavelength) for the first member of the first pair of bottom metal electrode layers 119, 419A through 419G. For example, if Titanium is used as the low acoustic impedance metal for a 24 GHz resonator (e.g., resonator having a main resonant frequency of about 24 GHz), a thickness T01 may be about 690 Angstroms, 690 A, for the first member of the first pair of bottom metal electrode layers 119, 419A through 419G, of the bottom acoustic reflector 113, 413A through 413G, while respective layer thicknesses, T02 through T08, shown in the figures for corresponding members of the pairs of bottom metal electrode layers may be substantially thinner than T01.

Respective layer thicknesses, T02 through T08, shown in FIG. 1A for corresponding members of the pairs of bottom metal electrode layers may be about an odd multiple (e.g., 1×, 3×, etc.) of a quarter of a wavelength (e.g., one quarter of the acoustic wavelength) at the main resonant frequency of the example resonator. However, the foregoing may be varied. For example, members of the pairs of bottom metal electrode layers of the bottom acoustic reflector may have respective layer thickness that are within a range from about one eighth to about one half wavelength at the resonant frequency, or an odd multiple (e.g., 1×, 3×, etc.) thereof.

In an example, if Tungsten is used as the high acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the high impedance metal electrode layer members of the pairs as about five hundred and forty Angstroms (540 A). For example, if Titanium is used as the low acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the low impedance metal electrode layer members of the second, third and fourth pairs as about six hundred and thirty Angstroms (630 A). Similarly, respective layer thicknesses for members of the remainder pairs of bottom metal electrode layers shown in FIGS. 4A through 4G (e.g., second, third and fourth pairs) may likewise be about one quarter of the wavelength (e.g., one quarter of the acoustic wavelength) of the main resonant frequency of the example resonator, and these respective layer thicknesses may likewise be determined for members of the pairs of bottom metal electrode layers for the high and low acoustic impedance metals employed.

As shown in the figures, a second member 121, 421A through 421G of the first pair of bottom metal electrode layers may have a relatively high acoustic impedance (e.g., high acoustic impedance metal layer 121, 421A through 421G, e.g. tungsten metal layer 121, 421A through 421G). A first member 119, 419A through 419G of the first pair of bottom metal electrode layers may have a relatively low acoustic impedance (e.g., low acoustic impedance metal layer 119, 419A through 419G, e.g., titanium metal layer 119, 419A through 419G). This relatively low acoustic impedance of the first member 119, 419A through 419G of the first pair may be relatively lower than the acoustic impedance of the second member 121, 421A through 421G of the first pair. The first member 119, 419A through 419G having the relatively lower acoustic impedance may abut a layer of piezoelectric material (e.g. may abut bottom piezoelectric layer 105, 405A through 405G, e.g. may abut piezoelectric stack 104, 404A through 404G). This arrangement may facilitate suppressing parasitic lateral resonances in operation of the BAW resonator. The first member 119, 419A through 419G having the relatively lower acoustic impedance may be arranged nearest to a layer of piezoelectric material (e.g. may be arranged nearest to bottom piezoelectric layer 105, 405A through 405G, e.g. may be arranged nearest to piezoelectric stack 104, 404A through 404G) relative to other bottom acoustic layers of the bottom acoustic reflector 113, 413A through 413G (e.g. relative to the second member 121, 421A through 421G of the first pair of bottom metal electrode layers, the second pair of bottom metal electrode layers 123, 423A through 423G, 125, 425A through 425G, the third pair of bottom metal electrode layers 127, 427A through 427C, 129, 429A through 429C, and the fourth pair of bottom metal electrodes 131, 431A through 431C, 133, 433A through 433C). This arrangement may facilitate suppressing parasitic lateral resonances in operation of the BAW resonator.

The first member 119, 419A through 419G having the relatively lower acoustic impedance may be arranged sufficiently proximate to the a layer of piezoelectric material (e.g. may be arranged sufficiently proximate to bottom piezoelectric layer 105, 405A through 405G, e.g. may be arranged sufficiently proximate to piezoelectric stack 104, 404A through 404G), so that the first member 119, 419A through 419G having the relatively lower acoustic impedance may contribute more to the multi-layer metal bottom acoustic reflector electrode 113, 413A through 413G being acoustically de-tuned from the resonant frequency of the BAW resonator than is contributed by any other bottom metal electrode layer of the multi-layer metal bottom acoustic reflector electrode 113, 413A through 413G (e.g., contribute more than the second member 121, 421A through 421G of the first pair of bottom metal electrode layers, e.g., contribute more than the first member 123, 423A through 423G of the second pair of bottom metal electrode layers, e.g., contribute more than the second member 125, 425A through 425G of the second pair of bottom metal electrode layers, e.g., contribute more than the first member 127, 427A through 427C of the third pair of bottom metal electrode layers, e.g., contribute more than the second member 129, 429A through 429C of the third pair of bottom metal electrode layers, e.g., contribute more than the first member 131, 431A through 431C of the fourth pair of bottom metal electrodes, e.g., contribute more than the second member 133, 433A through 433G of the fourth pair of bottom metal electrodes). The first member 119, 419A through 419G having the relatively lower acoustic impedance may be arranged sufficiently proximate to the a layer of piezoelectric material (e.g. may be arranged sufficiently proximate to bottom piezoelectric layer 105, 405A through 405G, e.g.

may be arranged sufficiently proximate to piezoelectric stack 104, 404A through 404G), so that the first member 119, 419A through 419G having the relatively lower acoustic impedance may contribute more to facilitate suppressing parasitic lateral resonances in operation of the BAW resonator than is contributed by any other bottom metal electrode layer of the multi-layer metal bottom acoustic reflector electrode 113, 413A through 413G (e.g., contribute more than the second member 121, 421A through 421G of the first pair of bottom metal electrode layers, e.g., contribute more than the first member 123, 423A through 423G of the second pair of bottom metal electrode layers, e.g., contribute more than the second member 125, 425A through 425G of the second pair of bottom metal electrode layers, e.g., contribute more than the first member 127, 427A through 427C of the third pair of bottom metal electrode layers, e.g., contribute more than the second member 129, 429A through 429C of the third pair of bottom metal electrode layers, e.g., contribute more than the first member 131, 431A through 431C of the fourth pair of bottom metal electrodes, e.g., contribute more than the second member 133, 433A through 433G of the fourth pair of bottom metal electrodes).

For example, the bottom piezoelectric layer 105, 405A through 405G, may be electrically and acoustically coupled with pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427D, 129, 429D, fourth pair of bottom metal electrode layers 131, 431D, 133, 433D), to excite the piezoelectrically excitable resonance mode (e.g., main resonance mode) at the resonant frequency (e.g., main resonant frequency) of the bottom piezoelectric layer 105, 405A through 405G. Further, the bottom piezoelectric layer 105, 405A through 405G and the first middle piezoelectric layer 107, 407A through 407G may be electrically and acoustically coupled with pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427D, 129, 429D), to excite the piezoelectrically excitable resonance mode (e.g., main resonance mode) at the resonant frequency (e.g., main resonant frequency) of the bottom piezoelectric layer 105, 405A through 405G acoustically coupled with the first middle piezoelectric layer 107, 407A through 407G. Additionally, the first middle piezoelectric layer 107, 407A through 407G, may be sandwiched between the bottom piezoelectric layer 105, 405A through 405G, and the second middle piezoelectric layer 109, 409A through 409G, and may be electrically and acoustically coupled with pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427D, 129, 429D), to excite the piezoelectrically excitable resonance mode (e.g., main resonance mode) at the resonant frequency (e.g., main resonant frequency) of the first middle piezoelectric layer 107, 407A through 407G, sandwiched between the bottom piezoelectric layer 105, 405A through 405G, and the second middle piezoelectric layer 109, 409A through 409G.

Another mesa structure 113, 413A through 413G, (e.g., second mesa structure 113, 413A through 413G), may comprise the bottom acoustic reflector 113, 413A through 413G. The another mesa structure 113, 413A through 413G, (e.g., second mesa structure 113, 413A through 413G), may comprise one or more pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427D, 129, 429D, e.g., fourth pair of bottom metal electrode layers 131, 431D, 133, 433D).

Similar to what has been discussed for the bottom electrode stack, likewise the top electrode stack of the plurality of top metal electrode layers of the top acoustic reflector 115, 415A through 415G, may have the alternating arrangement of low acoustic impedance metal layer and high acoustic impedance metal layer. The top electrode stack of the plurality of top metal electrode layers of the top acoustic reflector 115, 415A through 415G, may approximate a distributed Bragg acoustic reflector, e.g., a metal distributed Bragg acoustic reflector. The plurality of top metal electrode layers of the top acoustic reflector may be electrically coupled (e.g., electrically interconnected) with one another. The acoustically reflective top electrode stack of the plurality of top metal electrode layers may operate together as a multi-layer (e.g., bi-layer, e.g., multiple layer) top electrode for the top acoustic reflector 115, 415A through 415G. Next in the alternating arrangement of low acoustic impedance metal layer and high acoustic impedance metal layer of the acoustically reflective top electrode stack, may be a first pair of top metal electrode layers 137, 437A through 437G, and 139, 439A through 439G. A first member 137, 437A through 437G, of the first pair of top metal electrode layers may comprise the relatively low acoustic impedance metal, for example, Titanium or Aluminum. A second member 139, 439A through 439G, of the first pair of top metal electrode layers may comprise the relatively high acoustic impedance metal, for example, Tungsten or Molybdenum. Accordingly, the first pair of top metal electrode layers 137, 437A through 437G, 139, 439A through 439G, of the top acoustic reflector 115, 415A through 415G, may be different metals, and may have respective acoustic impedances that are different from one another so as to provide a reflective acoustic impedance mismatch at the resonant frequency (e.g., main resonant frequency). Similarly, the first member of the first pair of top metal electrode layers 137, 437A through 437G, of the top acoustic reflector 115, 415A through 415G, may be different metals, and may have respective acoustic impedances that are different from one another so as to provide a reflective acoustic impedance mismatch at the resonant frequency (e.g., main resonant frequency).

Next in the alternating arrangement of low acoustic impedance metal layer and high acoustic impedance metal layer of the acoustically reflective top electrode stack, a second pair of top metal electrode layers 141, 441A through 441G, and 143, 443A through 443G, may respectively comprise the relatively low acoustic impedance metal and the relatively high acoustic impedance metal. Accordingly, members of the first and second pairs of top metal electrode layers 137, 437A through 437G, 139, 439A through 439G, 141, 441A through 441G, 143, 443A through 443G, may have respective acoustic impedances in the alternating arrangement to provide a corresponding plurality of reflective acoustic impedance mismatches.

Next in the alternating arrangement of low acoustic impedance metal layer and high acoustic impedance metal layer of the acoustically reflective top electrode stack, a third pair of top metal electrode layers 145, 445A through 445C, and 147, 447A through 447C, may respectively comprise the relatively low acoustic impedance metal and the relatively high acoustic impedance metal. Next in the alternating arrangement of low acoustic impedance metal layer and high acoustic impedance metal layer of the acoustically reflective top electrode stack, a fourth pair of top metal electrode layers 149, 449A through 449C, 151, 451A through 451C, may respectively comprise the relatively low acoustic impedance metal and the relatively high acoustic impedance metal.

For example, the bottom piezoelectric layer 105, 405A through 405G, may be electrically and acoustically coupled with the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C), to excite the piezoelectrically excitable resonance mode (e.g., main resonance mode) at the resonant frequency (e.g., main resonant frequency) of the bottom piezoelectric layer 105, 405A through 405G. Further, the bottom piezoelectric layer 105, 405A through 405G and the first middle piezoelectric layer 107, 407A through 407G may be electrically and acoustically coupled with and pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C), to excite the piezoelectrically excitable resonance mode (e.g., main resonance mode) at the resonant frequency (e.g., main resonant frequency) of the bottom piezoelectric layer 105, 405A through 405G acoustically coupled with the first middle piezoelectric layer 107, 407A through 407G. Additionally, the first middle piezoelectric layer 107, 407A through 407G, may be sandwiched between the bottom piezoelectric layer 105, 405A through 405G, and the second middle piezoelectric layer 109, 409A through 409G, and may be electrically and acoustically coupled with the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C), to excite the piezoelectrically excitable resonance mode (e.g., main resonance mode) at the resonant frequency (e.g., main resonant frequency) of the first middle piezoelectric layer 107, 407A through 407G, sandwiched between the bottom piezoelectric layer 105, 405A through 405G, and the second middle piezoelectric layer 109, 409A through 409G.

Yet another mesa structure 115, 415A through 415G, (e.g., third mesa structure 115, 415A through 415G), may comprise the top acoustic reflector 115, 415A through 415G, or a portion of the top acoustic reflector 115, 415A through 415G. The yet another mesa structure 115, 415A through 415C, (e.g., third mesa structure 115, 415A through 415C), may comprise one or more pair(s) of top metal electrode layers (e.g., first pair of top metal electrode layers 137, 437A through 437C, 139, 439A through 439C, e.g., second pair of top metal electrode layers 141, 441A through 441C, 143, 443A through 443C, e.g., third pair of top metal electrode layers 145, 445A through 445C, 147, 447A through 447C, e.g., fourth pair of top metal electrode layers 149, 449A through 449C, 151, 451A through 451C).

Further, the top acoustic reflectors 115, 415A through 415G may be acoustically de-tuned from respective resonant frequencies of the respective BAW resonators 100, 400A through 400G. For example, respective multi-layer top acoustic reflectors 115, 415A through 415G (e.g., respective multi-layer top acoustic reflector electrodes 115, 415A through 415G, e.g., respective multi-layer metal top acoustic reflector electrodes 115, 415A through 415G) may approximate respective distributed Bragg reflectors 115, 415A through 415G, (e.g., respective metal distributed Bragg reflectors 115, 415A through 415G), which may be acoustically de-tuned from respective resonant frequencies of the respective BAW resonators 100, 400A through 400G. For example, respective top acoustic layers of the respective de-tuned multi-layer top acoustic reflectors 115, 415A through 415G may have respective layer thicknesses selected so that the respective multi-layer acoustic reflectors 115, 415A through 415G, may have respective quarter wavelength resonant frequencies that may be acoustically de-tuned from the respective resonant frequencies of the respective BAW resonators 100, 400A through 400G. For example, top metal electrode layers (e.g., first pair of top metal electrode layers 137, 437A through 437G, 121, 421A through 421G, e.g., second pair of top metal electrode layers 123, 423A through 423G, 125, 425A through 425G, e.g., third pair of top metal electrode layers 127, 427D, 129, 429D, fourth pair of top metal electrode layers 131, 431D, 133, 433D) may have respective layer thicknesses selected so that the respective de-tuned multi-layer acoustic reflectors 115, 415A through 415G may have respective quarter wavelength resonant frequencies that may be acoustically de-tuned to be above the respective resonant frequencies of the respective BAW resonators 100, 400A through 400G. For example, for a 24 GHz resonator, (e.g., resonator having a main resonant frequency of about 24 GHz) top metal electrode layers may have respective layer thicknesses selected so that the respective de-tuned multi-layer acoustic reflectors 115, 415A through 415G may have respective quarter wavelength resonance frequencies that may be acoustically de-tuned to be above (e.g., 2 GHz above) the respective resonant frequencies of the respective BAW resonators 100, 400A through 400G, e.g., acoustically de-tuned to about 26 GHz. As will be discussed in greater detail subsequently herein, top acoustic reflector de-tuning may facilitate suppressing parasitic (e.g., undesired) lateral resonances in acoustic resonators, for example, in respective BAW resonators 100, 400A through 400G.

In various differing examples, multi-layer top acoustic reflectors (e.g., the multi-layer top acoustic reflectors 115, 415A through 415G) may be de-tuned (e.g., tuned up in frequency) by various differing amounts from the resonant frequency (e.g. main resonant frequency) of the BAW resonator. As discussed in greater detail subsequently herein, in examples having about one or two piezoelectric layers in an alternating piezoelectric axis stack arrangement, the de-tuned multi-layer top acoustic reflector (e.g., the multi-layer metal top acoustic reflector electrode) may be acoustically de-tuned (e.g., tuned up in frequency) from the resonant frequency (e.g. main resonant frequency) of the BAW resonator by about up to about 5% of the resonant frequency (e.g. main resonant frequency) of the BAW resonator. It is theorized that this de-tuning by up to about 5% may facilitate suppression of parasitic lateral resonances for resonators comprising about one or two piezoelectric layers. In examples having about three piezoelectric layers to about six piezoelectric layers in an alternating piezoelectric axis stack arrangement, the multi-layer top acoustic reflector (e.g., the multi-layer metal top acoustic reflector electrode) may be acoustically de-tuned (e.g., tuned up in frequency) from the resonant frequency (e.g. main resonant frequency) of the BAW resonator by up to about 12% of the resonant frequency (e.g. main resonant frequency) of the BAW resonator. It is theorized that this de-tuning by up to about 12% may facilitate suppression of parasitic lateral resononanes for resonators comprising the about three piezoelectric layers to about six piezoelectric layers. In examples having about seven piezoelectric layers to about eighteen piezoelectric layers, in an alternating piezoelectric axis stack arrangement, the multi-layer top acoustic reflector (e.g., the multi-layer metal top acoustic reflector electrode) may be acoustically de-tuned (e.g., tuned up in frequency) from the resonant frequency (e.g. main resonant frequency) of the BAW resonator by up to about 36% of the resonant frequency (e.g. main resonant frequency) of the BAW resonator. It is theorized that this de-tuning by up to about 36% may facilitate suppression of parasitic lateral resonances for resonators comprising the about seven piezoelectric layers to about eighteen piezoelectric layers. In examples having greater than about eighteen piezoelectric layers, in an alternating piezoelectric stack arrangement, the multi-layer top acoustic reflector (e.g., the multi-layer metal top acoustic reflector electrode) may be acoustically de-tuned (e.g., tuned up in frequency) from the resonant frequency (e.g. main resonant frequency) of the BAW resonator by greater than about 36% of the resonant frequency (e.g. main resonant frequency) of the BAW resonator. It is theorized that this de-tuning by greater than 36% may facilitate suppression of parasitic lateral resonances for resonators comprising greater than eighteen piezoelectric layers.

For example in the figures, the first member of the first pair of top metal electrode layers 137, 437A through 437G, of the top acoustic reflector 115, 415A through 415G, is depicted as relatively thinner (e.g., thickness T11 of the first member of the first pair of top metal electrode layers 137, 437A through 437G is depicted as relatively thinner) than thickness of remainder top acoustic layers (e.g., than thicknesses T02 through T08 of remainder top metal electrode layers). For example, a thickness T11 may be about 60 Angstroms, 60 A, lesser, e.g., substantially lesser, than an odd multiple (e.g., 1×, 3×, etc.) of a quarter of a wavelength (e.g., 70 Angstroms lesser than one quarter of the acoustic wavelength) for the first member of the first pair of top metal electrode layers 137, 437A through 437G. For example, if Titanium is used as the low acoustic impedance metal for a 24 GHz resonator (e.g., resonator having a main resonant frequency of about 24 GHz), a thickness T11 may be about 570 Angstroms, 570 A, for the first member of the first pair of top metal electrode layers 137, 437A through 437G, of the top acoustic reflector 115, 415A through 415G, while respective layer thicknesses, T02 through T08, shown in the figures for corresponding members of the pairs of top metal electrode layers may be substantially thicker than T11.

Accordingly, like the respective layer thicknesses of the bottom metal electrode layers, respective thicknesses of the top metal electrode layers may likewise be related to wavelength (e.g., acoustic wavelength) for the main resonant frequency of the example bulk acoustic wave resonators, 100, 400A through 400G. Further, various embodiments for resonators having relatively higher main resonant frequency may have relatively thinner top metal electrode thicknesses, e.g., scaled thinner with relatively higher main resonant frequency. Similarly, various alternative embodiments for resonators having relatively lower main resonant frequency may have relatively thicker top metal electrode layer thicknesses, e.g., scaled thicker with relatively lower main resonant frequency. Respective layer thicknesses, T12 through T18, shown in FIG. 1A for corresponding members of the pairs of top metal electrode layers may be about an odd multiple (e.g., 1×, 3×, etc.) of a quarter of a wavelength (e.g., one quarter of an acoustic wavelength) of the main resonant frequency of the example resonator. Similarly, respective layer thicknesses for corresponding members of the pairs of top metal electrode layers shown in FIGS. 4A through 4G may likewise be about one quarter of a wavelength (e.g., one quarter of an acoustic wavelength) at the main resonant frequency of the example resonator multiplied by an odd multiplier (e.g., 1×, 3×, etc.), and these respective layer thicknesses may likewise be determined for members of the pairs of top metal electrode layers for the high and low acoustic impedance metals employed. However, the foregoing may be varied. For example, members of the pairs of top metal electrode layers of the top acoustic reflector may have respective layer thickness within a range from an odd multiple (e.g., 1×, 3×, etc.) of about one eighth to an odd multiple (e.g., 1×, 3×, etc.) of about one half wavelength at the resonant frequency.

In an example, if Tungsten is used as the high acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the high impedance metal electrode layer members of the pairs as about five hundred and forty Angstroms (540 A). For example, if Titanium is used as the low acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the low impedance metal electrode layer members of the second, third and fourth pairs as about six hundred and thirty Angstroms (630 A). Similarly, respective layer thicknesses for members of the remainder pairs of top metal electrode layers shown in FIGS. 4A through 4G (e.g., second, third and fourth pairs) may likewise be about one quarter of the wavelength (e.g., one quarter of the acoustic wavelength) of the main resonant frequency of the example resonator, and these respective layer thicknesses may likewise be determined for members of the pairs of top metal electrode layers for the high and low acoustic impedance metals employed.

As shown in the figures, a second member 139, 439A through 439G of the first pair of top metal electrode layers may have a relatively high acoustic impedance (e.g., high acoustic impedance metal layer 139, 439A through 439G, e.g. tungsten metal layer 139, 439A through 439G). A first member 137, 437A through 437G of the first pair of top metal electrode layers may have a relatively low acoustic impedance (e.g., low acoustic impedance metal layer 137, 437A through 437G, e.g., titanium metal layer 137, 437A through 437G). This relatively low acoustic impedance of the first member 137, 437A through 437G of the first pair may be relatively lower than the acoustic impedance of the second member 139, 439A through 439G of the first pair. The first member 137, 437A through 437G having the relatively lower acoustic impedance may abut a first layer of piezoelectric material (e.g. may abut top piezoelectric layer 111, 411A through 411G, e.g. may abut piezoelectric stack 104, 404A through 404G). This arrangement may facilitate suppressing parasitic lateral resonances in operation of the BAW resonator. The first member 137, 437A through 437G having the relatively lower acoustic impedance may be arranged nearest to a first layer of piezoelectric material (e.g.

may be arranged nearest to top piezoelectric layer 111, 411A through 411G, e.g. may be arranged nearest to piezoelectric stack 104, 404A through 404G) relative to other top acoustic layers of the top acoustic reflector 115, 415A through 415G (e.g. relative to the second member 139, 439A through 439G of the first pair of top metal electrode layers, the second pair of top metal electrode layers 141, 441A through 441G, 143, 443A through 443G, the third pair of top metal electrode layers 145, 445A through 445C, 147, 447A through 447C, and the fourth pair of top metal electrodes 149, 449A through 449C, 151, 451A through 451C). This arrangement may facilitate suppressing parasitic lateral resonances in operation of the BAW resonator. The first member 137, 437A through 437G having the relatively lower acoustic impedance may be arranged sufficiently proximate to the first layer of piezoelectric material (e.g. may be arranged sufficiently proximate to top piezoelectric layer 111, 411A through 411G, e.g. may be arranged sufficiently proximate to piezoelectric stack 104, 404A through 404G), so that the first member 137, 437A through 437G having the relatively lower acoustic impedance may contribute more to the multi-layer metal top acoustic reflector electrode 115, 415A through 415G being acoustically de-tuned from the resonant frequency of the BAW resonator than is contributed by any other top metal electrode layer of the multi-layer metal top acoustic reflector electrode 115, 415A through 415G (e.g., contributes more than the second member 139, 439A through 439G of the first pair of top metal electrode layers, e.g., contributes more than the first member 141, 441A through 441G of the second pair of top metal electrode layers, e.g., contributes more than the second member 143, 443A through 443G of the second pair of top metal electrode layers, e.g., contributes more than the first member 145, 445A through 445C of the third pair of top metal electrode layers, e.g., contributes more than the second member 147, 447A through 447C of the third pair of top metal electrode layers, e.g., contributes more than the first member 149, 449A through 449C of the fourth pair of top metal electrodes, e.g., contributes more than the second member 151, 451A through 451C of the fourth pair of top metal electrodes). The first member 137, 437A through 437G having the relatively lower acoustic impedance may be arranged sufficiently proximate to the first layer of piezoelectric material (e.g. may be arranged sufficiently proximate to top piezoelectric layer 111, 411A through 411G, e.g. may be arranged sufficiently proximate to piezoelectric stack 104, 404A through 404G), so that the first member 137, 437A through 437G having the relatively lower acoustic impedance may contribute more to facilitate suppressing parasitic lateral resonances in operation of the BAW resonator than is contributed by any other top metal electrode layer of the multi-layer metal top acoustic reflector electrode 115, 415A through 415G (e.g., contributes more than the second member 139, 439A through 439G of the first pair of top metal electrode layers, e.g., contributes more than the first member 141, 441A through 441G of the second pair of top metal electrode layers, e.g., contributes more than the second member 143, 443A through 443G of the second pair of top metal electrode layers, e.g., contributes more than the first member 145, 443A through 443C of the third pair of top metal electrode layers, e.g., contributes more than the second member 147, 447A through 447C of the third pair of top metal electrode layers, e.g., contributes more than the first member 149, 447A through 447C of the fourth pair of top metal electrodes, e.g., contributes more than the second member 151, 451A through 451C of the fourth pair of top metal electrodes).

The bottom acoustic reflector 113, 413A through 413G, may have a thickness dimension T23 extending along the stack of bottom electrode layers. For the example of the 24 GHz resonator, the thickness dimension T23 of the bottom acoustic reflector may be about five thousand Angstroms (5,000 A). The top acoustic reflector 115, 415A through 415G, may have a thickness dimension T25 extending along the stack of top electrode layers. For the example of the 24 GHz resonator, the thickness dimension T25 of the top acoustic reflector may be about five thousand Angstroms (5,000 A). The piezoelectric layer stack 104, 404A through 404G, may have a thickness dimension T27 extending along the piezoelectric layer stack 104, 404A through 404G. For the example of the 24 GHz resonator, the thickness dimension T27 of the piezoelectric layer stack may be about eight thousand Angstroms (8,000 A).

In the example resonators 100, 400A through 400G, of FIG. 1A and FIGS. 4A through 4G, a notional heavy dashed line is used in depicting an etched edge region 153, 453A through 453G, associated with the example resonators 100, 400A through 400G. Similarly, a laterally opposing etched edge region 154, 454A through 454G is arranged laterally opposing or opposite from the notional heavy dashed line depicting the etched edge region 153, 453A through 453G. The etched edge region may, but need not, assist with acoustic isolation of the resonators. The etched edge region may, but need not, help with avoiding acoustic losses for the resonators. The etched edge region 153, 453A through 453G, (and the laterally opposing etched edge region 154, 454A through 454G) may extend along the thickness dimension T27 of the piezoelectric layer stack 104, 404A through 404G. The etched edge region 153, 453A through 453G, may extend through (e.g., entirely through or partially through) the piezoelectric layer stack 104, 404A through 404G. Similarly, the laterally opposing etched edge region 154, 454A through 454G may extend through (e.g., entirely through or partially through) the piezoelectric layer stack 104, 404A through 404G. The etched edge region 153, 453A through 453G, (and the laterally opposing etched edge region 154, 454A through 454G) may extend through (e.g., entirely through or partially through) the bottom piezoelectric layer 105, 405A through 405G. The etched edge region 153, 453A through 453G, (and the laterally opposing etched edge region 154, 454A through 454G) may extend through (e.g., entirely through or partially through) the first middle piezoelectric layer 107, 407A through 407G. The etched edge region 153, 453A through 453G, (and the laterally opposing etched edge region 154, 454A through 454G) may extend through (e.g., entirely through or partially through) the second middle piezoelectric layer 109, 409A through 409G. The etched edge region 153, 453A through 453G, (and the laterally opposing etched edge region 154, 454A through 454G) may extend through (e.g., entirely through or partially through) the top piezoelectric layer 111, 411A through 411G.

The etched edge region 153, 453A through 453G, (and the laterally opposing etched edge region 154, 454A through 454G) may extend along the thickness dimension T23 of the bottom acoustic reflector 113, 413A through 413G. The etched edge region 153, 453A through 453G, (and the laterally opposing etched edge region 154, 454A through 454G) may extend through (e.g., entirely through or partially through) the bottom acoustic reflector 113, 413A through 413G. The etched edge region 153, 453A through 453G, (and the laterally opposing etched edge region 154, 454A through 454G) may extend through (e.g., entirely through or partially through) the first pair of bottom metal electrode layers, 119, 419A through 419G, 121, 421A through 421G. The etched edge region 153, 453A through 453G (and the laterally opposing etched edge region 154, 454A through 454G) may extend through (e.g., entirely through or partially through) the second pair of bottom metal electrode layers, 123, 423A through 423G, 125, 425A through 425G. The etched edge region 153, 453A through 453G (and the laterally opposing etched edge region 154, 454A through 454G) may extend through (e.g., entirely through or partially through) the third pair of bottom metal electrode layers, 127, 427D, 129, 429D. The etched edge region 153, 453A through 453G (and the laterally opposing etched edge region 154, 454A through 454G) may extend through (e.g., entirely through or partially through) the fourth pair of bottom metal electrode layers, 131, 431D, 133, 433D.

The etched edge region 153, 453A through 453G (and the laterally opposing etched edge region 154, 454A through 454G) may extend along the thickness dimension T25 of the top acoustic reflector 115, 415A through 415G. The etched edge region 153, 453A through 453G (and the laterally opposing etched edge region 154, 454A through 454G) may extend through (e.g., entirely through or partially through) the top acoustic reflector 115, 415A through 415G. The etched edge region 153, 453A through 453G (and the laterally opposing etched edge region 154, 454A through 454G) may extend through (e.g., entirely through or partially through) the first pair of top metal electrode layers, 137, 437A through 437G, 139, 439A through 49G. The etched edge region 153, 453A through 453C (and the laterally opposing etched edge region 154, 454A through 454C) may extend through (e.g., entirely through or partially through) the second pair of top metal electrode layers, 141, 441A through 441C, 143, 443A through 443C. The etched edge region 153, 453A through 453C (and the laterally opposing etched edge region 154, 454A through 454C) may extend through (e.g., entirely through or partially through) the third pair of top metal electrode layers, 145, 445A through 445C, 147, 447A through 447C. The etched edge region 153, 453A through 453C (and the laterally opposing etched edge region 154, 454A through 454C) may extend through (e.g., entirely through or partially through) the fourth pair of top metal electrode layers, 149, 449A through 449C, 151, 451A through 451C.

As mentioned previously, mesa structure 104, 404A through 404G (e.g., first mesa structure 104, 404A through 404G) may comprise the respective stack 104, 404A through 404G, of the example four layers of piezoelectric material. The mesa structure 104, 404A through 404G (e.g., first mesa structure 104, 404A through 404G) may extend laterally between (e.g., may be formed between) etched edge region 153, 453A through 453G and laterally opposing etched edge region 154, 454A through 454G. As mentioned previously, another mesa structure 113, 413A through 413G, (e.g., second mesa structure 113, 413A through 413G), may comprise the bottom acoustic reflector 113, 413A through 413G. The another mesa structure 113, 413A through 413G, (e.g., second mesa structure 113, 413A through 413G) may extend laterally between (e.g., may be formed between) etched edge region 153, 453A through 453G and laterally opposing etched edge region 154, 454A through 454G. As mentioned previously, yet another mesa structure 115, 415A through 415G, (e.g., third mesa structure 115, 415A through 415G), may comprise the top acoustic reflector 115, 415A through 415G or a portion of the top acoustic reflector 115, 415A through 415G. The yet another mesa structure 115, 415A through 415G, (e.g., third mesa structure 115, 415A through 415G) may extend laterally between (e.g., may be formed between) etched edge region 153, 453A through 453G and laterally opposing etched edge region 154, 454A through 454G. In some example resonators 100, 400A, 400B, 400D through 400F, the second mesa structure corresponding to the bottom acoustic reflector 113, 413A, 413B, 413D through 413F may be laterally wider than the first mesa structure corresponding to the stack 104, 404A, 404B, 404D through 404F, of the example four layers of piezoelectric material. In some example resonators 100, 400A through 400C, the first mesa structure corresponding to the stack 104, 404A through 404C, of the example four layers of piezoelectric material may be laterally wider than the third mesa structure corresponding to the top acoustic reflector 115, 415A through 415C. In some example resonators 400D through 400G, the first mesa structure corresponding to the stack 404D through 404G, of the example four layers of piezoelectric material may be laterally wider than a portion of the third mesa structure corresponding to the top acoustic reflector 415D through 415G.

An optional mass load layer 155, 455A through 455G, may be added to the example resonators 100, 400A through 400G. For example, filters may include series connected resonator designs and shunt connected resonator designs that may include mass load layers. For example, for ladder filter designs, the shunt resonator may include a sufficient mass load layer so that the parallel resonant frequency (Fp) of the shunt resonator approximately matches the series resonant frequency (Fs) of the series resonator design. Thus the series resonator design (without the mass load layer) may be used for the shunt resonator design, but with the addition of the mass load layer 155, 455A through 455G, for the shunt resonator design. By including the mass load layer, the design of the shunt resonator may be approximately downshifted, or reduced, in frequency relative to the series resonator by a relative amount approximately corresponding to the electromechanical coupling coefficient (Kt2) of the shunt resonator. For the example resonators 100, 400A through 400G, the optional mass load layer 155, 455A through 455G, may be arranged in the top acoustic reflector 115, 415A through 415G, above the first pair of top metal electrode layers. A metal may be used for the mass load. A dense metal such as Tungsten may be used for the mass load 155, 455A through 455G. An example thickness dimension of the optional mass load layer 155, 455A through 455G, may be about one hundred Angstroms (100 A).

However, it should be understood that the thickness dimension of the optional mass load layer 155, 455A through 455G, may be varied depending on how much mass loading is desired for a particular design and depending on which metal is used for the mass load layer. Since there may be less acoustic energy in the top acoustic reflector 115, 415A through 415G, at locations further away from the piezoelectric stack 104, 404A through 404G, there may be less acoustic energy interaction with the optional mass load layer, depending on the location of the mass load layer in the arrangement of the top acoustic reflector. Accordingly, in alternative arrangements where the mass load layer is further away from the piezoelectric stack 104, 404A through 404G, such alternative designs may use more mass loading (e.g., thicker mass load layer) to achieve the same effect as what is provided in more proximate mass load placement designs. Also, in other alternative arrangements the mass load layer may be arranged relatively closer to the piezoelectric stack 104, 404A through 404G. Such alternative designs may use less mass loading (e.g., thinner mass load layer). This may achieve the same or similar mass loading effect as what is provided in previously discussed mass load placement designs, in which the mass load is arranged less proximate to the piezoelectric stack 104, 404A through 404G. Similarly, since Titanium (Ti) or Aluminum (Al) is less dense than Tungsten (W) or Molybdenum (Mo), in alternative designs where Titanium or Aluminum is used for the mass load layer, a relatively thicker mass load layer of Titanium (Ti) or Aluminum (Al) is needed to produce the same mass load effect as a mass load layer of Tungsten (W) or Molybdenum (Mo) of a given mass load layer thickness. Moreover, in alternative arrangements both shunt and series resonators may be additionally mass-loaded with considerably thinner mass loading layers (e.g., having thickness of about one tenth of the thickness of a main mass loading layer) in order to achieve specific filter design goals, as may be appreciated by one skilled in the art.

The example resonators 100, 400A through 400G, of FIG. 1A and FIGS. 4A through 4G may include a plurality of lateral features 157, 457A through 457G, (e.g., patterned layer 157, 457A through 457G, e.g., step mass features 157, 457A through 457G), sandwiched between two top metal electrode layers (e.g., between the second member 139, 439A through 439G, of the first pair of top metal electrode layers and the first member 141, 441A through 441G, of the second pair of top metal electrode layers) of the top acoustic reflector 115, 415A through 415G. As shown in the figures, the plurality of lateral features 157, 457A through 457G, of patterned layer 157, 457A through 457G may comprise step features 157, 457A through 457G (e.g., step mass features 157, 457A through 457G). As shown in the figures, the plurality of lateral features 157, 457A through 457G, may be arranged proximate to lateral extremities (e.g., proximate to a lateral perimeter) of the top acoustic reflector 115, 415A through 415G. At least one of the lateral features 157, 457A through 457G, may be arranged proximate to where the etched edge region 153, 453A through 453G, extends through the top acoustic reflector 115, 415A through 415G.

After the lateral features 157, 457A through 457G, are formed, they may function as a step feature template, so that subsequent top metal electrode layers formed on top of the lateral features 157, 457A through 457G, may retain step patterns imposed by step features of the lateral features 157, 457A through 457G. For example, the second pair of top metal electrode layers 141, 441A through 441G, 143, 443A through 443G, the third pair of top metal electrode layers 145, 445A through 445C, 147, 447A through 447C, and the fourth pair of top metal electrodes 149, 449A through 449C, 151, 451A through 451C, may retain step patterns imposed by step features of the lateral features 157, 457A through 457G. The plurality of lateral features 157, 457A through 457G, may add a layer of mass loading. The plurality of lateral features 157, 457A through 457G, may be made of a patterned metal layer (e.g., a patterned layer of Tungsten (W), Molybdenum (Mo), Titanium (Ti) or Aluminum (Al)). In alternative examples, the plurality of lateral features 157, 457A through 457G, may be made of a patterned dielectric layer (e.g., a patterned layer of Silicon Nitride (SiN), Silicon Dioxide (SiO2) or Silicon Carbide (SiC)). The plurality of lateral features 157, 457A through 457G, may, but need not, limit parasitic lateral acoustic modes (e.g., facilitate suppression of spurious modes) of the example resonators 100, 400A through 400G. Thickness of the patterned layer of the lateral features 157, 457A through 457G, (e.g., thickness of the patterned layers 157, 457A through 457G) may be adjusted, e.g., may be determined as desired. For example, for the 24 GHz resonator, thickness may be adjusted within a range from about fifty Angstroms (50 A) to about five hundred Angstroms (500 A). Lateral step width of the lateral features 157, 457A through 457G (e.g., width of the step mass features 157, 457A through 457G) may be adjusted down, for example, from about two microns (2 um). The foregoing may be adjusted to balance a design goal of limiting parasitic lateral acoustic modes (e.g., facilitating suppression of spurious modes) of the example resonators 100, 400A through 400G as well as increasing average quality factor above the series resonance frequency against other design considerations e.g., maintaining desired average quality factor below the series resonance frequency.

In the example bulk acoustic wave resonator 100 shown in FIG. 1A, the patterned layer 157 may comprise Tungsten (W) (e.g., the step mass feature 157 of the patterned layer may comprise Tungsten (W)). A suitable thickness of the patterned layer 157 (e.g., thickness of the step mass feature 157) and lateral width of features of the patterned layer 157 may vary based on various design parameters e.g., material selected for the patterned layer 157, e.g., the desired resonant frequency of the given resonant design, e.g., effectiveness in facilitating spurious mode suppression. For an example of 24 GHz design of the bulk acoustic wave resonator 100 shown in FIG. 1A in which the patterned layer comprises Tungsten (W), a suitable thickness of the patterned layer 157 (e.g., thickness of the step mass feature 157) may be 200 Angstroms and lateral width of features of the patterned layer 157 (e.g., lateral width of the step mass feature 157) may be 0.8 microns, may facilitate suppression of the average strength of the spurious modes in the passband by approximately fifty percent (50%), as estimated by simulation relative to similar designs without the benefit of patterned layer 157.

The example resonators 100, 400A through 400G, of FIG. 1A and FIGS. 4A through 4G may include one or more (e.g., one or a plurality of) interposer layers sandwiched between piezoelectric layers of the stack 104, 404A through 404G. For example, a first interposer layer 159, 459A through 459G may be sandwiched between the bottom piezoelectric layer 105, 405A through 405G, and the first middle piezoelectric layer 107, 407A through 407G. For example, a second interposer layer 161, 461A through 461G, may be sandwiched between the first middle piezoelectric layer 107, 407A through 407G, and the second middle piezoelectric layer 109, 409A through 409G. For example, a third interposer layer 163, 463A through 463G, may be sandwiched between the second middle piezoelectric layer 109, 409A through 409G, and the top piezoelectric layer 111, 411A through 411G.

One or more (e.g., one or a plurality of) interposer layers may be metal interposer layers. The metal interposer layers may be relatively high acoustic impedance metal interposer layers (e.g., using relatively high acoustic impedance metals such as Tungsten (W) or Molybdenum (Mo)). Such metal interposer layers may (but need not) flatten stress distribution across adjacent piezoelectric layers, and may (but need not) raise effective electromechanical coupling coefficient (Kt2) of adjacent piezoelectric layers.

Alternatively or additionally, one or more (e.g., one or a plurality of) interposer layers may be dielectric interposer layers. The dielectric of the dielectric interposer layers may be a dielectric that has a positive acoustic velocity temperature coefficient, so acoustic velocity increases with increasing temperature of the dielectric. The dielectric of the dielectric interposer layers may be, for example, silicon dioxide. Dielectric interposer layers may, but need not, facilitate compensating for frequency response shifts with increasing temperature. Most materials (e.g., metals, e.g., dielectrics) generally have a negative acoustic velocity temperature coefficient, so acoustic velocity decreases with increasing temperature of such materials. Accordingly, increasing device temperature generally causes response of resonators and filters to shift downward in frequency. Including dielectric (e.g., silicon dioxide) that instead has a positive acoustic velocity temperature coefficient may facilitate countering or compensating (e.g., temperature compensating) this downward shift in frequency with increasing temperature. Alternatively or additionally, one or more (e.g., one or a plurality of) interposer layers may comprise metal and dielectric for respective interposer layers. For example, high acoustic impedance metal layer such as Tungsten (W) Molybdenum (Mo) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts. Alternatively or additionally, one or more (e.g., one or a plurality of) interposer layers may comprise different metals for respective interposer layers. For example, high acoustic impedance metal layer such as Tungsten (W), Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited piezoelectric layer. Alternatively or additionally, one or more (e.g., one or a plurality of) interposer layers may comprise different dielectrics for respective interposer layers. For example, high acoustic impedance dielectric layer such as Hafnium Dioxide (HfO2) may (but need not) raise effective electromechanical coupling coefficient (Kt2). Subsequently deposited amorphous dielectric layer such as Silicon Dioxide (SiO2) may (but need not) facilitate compensating for frequency dependent frequency shifts.

In addition to the foregoing application of metal interposer layers to raise effective electromechanical coupling coefficient (Kt2) of adjacent piezoelectric layers, and the application of dielectric interposer layers to facilitate compensating for frequency response shifts with increasing temperature, interposer layers may, but need not, increase quality factor (Q-factor) and/or suppress irregular spectral response patterns characterized by sharp reductions in Q-factor known as "rattles". Q-factor of a resonator is a figure of merit in which increased Q-factor indicates a lower rate of energy loss per cycle relative to the stored energy of the resonator. Increased Q-factor in resonators used in filters results in lower insertion loss and sharper roll-off in filters. The irregular spectral response patterns characterized by sharp reductions in Q-factor known as "rattles" may cause ripples in filter pass bands.

Metal and/or dielectric interposer layer of suitable thicknesses and acoustic material properties (e.g., velocity, density) may be placed at appropriate places in the stack 104, 404A through 404G, of piezoelectric layers, for example, proximate to the nulls of acoustic energy distribution in the stacks (e.g., between interfaces of piezoelectric layers of opposing axis orientation). Finite Element Modeling (FEM) simulations and varying parameters in fabrication prior to subsequent testing may help to optimize interposer layer designs for the stack. Thickness of interposer layers may, but need not, be adjusted to influence increased Q-factor and/or rattle suppression. It is theorized that if the interposer layer is too thin there is no substantial effect. Thus minimum thickness for the interposer layer may be about one monolayer, or about five Angstroms (5 A). Alternatively, if the interposer layer is too thick, rattle strength may increase rather than being suppressed. Accordingly, an upper limit of interposer thickness may be about five-hundred Angstroms (500 A) for a twenty-four Gigahertz (24 GHz) resonator design, with limiting thickness scaling inversely with frequency for alternative resonator designs. It is theorized that below a series resonant frequency of resonators, Fs, Q-factor may not be systematically and significantly affected by including a single interposer layer. However, it is theorized that there may, but need not, be significant increases in Q-factor, for example from about two-thousand (2000) to about three-thousand (3000), for inclusion of two or more interposer layers.

In the example resonators 100, 400A through 400C, of FIG. 1A and FIGS. 4A through 4C, a planarization layer 165, 465A through 465C may be included. A suitable material may be used for planarization layer 165, 465A through 465C, for example Silicon Dioxide (SiO2), Hafnium Dioxide (HfO2), polyimide, or BenzoCyclobutene (BCB). An isolation layer 167, 467A through 467C, may also be included and arranged over the planarization layer 165, 465A-465C. A suitable low dielectric constant (low-k), low acoustic impedance (low-Za) material may be used for the isolation layer 167, 467A through 467C, for example polyimide, or BenzoCyclobutene (BCB).

In the example resonators 100, 400A through 400G, of FIG. 1A and FIGS. 4A through 4G, a bottom electrical interconnect 169, 469A through 469G, may be included to interconnect electrically with (e.g., electrically contact with) the bottom acoustic reflector 113, 413A through 413G, stack of the plurality of bottom metal electrode layers. A top electrical interconnect 171, 471A through 471G, may be included to interconnect electrically with the top acoustic reflector 115, 415A through 415G, stack of the plurality of top metal electrode layers. A suitable material may be used for the bottom electrical interconnect 169, 469A through 469G, and the top electrical interconnect 171, 471A through 471G, for example, gold (Au). Top electrical interconnect 171, 471A through 471G may be substantially acoustically isolated from the stack 104, 404A through 404G of the example four layers of piezoelectric material by the top multi-layer metal acoustic reflector electrode 115, 415A through 415G. Top electrical interconnect 171, 471A through 471G may have dimensions selected so that the top electrical interconnect 171, 471A through 471G approximates a fifty ohm electrical transmission line at the main resonant frequency of the bulk acoustic wave resonator 100, 400A through 400G. Top electrical interconnect 171, 471A through 471G may have a thickness that is substantially thicker than a thickness of a pair of top metal electrode layers of the top multi-layer metal acoustic reflector electrode 115, 415A through 415G (e.g., thicker than thickness of the first pair of top metal electrode layers 137, 437A through 437G, 139, 439A through 439G). Top electrical interconnect 171, 471A through 471G may have a thickness within a range from about one hundred Angstroms (100 A) to about five micrometers (5 um). For example, top electrical interconnect 171, 471A through 471G may have a thickness of about two thousand Angstroms (2000 A).

Figure 1B:
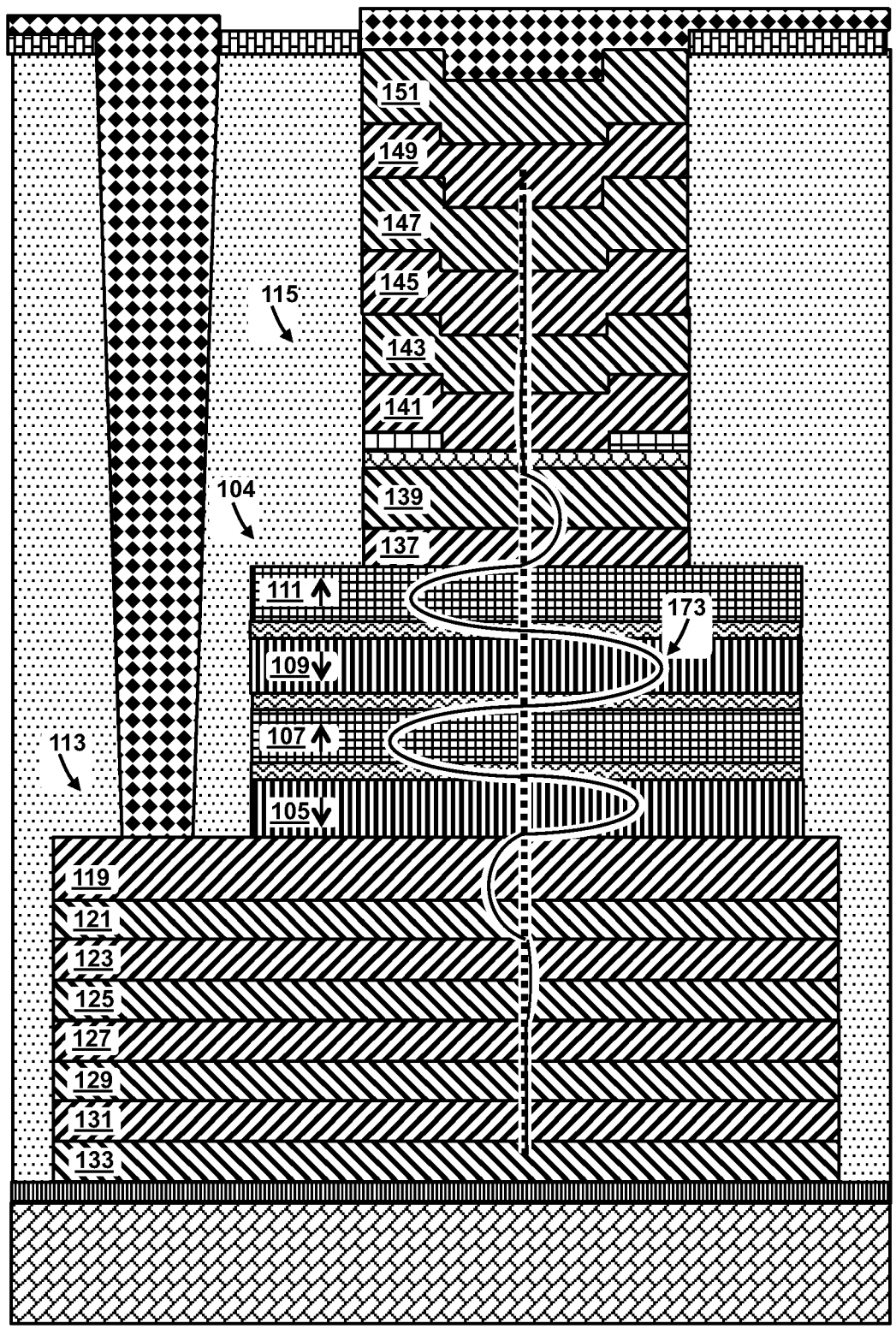
FIG. 1B is a simplified view of FIG. 1A that illustrates acoustic stress profile during electrical operation of the bulk acoustic wave resonator structure shown in FIG. 1A.

FIG. 1B is a simplified view of FIG. 1A that illustrates an example of acoustic stress distribution during electrical operation of the bulk acoustic wave resonator structure shown in FIG. 1A. A notional curved line schematically depicts vertical (Tzz) stress distribution 173 through stack 104 of the example four piezoelectric layers, 105, 107, 109, 111. The stress 173 is excited by the oscillating electric field applied via the top acoustic reflector 115 stack of the plurality of top metal electrode layers 137, 139, 141, 143, 145, 147, 149, 151, and the bottom acoustic reflector 113 stack of the plurality of bottom metal electrode layers 119, 121, 123, 125, 127, 129, 131, 133. The stress 173 has maximum values inside the stack 104 of piezoelectric layers, while exponentially tapering off within the top acoustic reflector 115 and the bottom acoustic reflector 113. Notably, acoustic energy confined in the resonator structure 100 is proportional to stress magnitude.

As discussed previously herein, the example four piezoelectric layers, 105, 107, 109, 111 in the stack 104 may have an alternating axis arrangement in the stack 104. For example the bottom piezoelectric layer 105 may have the normal axis orientation, which is depicted in FIG. 1B using the downward directed arrow. Next in the alternating axis arrangement of the stack 104, the first middle piezoelectric layer 107 may have the reverse axis orientation, which is depicted in FIG. 1B using the upward directed arrow. Next in the alternating axis arrangement of the stack 104, the second middle piezoelectric layer 109 may have the normal axis orientation, which is depicted in FIG. 1B using the downward directed arrow. Next in the alternating axis arrangement of the stack 104, the top piezoelectric layer 111 may have the reverse axis orientation, which is depicted in FIG. 1B using the upward directed arrow. For the alternating axis arrangement of the stack 104, stress 173 excited by the applied oscillating electric field causes normal axis piezoelectric layers (e.g., bottom and second middle piezoelectric layers 105, 109) to be in compression, while reverse axis piezoelectric layers (e.g., first middle and top piezoelectric layers 107, 111) to be in extension. Accordingly, FIG. 1B shows peaks of stress 173 on the right side of the heavy dashed line to depict compression in normal axis piezoelectric layers (e.g., bottom and second middle piezoelectric layers 105, 109), while peaks of stress 173 are shown on the left side of the heavy dashed line to depict extension in reverse axis piezoelectric layers (e.g., first middle and top piezoelectric layers 107, 111). In operation of the BAW resonator shown in FIG. 1B, peaks of standing wave acoustic energy may correspond to absolute value of peaks of stress 173 as shown in FIG. 1B (e.g., peaks of standing wave acoustic energy may correspond to squares of absolute value of peaks of stress 173 as shown in FIG. 1B). Standing wave acoustic energy may be coupled into the multi-layer metal top acoustic reflector electrode 115 shown in FIG. 1B in operation of the BAW resonator. A second member 139 of the first pair of top metal electrode layers may have a relatively high acoustic impedance (e.g., high acoustic impedance metal layer 139, e.g., tungsten layer 139). A first member 137 of the first pair of top metal electrode layers may have a relatively low acoustic impedance (e.g., low acoustic impedance metal layer 137, e.g., titanium layer 137). Accordingly, the first member 137 of the first pair of top metal electrode layers may have acoustic impedance that is relatively lower than the acoustic impedance of the second member 139. The first member 137 having the relatively lower acoustic impedance may be arranged, for example as shown in FIG. 1B, sufficiently proximate to a first layer of piezoelectric material (e.g. sufficiently proximate to top layer of piezoelectric material 111, e.g., sufficiently proximate to stack of piezoelectric material 104) so that standing wave acoustic energy to be in the first member 137 is greater than respective standing wave acoustic energy to be in other respective layers of the multi-layer metal top acoustic reflector electrode 115 in operation of the BAW resonator (e.g., greater than standing wave acoustic energy in the second member 139 of the first pair of top metal electrode layers, e.g., greater than standing wave acoustic energy in the first member 141 of the second pair of top metal electrode layers, e.g., greater than standing wave acoustic energy in the second member 143 of the second pair of top metal electrode layers, e.g., greater than standing wave acoustic energy in the first member 145 of the third pair of top metal electrode layers, e.g., greater than standing wave acoustic energy in the second member 147 of the third pair of top metal electrode layers, e.g., greater than standing wave acoustic energy in the first member 149 of the fourth pair of top metal electrodes, e.g., greater than standing wave acoustic energy in the second member 151 of the fourth pair of top metal electrodes). This may facilitate suppressing parasitic lateral resonances in operation of the BAW resonator shown in FIG. 1B.

Similarly, standing wave acoustic energy may be coupled into the multi-layer metal bottom acoustic reflector electrode 113 shown in FIG. 1B in operation of the BAW resonator. A second member 121 of the first pair of bottom metal electrode layers may have a relatively high acoustic impedance (e.g., high acoustic impedance metal layer 121, e.g., tungsten layer 121). A first member 119 of the first pair of bottom metal electrode layers may have a relatively low acoustic impedance (e.g., low acoustic impedance metal layer 119, e.g., titanium layer 119). Accordingly, the first member 119 of the first pair of bottom metal electrode layers may have acoustic impedance that is relatively lower than the acoustic impedance of the second member 121. The first member 119 having the relatively lower acoustic impedance may be arranged, for example as shown in FIG. 1B, sufficiently proximate to a first layer of piezoelectric material (e.g. sufficiently proximate to bottom layer of piezoelectric material 105, e.g., sufficiently proximate to stack of piezoelectric material 104) so that standing wave acoustic energy to be in the first member 119 is greater than respective standing wave acoustic energy to be in other respective layers of the multi-layer metal bottom acoustic reflector electrode 113 in operation of the BAW resonator (e.g. greater than standing wave acoustic energy in the second member 121 of the first pair of bottom metal electrode layers, e.g., greater than standing wave acoustic energy in the first member 123 of the second pair of bottom metal electrode layers, e.g., greater than standing wave acoustic energy in the second member 125 of the second pair of bottom metal electrode layers, e.g., greater than standing wave acoustic energy in the first member 127 of the third pair of bottom metal electrode layers, e.g., greater than standing wave acoustic energy in the second member 129 of the third pair of bottom metal electrode layers, e.g., greater than standing wave acoustic energy in the first member 131 of the fourth pair of bottom metal electrodes, e.g., greater than standing wave acoustic energy in the second member 133 of the fourth pair of bottom metal electrodes. This may facilitate suppressing parasitic lateral resonances in operation of the BAW resonator shown in FIG. 1B.

Figure 1C:
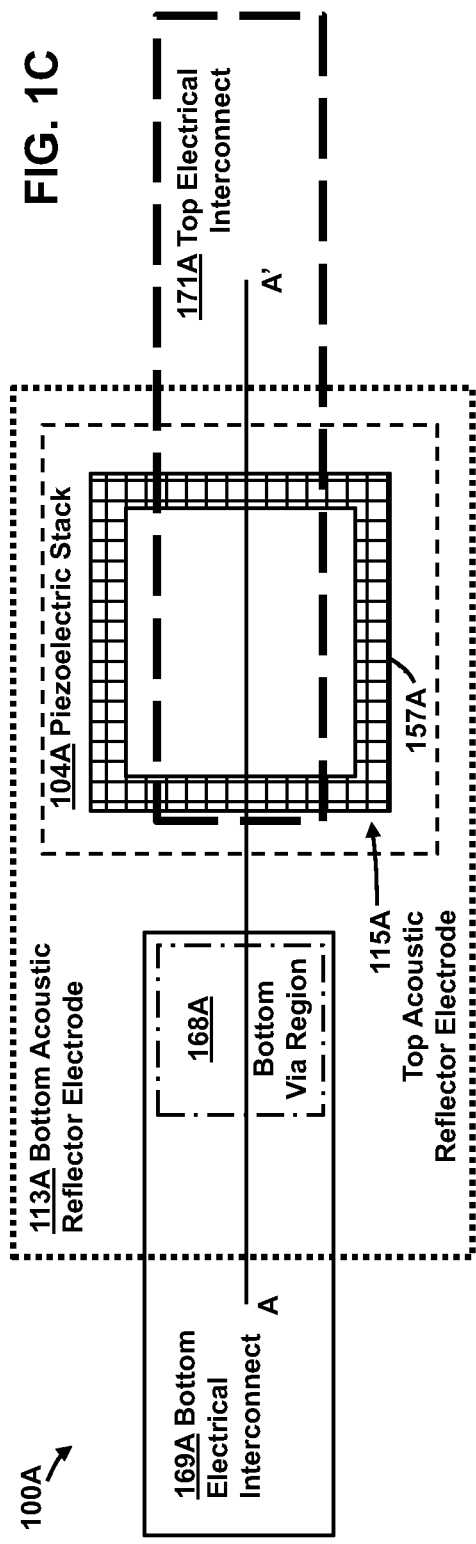
FIG. 1C shows a simplified top plan view of a bulk acoustic wave resonator structure corresponding to the cross sectional view of FIG. 1A, and also shows another simplified top plan view of an alternative bulk acoustic wave resonator structure.
Figure 1C:
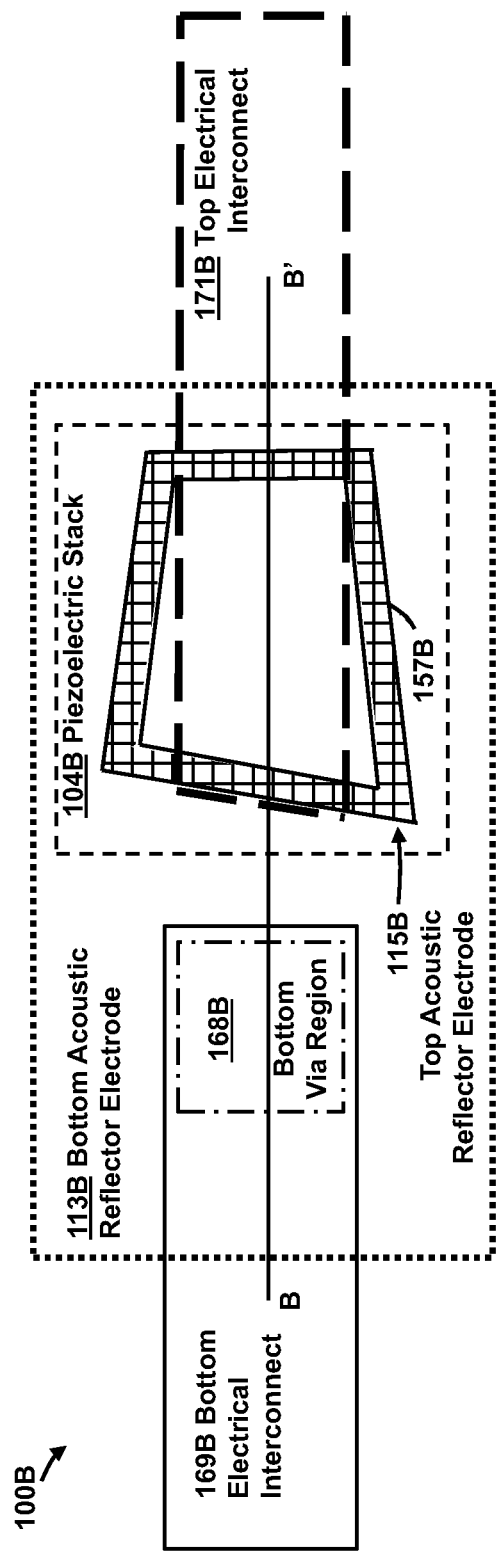

FIG. 1C shows a simplified top plan view of a bulk acoustic wave resonator structure 100A corresponding to the cross sectional view of FIG. 1A, and also shows another simplified top plan view of an alternative bulk acoustic wave resonator structure 100B. The bulk acoustic wave resonator structure 100A includes the stack 104A of four layers of piezoelectric material e.g., having the alternating piezoelectric axis arrangement of the four layers of piezoelectric material. The stack 104A of piezoelectric layers may be sandwiched between the bottom acoustic reflector electrode 113A and the top acoustic reflector electrode 115A. The bottom acoustic reflector electrode may comprise the stack of the plurality of bottom metal electrode layers of the bottom acoustic reflector electrode 113A, e.g., having the alternating arrangement of low acoustic impedance bottom metal electrode layers and high acoustic impedance bottom metal layers. Similarly, the top acoustic reflector electrode 115A may comprise the stack of the plurality of top metal electrode layers of the top acoustic reflector electrode 115A, e.g., having the alternating arrangement of low acoustic impedance top metal electrode layers and high acoustic impedance top metal electrode layers. The top acoustic reflector electrode 115A may include a patterned layer 157A. The patterned layer 157A may approximate a frame shape (e.g., rectangular frame shape) proximate to a perimeter (e.g., rectangular perimeter) of top acoustic reflector electrode 115A as shown in simplified top plan view in FIG. 1C. This patterned layer 157A, e.g., approximating the rectangular frame shape in the simplified top plan view in FIG. 1C, corresponds to the patterned layer 157 shown in simplified cross sectional view in FIG. 1A. Top electrical interconnect 171A extends over (e.g., electrically contacts) top acoustic reflector electrode 115A. Bottom electrical interconnect 169A extends over (e.g., electrically contacts) bottom acoustic reflector electrode 113A through bottom via region 168A.

FIG. 1C also shows another simplified top plan view of an alternative bulk acoustic wave resonator structure 100B. Similarly, the bulk acoustic wave resonator structure 100B includes the stack 104B of four layers of piezoelectric material e.g., having the alternating piezoelectric axis arrangement of the four layers of piezoelectric material. The stack 104B of piezoelectric layers may be sandwiched between the bottom acoustic reflector electrode 113B and the top acoustic reflector electrode 115B. The bottom acoustic reflector electrode may comprise the stack of the plurality of bottom metal electrode layers of the bottom acoustic reflector electrode 113B, e.g., having the alternating arrangement of low acoustic impedance bottom metal electrode layers and high acoustic impedance bottom metal layers. Similarly, the top acoustic reflector electrode 115B may comprise the stack of the plurality of top metal electrode layers of the top acoustic reflector electrode 115B, e.g., having the alternating arrangement of low acoustic impedance top metal electrode layers and high acoustic impedance top metal electrode layers. The top acoustic reflector electrode 115B may include a patterned layer 157B. The patterned layer 157B may approximate a frame shape (e.g., apodized frame shape) proximate to a perimeter (e.g., apodized perimeter) of top acoustic reflector electrode 115B as shown in simplified top plan view in FIG. 1C. The apodized frame shape may be a frame shape in which substantially opposing extremities are not parallel to one another. This patterned layer 157B, e.g., approximating the apodized frame shape in the simplified top plan view in FIG. 1C, is an alternative embodiment corresponding to the patterned layer 157 shown in simplified cross sectional view in FIG. 1A. Top electrical interconnect 171B extends over (e.g., electrically contacts) top acoustic reflector electrode 115B. Bottom electrical interconnect 169B extends over (e.g., electrically contacts) bottom acoustic reflector electrode 113B through bottom via region 168B.

In FIGS. 1D and 1E, Nitrogen (N) atoms are depicted with a hatching style, while Aluminum (Al) atoms are depicted without a hatching style. FIG. 1D is a perspective view of an illustrative model of a reverse axis crystal structure 175 of Aluminum Nitride, AlN, in piezoelectric material of layers in FIG. 1A, e.g., having reverse axis orientation of negative polarization. For example, first middle and top piezoelectric layers 107, 111 discussed previously herein with respect to FIGS. 1A and 1B are reverse axis piezoelectric layers. By convention, when the first layer of normal axis crystal structure 175 is a Nitrogen, N, layer and second layer in an upward direction (in the depicted orientation) is an Aluminum, Al, layer, the piezoelectric material including the reverse axis crystal structure 175 is said to have crystallographic c-axis negative polarization, or reverse axis orientation as indicated by the upward pointing arrow 177. For example, polycrystalline thin film Aluminum Nitride, AlN, may be grown in the crystallographic c-axis negative polarization, or reverse axis, orientation perpendicular relative to the substrate surface using reactive magnetron sputtering of an aluminum target in a nitrogen atmosphere, and by introducing oxygen into the gas atmosphere of the reaction chamber during fabrication at the position where the flip to the reverse axis is desired. An inert gas, for example, Argon may also be included in a sputtering gas atmosphere, along with the nitrogen and oxygen.

For example, a predetermined amount of oxygen containing gas may be added to the gas atmosphere over a short predetermined period of time or for the entire time the reverse axis layer is being deposited. The oxygen containing gas may be diatomic oxygen containing gas, such as oxygen (O2). Proportionate amounts of the Nitrogen gas (N2) and the inert gas may flow, while the predetermined amount of oxygen containing gas flows into the gas atmosphere over the predetermined period of time. For example, N2 and Ar gas may flow into the reaction chamber in approximately a 3:1 ratio of N2 to Ar, as oxygen gas also flows into the reaction chamber. For example, the predetermined amount of oxygen containing gas added to the gas atmosphere may be in a range from about a thousandth of a percent (0.001%) to about ten percent (10%), of the entire gas flow. The entire gas flow may be a sum of the gas flows of argon, nitrogen and oxygen, and the predetermined period of time during which the predetermined amount of oxygen containing gas is added to the gas atmosphere may be in a range from about a quarter (0.25) second to a length of time needed to create an entire layer, for example. For example, based on massflows, the oxygen composition of the gas atmosphere may be about 2 percent when the oxygen is briefly injected. This results in an aluminum oxynitride (ALON) portion of the final monolithic piezoelectric layer, integrated in the Aluminum Nitride, AlN, material, having a thickness in a range of about 5 nm to about 20 nm, which is relatively oxygen rich and very thin. Alternatively, the entire reverse axis piezoelectric layer may be aluminum oxynitride.

FIG. 1E is a perspective view of an illustrative model of a normal axis crystal structure 179 of Aluminum Nitride, AlN, in piezoelectric material of layers in FIG. 1A, e.g., having normal axis orientation of positive polarization. For example, bottom and second middle piezoelectric layers 105, 109 discussed previously herein with respect to FIGS. 1A and 1B are normal axis piezoelectric layers. By convention, when the first layer of the reverse axis crystal structure 179 is an Al layer and second layer in an upward direction (in the depicted orientation) is an N layer, the piezoelectric material including the reverse axis crystal structure 179 is said to have a c-axis positive polarization, or normal axis orientation as indicated by the downward pointing arrow 181. For example, polycrystalline thin film AlN may be grown in the crystallographic c-axis positive polarization, or normal axis, orientation perpendicular relative to the substrate surface by using reactive magnetron sputtering of an Aluminum target in a nitrogen atmosphere.

Figure 2A:
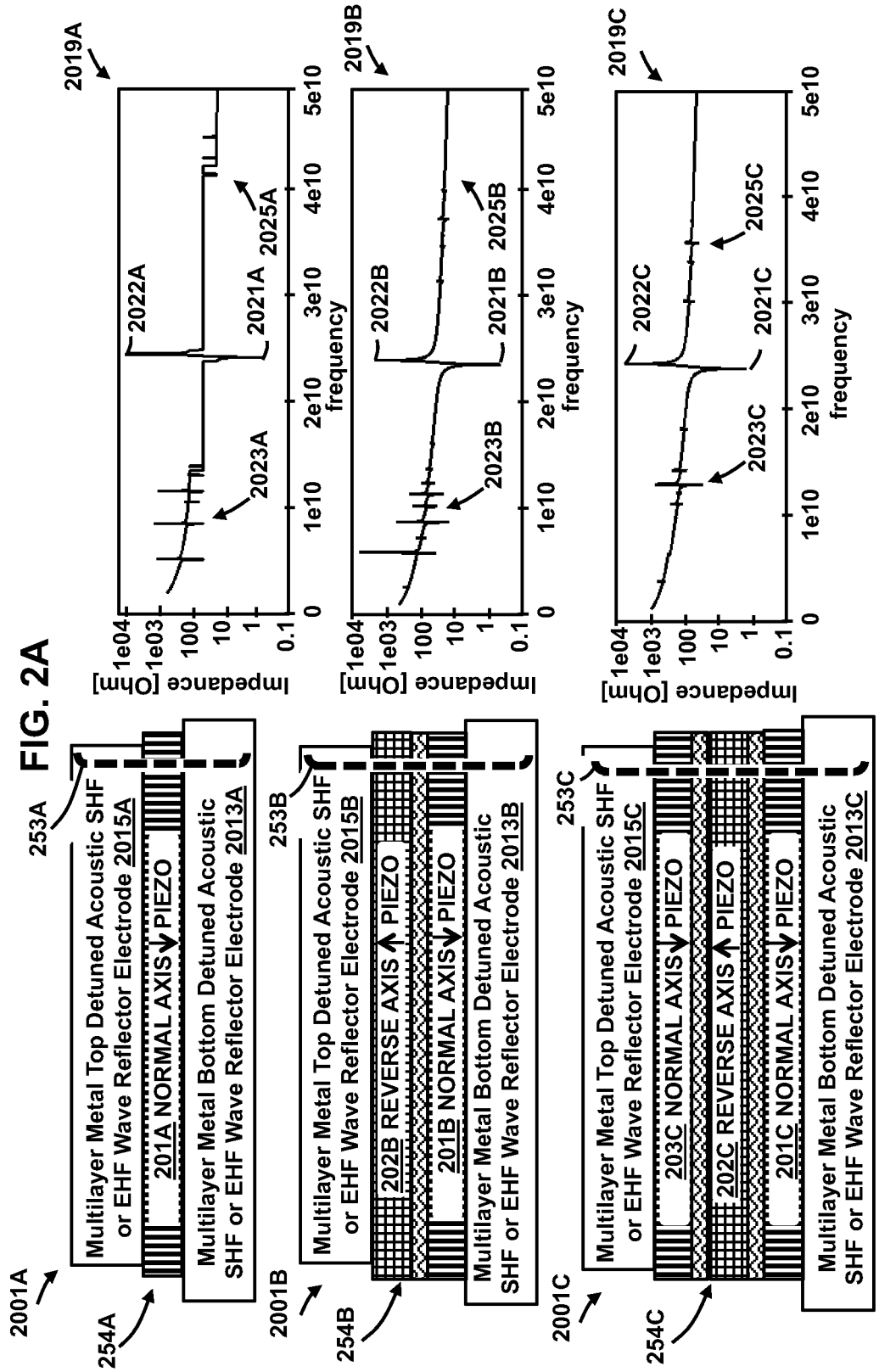
FIGS. 2A and 2B show a further simplified view of a bulk acoustic wave resonator similar to the bulk acoustic wave resonator structure shown in FIG. 1A along with its corresponding impedance versus frequency response during its electrical operation, as well as alternative bulk acoustic wave resonator structures with differing numbers of alternating axis piezoelectric layers, and their respective corresponding impedance versus frequency response during electrical operation, as predicted by simulation.
Figure 2B:
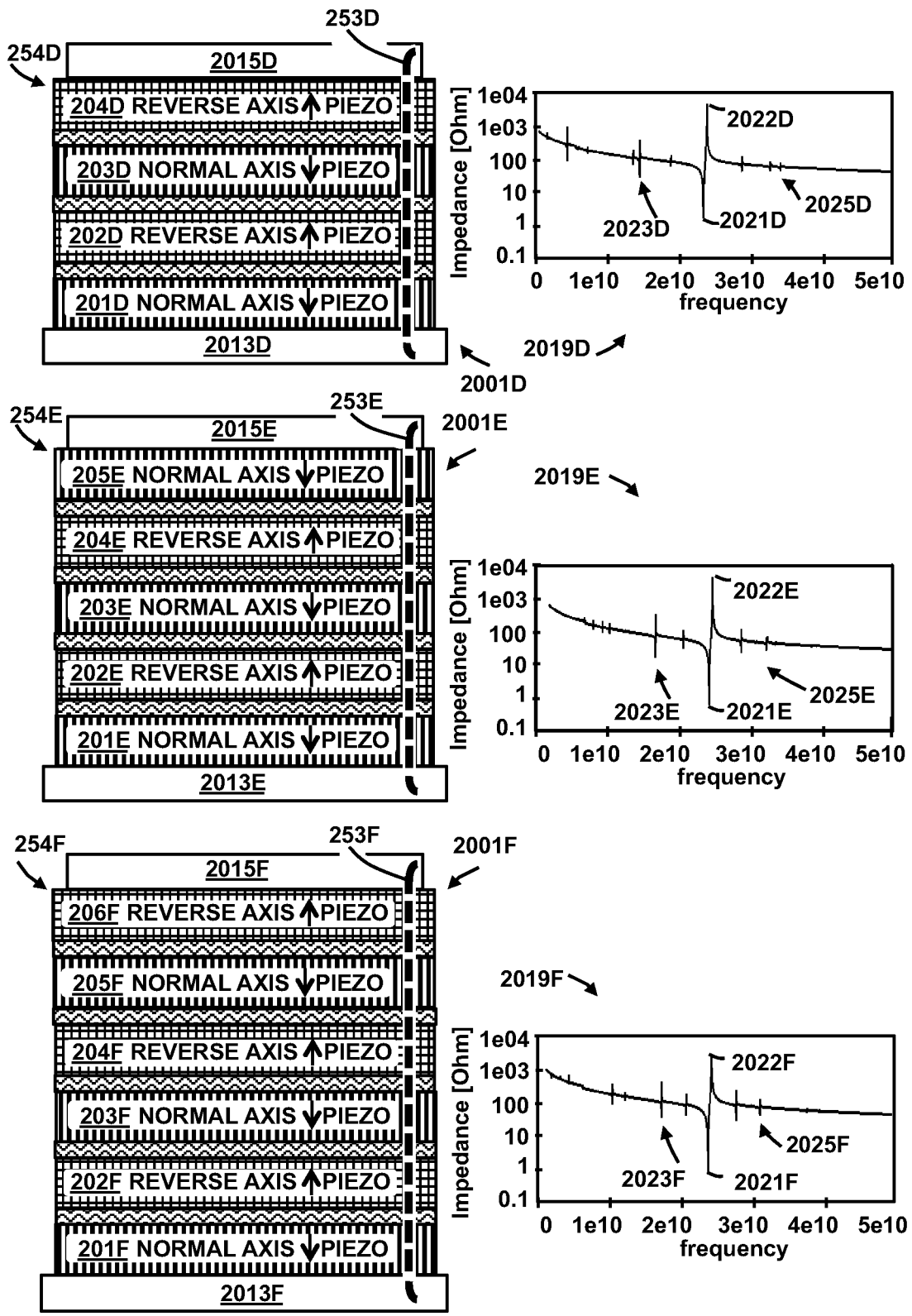
Figure 2D:
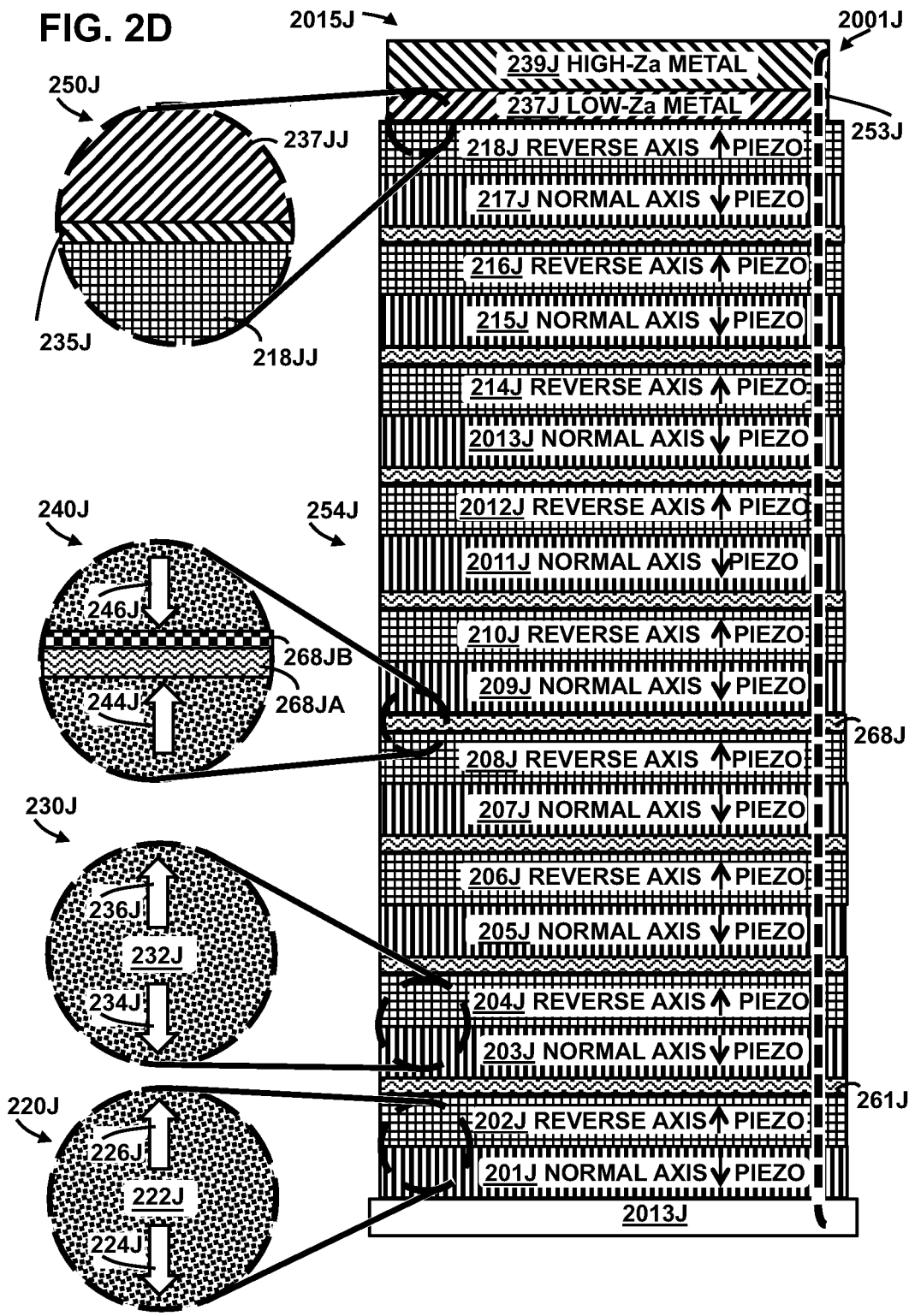
FIGS. 2D and 2E show more additional alternative bulk acoustic wave resonator structures.
Figure 2E:
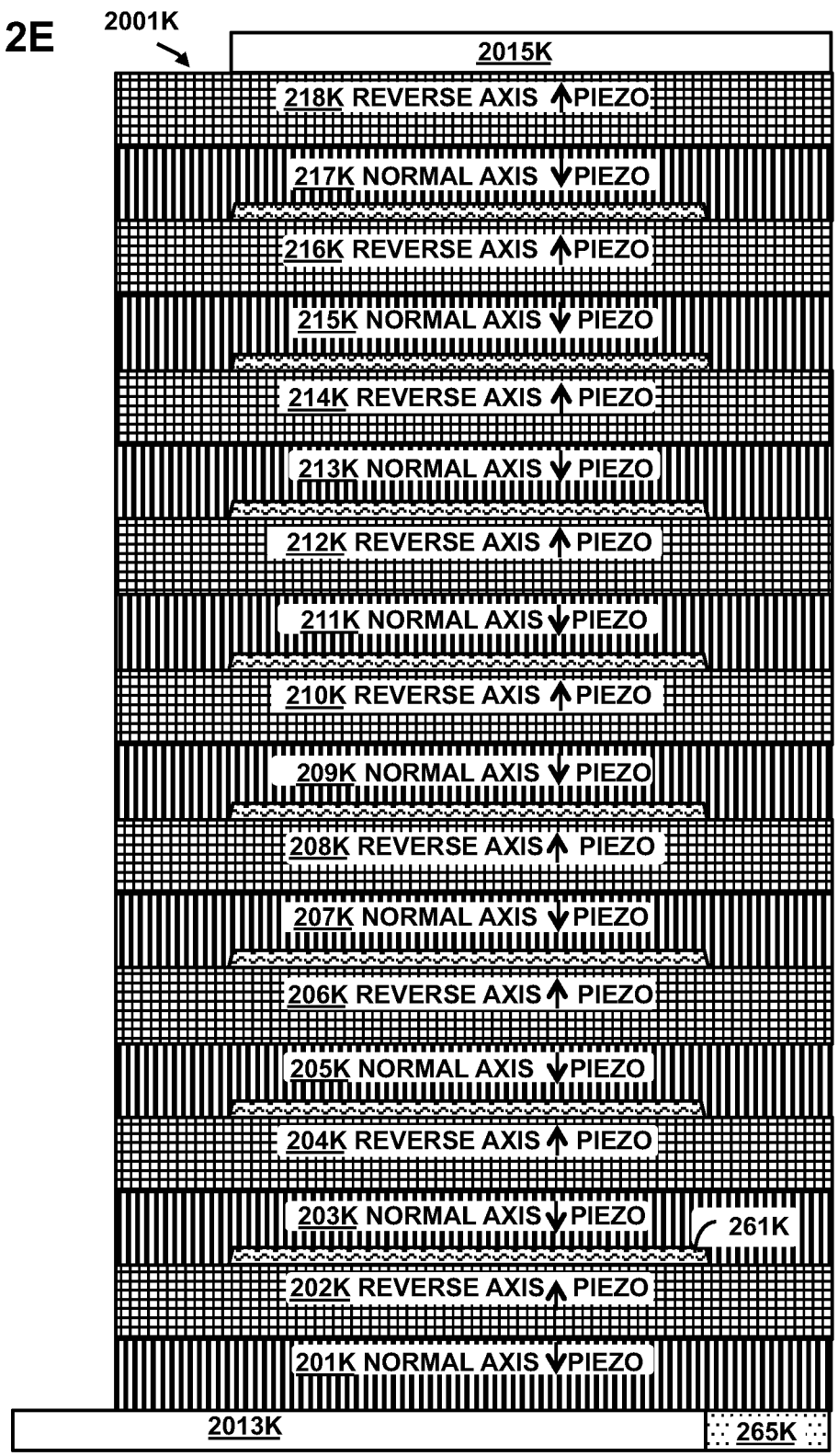

FIGS. 2A through 2E show further simplified views of bulk acoustic wave resonators similar to the bulk acoustic wave resonator structure shown in FIG. 1A. In addition to further simplified views of bulk acoustic wave resonators, FIGS. 2A and 2B show corresponding impedance versus frequency response during its electrical operation, as well as alternative bulk acoustic wave resonator structures with differing numbers of alternating axis piezoelectric layers, and their respective corresponding impedance versus frequency response during electrical operation. FIG. 2C shows additional alternative bulk acoustic wave resonator structures with additional numbers of alternating axis piezoelectric layers. FIGS. 2D and 2E show more additional alternative bulk acoustic wave resonator structures. Bulk acoustic wave resonators 2001A through 2001K may, but need not be, bulk acoustic millimeter wave resonators 2001A through 2001K, operable with a main resonance mode having a main resonant frequency that is a millimeter wave frequency (e.g., twenty-four Gigahertz, 24 GHz) in a millimeter wave frequency band. As defined herein, millimeter wave means a wave having a frequency within a range extending from eight Gigahertz (8 GHz) to three hundred Gigahertz (300 GHz), and millimeter wave band means a frequency band spanning this millimeter wave frequency range from eight Gigahertz (8 GHz) to three hundred Gigahertz (300 GHz). Bulk acoustic wave resonators 2001A through 2001K may, but need not be, bulk acoustic Super High Frequency (SHF) wave resonators 2001A through 2001K or bulk acoustic Extremely High Frequency (EHF) wave resonators 2001A through 2001K, as the terms Super High Frequency (SHF) and Extremely High Frequency (EHF) are defined by the International Telecommunications Union (ITU). For example, bulk acoustic wave resonators 2001A through 2001K may be bulk acoustic Super High Frequency (SHF) wave resonators 2001A through 2001K operable with a main resonance mode having a main resonant frequency that is a Super High Frequency (SHF) (e.g., twenty-four Gigahertz, 24 GHz) in a Super High Frequency (SHF) wave frequency band. Piezoelectric layer thicknesses may be selected to determine the main resonant frequency of bulk acoustic Super High Frequency (SHF) wave resonators 2001A through 2001K in the Super High Frequency (SHF) wave band (e.g., twenty-four Gigahertz, 24 GHz main resonant frequency).

Similarly, layer thicknesses of Super High Frequency (SHF) reflector layers (e.g., layer thickness of multi-layer metal acoustic SHF wave reflector bottom electrodes 2013A through 2013K, e.g., layer thickness of multi-layer metal acoustic SHF wave reflector top electrodes 2015A through 2015K) may be selected to determine quarter wavelength resonant frequency of such SHF reflectors at a frequency, e.g., quarter wavelength resonant frequency, within the Super High Frequency (SHF) wave band. For example, layer thickness of de-tuned multi-layer metal acoustic SHF wave reflector top electrodes 2015A through 2015K may be acoustically de-tuned (e.g., tuned up in frequency) from the resonant frequency (e.g. main resonant frequency) of the BAW resonator (e.g., tuned up to have a quarter wavelength resonant frequency that is up to about 5% higher than a 24 GHz main resonant frequency of the SHF BAW resonator, e.g., tuned up to have a quarter wavelength resonant frequency that is up to about 12% higher than the 24 GHz main resonant frequency of the SHF BAW resonator, e.g., tuned up to have a quarter wavelength resonant frequency that is up to about 36% higher than the 24 GHz main resonant frequency of the SHF BAW resonator). For example, layer thickness of de-tuned multi-layer metal acoustic SHF wave reflector bottom electrodes 2013A through 2013K may be acoustically de-tuned (e.g., tuned down in frequency) from the resonant frequency (e.g. main resonant frequency) of the BAW resonator (e.g., tuned down to have a quarter wavelength resonant frequency that is up to about 5% lower than a 24 GHz main resonant frequency of the SHF BAW resonator, e.g., tuned down to have a quarter wavelength resonant frequency that is up to about 12% lower than the 24 GHz main resonant frequency of the SHF BAW resonator, e.g., tuned down to have a quarter wavelength resonant frequency that is up to about 36% lower than the 24 GHz main resonant frequency of the SHF BAW resonator).

Alternatively, bulk acoustic wave resonators 2001A through 2001K may be bulk acoustic Extremely High Frequency (EHF) wave resonators 2001A through 2001K operable with a main resonance mode having a main resonant frequency that is an Extremely High Frequency (EHF) wave band (e.g., thirty-nine Gigahertz, 39 GHz main resonant frequency, e.g., seventy-seven Gigahertz, 77 GHz main resonant frequency) in an Extremely High Frequency (EHF) wave frequency band. As discussed previously herein, piezoelectric layer thicknesses may be selected to determine the main resonant frequency of bulk acoustic Extremely High Frequency (EHF) wave resonators 2001A through 2001K in the Extremely High Frequency (EHF) wave band (e.g., thirty-nine Gigahertz, 39 GHz main resonant frequency, e.g., seventy-seven Gigahertz, 77 GHz main resonant frequency). Similarly, layer thicknesses of Extremely High Frequency (EHF) reflector layers (e.g., layer thickness of multi-layer metal acoustic EHF wave reflector bottom electrodes 2013A through 2013K, e.g., layer thickness of multi-layer metal acoustic EHF wave reflector top electrodes 2015A through 2015K) may be selected to determine quarter wavelength resonant frequency of such EHF reflectors at a frequency, e.g., quarter wavelength resonant frequency, within the Extremely High Frequency (EHF) wave band. For example, layer thickness of de-tuned multi-layer metal acoustic EHF wave reflector top electrodes 2015A through 2015K may be acoustically de-tuned (e.g., tuned up in frequency) from the resonant frequency (e.g. main resonant frequency) of the BAW resonator (e.g., tuned up to have a quarter wavelength resonant frequency that is up to about 5% higher than a 77 GHz main resonant frequency of the EHF BAW resonator, e.g., tuned up to have a quarter wavelength resonant frequency that is up to about 12% higher than the 77 GHz main resonant frequency of the EHF BAW resonator, e.g., tuned up to have a quarter wavelength resonant frequency that is up to about 36% higher than the 77 GHz main resonant frequency of the EHF BAW resonator)). For example, layer thickness of de-tuned multi-layer metal acoustic EHF wave reflector bottom electrodes 2013A through 2013K may be acoustically de-tuned (e.g., tuned down in frequency) from the resonant frequency (e.g. main resonant frequency) of the BAW resonator (e.g., tuned down to have a quarter wavelength resonant frequency that is up to about 5% lower than a 77 GHz main resonant frequency of the EHF BAW resonator, e.g., tuned down to have a quarter wavelength resonant frequency that is up to about 12% lower than the 77 GHz main resonant frequency of the EHF BAW resonator, e.g., tuned down to have a quarter wavelength resonant frequency that is up to about 36% lower than the 77 GHz main resonant frequency of the EHF BAW resonator).

The general structures of the multi-layer metal acoustic reflector top electrode and the multi-layer metal acoustic reflector bottom electrode have already been discussed previously herein with respect of FIGS. 1A and 1B. As already discussed, these structures are directed to respective pairs of metal electrode layers, in which a first member of the pair has a relatively low acoustic impedance (relative to acoustic impedance of an other member of the pair), in which the other member of the pair has a relatively high acoustic impedance (relative to acoustic impedance of the first member of the pair).

For example, in top de-tuned reflector electrodes 2015A through 2015I and 2015K, the first member having the relatively lower acoustic impedance of the first pair may be arranged nearest, e.g. may abut, a first piezoelectric layer (e.g. top piezoelectric layer of the BAW resonator, e.g., piezoelectric stack of the BAW resonator). For example, in top de-tuned reflector electrodes 2015J, the first member having the relatively lower acoustic impedance of the first pair may be arranged substantially nearest, e.g. may substantially abut, the first piezoelectric layer (e.g. top piezoelectric layer of the BAW resonator, e.g., piezoelectric stack of the BAW resonator). This may facilitate suppressing parasitic lateral modes. In top de-tuned reflector electrodes 2015A through 2015K, the first member having the relatively lower acoustic impedance may be arranged sufficiently proximate to the first layer of piezoelectric material (e.g. may be arranged sufficiently proximate to the top piezoelectric layer, e.g. may be arranged sufficiently proximate to the piezoelectric stack), so that the first member having the relatively lower acoustic impedance may contribute more to the multi-layer metal top acoustic reflector electrode being acoustically de-tuned from the resonant frequency of the BAW resonator than is contributed by any other top metal electrode layer of the multi-layer metal top acoustic reflector electrode. In top de-tuned reflector electrodes 2015A through 2015K, the first member having the relatively lower acoustic impedance may be arranged sufficiently proximate to the first layer of piezoelectric material (e.g. may be arranged sufficiently proximate to the top piezoelectric layer, e.g. may be arranged sufficiently proximate to the piezoelectric stack), so that the first member having the relatively lower acoustic impedance may contribute more, e.g., may contribute more to facilitate suppressing parasitic lateral resonances in operation of the BAW resonator than is contributed by any other top metal electrode layer of the multi-layer metal top acoustic reflector electrode.

For example, in bottom de-tuned reflector electrodes 2013A through 2013I and 2013K, the first member having the relatively lower acoustic impedance of the first pair may be arranged nearest, e.g. may abut, a first piezoelectric layer (e.g. bottom piezoelectric layer of the BAW resonator, e.g., piezoelectric stack of the BAW resonator). For example, in bottom de-tuned reflector electrodes 2013J, the first member of the first pair of layers of bottom de-tuned reflector electrodes 2013J having the relatively lower acoustic impedance of the first pair may be arranged substantially nearest, e.g. may substantially abut, the first piezoelectric layer (e.g. bottom piezoelectric layer of the BAW resonator, e.g., piezoelectric stack of the BAW resonator). This may facilitate suppressing parasitic lateral modes. In bottom de-tuned reflector electrodes 2013A through 2013K, the first member having the relatively lower acoustic impedance may be arranged sufficiently proximate to the first layer of piezoelectric material (e.g. may be arranged sufficiently proximate to the bottom piezoelectric layer, e.g. may be arranged sufficiently proximate to the piezoelectric stack), so that the first member having the relatively lower acoustic impedance may contribute more to the multi-layer metal bottom acoustic reflector electrode being acoustically de-tuned from the resonant frequency of the BAW resonator than is contributed by any other bottom metal electrode layer of the multi-layer metal bottom acoustic reflector electrode. In bottom de-tuned reflector electrodes 2013A through 2013K, the first member having the relatively lower acoustic impedance may be arranged sufficiently proximate to the first layer of piezoelectric material (e.g. may be arranged sufficiently proximate to the bottom piezoelectric layer, e.g. may be arranged sufficiently proximate to the piezoelectric stack), so that the first member having the relatively lower acoustic impedance may contribute more, e.g., may contribute more to facilitate suppressing parasitic lateral resonances in operation of the BAW resonator than is contributed by any other bottom metal electrode layer of the multi-layer metal bottom acoustic reflector electrode.

Shown in FIG. 2A is a bulk acoustic SHF or EHF wave resonator 2001A including a normal axis piezoelectric layer 201A sandwiched between multi-layer metal top de-tuned acoustic SHF or EHF wave reflector electrode 2015A and multi-layer metal bottom de-tuned acoustic SHF or EHF wave reflector electrode 2013A. For the single piezoelectric layer 201A of bulk acoustic SHF or EHF wave resonator 2001A, simulation may predict optimal facilitation of suppressing parasitic lateral resonances by de-tuning of about 3.1% of the resonant frequency of the bulk acoustic wave resonator 2001A, for de-tuning of the multi-layer metal top de-tuned acoustic SHF or EHF wave reflector electrode 2015A and the multi-layer metal bottom de-tuned acoustic SHF or EHF wave reflector electrode 2013A. Also shown in FIG. 2A is a bulk acoustic SHF or EHF wave resonator 2001B including a normal axis piezoelectric layer 201B and a reverse axis piezoelectric layer 202B arranged in a two piezoelectric layer alternating stack arrangement sandwiched between multi-layer metal acoustic SHF or EHF wave reflector top electrode 2015B and multi-layer metal acoustic SHF or EHF wave reflector bottom electrode 2013B. For the two piezoelectric layer 201B, 202B of bulk acoustic SHF or EHF wave resonator 2001B, simulation may predict optimal facilitation of suppressing parasitic lateral resonances by de-tuning of about 4.9% of the resonant frequency of the bulk acoustic wave resonator 2001B, for de-tuning of the multi-layer metal top de-tuned acoustic SHF or EHF wave reflector electrode 2015B and the multi-layer metal bottom de-tuned acoustic SHF or EHF wave reflector electrode 2013B. A bulk acoustic SHF or EHF wave resonator 2001C includes a normal axis piezoelectric layer 201C, a reverse axis piezoelectric layer 202C, and another normal axis piezoelectric layer 203C arranged in a three piezoelectric layer alternating stack arrangement sandwiched between multi-layer metal acoustic SHF or EHF wave reflector top electrode 2015C and multi-layer metal acoustic SHF or EHF wave reflector bottom electrode 2013C. For the three piezoelectric layer 201C, 202C, 203C of bulk acoustic SHF or EHF wave resonator 2001C, simulation may predict optimal facilitation of suppressing parasitic lateral resonances by de-tuning of about 6.8% of the resonant frequency of the bulk acoustic wave resonator 2001C, for de-tuning of the multi-layer metal top de-tuned acoustic SHF or EHF wave reflector electrode 2015C and the multi-layer metal bottom de-tuned acoustic SHF or EHF wave reflector electrode 2013C.

Included in FIG. 2B is bulk acoustic SHF or EHF wave resonator 2001D in a further simplified view similar to the bulk acoustic wave resonator structure shown in FIGS. 1A and 1B and including a normal axis piezoelectric layer 201D, a reverse axis piezoelectric layer 202D, and another normal axis piezoelectric layer 203D, and another reverse axis piezoelectric layer 204D arranged in a four piezoelectric layer alternating stack arrangement sandwiched between multi-layer metal acoustic SHF or EHF wave reflector top electrode 2015D and multi-layer metal acoustic SHF or EHF wave reflector bottom electrode 2013D. For the four piezoelectric layer 201D, 202D, 203D, 204D of bulk acoustic SHF or EHF wave resonator 2001D, simulation may predict optimal facilitation of suppressing parasitic lateral resonances by de-tuning of about 8.7% of the resonant frequency of the bulk acoustic wave resonator 2001D, for de-tuning of the multi-layer metal top de-tuned acoustic SHF or EHF wave reflector electrode 2015D and the multi-layer metal bottom de-tuned acoustic SHF or EHF wave reflector electrode 2013D. A bulk acoustic SHF or EHF wave resonator 2001E includes a normal axis piezoelectric layer 201E, a reverse axis piezoelectric layer 202E, another normal axis piezoelectric layer 203E, another reverse axis piezoelectric layer 204E, and yet another normal axis piezoelectric layer 205E arranged in a five piezoelectric layer alternating stack arrangement sandwiched between multi-layer metal acoustic SHF or EHF wave reflector top electrode 2015E and multi-layer metal acoustic SHF or EHF wave reflector bottom electrode 2013E. For the five piezoelectric layer 201E, 202E, 203E, 204E, 205E of bulk acoustic SHF or EHF wave resonator 2001E, simulation may predict optimal facilitation of suppressing parasitic lateral resonances by de-tuning of about 10.5% of the resonant frequency of the bulk acoustic wave resonator 2001E, for de-tuning of the multi-layer metal top de-tuned acoustic SHF or EHF wave reflector electrode 2015E and the multi-layer metal bottom de-tuned acoustic SHF or EHF wave reflector electrode 2013E. A bulk acoustic SHF or EHF wave resonator 2001F includes a normal axis piezoelectric layer 201F, a reverse axis piezoelectric layer 202F, another normal axis piezoelectric layer 203F, another reverse axis piezoelectric layer 204F, yet another normal axis piezoelectric layer 205F, and yet another reverse axis piezoelectric layer 206F arranged in a six piezoelectric layer alternating stack arrangement sandwiched between multi-layer metal acoustic SHF or EHF wave reflector top electrode 2015F and multi-layer metal acoustic SHF or EHF wave reflector bottom electrode 2013F. For the six piezoelectric layer 201F, 202F, 203F, 204F, 205F, 206F of bulk acoustic SHF or EHF wave resonator 2001F, simulation may predict optimal facilitation of suppressing parasitic lateral resonances by de-tuning of about 12.4% of the resonant frequency of the bulk acoustic wave resonator 2001F, for de-tuning of the multi-layer metal top de-tuned acoustic SHF or EHF wave reflector electrode 2015F and the multi-layer metal bottom de-tuned acoustic SHF or EHF wave reflector electrode 2013F.

In FIG. 2A, shown directly to the right of the bulk acoustic SHF or EHF wave resonator 2001A including the normal axis piezoelectric layer 201A, is a corresponding diagram 2019A depicting its impedance versus frequency response during its electrical operation, as predicted by simulation. The diagram 2019A depicts the main resonant peak 2021A of the main resonant mode (e.g., main series resonant peak 2021A) of the bulk acoustic SHF or EHF wave resonator 2001A at its main resonant frequency (e.g., its 24 GHz series resonant frequency, e.g., its main series resonant frequency, e.g., Fs) and main parallel resonant peak 2022A of the bulk acoustic SHF or EHF wave resonator 2001A at its main parallel resonant frequency, Fp. The diagram 2019A also depicts the satellite resonance peaks 2023A, 2025A of the satellite resonant modes of the bulk acoustic SHF or EHF wave resonator 2001A at satellite frequencies above and below the main resonant frequency 2021A (e.g., above and below the 24 GHz series resonant frequency). Relatively speaking, the main resonant mode corresponding to the main resonance peak 2021A is the strongest resonant mode because it is stronger than other resonant modes of the resonator 2001A, (e.g., stronger than the satellite modes corresponding to relatively lesser satellite resonance peaks 2023A, 2025A).

Similarly, in FIGS. 2A and 2B, shown directly to the right of the bulk acoustic SHF or EHF wave resonators 2001B through 2001F are respective corresponding diagrams 2019B through 2019F depicting corresponding impedance versus frequency response during electrical operation, as predicted by simulation. The diagrams 2019B through 2019F depict respective example SHF main resonant peaks 2021B through 2021F of respective corresponding main resonant modes of bulk acoustic SHF wave resonators 2001B through 2001F at respective corresponding main resonant frequencies (e.g., respective 24 GHz series resonant frequencies, e.g., main series resonant frequencies, Fs) and main parallel resonant peak 2022B through 2022F of the bulk acoustic SHF or EHF wave resonator 2001A at its main parallel resonant frequencies, Fp. The diagrams 2019B through 2019F also depict respective example SHF satellite resonance peaks 2023B through 2023F, 2025B through 2025F of respective corresponding satellite resonant modes of the bulk acoustic SHF wave resonators 2001B through 2001F at respective corresponding SHF satellite frequencies above and below the respective corresponding main SHF resonant frequencies 2021B through 2021F (e.g., above and below the corresponding respective 24 GHz series resonant frequencies). Relatively speaking, for the corresponding respective main SHF resonant modes, its corresponding respective SHF main resonance peak 2021B through 2021F is the strongest for its bulk acoustic SHF wave resonators 2001B through 2001F (e.g., stronger than the corresponding respective SHF satellite modes and corresponding respective lesser SHF satellite resonance peaks 2023B, 2025B).

For the bulk acoustic SHF wave resonator 2001F having the alternating axis stack of six piezoelectric layers, simulation of the 24 GHz design predicts an average passband quality factor of approximately 1,700. Scaling this 24 GHz, six piezoelectric layer design to a 37 GHz, six piezoelectric layer design for a example EHF resonator 2001F, may have an average passband quality factor of approximately 1,300 as predicted by simulation. Scaling this 24 GHz, six piezoelectric layer design to a 77 GHz, six piezoelectric layer design for another example EHF resonator 2001F, may have an average passband quality factor of approximately 730 as predicted by simulation.

As mentioned previously, FIG. 2C shows additional alternative bulk acoustic wave resonator structures with additional numbers of alternating axis piezoelectric layers. A bulk acoustic SHF or EHF wave resonator 2001G includes four normal axis piezoelectric layers 201G, 203G, 205G, 207G, and four reverse axis piezoelectric layers 202G, 204G, 206G, 208G arranged in an eight piezoelectric layer alternating stack arrangement sandwiched between multi-layer metal top de-tuned acoustic SHF or EHF wave reflector electrode 2015G and multi-layer metal bottom de-tuned acoustic SHF or EHF wave reflector electrode 2013G. For the eight piezoelectric layer 201G, 202G, 203G, 204G, 205G, 206G, 207G, 208G of bulk acoustic SHF or EHF wave resonator 2001G, simulation may predict optimal facilitation of suppressing parasitic lateral resonances by de-tuning of about 16.1% of the resonant frequency of the bulk acoustic wave resonator 2001G, for de-tuning of the multi-layer metal top de-tuned acoustic SHF or EHF wave reflector electrode 2015G and the multi-layer metal bottom de-tuned acoustic SHF or EHF wave reflector electrode 2013G. A bulk acoustic SHF or EHF wave resonator 2001H includes five normal axis piezoelectric layers 201H, 203H, 205H, 207H, 209H and five reverse axis piezoelectric layers 202H, 204H, 206H, 208H, 210H arranged in a ten piezoelectric layer alternating stack arrangement sandwiched between multi-layer metal top de-tuned acoustic SHF or EHF wave reflector electrode 2015H and multi-layer metal bottom acoustic SHF or EHF wave reflector electrode 2013H. For the ten piezoelectric layer 201H, 202H, 203H, 204H, 205H, 206H, 207H, 208H, 209H, 210H of bulk acoustic SHF or EHF wave resonator 2001H, simulation may predict optimal facilitation of suppressing parasitic lateral resonances by de-tuning of about 19.8% of the resonant frequency of the bulk acoustic wave resonator 2001H, for de-tuning of the multi-layer metal top de-tuned acoustic SHF or EHF wave reflector electrode 2015H and the multi-layer metal bottom de-tuned acoustic SHF or EHF wave reflector electrode 2013H. A bulk acoustic SHF or EHF wave resonator 2001I includes nine normal axis piezoelectric layers 201I, 203I, 205I, 207I, 209I, 211I, 213I, 215I, 217I and nine reverse axis piezoelectric layers 202I, 204I, 206I, 208I, 210I, 212I, 214I, 216I, 218I arranged in an eighteen piezoelectric layer alternating stack arrangement sandwiched between multi-layer metal top de-tuned acoustic SHF or EHF wave reflector electrode 2015I and multi-layer metal bottom de-tuned acoustic SHF or EHF wave reflector bottom electrode 2013I. For the eighteen piezoelectric layer 201I, 202I, 203I, 204I, 205I, 206I, 207I, 208I, 209I, 210I, 211I, 212I, 213I, 214I, 215I, 216I, 217I, 218I of bulk acoustic SHF or EHF wave resonator 2001H, simulation may predict optimal facilitation of suppressing parasitic lateral resonances by de-tuning of about 34.6% of the resonant frequency of the bulk acoustic wave resonator 2001I, for de-tuning of the multi-layer metal top de-tuned acoustic SHF or EHF wave reflector electrode 2015I and the multi-layer metal bottom de-tuned acoustic SHF or EHF wave reflector electrode 2013I.

For the bulk acoustic SHF or EHF wave resonator 2001I having the alternating axis stack of eighteen piezoelectric layers, simulation of the 24 GHz design predicts an average passband quality factor of approximately 2,700. Scaling this 24 GHz, eighteen piezoelectric layer design to a 37 GHz, eighteen piezoelectric layer design, may have an average passband quality factor of approximately 2000 as predicted by simulation. Scaling this 24 GHz, eighteen piezoelectric layer design to a 77 GHz, eighteen piezoelectric layer design, may have an average passband quality factor of approximately 1,130 as predicted by simulation.

In the example resonators, 2001A through 2001I, of FIGS. 2A through 2C, a notional heavy dashed line is used in depicting respective etched edge region, 253A through 253I, associated with the example resonators, 2001A through 2001I. Similarly, in the example resonators, 2001A through 2001I, of FIGS. 2A through 2C, a laterally opposed etched edge region 254A through 254I may be arranged laterally opposite from etched edge region, 253A through 253I. The respective etched edge region may, but need not, assist with acoustic isolation of the resonators, 2001A through 2001I. The respective etched edge region may, but need not, help with avoiding acoustic losses for the resonators, 2001A through 2001I. The respective etched edge region, 253A through 253I, (and the laterally opposed etched edge region 254A through 254I) may extend along the thickness dimension of the respective piezoelectric layer stack. The respective etched edge region, 253A through 253I, (and the laterally opposed etched edge region 254A through 254I) may extend through (e.g., entirely through or partially through) the respective piezoelectric layer stack. The respective etched edge region, 253A through 253I may extend through (e.g., entirely through or partially through) the respective first piezoelectric layer, 201A through 201I. The respective etched edge region, 253B through 253I, (and the laterally opposed etched edge region 254B through 254I) may extend through (e.g., entirely through or partially through) the respective second piezoelectric layer, 202B through 202I. The respective etched edge region, 253C through 253I, (and the laterally opposed etched edge region 254C through 254I) may extend through (e.g., entirely through or partially through) the respective third piezoelectric layer, 203C through 203I. The respective etched edge region, 253D through 253I, (and the laterally opposed etched edge region 254D through 254I) may extend through (e.g., entirely through or partially through) the respective fourth piezoelectric layer, 204D through 204I. The respective etched edge region, 253E through 253I, (and the laterally opposed etched edge region 254E through 254I) may extend through (e.g., entirely through or partially through) the respective additional piezoelectric layers of the resonators, 2001E through 2001I. The respective etched edge region, 253A through 253I, (and the laterally opposed etched edge region 254A through 254I) may extend along the thickness dimension of the respective multi-layer metal acoustic SHF or EHF wave reflector bottom electrode, 2013A through 2013I, of the resonators, 2001A through 2001I. The respective etched edge region, 253A through 253I, (and the laterally opposed etched edge region 254A through 254I) may extend through (e.g., entirely through or partially through) the respective multi-layer metal acoustic SHF or EHF wave reflector bottom electrode, 2013A through 2013I. The respective etched edge region, 253A through 253I, (and the laterally opposed etched edge region 254A through 254I) may extend along the thickness dimension of the respective multi-layer metal top de-tuned acoustic SHF or EHF wave reflector electrode, 2015A through 2015I of the resonators, 2001A through 2001I. The etched edge region, 253A through 253I, (and the laterally opposed etched edge region 254A through 254I) may extend through (e.g., entirely through or partially through) the respective multi-layer metal bottom de-tuned acoustic SHF or EHF wave reflector electrode, 2013A through 2013I.

As shown in FIGS. 2A through 2C, first mesa structures corresponding to the respective stacks of piezoelectric material layers may extend laterally between (e.g., may be formed between) etched edge regions 253A through 253I and laterally opposing etched edge region 254A through 254I. Second mesa structures corresponding to multi-layer metal bottom de-tuned acoustic SHF or EHF wave reflector electrode 2013A through 2013I may extend laterally between (e.g., may be formed between) etched edge regions 253A through 253I and laterally opposing etched edge region 254A through 254I. Third mesa structures corresponding to multi-layer metal top de-tuned acoustic SHF or EHF wave reflector electrode 2015A through 2015I may extend laterally between (e.g., may be formed between) etched edge regions 253A through 253I and laterally opposing etched edge region 254A through 254I.

In accordance with the teachings herein, various bulk acoustic SHF or EHF wave resonators may include: a seven piezoelectric layer alternating axis stack arrangement; a nine piezoelectric layer alternating axis stack arrangement; an eleven piezoelectric layer alternating axis stack arrangement; a twelve piezoelectric layer alternating axis stack arrangement; a thirteen piezoelectric layer alternating axis stack arrangement; a fourteen piezoelectric layer alternating axis stack arrangement; a fifteen piezoelectric layer alternating axis stack arrangement; a sixteen piezoelectric layer alternating axis stack arrangement; and a seventeen piezoelectric layer alternating axis stack arrangement; and that these stack arrangements may be sandwiched between respective multi-layer metal top de-tuned acoustic SHF or EHF wave reflector electrodes and respective multi-layer metal bottom de-tuned acoustic SHF or EHF wave reflector electrodes. Mass load layers and lateral features (e.g., step features) as discussed previously herein with respect to FIG. 1A are not explicitly shown in the simplified diagrams of the various resonators shown in FIGS. 2A, 2B and 2C. However, such mass load layers may be included, and such lateral features may be included, and may be arranged between, for example, top metal electrode layers of the respective top acoustic reflectors of the resonators shown in FIGS. 2A, 2B and 2C. Further, such mass load layers may be included, and such lateral features may be included, and may be arranged between, for example, top metal electrode layers of the respective top de-tuned acoustic reflectors in the various resonators having the alternating axis stack arrangements of various numbers of piezoelectric layers, as described in this disclosure.

Further, it should be understood that interposer layers as discussed previously herein with respect to FIG. 1A are explicitly shown in the simplified diagrams of the various resonators shown in FIGS. 2A, 2B and 2C. Such interposers may be included and interposed between adjacent piezoelectric layers in the various resonators shown in FIGS. 2A, 2B and 2C, and further may be included and interposed between adjacent piezoelectric layers in the various resonators having the alternating axis stack arrangements of various numbers of piezoelectric layers, as described in this disclosure. In some other alternative bulk acoustic wave resonator structures, fewer interposer layers may be employed. For example, FIG. 2D shows another alternative bulk acoustic wave resonator structure 2001J, similar to bulk acoustic wave resonator structure 2001I shown in FIG. 2C, but with differences. For example, relatively fewer interposer layers may be included in the alternative bulk acoustic wave resonator structure 2001J shown in FIG. 2D. For example, FIG. 2D shows a first interposer layer 261J interposed between second layer of (reverse axis) piezoelectric material 202J and third layer of (normal axis) piezoelectric material 203J, but without an interposer layer interposed between first layer of (normal axis) piezoelectric material 201J and second layer of (reverse axis) piezoelectric material 202J. As shown in FIG. 2D in a first detailed view 220J, without an interposer layer interposed between first layer of piezoelectric material 201J and second layer of piezoelectric material 202J, the first and second piezoelectric layer 201J, 202J may be a monolithic layer 222J of piezoelectric material (e.g., Aluminum Nitride (AlN)) having first and second regions 224J, 226J. A central region of monolithic layer 222J of piezoelectric material (e.g., Aluminum Nitride (AlN)) between first and second regions 224J, 226J may be oxygen rich. The first region 224J of monolithic layer 222J (e.g., bottom region 224J of monolithic layer 222J) has a first piezoelectric axis orientation (e.g., normal axis orientation) as representatively illustrated in detailed view 220J using a downward pointing arrow at first region 224J, (e.g., bottom region 224J). This first piezoelectric axis orientation (e.g., normal axis orientation, e.g., downward pointing arrow) at first region 224J of monolithic layer 222J (e.g., bottom region 224J of monolithic layer 222J) corresponds to the first piezoelectric axis orientation (e.g., normal axis orientation, e.g., downward pointing arrow) of first piezoelectric layer 201J. The second region 226J of monolithic layer 222J (e.g., top region 226J of monolithic layer 222J) has a second piezoelectric axis orientation (e.g., reverse axis orientation) as representatively illustrated in detailed view 220J using an upward pointing arrow at second region 226J, (e.g., top region 226J). This second piezoelectric axis orientation (e.g., reverse axis orientation, e.g., upward pointing arrow) at second region 226J of monolithic layer 222J (e.g., top region 226J of monolithic layer 222J) may be formed to oppose the first piezoelectric axis orientation (e.g., normal axis orientation, e.g., downward pointing arrow) at first region 224J of monolithic layer 222J (e.g., bottom region 224J of monolithic layer 222J) by adding gas (e.g., oxygen) to flip the axis while sputtering the second region 226J of monolithic layer 222J (e.g., top region 226J of monolithic layer 222J) onto the first region 224J of monolithic layer 222J (e.g., bottom region 224J of monolithic layer 222J). The second piezoelectric axis orientation (e.g., reverse axis orientation, e.g., upward pointing arrow) at second region 226J of monolithic layer 222J (e.g., top region 226J of monolithic layer 222J) corresponds to the second piezoelectric axis orientation (e.g., reverse axis orientation, e.g., upward pointing arrow) of second piezoelectric layer 202J.

Similarly, as shown in FIG. 2D in a second detailed view 230J, without an interposer layer interposed between third layer of piezoelectric material 203J and fourth layer of piezoelectric material 204J, the third and fourth piezoelectric layer 203J, 204J may be an additional monolithic layer 232J of piezoelectric material (e.g., Aluminum Nitride (AlN)) having first and second regions 234J, 236J. A central region of additional monolithic layer 232J of piezoelectric material (e.g., Aluminum Nitride (AlN)) between first and second regions 234J, 236J may be oxygen rich. The first region 234J of additional monolithic layer 232J (e.g., bottom region 234J of additional monolithic layer 232J) has the first piezoelectric axis orientation (e.g., normal axis orientation) as representatively illustrated in second detailed view 230J using the downward pointing arrow at first region 234J, (e.g., bottom region 224J). This first piezoelectric axis orientation (e.g., normal axis orientation, e.g., downward pointing arrow) at first region 234J of additional monolithic layer 232J (e.g., bottom region 234J of additional monolithic layer 232J) corresponds to the first piezoelectric axis orientation (e.g., normal axis orientation, e.g., downward pointing arrow) of third piezoelectric layer 203J. The second region 236J of additional monolithic layer 232J (e.g., top region 236J of additional monolithic layer 232J) has the second piezoelectric axis orientation (e.g., reverse axis orientation) as representatively illustrated in second detailed view 230J using the upward pointing arrow at second region 236J, (e.g., top region 236J). This second piezoelectric axis orientation (e.g., reverse axis orientation, e.g., upward pointing arrow) at second region 236J of additional monolithic layer 232J (e.g., top region 236J of additional monolithic layer 232J) may be formed to oppose the first piezoelectric axis orientation (e.g., normal axis orientation, e.g., downward pointing arrow) at first region 234J of additional monolithic layer 232J (e.g., bottom region 234J of additional monolithic layer 232J) by adding gas (e.g., oxygen) to flip the axis while sputtering the second region 236J of additional monolithic layer 232J (e.g., top region 236J of additional monolithic layer 232J) onto the first region 234J of additional monolithic layer 232J (e.g., bottom region 234J of additional monolithic layer 232J). The second piezoelectric axis orientation (e.g., reverse axis orientation, e.g., upward pointing arrow) at second region 236J of additional monolithic layer 232J (e.g., top region 236J of additional monolithic layer 232J) corresponds to the second piezoelectric axis orientation (e.g., reverse axis orientation, e.g., upward pointing arrow) of fourth piezoelectric layer 204J.

Similar to what was just discussed, without an interposer layer interposed between fifth layer of piezoelectric material 205J and sixth layer of piezoelectric material 206J, the fifth and sixth piezoelectric layer 205J, 206J may be another additional monolithic layer of piezoelectric material (e.g., Aluminum Nitride (AlN)) having first and second regions. More generally, for example in FIG. 2D, where N is an odd positive integer, without an interposer layer interposed between Nth layer of piezoelectric material and (N+1)th layer of piezoelectric material, the Nth and (N+1)th piezoelectric layer may be an (N+1)/2th monolithic layer of piezoelectric material (e.g., Aluminum Nitride (AlN)) having first and second regions. Accordingly, without an interposer layer interposed between seventeenth layer of piezoelectric material 217J and eighteenth layer of piezoelectric material 218J, the seventeenth and eighteenth piezoelectric layer 217J, 218J may be ninth monolithic layer of piezoelectric material (e.g., Aluminum Nitride (AlN)) having first and second regions.

The first interposer layer 261J is shown in FIG. 2D as interposing between a first pair of opposing axis piezoelectric layers 201J, 202J, and a second pair of opposing axis piezoelectric layers 203J, 204J. More generally, for example, where M is a positive integer, an Mth interposer layer is shown in FIG. 2D as interposing between an Mth pair of opposing axis piezoelectric layers and an (M+1)th pair of opposing axis piezoelectric layers. Accordingly, an eighth interposer layer is shown in FIG. 2D as interposing between an eighth pair of opposing axis piezoelectric layers 215J, 216J, and a ninth pair of opposing axis piezoelectric layers 217J, 218J. FIG. 2D shows an eighteen piezoelectric layer alternating axis stack arrangement sandwiched between multi-layer metal top de-tuned acoustic SHF or EHF wave reflector electrode 2015J and multi-layer metal bottom de-tuned acoustic SHF or EHF wave reflector electrode 2013J. Etched edge region 253J (and laterally opposing etched edge region 254J) may extend through (e.g., entirely through, e.g., partially through) the eighteen piezoelectric layer alternating axis stack arrangement and its interposer layers, and may extend through (e.g., entirely through, e.g., partially through) multi-layer metal top de-tuned acoustic SHF or EHF wave reflector electrode 2015J, and may extend through (e.g., entirely through, e.g., partially through) multi-layer metal bottom de-tuned acoustic SHF or EHF wave reflector electrode 2013J. As shown in FIG. 2D, a first mesa structure corresponding to the stack of eighteen piezoelectric material layers may extend laterally between (e.g., may be formed between) etched edge region 253J and laterally opposing etched edge region 254J. A second mesa structure corresponding to multi-layer metal bottom de-tuned acoustic SHF or EHF wave reflector electrode 2013J may extend laterally between (e.g., may be formed between) etched edge region 253J and laterally opposing etched edge region 254J. Third mesa structure corresponding to multi-layer metal top de-tuned acoustic SHF or EHF wave reflector electrode 2015J may extend laterally between (e.g., may be formed between) etched edge region 253J and laterally opposing etched edge region 254J.

As mentioned previously herein, one or more (e.g., one or a plurality of) interposer layers may be metal interposer layers. Alternatively or additionally, one or more (e.g., one or a plurality of) interposer layers may be dielectric interposer layers. Interposer layers may be metal and/or dielectric interposer layers. Alternatively or additionally, one or more (e.g., one or a plurality of) interposer layers may be formed of different metal layers. For example, high acoustic impedance metal layer such as Tungsten (W), Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited piezoelectric layer. Alternatively or additionally, one or more (e.g., one or a plurality of) interposer layers may be formed of different dielectric layers. For example, high acoustic impedance dielectric layer such as Hafnium Dioxide (HfO2) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts. Alternatively or additionally, one or more (e.g., one or a plurality of) interposer layers may comprise metal and dielectric for respective interposer layers. For example, high acoustic impedance metal layer such as Tungsten (W), Molybdenum (Mo) may (but need not) raise effective electromechanical coupling coefficient (Kt2) while subsequently deposited amorphous dielectric layer such as Silicon Dioxide (SiO2) may (but need not) facilitate compensating for temperature dependent frequency shifts. For example, in FIG. 2D one or more of the interposer layers (e.g., interposer layer 268J) may comprise metal and dielectric for respective interposer layers. For example, detailed view 240J of interposer 268J shows interposer 268J as comprising metal sub-layer 268JB over dielectric sub-layer 268JA. For interposer 268J, example thickness of metal sub-layer 268JB may be approximately two hundred Angstroms (200 A). For interposer 268J, example thickness of dielectric sub-layer 268JA may be approximately two hundred Angstroms (200 A). The second piezoelectric axis orientation (e.g., reverse axis orientation, e.g., upward pointing arrow) at region 244J (e.g., bottom region 244J) corresponds to the second piezoelectric axis orientation (e.g., reverse axis orientation, e.g., upward pointing arrow) of eighth piezoelectric layer 208J. The first piezoelectric axis orientation (e.g., normal axis orientation, e.g., downward pointing arrow) at region 246J (e.g., top region 246J) corresponds to the first piezoelectric axis orientation (e.g., normal orientation, e.g., downward pointing arrow) of ninth piezoelectric layer 209J.

Multi-layer metal top de-tuned acoustic SHF or EHF wave reflector electrode 2015J may comprise a first pair of metal top electrode layers 237J, 239J. Multi-layer metal top de-tuned acoustic SHF or EHF wave reflector electrode 2015J may include additional similar pairs (not shown) of alternating high acoustic impedance metal layers. The first pair of metal top electrode layers may comprise a first member 237 of low acoustic impedance metal layer 237J and a second member of high acoustic impedance metal layer 239J. In addition to the first pair of metal top electrode layers 237J, 239J, the multi-layer metal top de-tuned acoustic SHF or EHF wave reflector electrode 2015J may include additional pairs (not shown) of alternating high acoustic impedance/low acoustic metal layers. As shown in FIG. 2D, the first member of low acoustic impedance metal layer 237J may be arranged nearer to a first piezoelectric layer (e.g., nearer to top piezoelectric layer 218J, e.g., nearer to eighteenth layer of piezoelectric material 218J, e.g., nearer to stack of piezoelectric layers 254J) than second member of high acoustic impedance metal layer 239J. This arrangement may facilitate suppressing parasitic lateral resonances in operation of the BAW resonator.

Close-up view 250J of low acoustic metal layer 237J and top piezoelectric layer 218J e.g., eighteenth layer of piezoelectric material 218J) shows very thin (e.g. thickness about one tenth or less of an acoustic wavelength of the main resonant frequency of the BAW resonator 2001J) intervening high acoustic impedance layer 235J. In close-up view 250J, intervening high acoustic impedance layer 235J is shown and arranged to intervene between close-up low acoustic metal layer 237JJ and close-up top piezoelectric layer 218JJ (e.g., eighteenth layer of piezoelectric material 218J). (In normal view of FIG. 2D intervening high acoustic impedance layer 235J may be present, but is not shown). In close-up view 250J, intervening high acoustic impedance layer 235J is shown as a single layer that is very thin (e.g. thickness about one tenth or less of an acoustic wavelength of the main resonant frequency of the BAW resonator 2001J). However, in alternative examples, intervening high acoustic impedance layer 235J may be otherwise embodied, e.g., in a very thin intervening multi-layer structure 235J in which an aggregate thickness of the entire intervening multi-layer structure is about one tenth or less of an acoustic wavelength of the main resonant frequency of the BAW resonator 2001J, e.g., various different materials comprising intervening multi-layer structure 235J in which an aggregate thickness of the entire intervening multi-layer structure is about one tenth or less of an acoustic wavelength of the main resonant frequency of the BAW resonator 2001J. As mentioned previously, in top de-tuned reflector electrodes 2015J, the first member having the relatively lower acoustic impedance of the first pair may be arranged substantially nearest, e.g. may substantially abut, the first piezoelectric layer (e.g. top piezoelectric layer of the BAW resonator, e.g., piezoelectric stack of the BAW resonator). As defined herein substantially nearest means nearest or sufficiently near so that nearness is only intervened by a very thin intervening layer (or in aggregate very thin intervening multi-layer structure) having a thickness of about one tenth or less of an acoustic wavelength of the main resonant frequency of the BAW resonator. As defined herein substantially abut means abut or sufficiently abuts so that abutting may be only intervened by a very thin intervening layer (or in aggregate very thin intervening multi-layer structure) having a thickness of about one tenth or less of an acoustic wavelength of the main resonant frequency of the BAW resonator. It is theorized that because any intervening layers are so thin (e.g., in aggregate any intervening multi-layer structures are so thin), despite their presence, there is still facilitation of suppressing parasitic lateral resonances in operation of the BAW resonator.

Similarly, multi-layer metal bottom de-tuned acoustic SHF or EHF wave reflector electrode 2013J may comprise a first pair of metal top electrode layers (not shown). Multi-layer metal bottom de-tuned acoustic SHF or EHF wave reflector electrode 2013J may also include additional similar pairs (not shown) of alternating high acoustic impedance metal layers. The first pair of metal top electrode layers may comprise a first member of low acoustic impedance metal layer and a second member of high acoustic impedance metal layer (not shown). In addition to the first pair of metal bottom electrode layers (not shown), the multi-layer metal bottom de-tuned acoustic SHF or EHF wave reflector electrode may include additional pairs (not shown) of alternating high acoustic impedance/low acoustic metal layers. In multi-layer metal bottom de-tuned acoustic SHF or EHF wave reflector electrode 2013J, the first member of low acoustic impedance metal layer (not shown) may be arranged nearer to a piezoelectric layer (e.g., nearer to bottom piezoelectric layer 201J, e.g., nearer to stack of piezoelectric layers 254J) than second member of high acoustic impedance metal layer (not shown). This arrangement may facilitate suppressing parasitic lateral resonances in operation of the BAW resonator.

In FIG. 2D, an additional intervening high acoustic impedance layer may be present in, multi-layer metal bottom de-tuned acoustic SHF or EHF wave reflector electrode 2013J but is not shown. This additional intervening high acoustic impedance layer may be very thin (e.g. thickness about one tenth or less of an acoustic wavelength of the main resonant frequency of the BAW resonator 2001J). However, in alternative examples, intervening high acoustic impedance layer may be otherwise embodied, e.g., in a very thin additional intervening multi-layer structure (not shown) in which an aggregate thickness of the entire additional intervening multi-layer structure is about one tenth or less of an acoustic wavelength of the main resonant frequency of the BAW resonator 2001J, e.g., various different materials comprising additional intervening multi-layer structure (not shown) in which an aggregate thickness of the entire additional intervening multi-layer structure is about one tenth or less of an acoustic wavelength of the main resonant frequency of the BAW resonator 2001J. As mentioned previously, in bottom de-tuned reflector electrodes 2013J, the first member having the relatively lower acoustic impedance of the first pair may be arranged substantially nearest, e.g. may substantially abut, the first piezoelectric layer (e.g. top piezoelectric layer of the BAW resonator, e.g., piezoelectric stack of the BAW resonator). It is theorized that because any intervening layers are so thin (e.g., in aggregate any intervening multi-layer structures are so thin), despite their presence, there is still facilitation of suppressing parasitic lateral resonances in operation of the BAW resonator.

As discussed, interposer layers shown in FIG. 1A, and as explicitly shown in the simplified diagrams of the various resonators shown in FIGS. 2A, 2B, 2C and 2D may be included and interposed between adjacent piezoelectric layers in the various resonators. Such interposer layers may laterally extend within the mesa structure of the stack of piezoelectric layers a full lateral extent of the stack, e.g., between the etched edge region of the stack and the opposing etched edge region of the stack. However, in some other alternative bulk acoustic wave resonator structures, interposer layers may be patterned during fabrication of the interposer layers (e.g., patterned using masking and selective etching techniques during fabrication of the interposer layers). Such patterned interposer layers need not extend a full lateral extent of the stack (e.g., need not laterally extend to any etched edge regions of the stack.) For example, FIG. 2E shows another alternative bulk acoustic wave resonator structure 2001K, similar to bulk acoustic wave resonator structure 2001J shown in FIG. 2D, but with differences. For example, in the alternative bulk acoustic wave resonator structure 2001K shown in FIG. 2E, patterned interposer layers (e.g., first patterned interposer layer 261K) may be interposed between sequential pairs of opposing axis piezoelectric layers (e.g., first patterned interposer layer 261K may be interposed between a first pair of opposing axis piezoelectric layers 201K, 202K, and a second pair of opposing axis piezoelectric layers 203K, 204K).

FIG. 2E shows an eighteen piezoelectric layer alternating axis stack arrangement having an active region of the bulk acoustic wave resonator structure 2001K sandwiched between overlap of multi-layer metal acoustic SHF or EHF wave reflector top electrode 2015IK and multi-layer metal acoustic SHF or EHF wave reflector bottom electrode 2013K. In FIG. 2E, patterned interposer layers (e.g., first patterned interposer layer 261K) may be patterned to have extent limited to the active region of the bulk acoustic wave resonator structure 2001K sandwiched between overlap of multi-layer metal acoustic SHF or EHF wave reflector top electrode 2015K and multi-layer metal acoustic SHF or EHF wave reflector bottom electrode 2013K. A planarization layer 265K at a limited extent of multi-layer metal acoustic SHF or EHF wave reflector bottom electrode 2013K may facilitate fabrication of the eighteen piezoelectric layer alternating axis stack arrangement (e.g., stack of eighteen piezoelectric layers 201K through 218K).

Patterning of interposer layers may be done in various combinations. For example, some interposer layers need not be patterned (e.g., may be unpatterned) within lateral extent of the stack of piezoelectric layers (e.g., some interposer layers may extend to full lateral extent of the stack of piezoelectric layers). For example, first interposer layer 261J shown in FIG. 2D need not be patterned (e.g., may be unpatterned) within lateral extent of the stack of piezoelectric layers (e.g., first interposer layer 261J may extend to full lateral extent of the stack of piezoelectric layers). For example, in FIG. 2D interposer layers interposed between adjacent sequential pairs of normal axis and reverse axis piezoelectric layers need not be patterned (e.g., may be unpatterned) within lateral extent of the stack of piezoelectric layers (e.g., interposer layers interposed between sequential pairs of normal axis and reverse axis piezoelectric layers may extend to full lateral extent of the stack of piezoelectric layers). For example in FIG. 2D, first interposer layer 261J interposed between first sequential pair of normal axis and reverse axis piezoelectric layers 201J, 202J and adjacent second sequential pair of normal axis and reverse axis piezoelectric layers 203J, 204J need not be patterned within lateral extent of the stack of piezoelectric layers (e.g., first interposer layer 261J may extend to full lateral extent of the stack of piezoelectric layers). In contrast to these unpatterned interposer layers (e.g., in contrast to unpatterned interposer layer 261J) as shown in FIG. 2D, in FIG. 2E patterned interposer layers (e.g., first patterned interposer layer 261K) may be patterned, for example, to have extent limited to the active region of the bulk acoustic wave resonator structure 2001K shown in FIG. 2E.

Figure 3A:
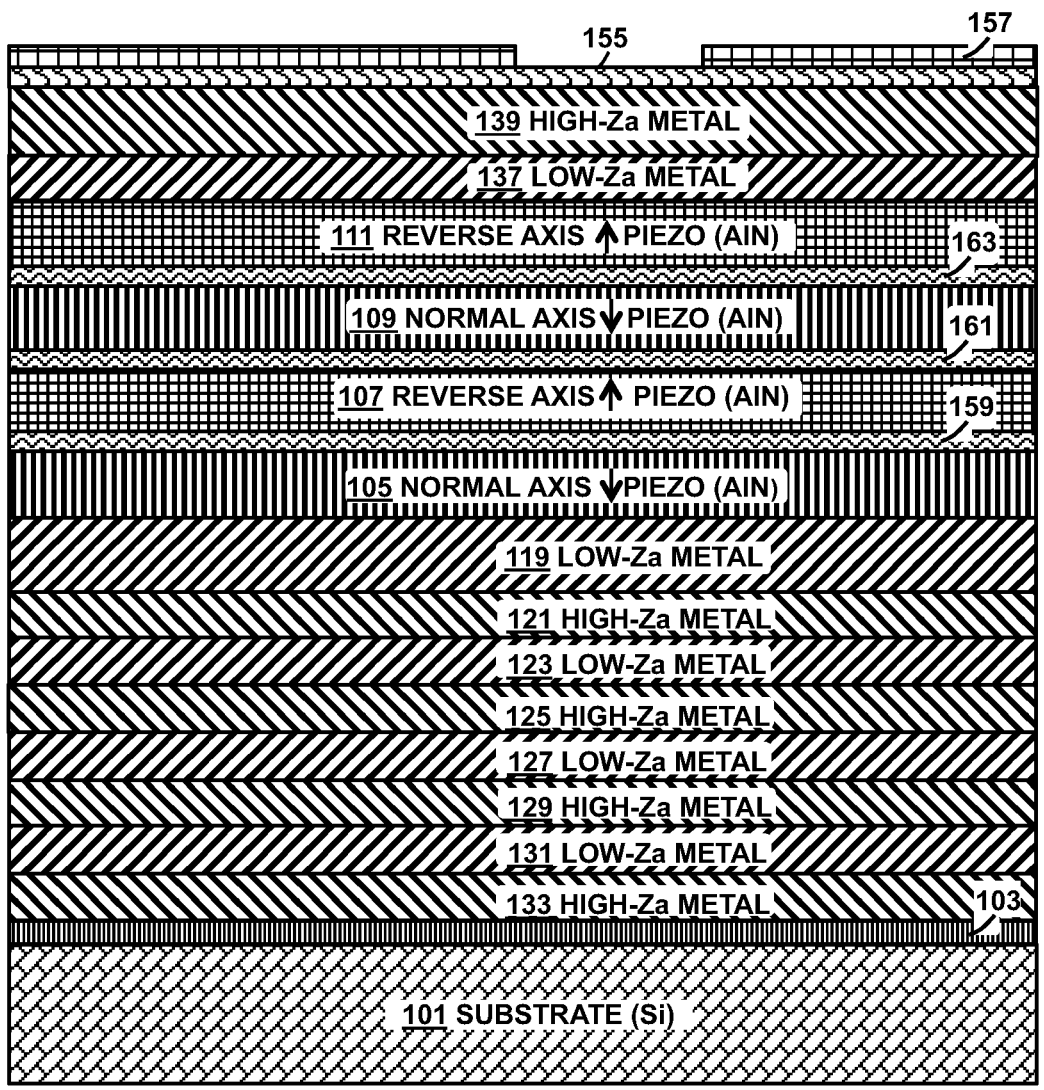
FIGS. 3A through 3E illustrate example integrated circuit structures used to form the example bulk acoustic wave resonator structure of FIG. 1A. Note that although AlN is used as an example piezoelectric layer material, the present disclosure is not intended to be so limited. For example, in some embodiments, the piezoelectric layer material may include other group III material-nitride (III-N) compounds (e.g., any combination of one or more of gallium, indium, and aluminum with nitrogen), and further, any of the foregoing may include doping, for example, of Scandium and/or Magnesium doping.

FIGS. 3A through 3E illustrate example integrated circuit structures used to form the example bulk acoustic wave resonator structure of FIG. 1A. As shown in FIG. 3A, magnetron sputtering may sequentially deposit layers on silicon substrate 101. Initially, a seed layer 103 of suitable material (e.g., aluminum nitride (AlN), e.g., silicon dioxide ($SiO_2$), e.g., aluminum oxide ($Al_2O_3$), e.g., silicon nitride ($Si_3N_4$), e.g., amorphous silicon (a-Si), e.g., silicon carbide (SiC)) may be deposited, for example, by sputtering from a respective target (e.g., from an aluminum, silicon, or silicon carbide target). The seed layer may have a layer thickness in a range from approximately one hundred Angstroms (100 A) to approximately one micron (1 um). In some examples, the seed layer 103 may also be at least partially formed of electrical conductivity enhancing material such as Aluminum (Al) or Gold (Au). Next, successive pairs of alternating layers of high acoustic impedance metal and low acoustic impedance metal may be deposited by alternating sputtering from targets of high acoustic impedance metal and low acoustic impedance metal. For example, sputtering targets of high acoustic impedance metal such as Molybdenum or Tungsten may be used for sputtering the high acoustic impedance metal layers, and sputtering targets of low acoustic impedance metal such as Aluminum or Titanium may be used for sputtering the low acoustic impedance metal layers. For example, the fourth pair of bottom metal electrode layers, 133, 131, may be deposited by sputtering the high acoustic impedance metal for a first bottom metal electrode layer 133 of the pair on the seed layer 103, and then sputtering the low acoustic impedance metal for a second bottom metal electrode layer 131 of the pair on the first layer 133 of the pair. Similarly, the third pair of bottom metal electrode layers, 129, 127, may then be deposited by sequentially sputtering from the high acoustic impedance metal target and the low acoustic impedance metal target. Similarly, the second pair of bottom metal electrodes 125, 123, may then be deposited by sequentially sputtering from the high acoustic impedance metal target and the low acoustic impedance metal target. Similarly, the first pair of bottom metal electrodes 121, 119, may then be deposited by sequentially sputtering from the high acoustic impedance metal target and the low acoustic impedance metal target. Respective layer thicknesses of bottom metal electrode layers of the second, third and fourth pairs 119, 121, 123, 125, 127, 129, 131, 133 may correspond to approximately a quarter wavelength (e.g., a quarter of an acoustic wavelength) of the resonant frequency at the resonator (e.g., respective layer thickness of about six hundred Angstroms (660 A) for the example 24 GHz resonator.) However, in the figures, the first member 119 of the first pair of bottom metal electrode layers for the bottom acoustic reflector is depicted as relatively thicker (e.g., thickness of the first member 119 of the first pair of bottom metal electrode layers is depicted as relatively thicker) than thickness of remainder bottom acoustic layers. For example, a thickness of the first member 119 of the first pair of bottom metal electrode layers may be about 60 Angstroms greater, e.g., substantially greater, than an odd multiple (e.g., 1×, 3×, etc.) of a quarter of a wavelength (e.g., 60 Angstroms greater than one quarter of the acoustic wavelength) for the first member 119 of the first pair of bottom metal electrode layers. For example, if Titanium is used as the low acoustic impedance metal for a 24 GHz resonator (e.g., resonator having a main resonant frequency of about 24 GHz), a thickness for the first member 119 of the first pair of bottom metal electrode layers of the bottom acoustic may be about 690 Angstroms, while respective layer thicknesses shown in the figures for corresponding members of the other pairs of bottom metal electrode layers may be substantially thinner.

A stack of four layers of piezoelectric material, for example, four layers of Aluminum Nitride (AlN) having the wurtzite structure may be deposited by sputtering. For example, bottom piezoelectric layer 105, first middle piezoelectric layer 107, second middle piezoelectric layer 109, and top piezoelectric layer 111 may be deposited by sputtering. The four layers of piezoelectric material in the stack 104, may have the alternating axis arrangement in the respective stack 104. For example the bottom piezoelectric layer 105 may be sputter deposited to have the normal axis orientation, which is depicted in FIG. 3A using the downward directed arrow. The first middle piezoelectric layer 107 may be sputter deposited to have the reverse axis orientation, which is depicted in the FIG. 3A using the upward directed arrow. The second middle piezoelectric layer 109 may have the normal axis orientation, which is depicted in the FIG. 3A using the downward directed arrow. The top piezoelectric layer may have the reverse axis orientation, which is depicted in the FIG. 3A using the upward directed arrow. As mentioned previously herein, polycrystalline thin film AlN may be grown in the crystallographic c-axis negative polarization, or normal axis orientation perpendicular relative to the substrate surface using reactive magnetron sputtering of the Aluminum target in the nitrogen atmosphere. As was discussed in greater detail previously herein, changing sputtering conditions, for example by adding oxygen, may reverse the axis to a crystallographic c-axis positive polarization, or reverse axis, orientation perpendicular relative to the substrate surface.

Interposer layers may be sputtered between sputtering of piezoelectric layers, so as to be sandwiched between piezoelectric layers of the stack. For example, first interposer layer 159, may sputtered between sputtering of bottom piezoelectric layer 105, and the first middle piezoelectric layer 107, so as to be sandwiched between the bottom piezoelectric layer 105, and the first middle piezoelectric layer 107. For example, second interposer layer 161 may be sputtered between sputtering first middle piezoelectric layer 107 and the second middle piezoelectric layer 109 so as to be sandwiched between the first middle piezoelectric layer 107, and the second middle piezoelectric layer 109. For example, third interposer layer 163, may be sputtered between sputtering of second middle piezoelectric layer 109 and the top piezoelectric layer 111 so as to be sandwiched between the second middle piezoelectric layer 109 and the top piezoelectric layer 111.

As discussed previously, one or more of the interposer layers (e.g., interposer layers 159, 161, 163) may be metal interposer layers, e.g., high acoustic impedance metal interposer layers, e.g., Molybdenum metal interposer layers. These may be deposited by sputtering from a metal target. As discussed previously, one or more of the interposer layers (e.g., interposer layers 159, 161, 163) may be dielectric interposer layers, e.g., silicon dioxide interposer layers. These may be deposited by reactive sputtering from a Silicon target in an oxygen atmosphere. Alternatively or additionally, one or more (e.g., one or a plurality of) interposer layers may be formed of different metal layers. For example, high acoustic impedance metal layer such as Tungsten (W), Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited piezoelectric layer. Alternatively or additionally, one or more (e.g., one or a plurality of) interposer layers may be formed of different dielectric layers.

For example, high acoustic impedance dielectric layer such as Hafnium Dioxide (HfO2) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts. Alternatively or additionally, one or more (e.g., one or a plurality of) interposer layers may comprise metal and dielectric for respective interposer layers. For example, high acoustic impedance metal layer such as Tungsten (W), Molybdenum (Mo) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts. Sputtering thickness of interposer layers may be as discussed previously herein. Interposer layers may facilitate sputter deposition of piezoelectric layers. For example, initial sputter deposition of second interposer layer 166 on reverse axis first middle piezoelectric layer 107 may facilitate subsequent sputter deposition of normal axis piezoelectric layer 109.

The first pair of top metal electrode layers, 137, 139, may be deposited by sputtering the low acoustic impedance metal for a first top metal electrode layer 137 of the pair, and then sputtering the high acoustic impedance metal for a second top metal electrode layer 139 of the pair on the first layer 137 of the pair. As shown in the figures, layer thickness may be thinner for the first member 137 of the first pair 137, 139 of top metal electrode layers. For example, the first member 137 of the first pair of top metal electrode layers for the top acoustic reflector is depicted as relatively thinner (e.g., thickness of the first member 137 of the first pair of top metal electrode layers is depicted as relatively thinner) than thickness of remainder top acoustic layers. For example, a thickness of the first member 137 of the first pair of top metal electrode layers may be about 60 Angstroms lesser, e.g., substantially lesser than an odd multiple (e.g., 1×, 3×, etc.) of a quarter of a wavelength (e.g., 60 Angstroms lesser than one quarter of the acoustic wavelength) for the first member 137 of the first pair of top metal electrode layers. For example, if Titanium is used as the low acoustic impedance metal for a 24 GHz resonator (e.g., resonator having a main resonant frequency of about 24 GHz), a thickness for the first member 137 of the first pair of top metal electrode layers of the top acoustic reflector may be about 570 Angstroms, while respective layer thicknesses shown in the figures for corresponding members of the other pairs of top metal electrode layers may be substantially thicker. For example, layer thickness for the second member 139 of the first pair 137, 139 of top metal electrode layers of may correspond to approximately a quarter wavelength (e.g., a quarter acoustic wavelength) of the resonant frequency of the resonator (e.g., respective layer thickness of about six hundred Angstroms (600 A) for the example 24 GHz resonator.) The optional mass load layer 155 may be sputtered from a high acoustic impedance metal target onto the second top metal electrode layer 139 of the pair. Thickness of the optional mass load layer may be as discussed previously herein. The mass load layer 155 may be an additional mass layer to increase electrode layer mass, so as to facilitate the preselected frequency compensation down in frequency (e.g., compensate to decrease resonant frequency). Alternatively, the mass load layer 155 may be a mass load reduction layer, e.g., ion milled mass load reduction layer 155, to decrease electrode layer mass, so as to facilitate the preselected frequency compensation up in frequency (e.g., compensate to increase resonant frequency). Accordingly, in such case, in FIG. 3A mass load reduction layer 155 may representatively illustrate, for example, an ion milled region of the second member 139 of the first pair of electrodes 137, 139 (e.g., ion milled region of high acoustic impedance metal electrode 139).

The plurality of lateral features 157 (e.g., patterned layer 157) may be formed by sputtering a layer of additional mass loading having a layer thickness as discussed previously herein. The plurality of lateral features 157 (e.g., patterned layer 157) may be made by patterning the layer of additional mass loading after it is deposited by sputtering. The patterning may done by photolithographic masking, layer etching, and mask removal. Initial sputtering may be sputtering of a metal layer of additional mass loading from a metal target (e.g., a target of Tungsten (W), Molybdenum (Mo), Titanium (Ti) or Aluminum (Al)). In alternative examples, the plurality of lateral features 157 may be made of a patterned dielectric layer (e.g., a patterned layer of Silicon Nitride (SiN), Silicon Dioxide (SiO2) or Silicon Carbide (SiC)). For example Silicon Nitride, and Silicon Dioxide may be deposited by reactive magnetron sputtering from a silicon target in an appropriate atmosphere, for example Nitrogen, Oxygen or Carbon Dioxide. Silicon Carbide may be sputtered from a Silicon Carbide target.

Figure 3B:
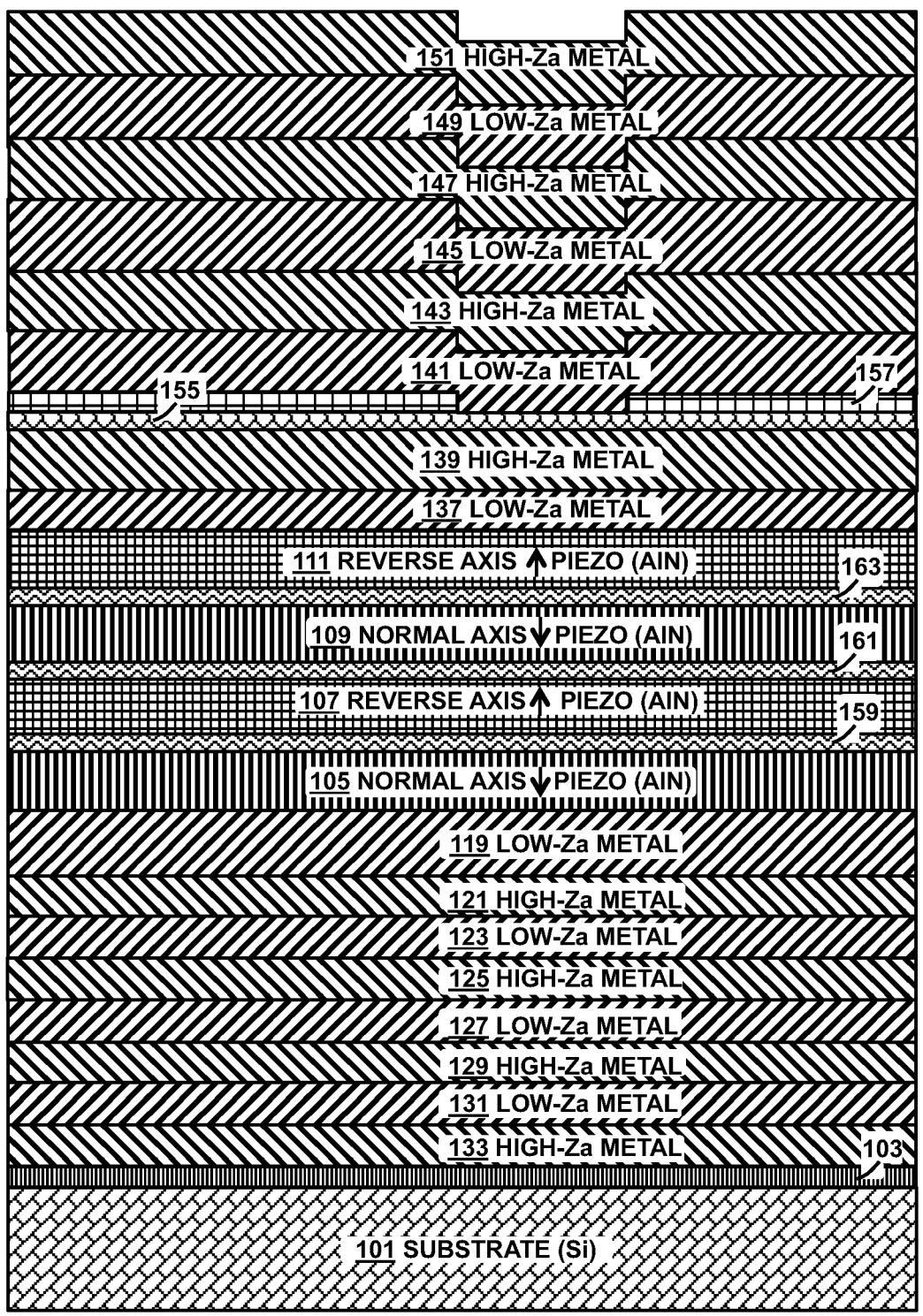

Once the plurality of lateral features 157 have been patterned (e.g., patterned layer 157) as shown in FIG. 3A, sputter deposition of successive additional pairs of alternating layers of high acoustic impedance metal and low acoustic impedance metal may continue as shown in FIG. 3B by alternating sputtering from targets of high acoustic impedance metal and low acoustic impedance metal. For example, sputtering targets of high acoustic impedance metal such as Molybdenum or Tungsten may be used for sputtering the high acoustic impedance metal layers, and sputtering targets of low acoustic impedance metal such as Aluminum or Titanium may be used for sputtering the low acoustic impedance metal layers. For example, the second pair of top metal electrode layers, 141, 143, may be deposited by sputtering the low acoustic impedance metal for a first bottom metal electrode layer 141 of the pair on the plurality of lateral features 157, and then sputtering the high acoustic impedance metal for a second top metal electrode layer 143 of the pair on the first layer 141 of the pair. Similarly, the third pair of top metal electrode layers, 145, 147, may then be deposited by sequentially sputtering from the low acoustic impedance metal target and the high acoustic impedance metal target. Similarly, the fourth pair of top metal electrodes 149, 151, may then be deposited by sequentially sputtering from the low acoustic impedance metal target and the high acoustic impedance metal target. Respective layer thicknesses of top metal electrode layers of the first, second, third and fourth pairs 137, 139, 141, 143, 145, 147, 149, 151 may correspond to approximately a quarter wavelength (e.g., a quarter acoustic wavelength) at the resonant frequency of the resonator (e.g., respective layer thickness of about six hundred Angstroms (600 A) for the example 24 GHz resonator.)

As mentioned previously, and as shown in FIG. 3B, after the lateral features 157 are formed, (e.g., patterned layer 157), they may function as a step feature template, so that subsequent top metal electrode layers formed on top of the lateral features 157 may retain step patterns imposed by step features of the lateral features 157. For example, the second pair of top metal electrode layers 141, 143, the third pair of top metal electrode layers 145, 147, and the fourth pair of top metal electrodes 149, 151, may retain step patterns imposed by step features of the lateral features 157.

Figure 3C:
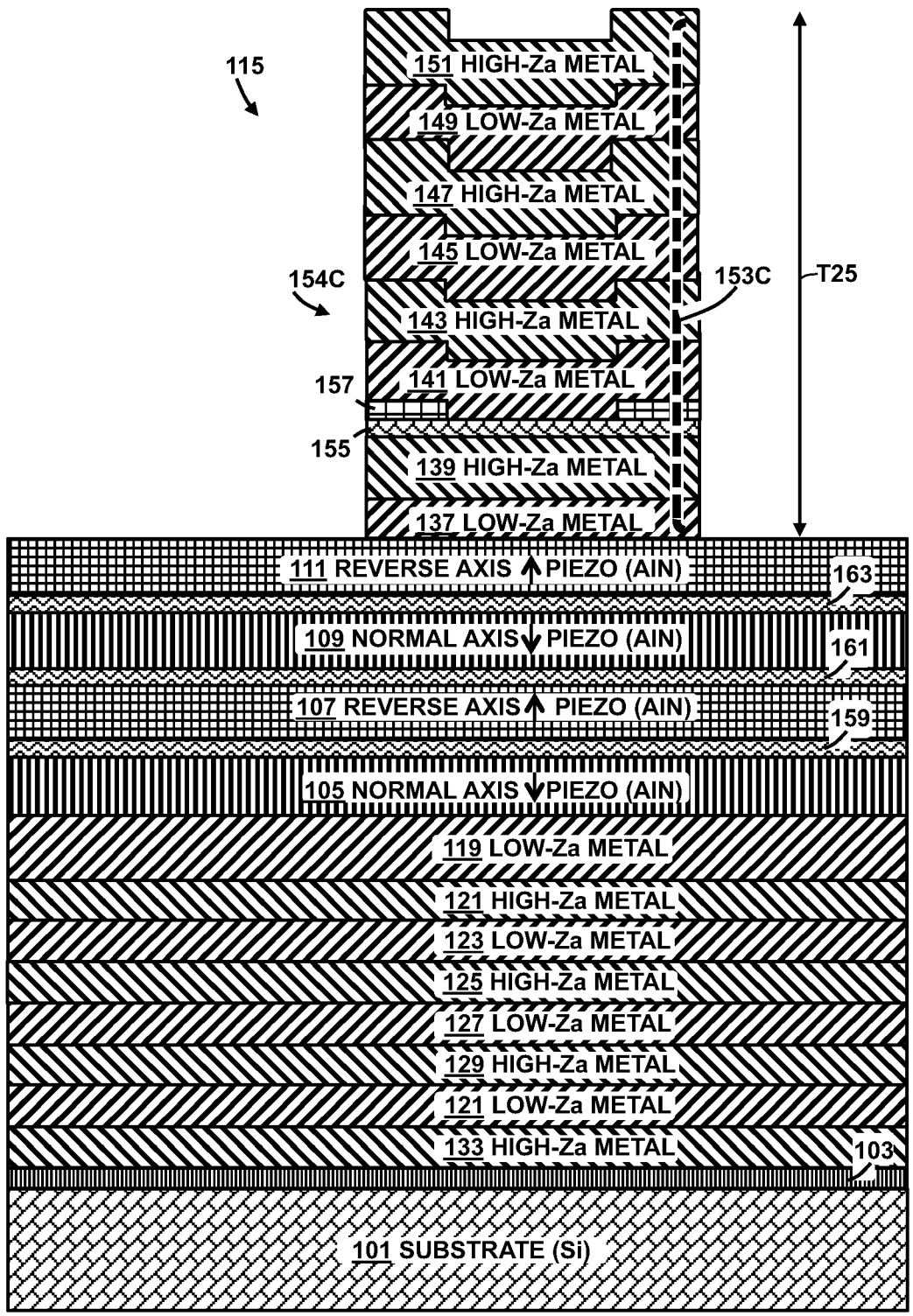

After depositing layers of the fourth pair of top metal electrodes 149, 151 as shown in FIG. 3B, suitable photolithographic masking and etching may be used to form a first portion of etched edge region 153C for the top acoustic reflector 115 as shown in FIG. 3C. A notional heavy dashed line is used in FIG. 3C depicting the first portion of etched edge region 153C associated with the top acoustic reflector 115. The first portion of etched edge region 153C may extend along the thickness dimension T25 of the top acoustic reflector 115. The first portion etched edge region 153C may extend through (e.g., entirely through or partially through) the top acoustic reflector 115. The first portion of the etched edge region 153C may extend through (e.g., entirely through or partially through) the first pair of top metal electrode layers 137, 139. The first portion of the etched edge region 153C may extend through (e.g., entirely through or partially through) the optional mass load layer 155. The first portion of the etched edge region 153C may extend through (e.g., entirely through or partially through) at least one of the lateral features 157 (e.g., through patterned layer 157). The first portion of etched edge region 153C may extend through (e.g., entirely through or partially through) the second pair of top metal electrode layers, 141, 143. The first portion of etched edge region 153C may extend through (e.g., entirely through or partially through) the third pair of top metal electrode layers, 145, 147. The first portion of etched edge region 153C may extend through (e.g., entirely through or partially through) the fourth pair of top metal electrode layers, 149, 151. Just as suitable photolithographic masking and etching may be used to form the first portion of etched edge region 153C at a lateral extremity the top acoustic reflector 115 as shown in FIG. 3C, such suitable photolithographic masking and etching may likewise be used to form another first portion of a laterally opposing etched edge region 154C at an opposing lateral extremity the top acoustic reflector 115, e.g., arranged laterally opposing or opposite from the first portion of etched edge region 153C, as shown in FIG. 3C. The another first portion of the laterally opposing etched edge region 154C may extend through (e.g., entirely through or partially through) the opposing lateral extremity of the top acoustic reflector 115, e.g., arranged laterally opposing or opposite from the first portion of etched edge region 153C, as shown in FIG. 3C. The mesa structure (e.g., third mesa structure) corresponding to the top acoustic reflector 115 may extend laterally between (e.g., may be formed between) etched edge region 153C and laterally opposing etched edge region 154C. Dry etching may be used, e.g., reactive ion etching may be used to etch the materials of the top acoustic reflector. Chlorine based reactive ion etch may be used to etch Aluminum, in cases where Aluminum is used in the top acoustic reflector. Fluorine based reactive ion etch may be used to etch Tungsten (W), Molybdenum (Mo), Titanium (Ti), Silicon Nitride (SiN), Silicon Dioxide (SiO2) and/or Silicon Carbide (SiC) in cases where these materials are used in the top acoustic reflector.

Figure 3D:
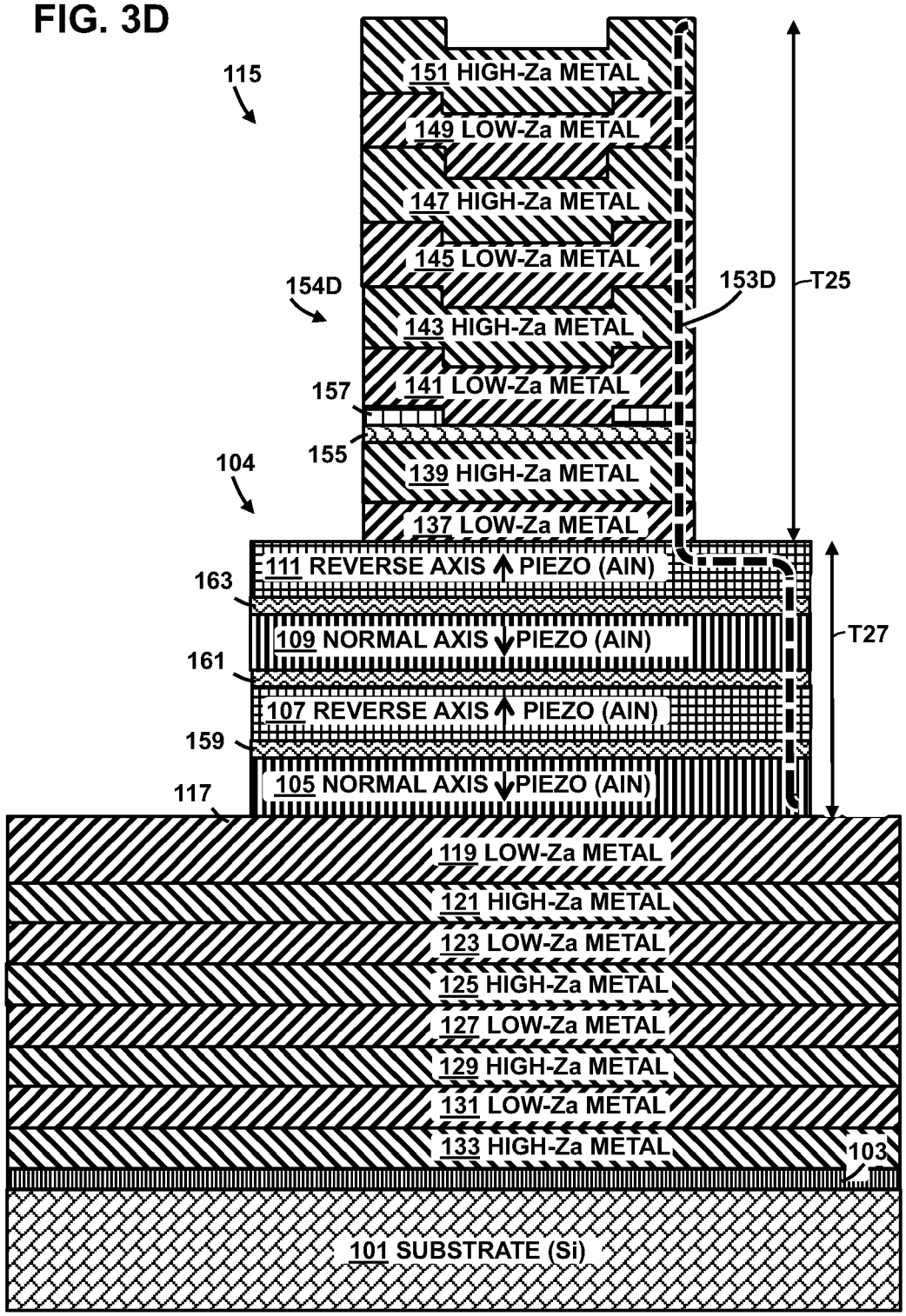

After etching to form the first portion of etched edge region 153C for top acoustic reflector 115 as shown in FIG. 3C, additional suitable photolithographic masking and etching may be used to form elongated portion of etched edge region 153D for top acoustic reflector 115 and for the stack 104 of four piezoelectric layers 105, 107, 109, 111 as shown in FIG. 3D. A notional heavy dashed line is used in FIG. 3D depicting the elongated portion of etched edge region 153D associated with the stack 104 of four piezoelectric layers 105, 107, 109, 111 and with the top acoustic reflector 115. Accordingly, the elongated portion of etched edge region 153D shown in FIG. 3D may extend through (e.g., entirely through or partially through) the fourth pair of top metal electrode layers, 149, 151, the third pair of top metal electrode layers, 145, 147, the second pair of top metal electrode layers, 141, 143, at least one of the lateral features 157 (e.g., through patterned layer 157), the optional mass load layer 155, the first pair of top metal electrode layers 137, 139 of the top acoustic reflector 115. The elongated portion of etched edge region 153D may extend through (e.g., entirely through or partially through) the stack 104 of four piezoelectric layers 105, 107, 109, 111. The elongated portion of etched edge region 153D may extend through (e.g., entirely through or partially through) the first piezoelectric layer, 105, e.g., having the normal axis orientation, first interposer layer 159, first middle piezoelectric layer, 107, e.g., having the reverse axis orientation, second interposer layer 161, second middle piezoelectric layer, 109, e.g., having the normal axis orientation, third interposer layer 163, and top piezoelectric layer 111, e.g., having the reverse axis orientation. The elongated portion of etched edge region 153D may extend along the thickness dimension T25 of the top acoustic reflector 115. The elongated portion of etched edge region 153D may extend along the thickness dimension T27 of the stack 104 of four piezoelectric layers 105, 107, 109, 111. Just as suitable photolithographic masking and etching may be used to form the elongated portion of etched edge region 153D at the lateral extremity the top acoustic reflector 115 and at a lateral extremity of the stack 104 of four piezoelectric layers 105, 107, 109, 111 as shown in FIG. 3D, such suitable photolithographic masking and etching may likewise be used to form another elongated portion of the laterally opposing etched edge region 154D at the opposing lateral extremity the top acoustic reflector 115 and the stack 104 of four piezoelectric layers 105, 107, 109, 111, e.g., arranged laterally opposing or opposite from the elongated portion of etched edge region 153D, as shown in FIG. 3D. The another elongated portion of the laterally opposing etched edge region 154D may extend through (e.g., entirely through or partially through) the opposing lateral extremity of the top acoustic reflector 115 and the stack of four piezoelectric layers 105, 107, 109, 111, e.g., arranged laterally opposing or opposite from the elongated portion of etched edge region 153D, as shown in FIG. 3D. The mesa structure (e.g., third mesa structure) corresponding to the top acoustic reflector 115 may extend laterally between (e.g., may be formed between) etched edge region 153D and laterally opposing etched edge region 154D. The mesa structure (e.g., first mesa structure) corresponding to stack 104 of the example four piezoelectric layers may extend laterally between (e.g., may be formed between) etched edge region 153D and laterally opposing etched edge region 154D. Dry etching may be used, e.g., reactive ion etching may be used to etch the materials of the stack 104 of four piezoelectric layers 105, 107, 109, 111 and any interposer layers. For example, Chlorine based reactive ion etch may be used to etch Aluminum Nitride piezoelectric layers. For example, Fluorine based reactive ion etch may be used to etch Tungsten (W), Molybdenum (Mo), Titanium (Ti), Silicon Nitride (SiN), Silicon Dioxide (SiO2) and/or Silicon Carbide (SiC) in cases where these materials are used interposer layers.

Figure 3E:
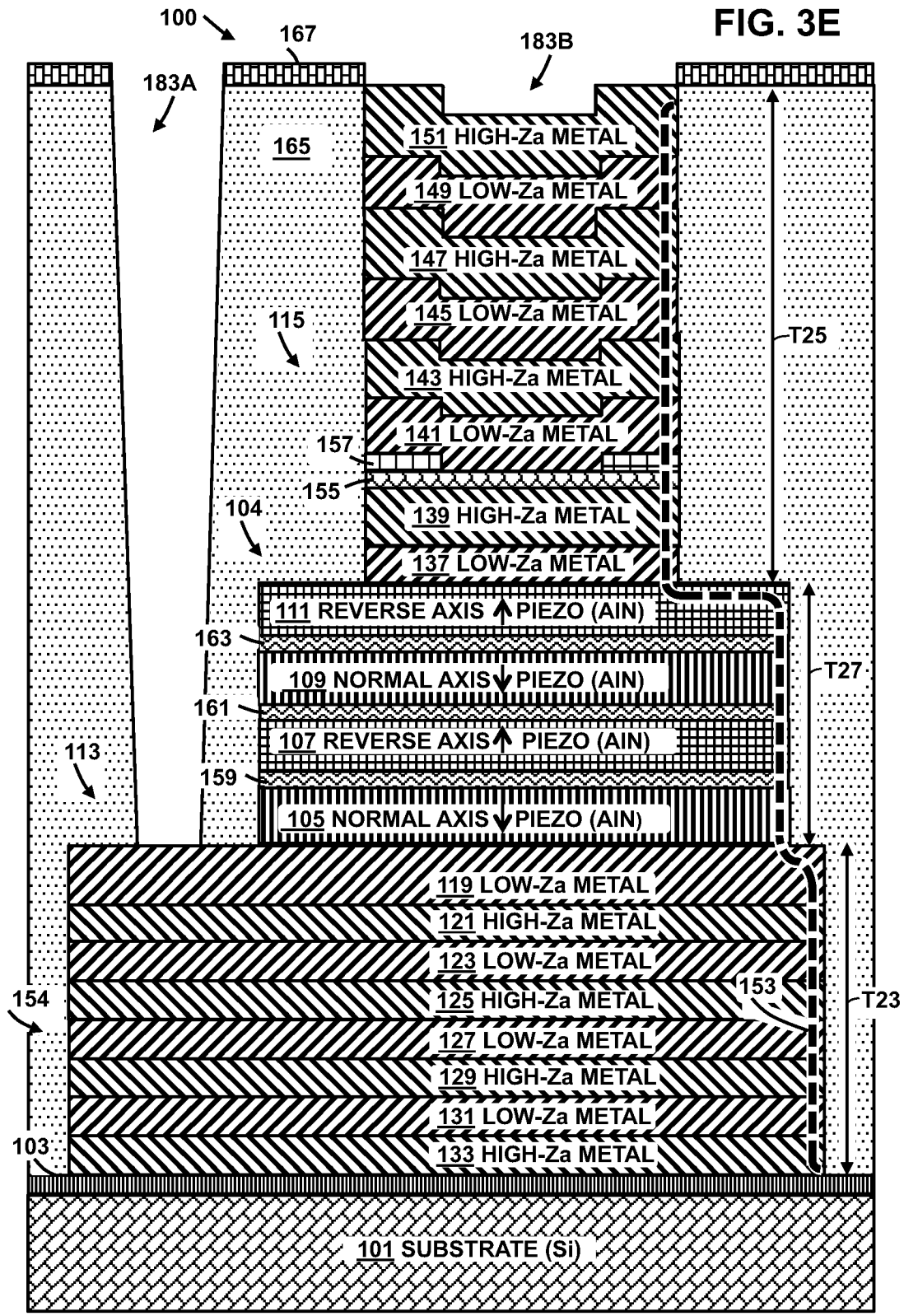

After etching to form the elongated portion of etched edge region 153D for top acoustic reflector 115 and the stack 104 of four piezoelectric layers 105, 107, 109, 111 as shown in FIG. 3D, further additional suitable photolithographic masking and etching may be used to form etched edge region 153D for top acoustic reflector 115 and for the stack 104 of four piezoelectric layers 105, 107, 109, 111 and for bottom acoustic reflector 113 as shown in FIG. 3E. The notional heavy dashed line is used in FIG. 3E depicting the etched edge region 153 associated with the stack 104 of four piezoelectric layers 105, 107, 109, 111 and with the top acoustic reflector 115 and with the bottom acoustic reflector 113. The etched edge region 153 may extend along the thickness dimension T25 of the top acoustic reflector 115. The etched edge region 153 may extend along the thickness dimension T27 of the stack 104 of four piezoelectric layers 105, 107, 109, 111. The etched edge region 153 may extend along the thickness dimension T23 of the bottom acoustic reflector 113. Just as suitable photolithographic masking and etching may be used to form the etched edge region 153 at the lateral extremity the top acoustic reflector 115 and at the lateral extremity of the stack 104 of four piezoelectric layers 105, 107, 109, 111 and at a lateral extremity of the bottom acoustic reflector 113 as shown in FIG. 3E, such suitable photolithographic masking and etching may likewise be used to form another laterally opposing etched edge region 154 at the opposing lateral extremity of the top acoustic reflector 115 and the stack 104 of four piezoelectric layers 105, 107, 109, 111, and the bottom acoustic reflector 113, e.g., arranged laterally opposing or opposite from the etched edge region 153, as shown in FIG. 3E. The laterally opposing etched edge region 154 may extend through (e.g., entirely through or partially through) the opposing lateral extremity of the top acoustic reflector 115 and the stack of four piezoelectric layers 105, 107, 109, 111, and the bottom acoustic reflector 113 e.g., arranged laterally opposing or opposite from the etched edge region 153, as shown in FIG. 3E.

After the foregoing etching to form the etched edge region 153 and the laterally opposing etched edge region 154 of the resonator 100 shown in FIG. 3E, a planarization layer 165 may be deposited. A suitable planarization material (e.g., Silicon Dioxide (SiO2), Hafnium Dioxide (HfO2), Polyimide, or BenzoCyclobutene (BCB)). These materials may be deposited by suitable methods, for example, chemical vapor deposition, standard or reactive magnetron sputtering (e.g., in cases of SiO2 or HfO2) or spin coating (e.g., in cases of Polyimide or BenzoCyclobutene (BCB)). An isolation layer 167 may also be deposited over the planarization layer 165. A suitable low dielectric constant (low-k), low acoustic impedance (low-Za) material may be used for the isolation layer 167, for example polyimide, or BenzoCyclobutene (BCB). These materials may be deposited by suitable methods, for example, chemical vapor deposition, standard or reactive magnetron sputtering or spin coating. After planarization layer 165 and the isolation layer 167 have been deposited, additional procedures of photolithographic masking, layer etching, and mask removal may be done to form a pair of etched acceptance locations 183A, 183B for electrical interconnections. Reactive ion etching or inductively coupled plasma etching with a gas mixture of argon, oxygen and a fluorine containing gas such as tetrafluoromethane (CF4) or Sulfur hexafluoride (SF6) may be used to etch through the isolation layer 167 and the planarization layer 165 to form the pair of etched acceptance locations 183A, 183B for electrical interconnections. Photolithographic masking, sputter deposition, and mask removal may then be used form electrical interconnects in the pair of etched acceptance locations 183A, 183B shown in FIG. 3E, so as to provide for the bottom electrical interconnect 169 and top electrical interconnect 171 that are shown explicitly in FIG. 1A. A suitable material, for example Gold (Au) may be used for the bottom electrical interconnect 169 and top electrical interconnect 171.

FIGS. 4A through 4G show alternative example bulk acoustic wave resonators 400A through 400G to the example bulk acoustic wave resonator 100A shown in FIG. 1A. For example, the bulk acoustic wave resonator 400A, 400E shown in FIG. 4A, 4E may have a cavity 483A, 483E, e.g., an air cavity 483A, 483E, e.g., extending into substrate 401A, 401E, e.g., extending into silicon substrate 401A, 401E, e.g., arranged below bottom acoustic reflector 413A, 413E. The cavity 483A, 483E may be formed using techniques known to those with ordinary skill in the art. For example, the cavity 483A, 483E may be formed by initial photolithographic masking and etching of the substrate 401A, 401E (e.g., silicon substrate 401A, 401E), and deposition of a sacrificial material (e.g., phosphosilicate glass (PSG)). The phosphosilicate glass (PSG) may comprise 8% phosphorous and 92% silicon dioxide. The resonator 400A, 400E may be formed over the sacrificial material (e.g., phosphosilicate glass (PSG)). The sacrificial material may then be selectively etched away beneath the resonator 400A, 400E, leaving cavity 483A, 483E beneath the resonator 400A, 400E. For example phosphosilicate glass (PSG) sacrificial material may be selectively etched away by hydrofluoric acid beneath the resonator 400A, 400E, leaving cavity 483A, 483E beneath the resonator 400A, 400E. The cavity 483A, 483E may, but need not, be arranged to provide acoustic isolation of the structures, e.g., bottom acoustic reflector 413A, 413E, e.g., stack 404A, 404E of piezoelectric layers, e.g., resonator 400A, 400E from the substrate 401A, 401E.

Figure 4A:
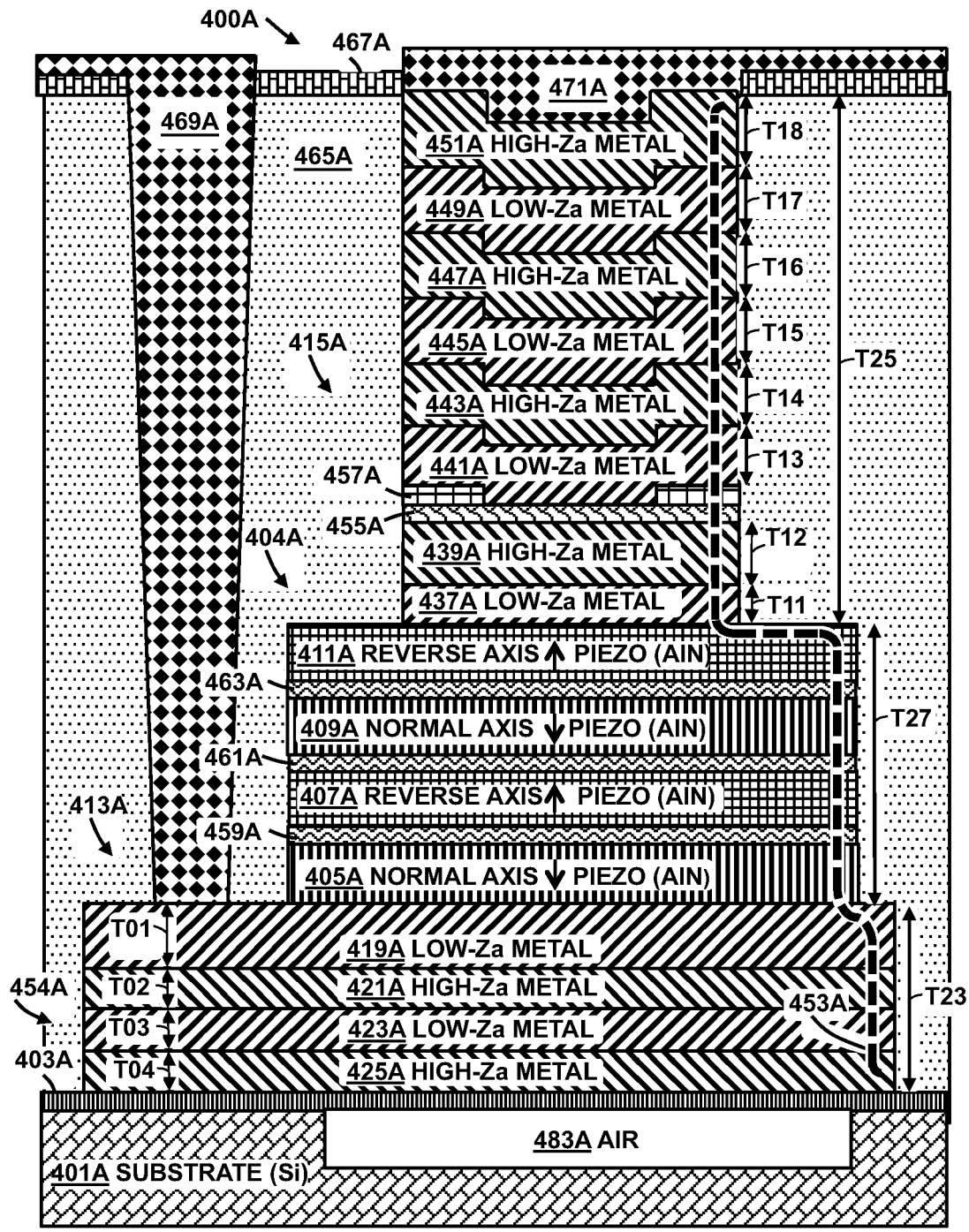
FIGS. 4A through 4G show alternative example bulk acoustic wave resonators to the example bulk acoustic wave resonator structures shown in FIG. 1A.
Figure 4B:
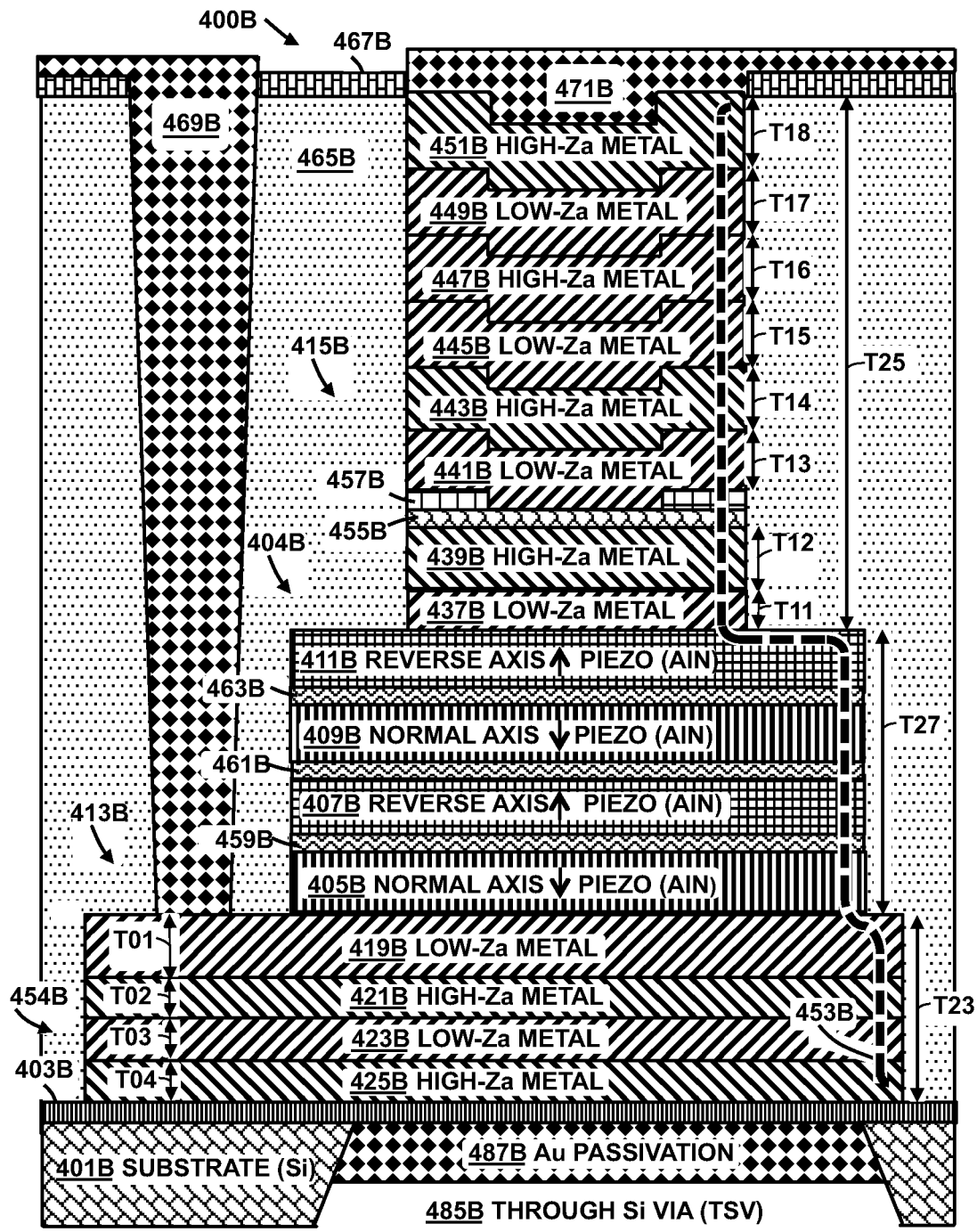
Figure 4C:
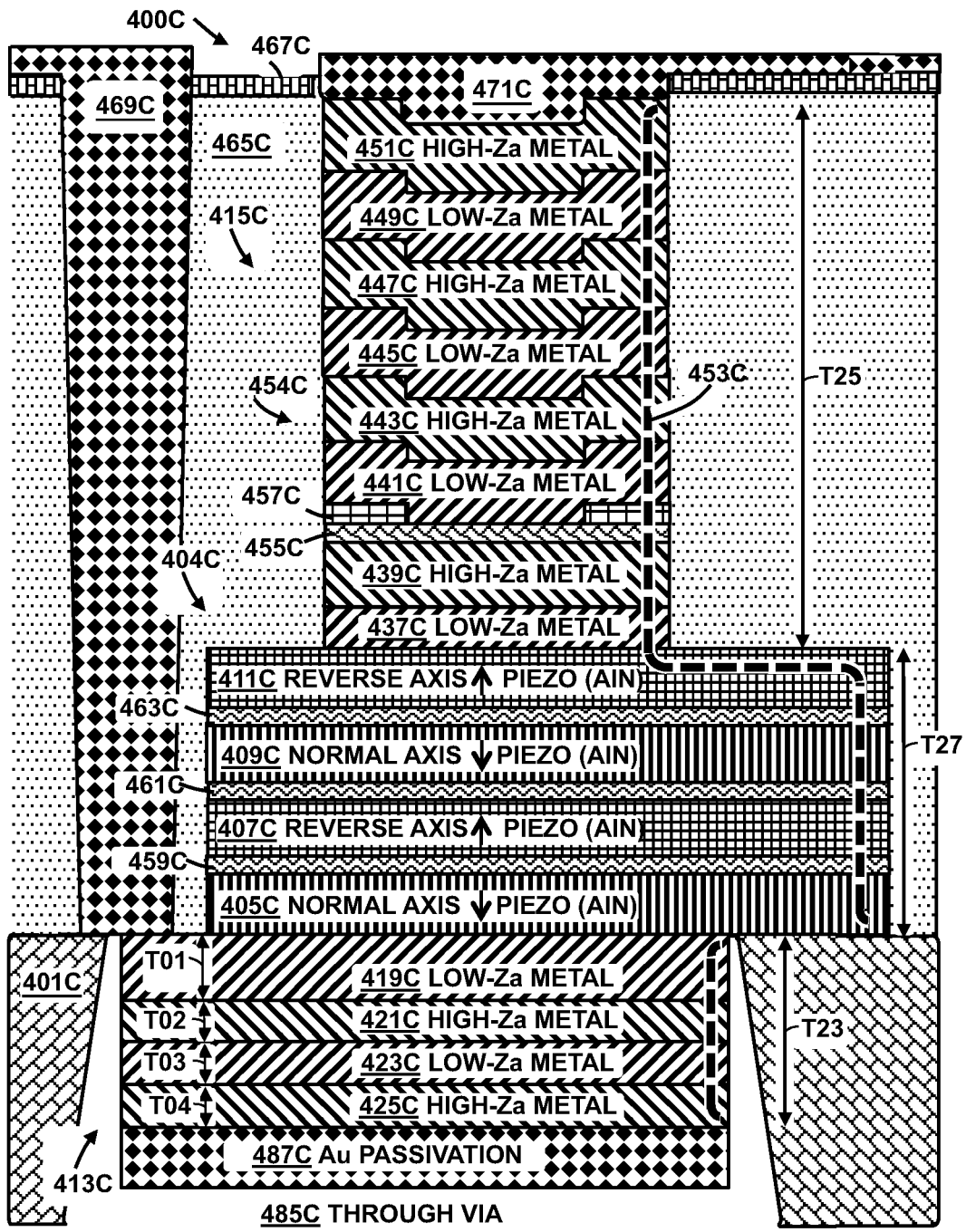
Figure 4D:
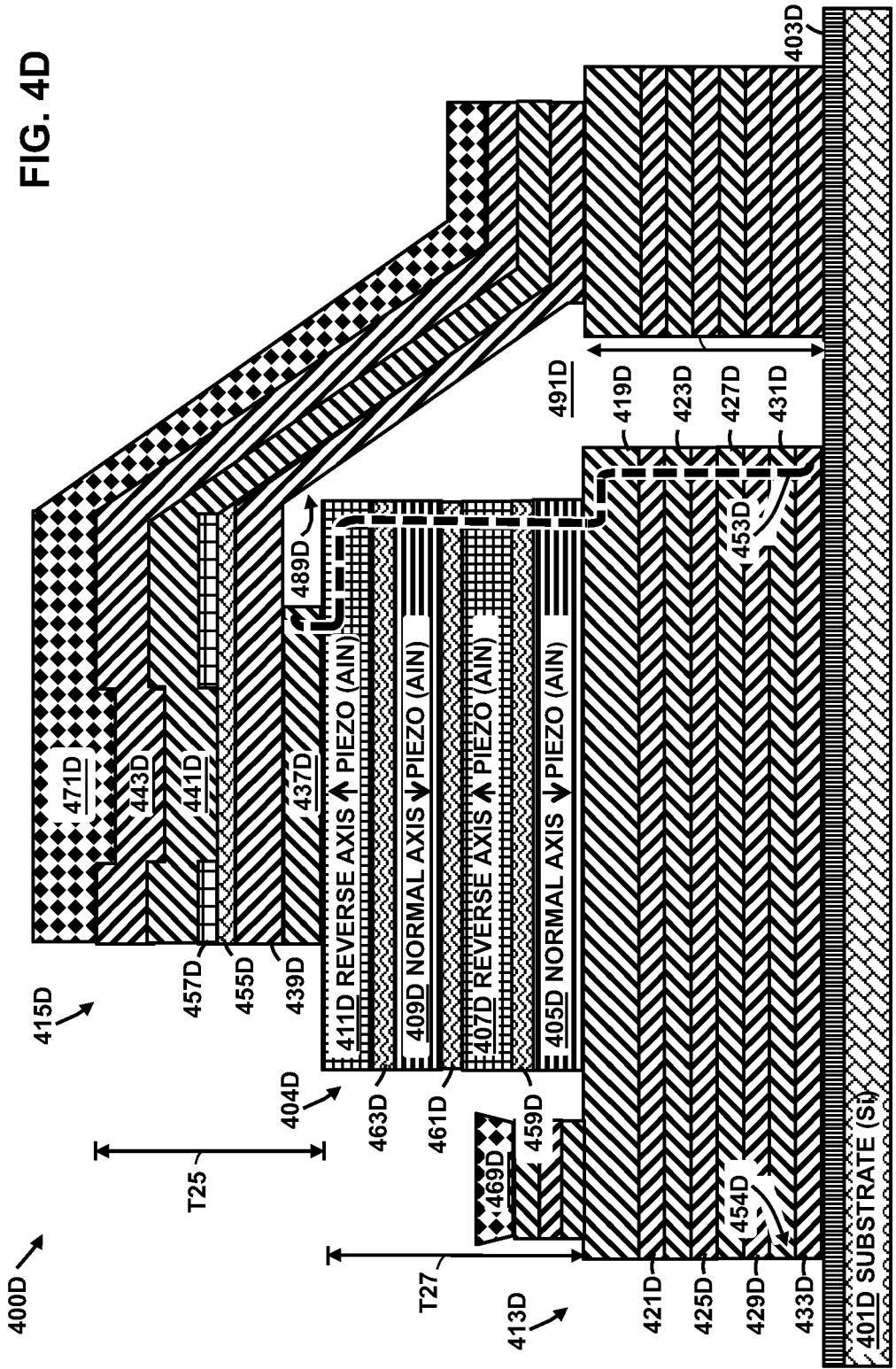
Figure 4E:
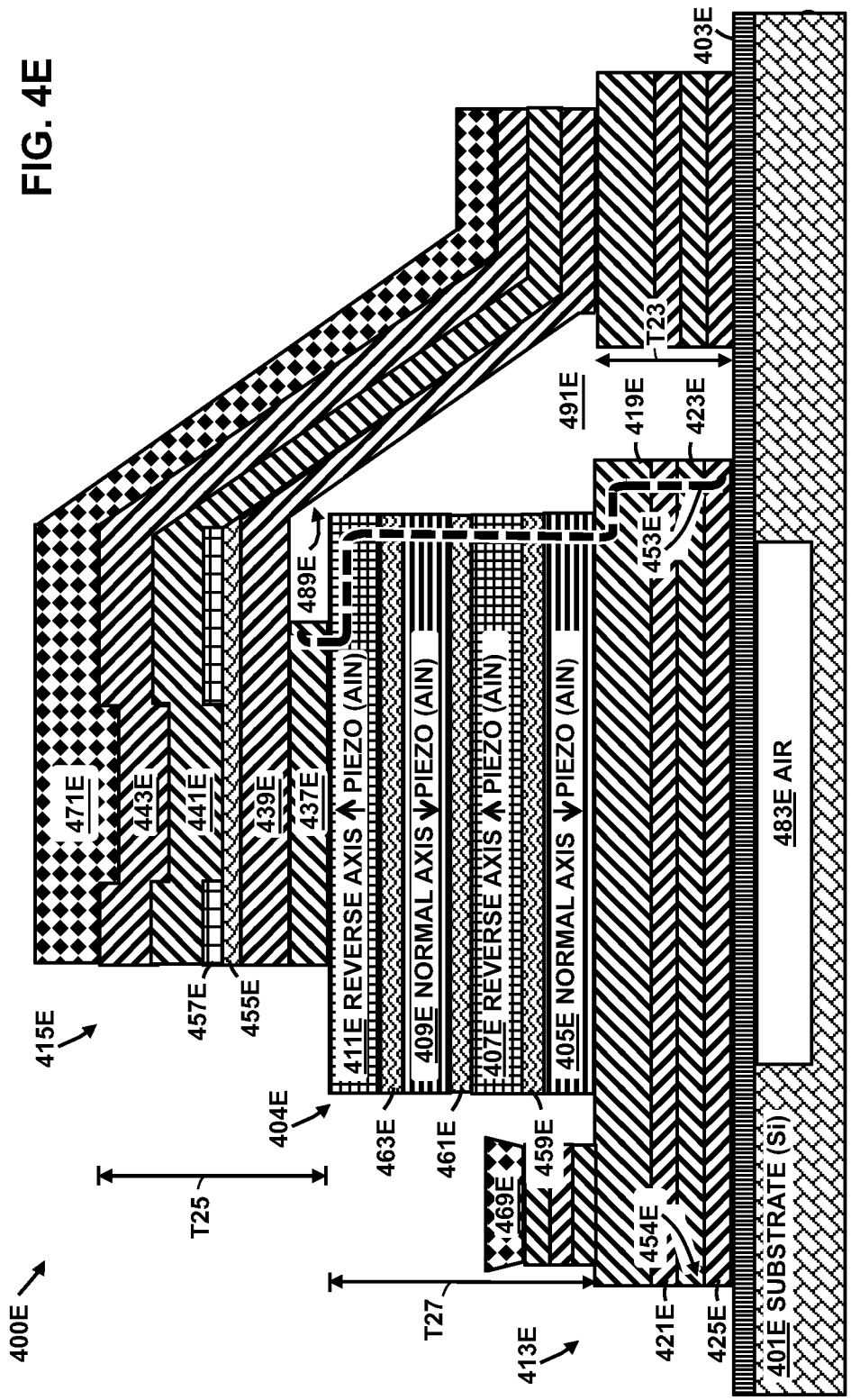
Figure 4F:
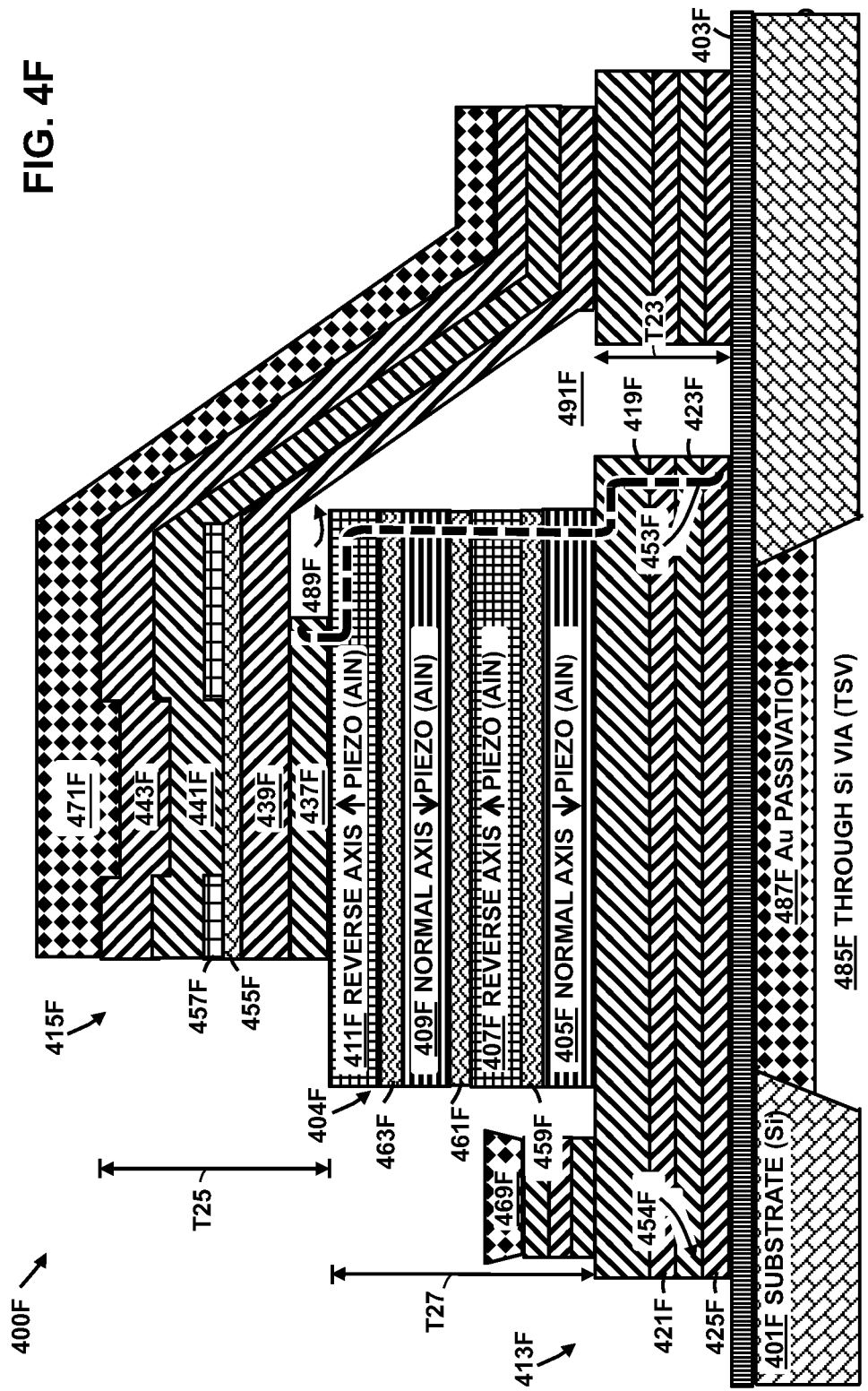
Figure 4G:
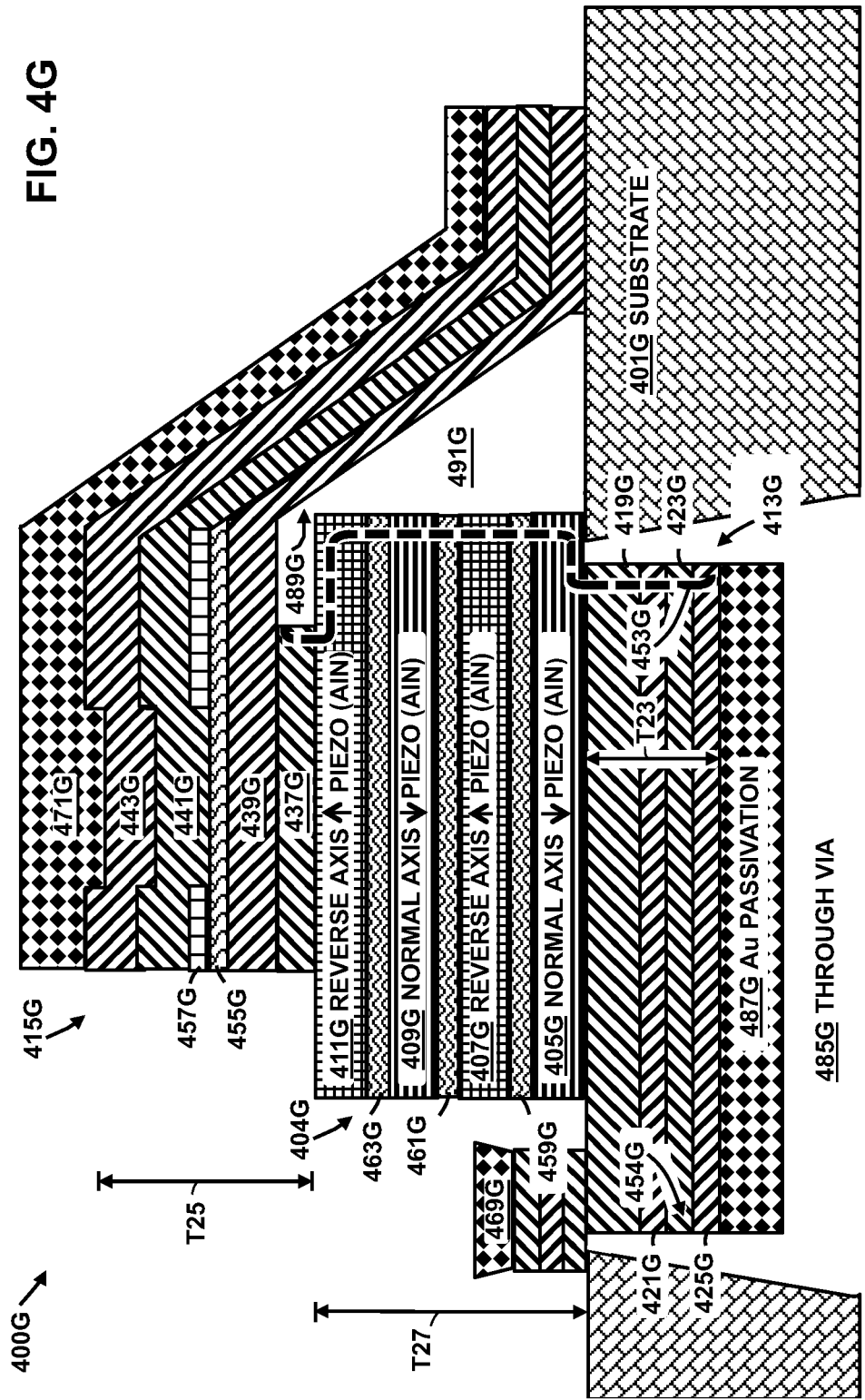

Similarly, in FIGS. 4B, 4C, 4F and 4G, a via 485B, 485C, 485F, 485G (e.g., through silicon via 485B, 485F, e.g., through silicon carbide via 485C, 485G) may, but need not, be arranged to provide acoustic isolation of the structures, e.g., bottom acoustic reflector 413B, 413C, 413F, 413G, e.g., stack 404B, 404C, 404F, 404G, of piezoelectric layers, e.g., resonator 400B, 400C, 400F, 400G from the substrate 401B, 401C, 401F, 401G. The via 485B, 485C, 485F, 485G (e.g., through silicon via 485B, 485F, e.g., through silicon carbide via 485C, 485G) may be formed using techniques (e.g., using photolithographic masking and etching techniques) known to those with ordinary skill in the art. For example, in FIGS. 4B and 4F, backside photolithographic masking and etching techniques may be used to form the through silicon via 485B, 485F, and an additional passivation layer 487B, 487F may be deposited, after the resonator 400B, 400F is formed. For example, in FIGS. 4C and 4G, backside photolithographic masking and etching techniques may be used to form the through silicon carbide via 485C, 485G, after the top acoustic reflector 415C, 415G and stack 404C, 404G of piezoelectric layers are formed. In FIGS. 4C and 4G, after the through silicon carbide via 485C, 485G, is formed, backside photolithographic masking and deposition techniques may be used to form bottom acoustic reflector 413C, 413G, and additional passivation layer 487C, 487G.

In FIGS. 4A, 4B, 4C, 4E, 4F, 4G, bottom acoustic reflector 413A, 413B, 413C, 413E, 413F, 413G, may include the acoustically reflective bottom electrode stack of the plurality of bottom metal electrode layers, in which thicknesses of the bottom metal electrode layers may be related to wavelength (e.g., acoustic wavelength) at the main resonant frequency of the example resonator 400A, 400B, 400C, 400E, 400F, 400G. Respective layer thicknesses, (e.g., T02 through T04, explicitly shown in FIGS. 4A, 4B, 4C) for members of the pairs of bottom metal electrode layers may be about one quarter of the wavelength (e.g., one quarter acoustic wavelength) at the main resonant frequency of the example resonators 400A, 400B, 400C, 400E, 400F, 400G. Relatively speaking, in various alternative designs of the example resonators 400A, 400B, 400C, 400E, 400F, 400G, for relatively lower main resonant frequencies (e.g., five Gigahertz (5 GHz)) and having corresponding relatively longer wavelengths (e.g., longer acoustic wavelengths), may have relatively thicker bottom metal electrode layers in comparison to other alternative designs of the example resonators 400A, 400B, 400C, 400E, 400F, 400G, for relatively higher main resonant frequencies (e.g., twenty-four Gigahertz (24 GHz)). There may be corresponding longer etching times to form, e.g., etch through, the relatively thicker bottom metal electrode layers in designs of the example resonator 400A, 400B, 400C, 400E, 400F, 400G, for relatively lower main resonant frequencies (e.g., five Gigahertz (5 GHz)). Accordingly, in designs of the example resonators 400A, 400B, 400C, 400E, 400F, 400G, for relatively lower main resonant frequencies (e.g., five Gigahertz (5 GHz)) having the relatively thicker bottom metal electrode layers, there may (but need not) be an advantage in etching time in having a relatively fewer number (e.g., four (4)) of bottom metal electrode layers, shown in 4A, 4B, 4C, 4E, 4F, 4G, in comparison to a relatively larger number (e.g., eight (8)) of bottom metal electrode layers, shown in FIG. 1A and in FIG. 4D. The relatively larger number (e.g., eight (8)) of bottom metal electrode layers, shown in FIGS. 1A and 1n FIG. 4D may (but need not) provide for relatively greater acoustic isolation than the relatively fewer number (e.g., four (4)) of bottom metal electrode layers. However, in FIGS. 4A and 4E the cavity 483A, 483E, (e.g., air cavity 483A, 483E) may (but need not) be arranged to provide acoustic isolation enhancement relative to some designs without the cavity 483A, 483E. Similarly, in FIGS. 4B, 4C, 4F, 4G, the via 483B, 483C, 483F, 483G, (e.g., through silicon via 485B, 485F, e.g., through silicon carbide via 485C, 485G) may (but need not) be arranged to provide acoustic isolation enhancement relative to some designs without the via 483B, 483C, 483F, 483G.

In FIGS. 4A and 4E, the cavity 483A, 483E may (but need not) be arranged to compensate for relatively lesser acoustic isolation of the relatively fewer number (e.g., four (4)) of bottom metal electrode layers. In FIGS. 4A and 4E, the cavity 483A, 483E may (but need not) be arranged to provide acoustic isolation benefits, while retaining possible electrical conductivity improvements and etching time benefits of the relatively fewer number (e.g., four (4)) of bottom metal electrode layers, e.g., particularly in designs of the example resonator 400A, 400E, for relatively lower main resonant frequencies (e.g., five Gigahertz (5 GHz)). Similarly, in FIGS. 4B, 4C, 4F, 4G, the via 483B, 483C, 483F, 483G, may (but need not) be arranged to compensate for relatively lesser acoustic isolation of the relatively fewer number (e.g., four (4)) of bottom metal electrode layers. In FIGS. 4B, 4C, 4F, 4G, the via 483B, 483C, 483F, 483G, may (but need not) be arranged to provide acoustic isolation benefits, while retaining possible electrical conductivity improvement benefits and etching time benefits of the relatively fewer number (e.g., four (4)) of bottom metal electrode layers, e.g., particularly in designs of the example resonator 400B, 400C, 400F, 400G, for relatively lower main resonant frequencies (e.g., five Gigahertz (5 GHz), e.g., below six Gigahertz (6 GHz), e.g., below five Gigahertz (5 GHz)).

FIGS. 4D through 4G show alternative example bulk acoustic wave resonators 400D through 400G to the example bulk acoustic wave resonator 100A shown in FIG. 1A, in which the top acoustic reflector, 415D through 415G, may comprise a lateral connection portion, 489D through 489G, (e.g., bridge portion, 489D through 489G), of the top acoustic reflector, 415D through 415G. A gap, 491D through 491G, may be formed beneath the lateral connection portion, 489D through 489G, (e.g., bridge portion, 489D through 489G), of the top acoustic reflector 415D through 415G. The gap, 491D through 491G, may be arranged adjacent to the etched edge region, 453D through 453G, of the example resonators 400D through 400G.

For example, the gap, 491D through 491G, may be arranged adjacent to where the etched edge region, 453D through 453G, extends through (e.g., extends entirely through or extends partially through) the stack 404D through 404G, of piezoelectric layers, for example along the thickness dimension T27 of the stack 404D through 404G. For example, the gap, 491D through 491G, may be arranged adjacent to where the etched edge region, 453D through 453G, extends through (e.g., extends entirely through or extends partially through) the bottom piezoelectric layer 405D through 405G. For example, the gap, 491D through 491G, may be arranged adjacent to where the etched edge region, 453D through 453G, extends through (e.g., extends entirely through or extends partially through) the bottom piezoelectric layer 405D through 405G. For example, the gap, 491D through 491G, may be arranged adjacent to where the etched edge region, 453D through 453G, extends through (e.g., extends entirely through or extends partially through) the first middle piezoelectric layer 407D through 407G. For example, the gap, 491D through 491G, may be arranged adjacent to where the etched edge region, 453D through 453G, extends through (e.g., extends entirely through or extends partially through) the second middle piezoelectric layer 409D through 409G. For example, the gap, 491D through 491G, may be arranged adjacent to where the etched edge region, 453D through 453G, extends through (e.g., extends entirely through or extends partially through) the top piezoelectric layer 411D through 411G. For example, the gap, 491D through 491G, may be arranged adjacent to where the etched edge region, 453D through 453G, extends through (e.g., extends entirely through or extends partially through) one or more interposer layers (e.g., first interposer layer, 495D through 459G, second interposer layer, 461D through 461G, third interposer layer 411D through 411G).

For example, as shown in FIGS. 4D through 4G, the gap, 491D through 491G, may be arranged adjacent to where the etched edge region, 453D through 453G, extends through (e.g., extends partially through) the top acoustic reflector 415D through 415G, for example partially along the thickness dimension T25 of the top acoustic reflector 415D through 415G. For example, the gap, 491D through 491G, may be arranged adjacent to where the etched edge region, 453D through 453G, extends through (e.g., extends entirely through or extends partially through) the first member, 437D through 437G, of the first pair of top electrode layers, 437D through 437G, 439D through 439G.

For example, as shown in FIGS. 4D through 4F, the gap, 491D through 491F, may be arranged adjacent to where the etched edge region, 453D through 453F, extends through (e.g., extends entirely through or extends partially through) the bottom acoustic reflector 413D through 413F, for example along the thickness dimension T23 of the bottom acoustic reflector 413D through 413F. For example, the gap, 491D through 491F, may be arranged adjacent to where the etched edge region, 453D through 453F, extends through (e.g., extends entirely through or extends partially through) the first pair of bottom electrode layers, 419D through 419F, 421D through 421F. For example, the gap, 491D through 491F, may be arranged adjacent to where the etched edge region, 453D through 453F, extends through (e.g., extends entirely through or extends partially through) the second pair of bottom electrode layers, 423D through 423F, 425D through 425F.

For example, as shown in FIGS. 4D through 4F, the etched edge region, 453D through 453F, may extend through (e.g., entirely through or partially through) the bottom acoustic reflector, 413D through 413F, and through (e.g., entirely through or partially through) one or more of the piezoelectric layers, 405D through 405F, 407D through 407F, 409D through 409F, 411D through 411F, to the lateral connection portion, 489D through 489G, (e.g., to the bridge portion, 489D through 489G), of the top acoustic reflector, 415D through 415F.

As shown in FIGS. 4D-4G, lateral connection portion, 489D through 489G, (e.g., bridge portion, 489D through 489G), of top acoustic reflector, 415D through 415G, may be a multi-layer lateral connection portion, 415D through 415G, (e.g., a multi-layer metal bridge portion, 415D through 415G, comprising differing metals, e.g., metals having differing acoustic impedances.) For example, lateral connection portion, 489D through 489G, (e.g., bridge portion, 489D through 489G), of top acoustic reflector, 415D through 415G, may comprise the second member, 439D through 439G, (e.g., comprising the relatively high acoustic impedance metal) of the first pair of top electrode layers, 437D through 437G, 439D through 439G. For example, lateral connection portion, 489D through 489G, (e.g., bridge portion, 489D through 489G), of top acoustic reflector, 415D through 415G, may comprise the second pair of top electrode layers, 441D through 441G, 443D through 443G.

Gap 491D-491G may be an air gap 491D-491G, or may be filled with a relatively low acoustic impedance material (e.g., BenzoCyclobutene (BCB)), which may be deposited using various techniques known to those with skill in the art. Gap 491D-491G may be formed by depositing a sacrificial material (e.g., phosphosilicate glass (PSG)) after the etched edge region, 453D through 453G, is formed. The lateral connection portion, 489D through 489G, (e.g., bridge portion, 489D through 489G), of top acoustic reflector, 415D through 415G, may then be deposited (e.g., sputtered) over the sacrificial material. The sacrificial material may then be selectively etched away beneath the lateral connection portion, 489D through 489G, (e.g., e.g., beneath the bridge portion, 489D through 489G), of top acoustic reflector, 415D through 415G, leaving gap 491D-491G beneath the lateral connection portion, 489D through 489G, (e.g., beneath the bridge portion, 489D through 489G). For example the phosphosilicate glass (PSG) sacrificial material may be selectively etched away by hydrofluoric acid beneath the lateral connection portion, 489D through 489G, (e.g., beneath the bridge portion, 489D through 489G), of top acoustic reflector, 415D through 415G, leaving gap 491D-491G beneath the lateral connection portion, 489D through 489G, (e.g., beneath the bridge portion, 489D through 489G). Although in various example resonators, 100A, 400A, 400B, 400D, 400E, 400F, polycrystalline piezoelectric layers (e.g., polycrystalline Aluminum Nitride (AlN)) may be deposited (e.g., by sputtering), in other example resonators 400C, 400G, alternative single crystal or near single crystal piezoelectric layers (e.g., single/near single crystal Aluminum Nitride (AlN)) may be deposited (e.g., by metal organic chemical vapor deposition (MOCVD)). Normal axis piezoelectric layers (e.g., normal axis Aluminum Nitride (AlN) piezoelectric layers) may be deposited by MOCVD using techniques known to those with skill in the art. As discussed previously herein, the interposer layers may be deposited by sputtering, but alternatively may be deposited by MOCVD. Reverse axis piezoelectric layers (e.g., reverse axis Aluminum Nitride (AlN) piezoelectric layers) may likewise be deposited via MOCVD. For the respective example resonators 400C, 400G shown in FIGS. 4C and 4G, the alternating axis piezoelectric stack 404C, 404G comprised of piezoelectric layers 405C, 407C, 409C, 411C, 405G, 407G, 409G, 411G as well as interposer layers 459C, 461C, 463C, 459G, 461G, 463G extending along stack thickness dimension T27 fabricated using MOCVD on a silicon carbide substrate 401C, 401G. For example, aluminum nitride of piezoelectric layers 405C, 407C, 409C, 411C, 405G, 407G, 409G, 411G the may grow nearly epitaxially on silicon carbide (e.g., 4H SiC) by virtue of the small lattice mismatch between the polar axis aluminum nitride wurtzite structure and specific crystal orientations of silicon carbide. Alternative small lattice mismatch substrates may be used (e.g., sapphire, e.g., aluminum oxide). By varying the ratio of the aluminum and nitrogen in the deposition precursors, an aluminum nitride film may be produced with the desired polarity (e.g., normal axis, e.g., reverse axis). For example, normal axis aluminum nitride may be synthesized using MOCVD when a nitrogen to aluminum ratio in precursor gases approximately 1000. For example, reverse axis aluminum nitride may synthesized when the nitrogen to aluminum ratio is approximately 27000. In accordance with the foregoing, FIGS. 4C and 4G show MOCVD synthesized normal axis piezoelectric layer 405C, 405G, MOCVD synthesized reverse axis piezoelectric layer 407C, 407G, MOCVD synthesized normal axis piezoelectric layer 409C, 409G, and MOCVD synthesized reverse axis piezoelectric layer 411C, 411G. For example, normal axis piezoelectric layer 405C, 405G may be synthesized by MOCVD in a deposition environment where the nitrogen to aluminum gas ratio is relatively low, e.g., 1000 or less. Next an oxyaluminum nitride layer, 459C at lower temperature, may be deposited by MOCVD that may reverse axis (e.g., reverse axis polarity) of the growing aluminum nitride under MOCVD growth conditions, and has also been shown to be able to be deposited by itself under MOCVD growth conditions. Increasing the nitrogen to aluminum ratio into the several thousands during the MOCVD synthesis may enable the reverse axis piezoelectric layer 407C, 407G to be synthesized. Interposer layer 461C, 461G may be an oxide layer such as, but not limited to, aluminum oxide or silicon dioxide. This oxide layer may be deposited in a low temperature physical vapor deposition process such as sputtering or in a higher temperature chemical vapor deposition process. Normal axis piezoelectric layer 409C, 409G may be grown by MOCVD on top of interposer layer 461C, 461G using growth conditions similar to the normal axis layer 405C, 405G, as discussed previously, namely MOCVD in a deposition environment where the nitrogen to aluminum gas ratio is relatively low, e.g., 1000 or less. Next an aluminum oxynitride, interposer layer 463C, 463G may be deposited in a low temperature MOCVD process followed by a reverse axis piezoelectric layer 411C, 411G, synthesized in a high temperature MOCVD process and an atmosphere of nitrogen to aluminum ratio in the several thousand range. Upon conclusion of these depositions, the piezoelectric stack 404C, 404G shown in FIGS. 4C and 4G may be realized.

Figure 5:
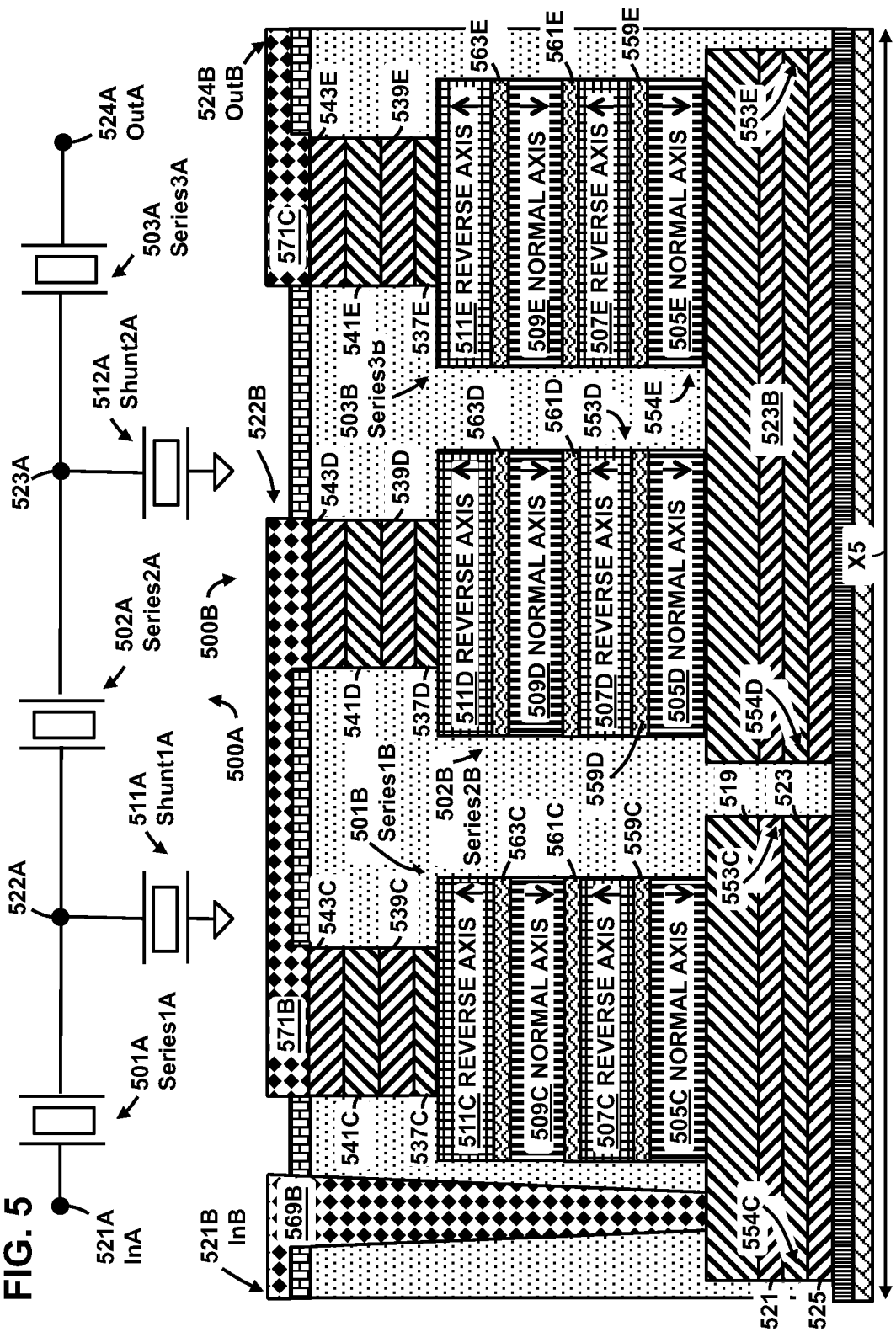
FIG. 5 shows a schematic of an example ladder filter using three series resonators of the bulk acoustic wave resonator structure of FIG. 1A, and two mass loaded shunt resonators of the bulk acoustic wave resonator structure of FIG. 1A, along with a simplified view of the three series resonators.

FIG. 5 shows a schematic of an example ladder filter 500A (e.g., SHF or EHF wave ladder filter 500A) using three series resonators of the bulk acoustic wave resonator structure of FIG. 1A (e.g., three bulk acoustic SHF or EHF wave resonators), and two mass loaded shunt resonators of the bulk acoustic wave resonator structure of FIG. 1A (e.g., two mass loaded bulk acoustic SHF or EHF wave resonators), along with a simplified view of the three series resonators. Accordingly, the example ladder filter 500A (e.g., SHF or EHF wave ladder filter 500A) is an electrical filter, comprising a plurality of bulk acoustic wave (BAW) resonators, e.g., on a substrate, in which the plurality of BAW resonators may comprise a respective first layer (e.g., bottom layer) of piezoelectric material having a respective piezoelectrically excitable resonance mode. The plurality of BAW resonators of the filter 500A may comprise a respective top de-tuned acoustic reflector (e.g., top de-tuned acoustic reflector electrode) including a respective first pair of top metal electrode layers electrically and acoustically coupled with the respective first layer (e.g., bottom layer) of piezoelectric material to excite the respective piezoelectrically excitable resonance mode at a respective resonant frequency. For example, the respective top de-tuned acoustic reflector (e.g., top de-tuned acoustic reflector electrode) may include the respective first pair of top metal electrode layers, and the foregoing may have a respective quarter wavelength resonant frequency in the Super High Frequency (SHF) band or the Extremely High Frequency (EHF) band that includes the respective resonant frequency of the respective BAW resonator. The plurality of BAW resonators of the filter 500A may comprise a respective bottom de-tuned acoustic reflector (e.g., bottom de-tuned acoustic reflector electrode) including a respective first pair of bottom metal electrode layers electrically and acoustically coupled with the respective first layer (e.g., bottom layer) of piezoelectric material to excite the respective piezoelectrically excitable resonance mode at the respective resonant frequency. For example, the respective bottom de-tuned acoustic reflector (e.g., bottom de-tuned acoustic reflector electrode) may include the respective first pair of bottom metal electrode layers, and the foregoing may have a respective quarter wavelength resonant frequency in the super high frequency band or the extremely high frequency band that includes the respective resonant frequency of the respective BAW resonator. The respective first layer (e.g., bottom layer) of piezoelectric material may be sandwiched between the respective top de-tuned acoustic reflector and the respective bottom de-tuned acoustic reflector. Further, the plurality of BAW resonators may comprise at least one respective additional layer of piezoelectric material, e.g., first middle piezoelectric layer. The at least one additional layer of piezoelectric material may have the piezoelectrically excitable main resonance mode with the respective first layer (e.g., bottom layer) of piezoelectric material. The respective first layer (e.g., bottom layer) of piezoelectric material may have a respective first piezoelectric axis orientation (e.g., normal axis orientation) and the at least one respective additional layer of piezoelectric material may have a respective piezoelectric axis orientation (e.g., reverse axis orientation) that opposes the first piezoelectric axis orientation of the respective first layer of piezoelectric material. Further discussion of features that may be included in the plurality of BAW resonators of the filter 500A is present previously herein with respect to previous discussion of FIG. 1A As shown in the schematic appearing at an upper section of FIG. 5, the example ladder filter 500A may include an input port comprising a first node 521A (InA), and may include a first series resonator 501A (Series1A) (e.g., first bulk acoustic SHF or EHF wave resonator 501A) coupled between the first node 521A (InA) associated with the input port and a second node 522A. The example ladder filter 500A may also include a second series resonator 502A (Series2A) (e.g., second bulk acoustic SHF or EHF wave resonator 502A) coupled between the second node 522A and a third node 523A. The example ladder filter 500A may also include a third series resonator 503A (Series3A) (e.g., third bulk acoustic SHF or EHF wave resonator 503A) coupled between the third node 523A and a fourth node 524A (OutA), which may be associated with an output port of the ladder filter 500A. The example ladder filter 500A may also include a first mass loaded shunt resonator 511A (Shunt1A) (e.g., first mass loaded bulk acoustic SHF or EHF wave resonator 511A) coupled between the second node 522A and ground. The example ladder filter 500A may also include a second mass loaded shunt resonator 512A (Shunt2A) (e.g., second mass loaded bulk acoustic SHF or EHF wave resonator 512A) coupled between the third node 523 and ground.

Appearing at a lower section of FIG. 5 is the simplified view of the three series resonators 501B (Series1B), 502B (Series2B), 503B (Series3B) in a serial electrically interconnected arrangement 500B, for example, corresponding to series resonators 501A, 502A, 503A, of the example ladder filter 500A. The three series resonators 501B (Series1B), 502B (Series2B), 503B (Series3B), may be constructed as shown in the arrangement 500B and electrically interconnected in a way compatible with integrated circuit fabrication of the ladder filter. Although the first mass loaded shunt resonator 511A (Shunt1A) and the second mass loaded shunt resonator 512A are not explicitly shown in the arrangement 500B appearing at a lower section of FIG. 5, it should be understood that the first mass loaded shunt resonator 511A (Shunt1A) and the second mass loaded shunt resonator 512A are constructed similarly to what is shown for the series resonators in the lower section of FIG. 5, but that the first and second mass loaded shunt resonators 511A, 512A may include mass layers, in addition to layers corresponding to those shown for the series resonators in the lower section of FIG. 5 (e.g., the first and second mass loaded shunt resonators 511A, 512A may include respective mass layers, in addition to respective top de-tuned acoustic reflectors of respective top metal electrode layers, may include respective alternating axis stacks of piezoelectric material layers, and may include respective bottom de-tuned acoustic reflectors of bottom metal electrode layers.) For example, all of the resonators of the ladder filter may be co-fabricated using integrated circuit processes (e.g., Complementary Metal Oxide Semiconductor (CMOS) compatible fabrication processes) on the same substrate (e.g., same silicon substrate). The example ladder filter 500A and serial electrically interconnected arrangement 500B of series resonators 501A, 502A, 503A, may respectively be relatively small in size, and may respectively have a lateral dimension (X5) of less than approximately one millimeter.

For example, the serial electrically interconnected arrangement 500B of three series resonators 501B (Series1B), 502B (Series2B), 503B (Series3B), may include an input port comprising a first node 521B (InB) and may include a first series resonator 501B (Series1B) (e.g., first bulk acoustic SHF or EHF wave resonator 501B) coupled between the first node 521B (InB) associated with the input port and a second node 522B. The first node 521B (InB) may include bottom electrical interconnect 569B electrically contacting a first bottom de-tuned acoustic reflector of first series resonator 501B (Series1B) (e.g., first bottom de-tuned acoustic reflector electrode of first series resonator 501B (Series1B)). Accordingly, in addition to including bottom electrical interconnect 569, the first node 521B (InB) may also include the first bottom de-tuned acoustic reflector of first series resonator 501B (Series1B) (e.g., first bottom de-tuned acoustic reflector electrode of first series resonator 501B (Series1B)). The first bottom de-tuned acoustic reflector of first series resonator 501B (Series1B) (e.g., first bottom de-tuned acoustic reflector electrode of first series resonator 501B (Series1B)) may include a stack of the plurality of bottom metal electrode layers 519 through 525. The serial electrically interconnected arrangement 500B of three series resonators 501B (Series1B), 502B (Series2B), 503B (Series3B), may include the second series resonator 502B (Series2B) (e.g., second bulk acoustic SHF or EHF wave resonator 502B) coupled between the second node 522B and a third node 523B. The third node 523B may include a second bottom de-tuned acoustic reflector of second series resonator 502B (Series2B) (e.g., second bottom de-tuned acoustic reflector electrode of second series resonator 502B (Series2B)). The second bottom de-tuned acoustic reflector of second series resonator 502B (Series2B) (e.g., second bottom de-tuned acoustic reflector electrode of second series resonator 502B (Series2B)) may include an additional stack of an additional plurality of bottom metal electrode layers. The serial electrically interconnected arrangement 500B of three series resonators 501B (Series1B), 502B (Series2B), 503B (Series3B), may also include the third series resonator 503B (Series3B) (e.g., third bulk acoustic SHF or EHF wave resonator 503B) coupled between the third node 523B and a fourth node 524B (OutB). The third node 523B, e.g., including the additional plurality of bottom metal electrode layers, may electrically interconnect the second series resonator 502B (Series2B) and the third series resonator 503B (Series3B). The second bottom de-tuned acoustic reflector (e.g., second bottom de-tuned acoustic reflector electrode) of second series resonator 502B (Series2B) of the third node 523B, e.g., including the additional plurality of bottom metal electrode layers, may be a mutual bottom de-tuned acoustic reflector (e.g., mutual bottom de-tuned acoustic reflector electrode), and may likewise serve as bottom de-tuned acoustic reflector (e.g., bottom de-tuned acoustic reflector) of third series resonator 503B (Series3B). The fourth node 524B (OutB) may be associated with an output port of the serial electrically interconnected arrangement 500B of three series resonators 501B (Series1B), 502B (Series2B), 503B (Series3B). The fourth node 524B (OutB) may include electrical interconnect 571C.

The stack of the plurality of bottom metal electrode layers 519 through 525 are associated with the first bottom de-tuned acoustic reflector (e.g., first bottom de-tuned acoustic reflector electrode) of first series resonator 501B (Series1B). The additional stack of the additional plurality of bottom metal electrode layers (e.g., of the third node 523B) may be associated with the mutual bottom de-tuned acoustic reflector (e.g., mutual bottom de-tuned acoustic reflector electrode) of both the second series resonant 502B (Series2B) and the third series resonator 503B (Series3B). Although stacks of respective five bottom metal electrode layers are shown in simplified view in FIG. 5, in should be understood that the stacks may include respective larger numbers of bottom metal electrode layers, e.g., respective nine top metal electrode layers. Further, the first series resonator (Series1B), and the second series resonant 502B (Seires2B) and the third series resonator 503B (Series3B) may all have the same, or approximately the same, or different (e.g., achieved by means of additional mass loading layers) resonant frequency (e.g., the same, or approximately the same, or different main resonant frequency). For example, small additional massloads (e.g, a tenth of the main shunt massload) of series and shunt resonators may help to reduce pass-band ripples insertion loss, as may be appreciated by one with skill in the art. The bottom metal electrode layers 519 through 525 and the additional plurality of bottom metal electrode layers (e.g., of the mutual bottom acoustic de-tuned reflector, e.g., of the third node 523B) may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner bottom metal electrode thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker bottom metal electrode layer thicknesses, e.g., scaled thicker with relatively lower resonant frequency (e.g., lower main resonant frequency).

Further, as shown in the FIG. 5, to provide for de-tuning (e.g., tuning down) of the bottom acoustic reflectors, respective layer thickness may be thicker for respective first members 519 of the respective first pairs 519, 521 of bottom metal electrode layers. For example, the respective first members 519 of the respective first pairs of bottom metal electrode layers for the respective bottom acoustic reflectors are depicted as relatively thicker (e.g., respective thickness of the first members 519 of the first pairs of bottom metal electrode layers are depicted as relatively thicker) than respective thicknesses of remainder bottom acoustic layers. For example, respective thicknesses of the first members 519 of the first pairs of bottom metal electrode layers may be about 60 Angstroms greater, e.g., substantially greater than an odd multiple (e.g., 1×, 3×, etc.) of a quarter of a wavelength (e.g., 60 Angstroms greater than one quarter of the acoustic wavelength) for the first members 519 of the first pairs of bottom metal electrode layers. For example, if Titanium is used as the low acoustic impedance metal for a 24 GHz resonator (e.g., resonator having a main resonant frequency of about 24 GHz), respective thicknesses for the first members 519 of the first pairs of bottom metal electrode layers of the bottom acoustic reflectors may be about 690 Angstroms, while respective layer thicknesses shown in FIG. 5 for corresponding members of the other pairs of bottom metal electrode layers may be substantially thicker. For example, respective layer thickness for the respective second members 521 of the respective first pairs of bottom metal electrode layers of may correspond to approximately a quarter wavelength (e.g., a quarter acoustic wavelength) of the resonant frequency of the resonator (e.g., respective layer thickness of about six hundred Angstroms (600 A) for the example 24 GHz resonator.) The bottom metal electrode layers 523 and 525 and the additional plurality of bottom metal electrode layers (e.g., of the mutual bottom de-tuned acoustic reflector, e.g., of the third node 523B) may include members of pairs of bottom metal electrodes having respective thicknesses of one quarter wavelength (e.g., one quarter acoustic wavelength) at the resonant frequency (e.g., main resonant frequency) of the series resonators (e.g., first series resonator 501B (Series1B), e.g., second series resonator 502B, e.g., third series resonator (503B)). The stack of bottom metal electrode layers 519 through 525 and the stack of additional plurality of bottom metal electrode layers (e.g., of the mutual bottom de-tuned acoustic reflector, e.g., of the third node 523B) may include respective alternating stacks of different metals, e.g., different metals having different acoustic impedances (e.g., alternating relatively high acoustic impedance metals with relatively low acoustic impedance metals). The foregoing may provide acoustic impedance mismatches for facilitating acoustic reflectivity (e.g., SHF or EHF acoustic wave reflectivity) of the first bottom acoustic de-tuned reflector (e.g., first bottom de-tuned acoustic reflector electrode) of the first series resonator 501B (Series1B) and the mutual bottom acoustic reflector (e.g., of the third node 523B) of the second series resonator 502B (Series2B) and the third series resonator 503B (Series3B).

A first top de-tuned acoustic reflector (e.g., first top acoustic de-tuned reflector electrode) may comprise a first stack of a first plurality of top metal electrode layers 537C through 543C of the first series resonator 501B (Series1B). A second top de-tuned acoustic reflector (e.g., second top de-tuned acoustic reflector electrode) may comprise a second stack of a second plurality of top metal electrode layers 537D through 543D of the second series resonator 502B (Series2B). A third top de-tuned acoustic reflector (e.g., third top de-tuned acoustic reflector electrode) may comprise a third stack of a third plurality of top metal electrode layers 537E through 543E of the third series resonator 503B (Series3B). Although stacks of respective five top metal electrode layers are shown in simplified view in FIG. 5, it should be understood that the stacks may include respective larger numbers of top metal electrode layers, e.g., respective nine bottom metal electrode layers. Further, the first plurality of top metal electrode layers 537C through 543C, the second plurality of top metal electrode layers 537D through 543D, and the third plurality of top metal electrode layers 537E through 543E may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner top metal electrode thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker top metal electrode layer thicknesses, e.g., scaled thicker with relatively lower resonant frequency (e.g., lower main resonant frequency).

As shown in the FIG. 5, to provide for de-tuning (e.g., tuning up) of the multi-layer top acoustic reflectors, respective layer thickness may be thinner for respective first members 537C, 537D, 537E of the respective first pairs 537C, 537D, 537E, 539C, 539D, 539E of top metal electrode layers. For example, the respective first members 537C, 537D, 537E of the respective first pairs of top metal electrode layers for the respective multi-layer top de-tuned acoustic reflectors are depicted as relatively thinner (e.g., respective thickness of the first members 537C, 537D, 537E of the first pairs of top metal electrode layers are depicted as relatively thinner) than respective thicknesses of remainder top acoustic layers. For example, respective thicknesses of the first members 537C, 537D, 537E of the first pairs of top metal electrode layers may be about 60 Angstroms lesser, e.g., substantially lesser than an odd multiple (e.g., 1×, 3×, etc.) of a quarter of a wavelength (e.g., 60 Angstroms lesser than one quarter of the acoustic wavelength) for the first members 537C, 537D, 537E of the first pairs of top metal electrode layers. For example, if Titanium is used as the low acoustic impedance metal for a 24 GHz resonator (e.g., resonator having a main resonant frequency of about 24 GHz), respective thicknesses for the first members 537C, 537D, 537E of the first pairs of top metal electrode layers of the top acoustic reflectors may be about 570 Angstroms, while respective layer thicknesses shown in FIG. 5 for corresponding members of the other pairs of top metal electrode layers may be substantially thicker. For example, respective layer thickness for the respective second members 539C, 539D, 539E of the respective first pairs of top metal electrode layers of may correspond to approximately a quarter wavelength (e.g., a quarter acoustic wavelength) of the resonant frequency of the resonator (e.g., respective layer thickness of about six hundred Angstroms (600 A) for the example 24 GHz resonator.)

The second pair of top metal electrode layers 541C, 543C of the first top acoustic reflector, the second pair of top metal electrode layers 541D, 543D of the second top acoustic reflector, and the second pair of top metal electrode layers 541D, 543E of the third top acoustic reflector may include members of pairs of top metal electrodes having respective thicknesses of one quarter wavelength (e.g., one quarter acoustic wavelength) of the resonant frequency (e.g., main resonant frequency) of the series resonators (e.g., first series resonator 501B (Series1B), e.g., second series resonator 502B, e.g., third series resonator (503B)). The first stack of the first plurality of top metal electrode layers 537C through 543C, the second stack of the second plurality of top metal electrode layers 537D through 543D, and the third stack of the third plurality of top metal electrode layers 537E through 543E may include respective alternating stacks of different metals, e.g., different metals having different acoustic impedances (e.g., alternating relatively high acoustic impedance metals with relatively low acoustic impedance metals). The foregoing may provide acoustic impedance mismatches for facilitating acoustic reflectivity (e.g., SHF or EHF acoustic wave reflectivity) of the top de-tuned acoustic reflectors (e.g., the first top de-tuned acoustic reflector of the first series resonator 501B (Series1B), e.g., the second top de-tuned acoustic reflector of the second series resonator 502B (Series2B), e.g., the third top de-tuned acoustic reflector of the third series resonator 503B (Series3B)). Although not explicitly shown in the FIG. 5 simplified views of metal electrode layers of the series resonators, respective pluralities of lateral features (e.g., respective pluralities of step features) may be sandwiched between metal electrode layers (e.g., between respective pairs of top metal electrode layers, e.g., between respective first pairs of top metal electrode layers 537C, 539C, 537D, 539D, 537E, 539E, and respective second pairs of top metal electrode layers 541C, 543C, 541D, 543D, 541E, 543E. The respective pluralities of lateral features may, but need not, limit parasitic lateral acoustic modes (e.g., facilitate suppression of spurious modes) of the bulk acoustic wave resonators of FIG. 5 (e.g., of the series resonators, the mass loaded series resonators, and the mass loaded shunt resonators).

The first series resonator 501B (Series1B) may comprise a first alternating axis stack, e.g., an example first stack of four layers of alternating axis piezoelectric material, 505C through 511C. The second series resonator 502B (Series2B) may comprise a second alternating axis stack, e.g., an example second stack of four layers of alternating axis piezoelectric material, 505D through 511D. The third series resonator 503B (Series3B) may comprise a third alternating axis stack, e.g., an example third stack of four layers of alternating axis piezoelectric material, 505E through 511E. The first, second and third alternating axis piezoelectric stacks may comprise layers of Aluminum Nitride (AlN) having alternating C-axis wurtzite structures. For example, piezoelectric layers 505C, 505D, 505E, 509C, 509D, 509E have normal axis orientation. For example, piezoelectric layers 507C, 507D, 507E, 511C, 511D, 511E have reverse axis orientation. Members of the first stack of four layers of alternating axis piezoelectric material, 505C through 511C, and members of the second stack of four layers of alternating axis piezoelectric material, 505D through 511D, and members of the third stack of four layers of alternating axis piezoelectric material, 505E through 511E, may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner piezoelectric layer thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker piezoelectric layer thicknesses, e.g., scaled thicker with relatively lower resonant frequency (e.g., lower main resonant frequency). The example first stack of four layers of alternating axis piezoelectric material, 505C through 511C, the example second stack of four layers of alternating axis piezoelectric material, 505D through 511D and the example third stack of four layers of alternating axis piezoelectric material, 505D through 511D may include stack members of piezoelectric layers having respective thicknesses of approximately one half wavelength (e.g., one half acoustic wavelength) at the resonant frequency (e.g., main resonant frequency) of the series resonators (e.g., first series resonator 501B (Series1B), e.g., second series resonator 502B, e.g., third series resonator (503B)).

The example first stack of four layers of alternating axis piezoelectric material, 505C through 511C, may include a first three members of interposer layers 559C, 561C, 563C respectively sandwiched between the corresponding four layers of alternating axis piezoelectric material, 505C through 511C. The example second stack of four layers of alternating axis piezoelectric material, 505D through 511D, may include a second three members of interposer layers 559D, 561D, 563D respectively sandwiched between the corresponding four layers of alternating axis piezoelectric material, 505D through 511D. The example third stack of four layers of alternating axis piezoelectric material, 505E through 511E, may include a third three members of interposer layers 559E, 561E, 563E respectively sandwiched between the corresponding four layers of alternating axis piezoelectric material, 505E through 511E. One or more (e.g., one or a plurality of) interposer layers may be metal interposer layers. The metal interposer layers may be relatively high acoustic impedance metal interposer layers (e.g., using relatively high acoustic impedance metals such as Tungsten (W) or Molybdenum (Mo)). Such metal interposer layers may (but need not) flatten stress distribution across adjacent piezoelectric layers, and may (but need not) raise effective electromechanical coupling coefficient (Kt2) of adjacent piezoelectric layers. Alternatively or additionally, one or more (e.g., one or a plurality of) interposer layers may be dielectric interposer layers. The dielectric of the dielectric interposer layers may be a dielectric that has a positive acoustic velocity temperature coefficient, so acoustic velocity increases with increasing temperature of the dielectric. The dielectric of the dielectric interposer layers may be, for example, silicon dioxide. Dielectric interposer layers may, but need not, facilitated compensating for frequency response shifts with increasing temperature. Alternatively or additionally, one or more (e.g., one or a plurality of) interposer layers may comprise metal and dielectric for respective interposer layers. For example, high acoustic impedance metal layer such as Tungsten (W) or Molybdenum (Mo) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts. Alternatively or additionally, one or more (e.g., one or a plurality of) interposer layers may be formed of different metal layers. For example, high acoustic impedance metal layer such as Tungsten (W), or Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited piezoelectric layer. Alternatively or additionally, one or more (e.g., one or a plurality of) interposer layers may be formed of different dielectric layers. For example, high acoustic impedance dielectric layer such as Hafnium Dioxide (HfO2) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts. The first series resonator 501B (Series1B), the second series resonator 502B (Series2B) and the third series resonator 503B (Series3B) may have respective etched edge regions 553C, 553D, 553E, and respective laterally opposing etched edge regions 554C, 554D, 554E. Reference is made to resonator mesa structures as have already been discussed in detail previously herein. Accordingly, they are not discussed again in detail at this point. Briefly, respective first, second and third mesa structures of the respective first series resonator 501B (Series1B), the respective second series resonator 502B (Series2B) and the respective third series resonator 503B (Series3B) may extend between respective etched edge regions 553C, 553D, 553E, and respective laterally opposing etched edge regions 554C, 554D, 554E of the respective first series resonator 501B (Series1B), the respective second series resonator 502B (Series2B) and the respective third series resonator 503B (Series3B). The second bottom de-tuned acoustic reflector of second series resonator 502B (Series2B) of the third node 523B, e.g., including the additional plurality of bottom metal electrode layers may be a second mesa structure. For example, this may be a mutual second mesa structure bottom de-tuned acoustic reflector 523B, and may likewise serve as bottom de-tuned acoustic reflector of third series resonator 503B (Series3B). Accordingly, this mutual second mesa structure bottom de-tuned acoustic reflector 523B may extend between etched edge region 553E of the third series resonator 503B (Series3B) and the laterally opposing etched edge region 554D of the third series resonator 503B (Series3B).

For example, in the plurality of top de-tuned reflector electrodes, respective first members 537C, 537D, 537E having the relatively lower acoustic impedance of the first pairs may be arranged nearest, e.g. may abut, respective first piezoelectric layers (e.g. respective top piezoelectric layers 511C, 511D, 511E of the BAW resonators, e.g., respective piezoelectric stacks of the BAW resonators). For example, in respective top de-tuned reflector electrodes, the respective first members 537C, 537D, 537E having the relatively lower acoustic impedance of the respective first pairs may be arranged substantially nearest, e.g. may substantially abut, respective first piezoelectric layers (respective top piezoelectric layers 511C, 511D, 511E of the BAW resonators, e.g., respective piezoelectric stacks of the BAW resonators). This may facilitate suppressing parasitic lateral modes. In the plurality of multi-layer metal top de-tuned reflector electrodes, the respective first members 537C, 537D, 537E having the relatively lower acoustic impedance may be arranged sufficiently proximate to the respective first layers of piezoelectric material (e.g. may be arranged sufficiently proximate to respective top piezoelectric layers 511C, 511D, 511E of the BAW resonators, e.g., may be arranged sufficiently proximate to respective piezoelectric stacks of the BAW resonators), so that the respective first members 537C, 537D, 537E having the relatively lower acoustic impedance may contribute more to the respective multi-layer metal top acoustic reflector electrodes being acoustically de-tuned from the resonant frequency of the BAW resonator than is contributed by any other top metal electrode layer of the respective multi-layer metal top acoustic reflector electrodes. In the plurality of multi-layer top de-tuned reflector electrodes, the respective first members 537C, 537D, 537E having the relatively lower acoustic impedance may be arranged sufficiently proximate to the respective first layer of piezoelectric material (e.g. may be arranged sufficiently proximate to the respective top piezoelectric layers 511C, 511D, 511E of the BAW resonators, e.g., may be arranged sufficiently proximate to respective piezoelectric stacks of the BAW resonators), so that the respective first members having the relatively lower acoustic impedance may contribute more, e.g., may contribute more to facilitate suppressing parasitic lateral resonances in operation of the respective BAW resonators than is contributed by any other top metal electrode layer of the plurality of multi-layer metal top acoustic reflector electrodes.

For example, in the plurality of bottom de-tuned reflector electrodes, the respective first members 519 having the relatively lower acoustic impedance of the respective first pairs may be arranged nearest, e.g. may abut, respective piezoelectric layers (e.g. respective bottom piezoelectric layers 505C, 505D, 505E of the BAW resonator, e.g., respective piezoelectric stacks of the BAW resonators). For example, in the plurality of multi-layer bottom de-tuned reflector electrodes, the respective first members 519 of the respective first pairs of layers of respective multi-layer bottom de-tuned reflector electrodes having the relatively lower acoustic impedance of the respective first pairs may be arranged substantially nearest, e.g. may substantially abut, the respective piezoelectric layers (e.g. respective bottom piezoelectric layers 505C, 505D, 505E of the BAW resonators, e.g., respective piezoelectric stacks of the BAW resonators). This may facilitate suppressing parasitic lateral modes. In the plurality of multi-layer bottom de-tuned reflector electrodes, the respective first members having the relatively lower acoustic impedance may be arranged sufficiently proximate to the respective layers of piezoelectric material (e.g. may be arranged sufficiently proximate to the respective bottom piezoelectric layers 505C, 505D, 505E, e.g. may be arranged sufficiently proximate to the respective piezoelectric stacks, so that the respective first members 519 having the relatively lower acoustic impedance may contribute more to the respective multi-layer metal bottom acoustic reflector electrodes being acoustically de-tuned from the resonant frequency of the respective BAW resonators than is contributed by any other of the bottom metal electrode layers of the respective multi-layer metal bottom acoustic reflector electrodes. In the plurality of bottom de-tuned reflector electrodes, the respective first members 519 having the relatively lower acoustic impedance may be arranged sufficiently proximate to the respective layer of piezoelectric material (e.g. may be arranged sufficiently proximate to the respective bottom piezoelectric layers 505C, 505D, 505E, e.g. may be arranged sufficiently proximate to the respective piezoelectric stacks), so that the respective first members 519 having the relatively lower acoustic impedance may contribute more, e.g., may contribute more to facilitate suppressing parasitic lateral resonances in operation of the plurality of BAW resonators than is contributed by any other bottom metal electrode layers of the plurality of the multi-layer metal bottom acoustic reflector electrodes.

Figure 6:
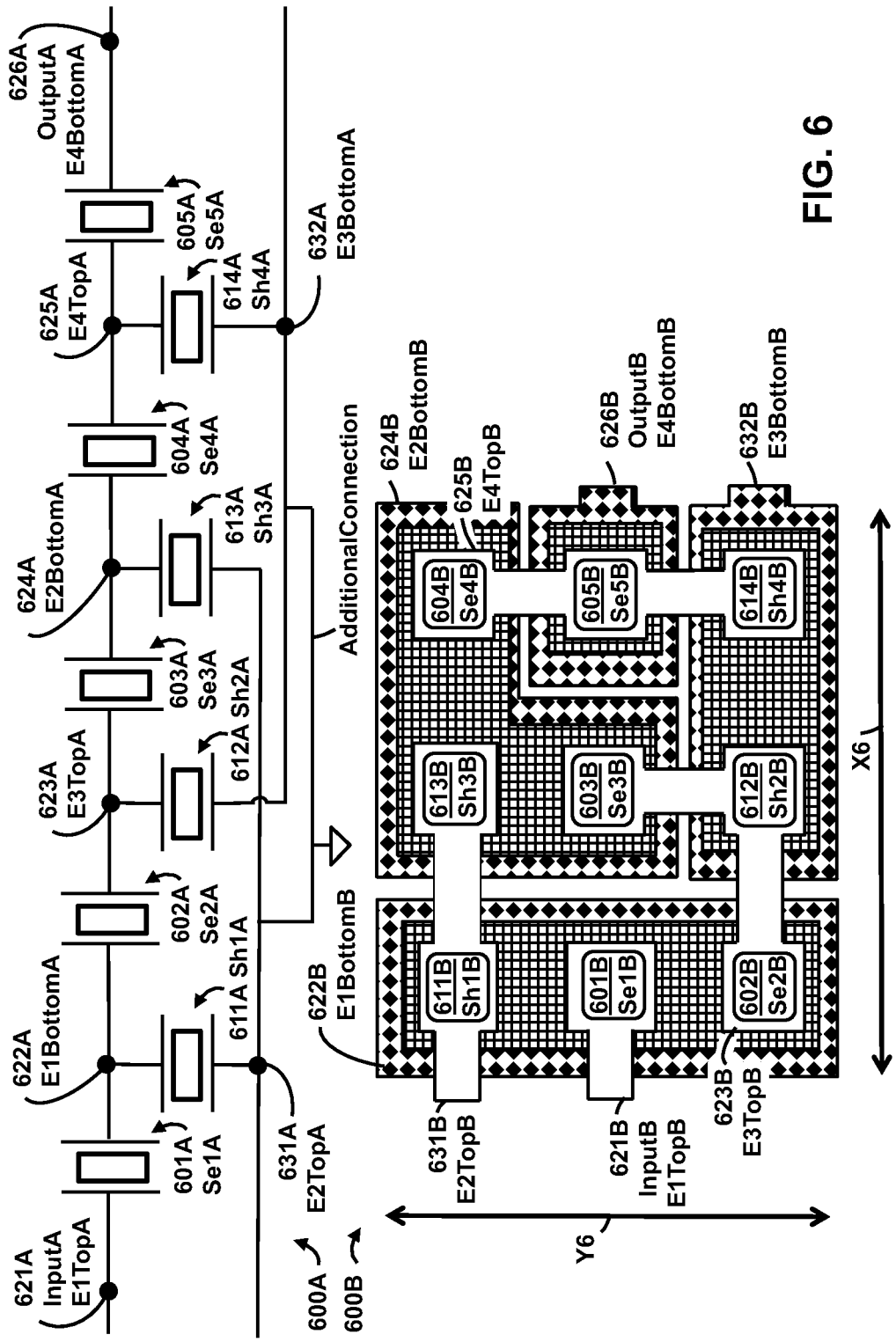
FIG. 6 shows a schematic of an example ladder filter using five series resonators of the bulk acoustic wave resonator structure of FIG. 1A, and four mass loaded shunt resonators of the bulk acoustic wave resonator structure of FIG. 1A, along with a simplified top view of the nine resonators interconnected in the example ladder filter, and lateral dimensions of the example ladder filter.

FIG. 6 shows a schematic of an example ladder filter 600A (e.g., SHF or EHF wave ladder filter 600A) using five series resonators of the bulk acoustic wave resonator structure of FIG. 1A (e.g., five bulk acoustic SHF or EHF wave resonators), and four mass loaded shunt resonators of the bulk acoustic wave resonator structure of FIG. 1A (e.g., four mass loaded bulk acoustic SHF or EHF wave resonators), along with a simplified top view of the nine resonators interconnected in the example ladder filter 600B, and lateral dimensions of the example ladder filter 600B. As shown in the schematic appearing at an upper section of FIG. 6, the example ladder filter 600A may include an input port comprising a first node 621A (InputA E1TopA), and may include a first series resonator 601A (Ser1A) (e.g., first bulk acoustic SHF or EHF wave resonator 601A) coupled between the first node 621A (InputA E1TopA) associated with the input port and a second node 622A (E1BottomA). The example ladder filter 600A may also include a second series resonator 602A (Ser2A) (e.g., second bulk acoustic SHF or EHF wave resonator 602A) coupled between the second node 622A (E1BottomA) and a third node 623A (E3TopA). The example ladder filter 600A may also include a third series resonator 603A (Ser3A) (e.g., third bulk acoustic SHF or EHF wave resonator 603A) coupled between the third node 623A (E3TopA) and a fourth node 624A (E2BottomA). The example ladder filter 600A may also include a fourth series resonator 604A (Ser4A) (e.g., fourth bulk acoustic SHF or EHF wave resonator 604A) coupled between the fourth node 624A (E2BottomA) and a fifth node 625A (E4TopA). The example ladder filter 600A may also include a fifth series resonator 605A (Ser5A) (e.g., fifth bulk acoustic SHF or EHF wave resonator 605A) coupled between the fifth node 625A (E4TopA) and a sixth node 626A (OutputA E4BottomA), which may be associated with an output port of the ladder filter 600A. The example ladder filter 600A may also include a first mass loaded shunt resonator 611A (Sh1A) (e.g., first mass loaded bulk acoustic SHF or EHF wave resonator 611A) coupled between the second node 622A (E1BottomA) and a first grounding node 631A (E2TopA). The example ladder filter 600A may also include a second mass loaded shunt resonator 612A (Sh2A) (e.g., second mass loaded bulk acoustic SHF or EHF wave resonator 612A) coupled between the third node 623A (E3TopA) and a second grounding node 632A (E3BottomA). The example ladder filter 600A may also include a third mass loaded shunt resonator 613A (Sh3A) (e.g., third mass loaded bulk acoustic SHF or EHF wave resonator 613A) coupled between the fourth node 624A (E2BottomA) and the first grounding node 631A (E2TopA). The example ladder filter 600A may also include a fourth mass loaded shunt resonator 614A (Sh4A) (e.g., fourth mass loaded bulk acoustic SHF or EHF wave resonator 614A) coupled between the fifth node 625A (E4TopA) and the second grounding node 632A (E3BottomA). The first grounding node 631A (E2TopA) and the second grounding node 632A (E3BottomA) may be interconnected to each other, and may be connected to ground, through an additional grounding connection (AdditionalConnection).

Appearing at a lower section of FIG. 6 is the simplified top view of the nine resonators interconnected in the example ladder filter 600B, and lateral dimensions of the example ladder filter 600B. The example ladder filter 600B may include an input port comprising a first node 621B (InputA E1TopB), and may include a first series resonator 601B (Ser1B) (e.g., first bulk acoustic SHF or EHF wave resonator 601B) coupled between (e.g., sandwiched between) the first node 621B (InputA E1TopB) associated with the input port and a second node 622B (E1BottomB). The example ladder filter 600B may also include a second series resonator 602B (Ser2B) (e.g., second bulk acoustic SHF or EHF wave resonator 602B) coupled between (e.g., sandwiched between) the second node 622B (E1BottomB) and a third node 623B (E3TopB). The example ladder filter 600B may also include a third series resonator 603B (Ser3B) (e.g., third bulk acoustic SHF or EHF wave resonator 603B) coupled between (e.g., sandwiched between) the third node 623B (E3TopB) and a fourth node 624B (E2BottomB). The example ladder filter 600B may also include a fourth series resonator 604B (Ser4B) (e.g., fourth bulk acoustic SHF or EHF wave resonator 604B) coupled between (e.g., sandwiched between) the fourth node 624B (E2BottomB) and a fifth node 625B (E4TopB). The example ladder filter 600B may also include a fifth series resonator 605B (Ser5B) (e.g., fifth bulk acoustic SHF or EHF wave resonator 605B) coupled between (e.g., sandwiched between) the fifth node 625B (E4TopB) and a sixth node 626B (OutputB E4BottomB), which may be associated with an output port of the ladder filter 600B. The example ladder filter 600B may also include a first mass loaded shunt resonator 611B (Sh1B) (e.g., first mass loaded bulk acoustic SHF or EHF wave resonator 611B) coupled between (e.g., sandwiched between) the second node 622B (E1BottomB) and a first grounding node 631B (E2TopB). The example ladder filter 600B may also include a second mass loaded shunt resonator 612B (Sh2B) (e.g., second mass loaded bulk acoustic SHF or EHF wave resonator 612B) coupled between (e.g., sandwiched between) the third node 623B (E3TopB) and a second grounding node 632B (E3BottomB). The example ladder filter 600B may also include a third mass loaded shunt resonator 613B (Sh3B) (e.g., third mass loaded bulk acoustic SHF or EHF wave resonator 613B) coupled between (e.g., sandwiched between) the fourth node 624B (E2BottomB) and the first grounding node 631B (E2TopB). The example ladder filter 600B may also include a fourth mass loaded shunt resonator 614B (Sh4B) (e.g., fourth mass loaded bulk acoustic SHF or EHF wave resonator 614B) coupled between (e.g., sandwiched between) the fifth node 625B (E4TopB) and the second grounding node 632B (E3BottomB). The first grounding node 631B (E2TopB) and the second grounding node 632B (E3BottomB) may be interconnected to each other, and may be connected to ground, through an additional grounding connection, not shown in the lower section of FIG. 6. The example ladder filter 600B may respectively be relatively small in size, and may respectively have lateral dimensions (X6 by Y6) of less than approximately one millimeter by one millimeter.

Figure 7A:
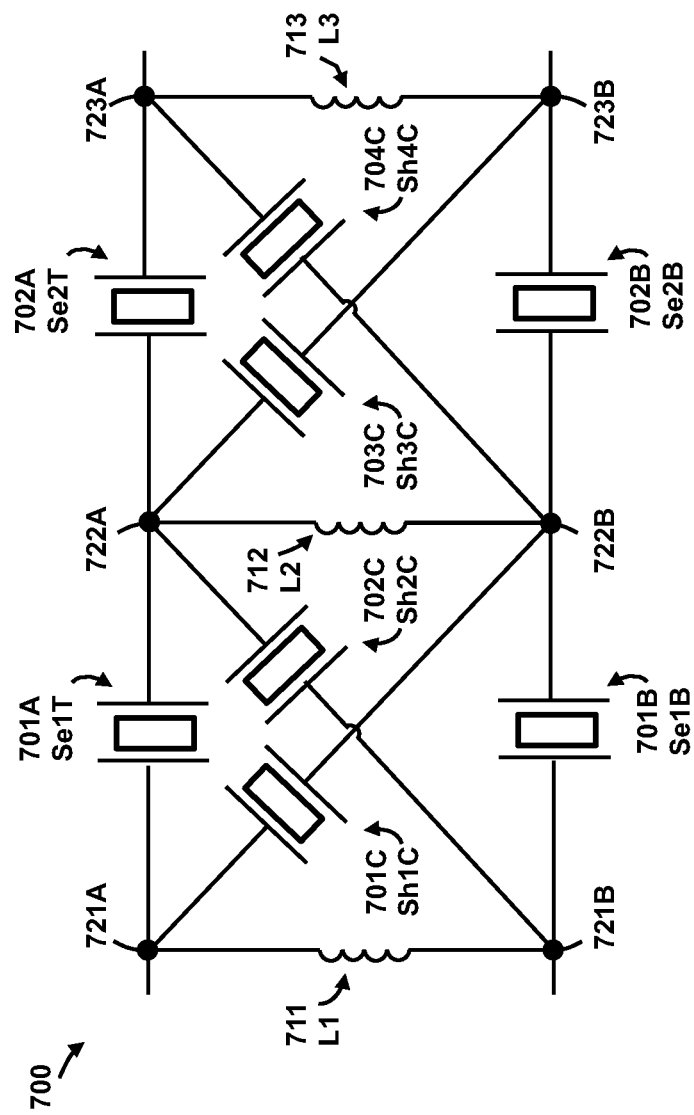
FIG. 7A shows a schematic of example inductors modifying an example lattice filter using a first pair of series resonators of the bulk acoustic wave resonator structure of FIG. 1A, a second pair of series resonators of the bulk acoustic wave resonator structure of FIG. 1A and two pairs of cross coupled mass loaded shunt resonators of the bulk acoustic wave resonator structure of FIG. 1A.

FIG. 7A shows a schematic of example inductors modifying an example lattice filter 700 using a first pair of series resonators 701A (Se1T), 702A (Se2T), (e.g., two bulk acoustic SHF or EHF wave resonators) of the bulk acoustic wave resonator structure of FIG. 1A, a second pair of series resonators 701B (Se2B), 702B (Se2B), (e.g., two additional bulk acoustic SHF or EHF wave resonators) of the bulk acoustic wave resonator structure of FIG. 1A and two pairs of cross coupled mass loaded shunt resonators 701C (Sh1C), 702C (Sh2C), 703C (Sh3C), 704C (Sh4C), (e.g., four mass loaded bulk acoustic SHF or EHF wave resonators) of the bulk acoustic wave resonator structure of FIG. 1A. As shown in the schematic of FIG. 7A, the example inductor modified lattice filter 700 may include a first top series resonator 701A (Se1T) (e.g., first top bulk acoustic SHF or EHF wave resonator 701A) coupled between a first top node 721A and a second top node 722A. The example inductor modified lattice filter 700 may also include a second top series resonator 702A (Se2T) (e.g., second top bulk acoustic SHF or EHF wave resonator 702A) coupled between the second top node 722A and a third top node 723A.

The example inductor modified lattice filter 700 may include a first bottom series resonator 701B (Se1B) (e.g., first bottom bulk acoustic SHF or EHF wave resonator 701B) coupled between a first bottom node 721B and a second bottom node 722B. The example inductor modified lattice filter 700 may also include a second bottom series resonator 702B (Se2B) (e.g., second bottom bulk acoustic SHF or EHF wave resonator 702B) coupled between the second bottom node 722B and a third bottom node 723B. The example inductor modified lattice filter 700 may include a first cross-coupled mass loaded shunt resonator 701C (Sh1C) (e.g., first mass loaded bulk acoustic SHF or EHF wave resonator 701C) coupled between the first top node 721A and the second bottom node 722B. The example inductor modified lattice filter 700 may also include a second cross-coupled mass loaded shunt resonator 702C (Sh2C) (e.g., second mass loaded bulk acoustic SHF or EHF wave resonator 702C) coupled between the second top node 722A and the first bottom node 721B. The example inductor modified lattice filter 700 may include a third cross-coupled mass loaded shunt resonator 703C (Sh3C) (e.g., third mass loaded bulk acoustic SHF or EHF wave resonator 703C) coupled between the second top node 722A and the third bottom node 723B. The example inductor modified lattice filter 700 may also include a fourth cross-coupled mass loaded shunt resonator 704C (Sh4C) (e.g., fourth mass loaded bulk acoustic SHF or EHF wave resonator 704C) coupled between the third top node 723A and the second bottom node 722B. The example inductor modified lattice filter 700 may include a first inductor 711 (L1) coupled between the first top node 721A and the first bottom node 721B. The example inductor modified lattice filter 700 may include a second inductor 712 (L2) coupled between the second top node 722A and the second bottom node 722B. The example inductor modified lattice filter 700 may include a third inductor 713 (L3) coupled between the third top node 723A and the third bottom node 723B.

Figure 7B:
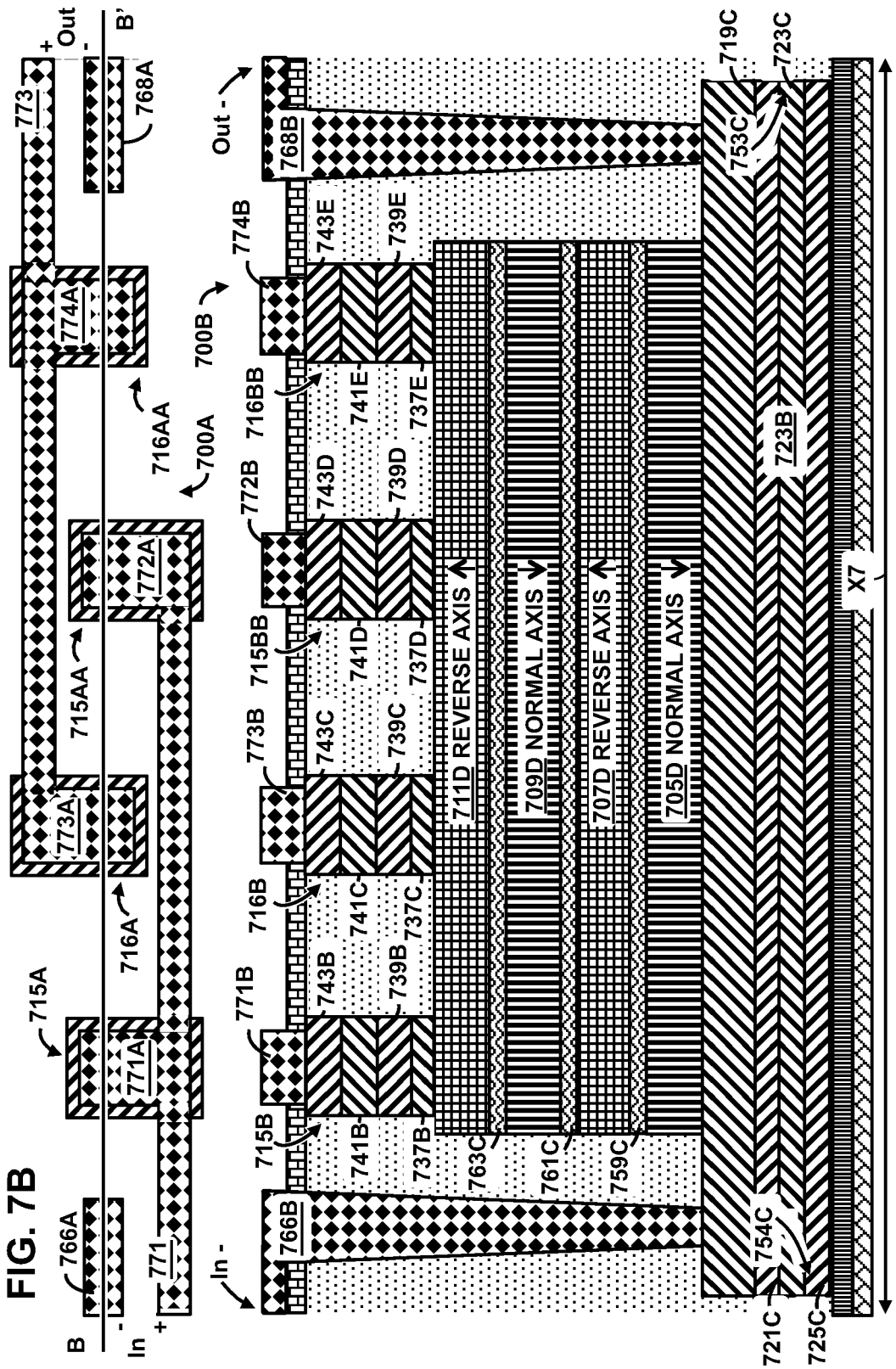
FIG. 7B shows simplified top view of an example Laterally Coupled Resonator Filter (LCRF) and also shows a simplified cross sectional view of the example Laterally Coupled Resonator Filter (LCRF) shown in the simplified top view.

FIG. 7B shows simplified top view of an example Laterally Coupled Resonator Filter (LCRF) and also shows a simplified cross sectional view of the example Laterally Coupled Resonator Filter (LCRF) shown in the simplified top view. FIG. 7B shows simplified top view of an example Laterally Coupled Resonator Filter (LCRF) 700A in an upper section of FIG. 7B. A lower section of FIG. 7B shows a simplified cross sectional view of the example Laterally Coupled Resonator Filter (LCRF) 700B (corresponding to the simplified top view). As shown in the simplified top view in the upper portion of FIG. 7B, the Laterally Coupled Resonator Filter (LCRF) 700A may comprise a top contour electrode disposed over the stack of piezoelectric layers. The top electrode (e.g., top contour electrode) may comprise a plurality of top electrode structures. The top electrode (e.g.,
top contour electrode) may comprise a first top comb electrode including a first top bus bar 771. The first top comb electrode may comprise a plurality of first top finger multi-layer metal acoustic reflector electrodes 715A, 715AA. The first top bus bar 771 may include a plurality of first top electrical contacts 771A, 772A respectively contacting the plurality of first top finger multi-layer metal acoustic reflector electrodes 715A, 715AA. The plurality of first top finger multi-layer metal acoustic reflector electrodes 715A, 715AA may extend in a first direction from the first top bus bar 771. In other words, the top portion of FIG. 7B shows the first top multi-layer metal acoustic reflector comb electrode, which may comprise the first top bus bar 771 coupled with the first plurality of multi-layer metal fingers 715A, 715AA extending in the first direction away from the first top bus bar 771. Additionally, the top electrode (e.g., top contour electrode) may comprise a second top comb electrode including a second top bus bar 773. The second top comb electrode may comprise a plurality of second top finger multi-layer metal acoustic reflector electrodes 716A, 716AA. The second top bus bar 773 may include a plurality of second top electric contacts 773A, 774A respectively contacting the plurality of second top finger multi-layer metal acoustic reflector electrodes 716A, 716AA. The plurality of second top finger multi-layer metal acoustic reflector electrodes 716A, 716AA may extend in a second direction from the second top bus bar 773. In other words, the top portion of FIG. 7B shows the second top multi-layer metal acoustic reflector comb electrode, which may comprise the second top bus bar 773 coupled with the second plurality of multi-layer metal fingers 716A, 716AA extending in the second direction away from the second top bus bar 773. The second direction may be substantially opposite to the first direction such that the plurality of first top fingers (e.g., plurality of first top finger multi-layer metal acoustic reflector electrodes 715A, 715AA) and the plurality of second top fingers (e.g., plurality of second top finger multi-layer metal acoustic reflector electrodes 716A, 716AA) may form a top interleaving pattern (e.g., interdigitated pattern), as shown in top view in the upper portion of FIG. 7B. The first top bus bar 771, including the plurality of first top electrical contacts 771A, 772A, and the second top bus bar 773, including the plurality of second top electric contacts 773A, 774A, may be formed by sputter deposition and patterning a suitable metal e.g., gold (Au). A suitable sputter deposited and patterned metal, e.g., patterned gold (AU), may be used for first bottom electrical interconnect 766A and second bottom interconnect 768A.

The Laterally Coupled Resonator Filter (LCRF) 700A as shown in simplified top view in the upper portion of FIG. 7B may include an input port and an output port. The input port of Laterally Coupled Resonator Filter (LCRF) 700A may comprise a positive signal input contact (+) at an extremity of the first top bus bar 771 and a negative or ground signal input contact (−) at the first bottom electrical interconnect 766A. The output port of Laterally Coupled Resonator Filter (LCRF) 700A may comprise a positive signal output contact (+) at an extremity of the second top bus bar 773 and a negative or ground signal output contact (−) at the second bottom electrical interconnect 768A. Adjacent lateral spacing between respective members of the first top finger multi-layer metal acoustic reflector electrodes 715A, 715AA and respective members of the second top finger multi-layer metal acoustic reflector electrodes 716A, 716AA (e.g., adjacent lateral spacing between first top finger 715A and second top finger 716A, e.g., adjacent lateral spacing between first top finger 715AA and second top finger 716A, e.g., adjacent lateral between first top finger 715AA and second top finger 716AA) may be selected to determine (at least in part) SHF or EHF band pass filter characteristics of the Laterally Coupled Resonator Filter (LCRF) 700A. For example, for a SHF LCRF band pass filter having center frequency of about five Gigahertz (5 GHz) and a three decibel (3 dB) bandwidth of about three percent (3%), adjacent lateral spacing between respective members of the first top finger multi-layer metal acoustic reflector electrodes 715A, 715AA and respective members of the second top finger multi-layer metal acoustic reflector electrodes 716A, 716AA (e.g., adjacent lateral spacing between first top finger 715A and second top finger 716A) may be about one micrometer (1 um).

The lower section of FIG. 7B shows the simplified cross sectional view of the example Laterally Coupled Resonator Filter (LCRF) 700B (corresponding to the simplified top view). Shown in cross section view are the plurality of first top electrical contacts 771B, 772B of the first top bus bar. Also shown in cross sectional view are the plurality of second top electric contacts 773B, 774B of the second top bus bar. Respective members of the plurality of first top electrical contacts 771B, 772B of the first top bus bar may contact (e.g., may be electrically coupled with) respective members of the plurality of first top fingers (e.g., members of the plurality of first top finger multi-layer metal acoustic reflector electrodes 715B, 715BB). Respective members of the plurality of second top electric contacts 773B, 774B of the second top bus bar may contact (e.g., may be electrically coupled with) respective members of the plurality of second top fingers (e.g., members of the plurality of second top finger multi-layer metal acoustic reflector electrodes 716B, 716BB).

As shown in FIG. 7B, to provide for de-tuning (e.g., tuning up) of the multi-layer top acoustic reflectors 715B, 716B, 715BB, 716BB, respective layer thickness may be thinner for respective first members 737B, 737C, 737D, 737E of the respective first pairs 737B, 739B, 737C, 739C, 737D, 739D, 737E, 739E of top metal electrode layers. For example, the respective first members 737B, 737C, 737D, 737E of the respective first pairs of top metal electrode layers for the respective multi-layer top de-tuned acoustic reflectors are depicted as relatively thinner (e.g., respective thickness of the first members 737B, 737C, 737D, 737E of the first pairs of top metal electrode layers are depicted as relatively thinner) than respective thicknesses of remainder top acoustic layers. For example, respective thicknesses of the first members 737B, 737C, 737D, 737E of the first pairs of top metal electrode layers may be about 300 Angstroms lesser, e.g., substantially lesser than an odd multiple (e.g., 1×, 3×, etc.) of a quarter of a wavelength (e.g., 300 Angstroms lesser than one quarter of the acoustic wavelength) for the first members 737B, 737C, 737D, 737E of the first pairs of top metal electrode layers. For example, if Titanium is used as the low acoustic impedance metal for a 5 GHz LCRF (e.g., resonator having a main/center resonant frequency of about 5 GHz), respective thicknesses for the first members 737B, 737C, 737D, 737E of the first pairs of top metal electrode layers of the top acoustic reflectors may be about 2850 Angstroms, while respective layer thicknesses shown in FIG. 7B for corresponding members of the additional pairs of top metal electrode layers may also be substantially thinner Respective layer thickness for the respective second members 739B, 739C, 739D, 739E of the respective first pairs of top metal electrode layers of may correspond to approximately a quarter wavelength (e.g., a quarter acoustic wavelength) of the resonant frequency of the LCRF (e.g., respective layer thickness of about three thousand one hundred fifty Angstroms (3150 A) for the example 5 GHz LCRF.) In other words, the first top multi-layer metal acoustic reflector comb electrode may have a quarter wavelength resonant acoustic frequency that is detuned from the resonant acoustic frequency of the piezoelectric resonator of the Laterally Coupled Resonator Filter (LCRF). Similarly, the second top multi-layer metal acoustic reflector comb electrode may have a quarter wavelength resonant acoustic frequency that is detuned from the resonant acoustic frequency of the piezoelectric resonator of the Laterally Coupled Resonator Filter (LCRF).

Additional member layers of the plurality of first top fingers (e.g., additional member layers of the plurality of first top finger multi-layer metal de-tuned acoustic reflector electrodes 715B, 715BB) may comprise respective quarter wave stacks of alternating high acoustic impedance and low acoustic impedance top metal electrode layers 739B, 741B, 743B, 739D, 741D, 743D. Similarly, additional member layers of the plurality of second top fingers (e.g., additional members of the plurality of second top finger multi-layer metal de-tuned acoustic reflector electrodes 716B, 716BB) may comprise respective quarter wave stacks of alternating high acoustic impedance and low acoustic impedance metal electrode layers 739C, 741C, 743C, 739E, 741E, 743E. Acoustic impedance of the respective second members 739B, 739C, 739D, 739E of the respective first pairs of metal layers (e.g., acoustic impedance of Tungsten metal layers 739B, 739C, 739D, 739E) may be at least about twice as high as acoustic impedance of respective first members 737B, 737C, 737D, 737E of the first pair of metal layers (e.g., acoustic impedance of Titanium metal layers 737B, 737C, 737D, 737E).

An example four layer stack of alternating piezoelectric axis layers of piezoelectric material may comprise bottom normal axis piezoelectric layer 705D, first middle reverse axis piezoelectric layer 707D, second middle normal axis layer 709D and top reverse axis piezoelectric layer 711D. First interposer layer 759C may be interposed between bottom normal axis piezoelectric layer 705D and first middle reverse axis piezoelectric layer 707D. Second interposer layer 761C may be interposed between first middle reverse axis piezoelectric layer 707D and second middle normal axis layer 709D. Third interposer layer 763C may be interposed between second middle normal axis layer 709D and top reverse axis piezoelectric layer 711D.

As shown in FIG. 7B, to provide for de-tuning (e.g., tuning down) of the bottom acoustic reflector, layer thickness may be thicker for first member 719C of the first pair 719C, 721C of bottom metal electrode layers. For example, the first member 719C of the first pair of bottom metal electrode layers for the bottom acoustic reflector is depicted as relatively thicker (e.g., thickness of the first member 719C of the first pair of bottom metal electrode layers is depicted as relatively thicker) than thicknesses of remainder bottom acoustic layers. For example, thickness of the first member 719C of the first pair of bottom metal electrode layers may be about 300 A greater, e.g., substantially greater than an odd multiple (e.g., 1×, 3×, etc.) of a quarter of a wavelength (e.g., 300 A greater than one quarter of the acoustic wavelength) for the first member 719C of the first pair of bottom metal electrode layers. For example, if Titanium is used as the low acoustic impedance metal for a 5 GHz LCRF (e.g., LCRF having a main/center resonant frequency of about 5 GHz), thickness for the first member 719C of the first pair of bottom metal electrode layers of the bottom acoustic reflector may be about 3450 Angstroms, while layer thickness shown in FIG. 7B for corresponding members of the additional pair of bottom metal electrode layers may also be substantially thicker. Layer thickness for the second member 721C of the first pair of bottom metal electrode layers of may correspond to approximately a quarter wavelength (e.g., a quarter acoustic wavelength) of the resonant frequency of the LCRF (e.g., layer thickness of about three thousand one hundred fifty Angstroms (3150 A) for the example 5 GHz LCRF.)

A bottom stack of a multi-layer metal de-tuned acoustic reflector electrode may further comprise a quarter wave stack of additional alternating high acoustic impedance and low acoustic impedance bottom metal electrode layers 723C, 725C. The example four layer stack of alternating piezoelectric axis layers of piezoelectric material my be sandwiched between the bottom stack of a multi-layer metal de-tuned acoustic reflector electrode and the top arrangement of first top finger multi-layer metal de-tuned acoustic reflector electrodes 715B, 715BB and second top finger multi-layer metal de-tuned acoustic reflector electrodes 716B, 716BB. An etched edge region 753C may be associated with example Laterally Coupled Resonator Filter (LCRF) 700B. The example Laterally Coupled Resonator Filter (LCRF) 700B may also include a laterally opposing etched edge region 754C arranged opposite from the etched edge region 753A. The etched edge region 753C (and the laterally opposing etch edge region 754C) may similarly extend through various members of the example Laterally Coupled Resonator Filter (LCRF) 700B, in a similar fashion as discussed previously herein with respect to bulk acoustic wave resonators. Mesa structures of the example Laterally Coupled Resonator Filter (LCRF) 700B may extend between the etched edge region 753C (and the laterally opposing etch edge region 754C) comprising: a first mesa structure including the four layer stack of alternating piezoelectric axis layers of piezoelectric material; a second mesa structure including the bottom stack of a multi-layer metal de-tuned acoustic reflector electrode; and a third set of mesa structures including the top arrangement of first top finger multi-layer metal de-tuned acoustic reflector electrodes 715B, 715BB and the second top finger multi-layer metal de-tuned acoustic reflector electrodes 716B, 716BB. The example Laterally Coupled Resonator Filter (LCRF) 700B may include first bottom electrical interconnect 766B (e.g., input ground, e.g., In −) and second bottom electrical interconnect 768B (e.g., output ground, e.g., Out −). First bottom electrical interconnect 766B and second bottom electrical interconnect 768B may electrically contact (e.g., electrically couple with) the bottom stack of multi-layer metal de-tuned acoustic reflector electrode. A lateral dimension X7 of the example Laterally Coupled Resonator Filter (LCRF) 700B may be less than about three millimeters. For the sake of brevity, all of the previous additional teachings of this disclosure and directed to mesa structures, to interposers, to stacks of alternating axis piezoelectric layers, to bottom stacks of multi-layer metal de-tuned acoustic reflector electrodes and to top stacks of multi-layer metal de-tuned acoustic reflector electrodes are not repeated here, but rather are incorporated by reference within this disclosure.

For example, in the plurality of top de-tuned reflector electrodes, respective first members 737B, 737C, 737D, 737E having the relatively lower acoustic impedance of the first pairs may be arranged nearest, e.g. may abut, first piezoelectric layer (e.g. top piezoelectric layer 711D of the LCRF, e.g., the piezoelectric stack of the LCRF). For example, in respective top de-tuned reflector electrodes, the respective first members 737B, 737C, 737D, 737E having the relatively lower acoustic impedance of the respective first pairs may be arranged substantially nearest, e.g. may substantially abut, first piezoelectric layer (top piezoelectric layer 711D of the LCRF, e.g., the piezoelectric stack of the LCRF). This may facilitate suppressing parasitic lateral modes. In the plurality of multi-layer metal top de-tuned reflector electrodes, the respective first members 737B, 737C, 737D, 737E having the relatively lower acoustic impedance may be arranged sufficiently proximate to the first layer of piezoelectric material (e.g. may be arranged sufficiently proximate to top piezoelectric layer 711D of the LCRF, e.g., may be arranged sufficiently proximate to the piezoelectric stack of the LCRF), so that the respective first members 737B, 737C, 737D, 737E having the relatively lower acoustic impedance may contribute more to the respective multi-layer metal top acoustic reflector electrodes being acoustically de-tuned from the resonant frequency of the LCRF than is contributed by any other top metal electrode layer of the respective multi-layer metal top acoustic reflector electrodes. In the plurality of multi-layer top de-tuned reflector electrodes, the respective first members 737B, 737C, 737D, 737E having the relatively lower acoustic impedance may be arranged sufficiently proximate to the first layer of piezoelectric material (e.g. may be arranged sufficiently proximate to the top piezoelectric layer 711D of the LCRF, e.g., may be arranged sufficiently proximate to the piezoelectric stack of the LCRF), so that the respective first members having the relatively lower acoustic impedance may contribute more, e.g., may contribute more to facilitate suppressing parasitic lateral resonances in operation of the LCRF than is contributed by any other top metal electrode layer of the plurality of multi-layer metal top acoustic reflector electrodes.

For example, in the bottom de-tuned reflector electrodes, the first member 719C having the relatively lower acoustic impedance of the first pair may be arranged nearest, e.g. may abut, a piezoelectric layer (e.g. bottom piezoelectric layers 705D of the LCRF, e.g., the piezoelectric stack of the LCRF). For example, in the multi-layer bottom de-tuned reflector electrode, the first member 719C of the respective first pair of layers of the multi-layer bottom de-tuned reflector electrode having the relatively lower acoustic impedance of the first pair may be arranged substantially nearest, e.g. may substantially abut, the piezoelectric layer (e.g. bottom piezoelectric layer 705D of the LCRF, e.g., the piezoelectric stack of the LCRF). This may facilitate suppressing parasitic lateral modes. In the multi-layer bottom de-tuned reflector electrode, the first member 719C having the relatively lower acoustic impedance may be arranged sufficiently proximate to the layer of piezoelectric material (e.g. may be arranged sufficiently proximate to bottom piezoelectric layer 705D, e.g. may be arranged sufficiently proximate to the piezoelectric stack), so that the first member 719C having the relatively lower acoustic impedance may contribute more to the multi-layer metal bottom acoustic reflector electrode being acoustically de-tuned from the main/center resonant frequency of the LCRF than is contributed by any other of the bottom metal electrode layers of the multi-layer metal bottom acoustic reflector electrode. In the bottom de-tuned reflector electrode, the first member 719C having the relatively lower acoustic impedance may be arranged sufficiently proximate to the layer of piezoelectric material (e.g. may be arranged sufficiently proximate to the bottom piezoelectric layer 705D, e.g. may be arranged sufficiently proximate to the piezoelectric stack), so that the first member 719C having the relatively lower acoustic impedance may contribute more, e.g., may contribute more to facilitate suppressing parasitic lateral resonances in operation of the plurality of LCRF than is contributed by any other bottom metal electrode layers of the multi-layer metal bottom acoustic reflector electrode.

FIG. 7C shows a simplified top view of an example Contour Mode Resonator (CMR) and also shows a simplified cross section view of the Contour Mode Resonator (CMR) shown in the simplified top view. FIG. 7C shows simplified top view of an example contour mode resonator 1700A in an upper section of FIG. 7C. A lower section of FIG. 7C shows a simplified cross sectional view of the example contour mode resonator 1700B (corresponding to the simplified top view). As shown in the simplified top view in the upper portion of FIG. 7C, the contour mode resonator 1700A may comprise a top contour electrode disposed over the stack of piezoelectric layers. The top electrode (e.g., top contour electrode) may comprise a plurality of top electrode structures. The top electrode (e.g., top contour electrode) may comprise a first top comb electrode including a first top bus bar 1771. The first top comb electrode may comprise a plurality of first top finger multi-layer metal acoustic reflector electrodes 1715A, 1715AA. The first top bus bar 1771 may include a plurality of first top electrical contacts 1771A, 1772A respectively contacting the plurality of first top finger multi-layer metal acoustic reflector electrodes 1715A, 1715AA. The plurality of first top finger multi-layer metal acoustic reflector electrodes 1715A, 1715AA may extend in a first direction from the first top bus bar 1771. In other words, the top portion of FIG. 7C shows the first top multi-layer metal acoustic reflector comb electrode, which may comprise the first top bus bar 1771 coupled with the first plurality of multi-layer metal fingers 1715A, 1715AA extending in the first direction away from the first top bus bar 1771. Additionally, the top electrode (e.g., top contour electrode) may comprise a second top comb electrode including a second top bus bar 1773. The second top comb electrode may comprise a plurality of second top finger multi-layer metal acoustic reflector electrodes 1716A, 1716AA. The second top bus bar 1773 may include a plurality of second top electric contacts 1773A, 1774A respectively contacting the plurality of second top finger multi-layer metal acoustic reflector electrodes 1716A, 1716AA. The plurality of second top finger multi-layer metal acoustic reflector electrodes 1716A, 1716AA may extend in a second direction from the second top bus bar 1773. In other words, the top portion of FIG. 7C shows the second top multi-layer metal acoustic reflector comb electrode, which may comprise the second top bus bar 1773 coupled with the second plurality of multi-layer metal fingers 1716A, 1716AA extending in the second direction away from the second top bus bar 1773. The second direction may be substantially opposite to the first direction such that the plurality of first top fingers (e.g., plurality of first top finger multi-layer metal acoustic reflector electrodes 1715A, 1715AA) and the plurality of second top fingers (e.g., plurality of second top finger multi-layer metal acoustic reflector electrodes 1716A, 1716AA) may form a top interleaving pattern (e.g., interdigitated pattern), as shown in top view in the upper portion of FIG. 7C. The first top bus bar 1771, including the plurality of first top electrical contacts 1771A, 1772A, and the second top bus bar 1773, including the plurality of second top electric contacts 1773A, 1774A, may be formed by sputter deposition and patterning a suitable metal e.g., gold (Au). A suitable sputter deposited and patterned metal, e.g., patterned gold (AU), may be used for first bottom electrical interconnect 1766A and second bottom interconnect 1768A.

The contour mode resonator 1700A as shown in simplified top view in the upper portion of FIG. 7C may include a signal port. The signal port of contour mode resonator 1700A may comprise a positive signal input contact (+) at an extremity of the second top bus bar 1773 and a negative signal input contact (−) at an extremity of the first top bus bar 1771. Adjacent lateral spacing between respective members of the first top finger multi-layer metal de-tuned acoustic reflector electrodes 1715A, 1715AA and respective members of the second top finger multi-layer metal de-tuned acoustic reflector electrodes 1716A, 1716AA (e.g., adjacent lateral spacing between first top finger 1715A and second top finger 1716A, e.g., adjacent lateral spacing between first top finger 1715AA and second top finger 1716A, e.g., adjacent lateral between first top finger 1715AA and second top finger 1716AA) may be selected to determine (at least in part) SHF or EHF frequency characteristics of the contour mode resonator 1700A. For example, for a SHF contour mode resonator having a main resonant frequency of about five Gigahertz (5 GHz), adjacent lateral spacing between respective members of the first top finger multi-layer metal de-tuned acoustic reflector electrodes 1715A, 1715AA and respective members of the second top finger multi-layer metal de-tuned acoustic reflector electrodes 1716A, 1716AA (e.g., adjacent lateral spacing between first top finger 1715A and second top finger 1716A) may be about one micrometer (1 um). Notably, various realizations of contour mode resonator 1700A are possible by various connections of a positive signal input contact (+) at an extremity of the second top bus bar 1773, a negative signal input contact (−) at an extremity of the first top bus bar 1771 and a common connection 1768A, as may be appreciated by one skilled in the art. In one non-limiting illustrative example, thickness field excitation contour mode resonator 1700A may be realized by connecting positive signal input contact (+) at the extremity of the second top bus bar 1773 and negative signal input contact (−) at the extremity of the first top bus bar 1771 to a signal port and connecting common connection 1768A to a ground terminal. In another non-limiting illustrative example, a mixed thickness/lateral field excitation contour mode resonator 1700A may be realized by connecting positive signal input contact (+) at the extremity of the second top bus bar 1773 to a signal port and connecting a negative signal input contact (−) at the extremity of the first top bus bar 1771 to a ground terminal, while keeping common connection 1768A electrically floating. In yet another non-limiting illustrative example a mixed thickness/lateral field excitation contour mode resonator 1700A may be realized by connecting positive signal input contact (+) at the extremity of the second top bus bar 1773 to a signal port and connecting a negative signal input contact (−) at the extremity of the first top bus bar 1771 and a common connection 1768A to a ground terminal. In yet another non-limiting illustrative example a mixed thickness/lateral field excitation contour mode resonator 1700A may be realized by connecting positive signal input contact (+) at the extremity of the second top bus bar 1773 to a signal port and connecting a common connection 1768A to a ground terminal while keeping a negative a negative signal input contact (−) at the extremity of the first top bus bar 1771 electrically floating.

The lower section of FIG. 7C shows the simplified cross sectional view of the example contour mode resonator 1700B (corresponding to the simplified top view). Shown in cross section view are the plurality of first top electrical contacts 1771B, 1772B of the first top bus bar. Also shown in cross sectional view are the plurality of second top electric contacts 1773B, 1774B of the second top bus bar. Respective members of the plurality of first top electrical contacts 1771B, 1772B of the first top bus bar may contact (e.g., may be electrically coupled with) respective members of the plurality of first top fingers (e.g., members of the plurality of first top finger multi-layer metal de-tuned acoustic reflector electrodes 1715B, 1715BB). Respective members of the plurality of second top electric contacts 1773B, 1774B of the second top bus bar may contact (e.g., may be electrically coupled with) respective members of the plurality of second top fingers (e.g., members of the plurality of second top finger multi-layer metal de-tuned acoustic reflector electrodes 1716B, 1716BB).

As shown in FIG. 7C, to provide for de-tuning (e.g., tuning up) of the multi-layer top acoustic reflectors 1715B, 1716B, 1715BB, 1716BB, respective layer thickness may be thinner for respective first members 1737B, 1737C, 1737D, 1737E of the respective first pairs 1737B, 1739B, 1737C, 1739C, 1737D, 1739D, 1737E, 1739E of top metal electrode layers. For example, the respective first members 1737B, 1737C, 1737D, 1737E of the respective first pairs of top metal electrode layers for the respective multi-layer top de-tuned acoustic reflectors are depicted as relatively thinner (e.g., respective thickness of the first members 1737B, 1737C, 1737D, 1737E of the first pairs of top metal electrode layers are depicted as relatively thinner) than respective thicknesses of remainder top acoustic layers. For example, respective thicknesses of the first members 1737B, 1737C, 1737D, 1737E, 1739E of the first pairs of top metal electrode layers may be about 300 Angstroms lesser, e.g., substantially lesser than an odd multiple (e.g., 1×, 3×, etc.) of a quarter of a wavelength (e.g., 300 Angstroms lesser than one quarter of the acoustic wavelength) for the first members 1737B, 1737C, 1737D, 1737E of the first pairs of top metal electrode layers. For example, if Titanium is used as the low acoustic impedance metal for a 5 GHz CMR (e.g., resonator having a main/center resonant frequency of about 5 GHz), respective thicknesses for the first members 1737B, 1737C, 1737D, 1737E of the first pairs of top metal electrode layers of the top acoustic reflectors may be about 2850 Angstroms, while respective layer thicknesses shown in FIG. 7C for corresponding members of the additional pairs of top metal electrode layers may also be substantially thinner Respective layer thickness for the respective second members 1739B, 1739C, 1739D, 1739E of the respective first pairs of top metal electrode layers of may correspond to approximately a quarter wavelength (e.g., a quarter acoustic wavelength) of the resonant frequency of the CMR (e.g., respective layer thickness of about three thousand one hundred fifty Angstroms (3150 A) for the example 5 GHz CMR.) In other words, the first top multi-layer metal acoustic reflector comb electrode may have a quarter wavelength resonant acoustic frequency that is detuned from the resonant acoustic frequency of the piezoelectric Contour Mode Resonator (CMR). Similarly, the second top multi-layer metal acoustic reflector comb electrode may have a quarter wavelength resonant acoustic frequency that is detuned from the resonant acoustic frequency of the piezoelectric Contour Mode Resonator (CMR).

Additional member layers members of the plurality of first top fingers (e.g., members of the plurality of first top finger multi-layer metal de-tuned acoustic reflector electrodes 1715B, 1715BB) may comprise respective quarter wave stacks of alternating high acoustic impedance and low acoustic impedance top metal electrode layers 1739B, 1741B, 1743B, 1739D, 1741D, 1743D. Similarly, additional members of the plurality of second top fingers (e.g., members of the plurality of second top finger multi-layer metal de-tuned acoustic reflector electrodes 1716B, 1716BB) may comprise respective quarter wave stacks of alternating high acoustic impedance and low acoustic impedance metal electrode layers 1739C, 1741C, 1743C, 1739E, 1741E, 1743E. Acoustic impedance of the respective second members 1739B, 1739C, 1739D, 1739E of the respective first pairs of metal layers (e.g., acoustic impedance of Tungsten metal layers 1739B, 1739C, 1739D, 1739E) may be at least about twice as high as acoustic impedance of respective first members 1737B, 1737C, 1737D, 1737E of the first pair of metal layers (e.g., acoustic impedance of Titanium metal layers 1737B, 1737C, 1737D, 1737E).

An example four layer stack of alternating piezoelectric axis layers of piezoelectric material may comprise bottom normal axis piezoelectric layer 1705D, first middle reverse axis piezoelectric layer 1707D, second middle normal axis layer 1709D and top reverse axis piezoelectric layer 1711D. First interposer layer 1759C may be interposed between bottom normal axis piezoelectric layer 1705D and first middle reverse axis piezoelectric layer 1707D. Second interposer layer 1761C may be interposed between first middle reverse axis piezoelectric layer 1707D and second middle normal axis layer 1709D. Third interposer layer 1763C may be interposed between second middle normal axis layer 1709D and top reverse axis piezoelectric layer 1711D.

As shown in the FIG. 7C, to provide for de-tuning (e.g., tuning down) of the bottom acoustic reflector, layer thickness may be thicker for first member 1719C of the first pair 1719C, 1721C of bottom metal electrode layers. For example, the first member 1719C of the first pair of bottom metal electrode layers for the bottom acoustic reflector is depicted as relatively thicker (e.g., thickness of the first member 1719C of the first pair of bottom metal electrode layers is depicted as relatively thicker) than thicknesses of remainder bottom acoustic layers. For example, thickness of the first member 1719C of the first pair of bottom metal electrode layers may be about 300 Angstroms greater, e.g., substantially greater than an odd multiple (e.g., 1×, 3×, etc.) of a quarter of a wavelength (e.g., 300 Angstroms greater than one quarter of the acoustic wavelength) for the first member 1719C of the first pair of bottom metal electrode layers. For example, if Titanium is used as the low acoustic impedance metal for a 5 GHz CMR (e.g., CMR having a main/center resonant frequency of about 5 GHz), thickness for the first member 1719C of the first pair of bottom metal electrode layers of the bottom acoustic reflector may be about 3450 Angstroms, while layer thickness shown in FIG. 7C for corresponding members of the additional pair of bottom metal electrode layers may also be substantially thicker. Layer thickness for the second member 1721C of the first pair of bottom metal electrode layers of may correspond to approximately a quarter wavelength (e.g., a quarter acoustic wavelength) of the resonant frequency of the CMR (e.g., layer thickness of about three thousand one hundred fifty Angstroms (3150 A) for the example 5 GHz CMR.)

The bottom stack of a multi-layer metal de-tuned acoustic reflector electrode may comprise a quarter wave stack of additional alternating high acoustic impedance and low acoustic impedance bottom metal electrode layers 1723C, 1725C. The example four layer stack of alternating piezoelectric axis layers of piezoelectric material my be sandwiched between the bottom stack of a multi-layer metal de-tuned acoustic reflector electrode and the top arrangement of first top finger multi-layer metal de-tuned acoustic reflector electrodes 1715B, 1715BB and second top finger multi-layer metal de-tuned acoustic reflector electrodes

1716B, 1716BB. An etched edge region 1753C may be associated with example contour mode resonator 1700B. The example contour mode resonator 1700B may also include a laterally opposing etched edge region 1754C arranged opposite from the etched edge region 853A. The etched edge region 1753C (and the laterally opposing etch edge region 1754C) may similarly extend through various members of the example contour mode resonator 1700B, in a similar fashion as discussed previously herein with respect to bulk acoustic wave resonators. Mesa structures of the example contour mode resonator 1700B may extend between the etched edge region 1753C (and the laterally opposing etch edge region 1754C) comprising: a first mesa structure including the four layer stack of alternating piezoelectric axis layers of piezoelectric material; a second mesa structure including the bottom stack of a multi-layer metal de-tuned acoustic reflector electrode; and a third set of mesa structures including the top arrangement of first top finger multi-layer metal de-tuned acoustic reflector electrodes 1715B, 1715BB and the second top finger multi-layer metal de-tuned acoustic reflector electrodes 1716B, 1716BB. The example contour mode resonator 1700B may include first bottom electrical interconnect 1768B (e.g., common, e.g., ground). First bottom electrical interconnect 1768B may electrically contact (e.g., electrically couple with) the bottom stack of multi-layer metal de-tuned acoustic reflector electrode. A lateral dimension X8 of the example contour mode resonator 1700B may be less than about three millimeters. For the sake of brevity, all of the previous additional teachings of this disclosure and directed to mesa structures, to interposers, to stacks of alternating axis piezoelectric layers, to bottom stacks of multi-layer metal de-tuned acoustic reflector electrodes and to top stacks of multi-layer metal de-tuned acoustic reflector electrodes are not repeated here, but rather are incorporated by reference within this disclosure.

For example, in the plurality of top de-tuned reflector electrodes, respective first members 1737B, 1737C, 1737D, 1737E having the relatively lower acoustic impedance of the first pairs may be arranged nearest, e.g. may abut, first piezoelectric layer (e.g. top piezoelectric layer 1711D of the CMR, e.g., the piezoelectric stack of the CMR). For example, in respective top de-tuned reflector electrodes, the respective first members 1737B, 1737C, 1737D, 1737E having the relatively lower acoustic impedance of the respective first pairs may be arranged substantially nearest, e.g. may substantially abut, first piezoelectric layer (top piezoelectric layer 1711D of the CMR, e.g., the piezoelectric stack of the CMR). This may facilitate suppressing parasitic lateral modes. In the plurality of multi-layer metal top de-tuned reflector electrodes, the respective first members 1737B, 1737C, 1737D, 1737E having the relatively lower acoustic impedance may be arranged sufficiently proximate to the first layer of piezoelectric material (e.g. may be arranged sufficiently proximate to top piezoelectric layer 1711D of the CMR, e.g., may be arranged sufficiently proximate to the piezoelectric stack of the CMR), so that the respective first members 1737B, 1737C, 1737D, 1737E having the relatively lower acoustic impedance may contribute more to the respective multi-layer metal top acoustic reflector electrodes being acoustically de-tuned from the resonant frequency of the CMR than is contributed by any other top metal electrode layer of the respective multi-layer metal top acoustic reflector electrodes. In the plurality of multi-layer top de-tuned reflector electrodes, the respective first members 1737B, 1737C, 1737D, 1737E having the relatively lower acoustic impedance may be arranged sufficiently proximate to the first layer of piezoelectric material (e.g. may be arranged sufficiently proximate to the top piezoelectric layer 1711D of the CMR, e.g., may be arranged sufficiently proximate to the piezoelectric stack of the CMR), so that the respective first members having the relatively lower acoustic impedance may contribute more, e.g., may contribute more to facilitate suppressing parasitic lateral resonances in operation of the CMR than is contributed by any other top metal electrode layer of the plurality of multi-layer metal top acoustic reflector electrodes.

For example, in the bottom de-tuned reflector electrodes, the first member 1719C having the relatively lower acoustic impedance of the first pair may be arranged nearest, e.g. may abut, a piezoelectric layer (e.g. bottom piezoelectric layers 1705D of the CMR, e.g., the piezoelectric stack of the CMR). For example, in the multi-layer bottom de-tuned reflector electrode, the first member 1719C of the respective first pair of layers of the multi-layer bottom de-tuned reflector electrode having the relatively lower acoustic impedance of the first pair may be arranged substantially nearest, e.g. may substantially abut, the piezoelectric layer (e.g. bottom piezoelectric layer 1705D of the CMR, e.g., the piezoelectric stack of the CMR). This may facilitate suppressing parasitic lateral modes. In the multi-layer bottom de-tuned reflector electrode, the first member 1719C having the relatively lower acoustic impedance may be arranged sufficiently proximate to the layer of piezoelectric material (e.g. may be arranged sufficiently proximate to bottom piezoelectric layer 1705D, e.g. may be arranged sufficiently proximate to the piezoelectric stack), so that the first member 1719C having the relatively lower acoustic impedance may contribute more to the multi-layer metal bottom acoustic reflector electrode being acoustically de-tuned from the main resonant frequency of the CMR than is contributed by any other of the bottom metal electrode layers of the multi-layer metal bottom acoustic reflector electrode. In the bottom de-tuned reflector electrode, the first member 1719C having the relatively lower acoustic impedance may be arranged sufficiently proximate to the layer of piezoelectric material (e.g. may be arranged sufficiently proximate to the bottom piezoelectric layer 1705D, e.g. may be arranged sufficiently proximate to the piezoelectric stack), so that the first member 1719C having the relatively lower acoustic impedance may contribute more, e.g., may contribute more to facilitate suppressing parasitic lateral resonances in operation of the plurality of CMR than is contributed by any other bottom metal electrode layers of the multi-layer metal bottom acoustic reflector electrode.

Figure 8B:
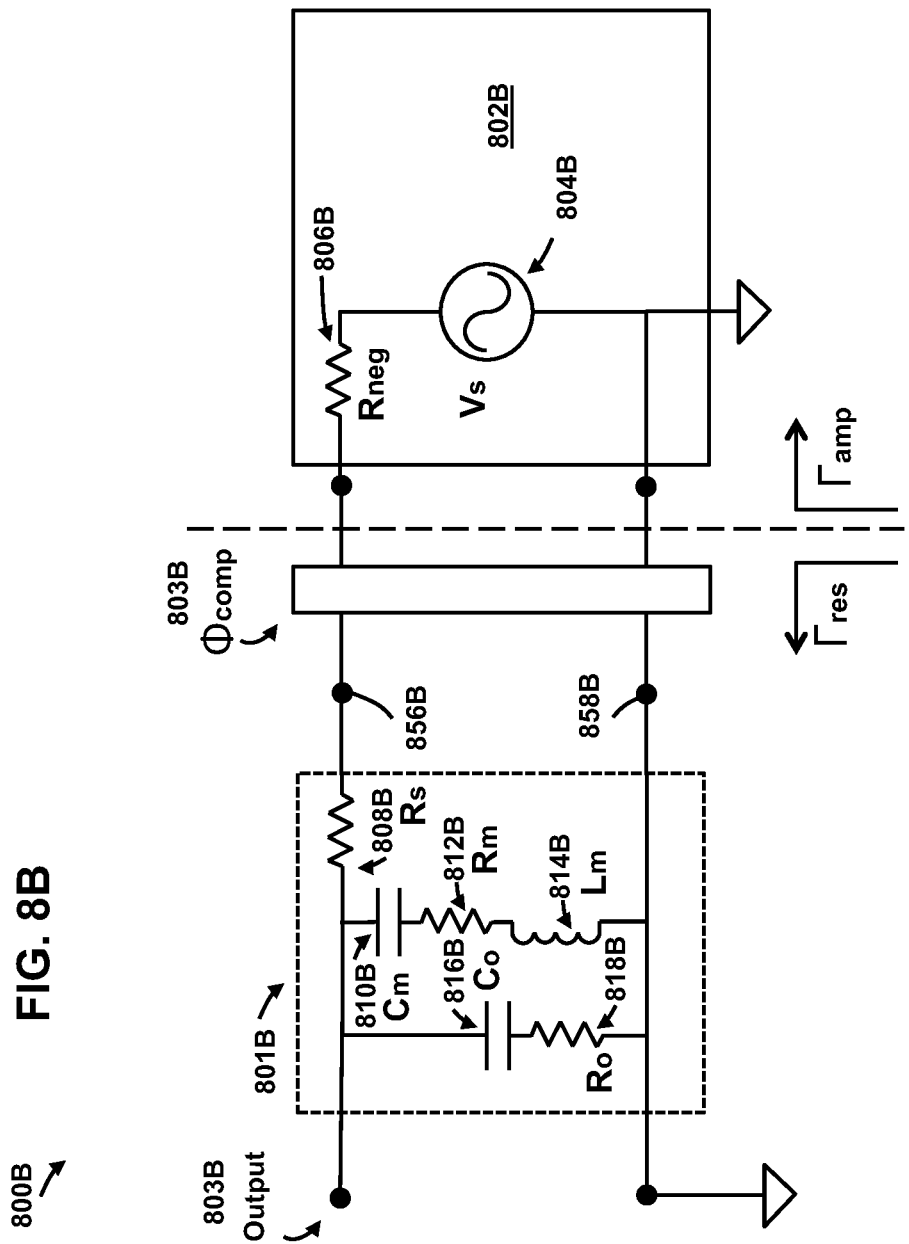
FIG. 8B shows a schematic of and example circuit implementation of the oscillator shown in FIG. 8A.

FIGS. 8A and 8B show an example oscillator 800A, 800B (e.g., millimeter wave oscillator 800A, 800B, e.g., Super High Frequency (SHF) wave oscillator 800A, 800B, e.g., Extremely High Frequency (EHF) wave oscillator 800A, 800B) using the bulk acoustic wave resonator structure of FIG. 1A. For example, FIGS. 8A and 8B shows simplified views of bulk acoustic wave resonator 801A, 801B and electrical coupling nodes 856A, 858A, 856B, 858B that may be electrically coupled with bulk acoustic wave resonator 801A, 801B. As shown in FIGS. 8A and 8B, electrical coupling nodes 856A, 858A, 856B, 858B may facilitate an electrical coupling of bulk acoustic wave resonator 801A, 801B with electrical oscillator circuitry (e.g., active oscillator circuitry 802A, 802B), for example, through phase compensation circuitry 803A, 803B (Φcomp). The example oscillator 800A, 800B may be a negative resistance oscillator, e.g., in accordance with a one-port model as shown in FIGS. 8A and 8B. The electrical oscillator circuitry, e.g., active oscillator circuitry may include one or more suitable active devices (e.g., one or more suitably configured amplifying transistors) to generate a negative resistance commensurate with resistance of the bulk acoustic wave resonator 801A, 801B. In other words, energy lost in bulk acoustic wave resonator 801A, 801B may be replenished by the active oscillator circuitry, thus allowing steady oscillation, e.g., steady SHF or EHF wave oscillation. To ensure oscillation start-up, active gain (e.g., negative resistance) of active oscillator circuitry 802A, 802B may be greater than one. As illustrated on opposing sides of a notional dashed line in FIGS. 8A and 8B, the active oscillator circuitry 802A, 802B may have a complex reflection coefficient of the active oscillator circuitry (Γamp), and the bulk acoustic wave resonator 801A, 801B together with the phase compensation circuitry 803A, 803B (Φcomp) may have a complex reflection coefficient (Γres). To provide for the steady oscillation, e.g., steady SHF or EHF wave oscillation, a magnitude may be greater than one for |Γamp Γres|, e.g., magnitude of a product of the complex reflection coefficient of the active oscillator circuitry (Γamp) and the complex reflection coefficient (Γres) of the resonator to bulk acoustic wave resonator 801A, 801B together with the phase compensation circuitry 803A, 803B (Φcomp) may be greater than one. Further, to provide for the steady oscillation, e.g., steady SHF or EHF wave oscillation, phase angle may be an integer multiple of three-hundred-sixty degrees for ∠Γamp Γres, e.g., a phase angle of the product of the complex reflection coefficient of the active oscillator circuitry (Γamp) and the complex reflection coefficient (Γres) of the resonator to bulk acoustic wave resonator 801A, 801B together with the phase compensation circuitry 803A, 803B (Φcomp) may be an integer multiple of three-hundred-sixty degrees. The foregoing may be facilitated by phase selection, e.g., electrical length selection, of the phase compensation circuitry 803A, 803B (Φcomp).

In the simplified view of FIG. 8A, the bulk acoustic wave resonator 801A (e.g., bulk acoustic SHF or EHF wave resonator) includes first normal axis piezoelectric layer 805A, first reverse axis piezoelectric layer 807A, and another normal axis piezoelectric layer 809A, and another reverse axis piezoelectric layer 811A arranged in a four piezoelectric layer alternating axis stack arrangement sandwiched between multi-layer metal top de-tuned acoustic SHF or EHF wave reflector electrode 815A and multi-layer metal bottom de-tuned acoustic SHF or EHF wave reflector electrode 813A. General structures and applicable teaching of this disclosure for the multi-layer metal top de-tuned acoustic SHF or EHF reflector electrode 815A and the multi-layer metal bottom de-tuned acoustic SHF or EHF reflector electrode have already been discussed in detail previously herein with respect of FIGS. 1A and 4A through 4G, which for brevity are incorporated by reference rather than repeated fully here. As already discussed, these structures are directed to respective pairs of metal electrode layers, in which a first member of the pair has a relatively low acoustic impedance (relative to acoustic impedance of an other member of the pair), in which the other member of the pair has a relatively high acoustic impedance (relative to acoustic impedance of the first member of the pair), and in which the respective pairs of metal electrode layers have layer thicknesses corresponding to one quarter wavelength (e.g., one quarter acoustic wavelength) at a main resonant frequency of the resonator. Accordingly, it should be understood that the bulk acoustic SHF or EHF wave resonator 801A shown in FIG. 8A includes multi-layer metal top de-tuned acoustic SHF or EHF wave reflector electrode 815A and multi-layer metal bottom de-tuned acoustic SHF or EHF wave reflector electrode 815B.

For example, to provide for de-tuning (e.g., tuning up) of the multi-layer top acoustic reflector electrode 815A, a layer thickness may be thinner for a first member layer having a relatively lower acoustic impedance of top metal electrode layers. For example, the first member having a low acoustic impedance of top metal electrode layers for the multi-layer top de-tuned acoustic reflector electrode 815A may be relatively thinner (e.g., thickness of the first member having the low acoustic impedance may be relatively thinner) than respective thicknesses of remainder top acoustic metal layers. For example, respective thicknesses of the first member of the top metal electrode layers may be about 60 Angstroms lesser, e.g., substantially lesser than an odd multiple (e.g., 1×, 3×, etc.) of a quarter of a wavelength (e.g., 60 Angstroms lesser than one quarter of the acoustic wavelength) for the first member of top metal electrode layers. For example, if Titanium is used as the low acoustic impedance metal for a 24 GHz resonator (e.g., resonator having a main resonant frequency of about 24 GHz), thickness for the first member of the top metal electrode layers of the multi-layer top acoustic reflector electrode 815A may be about 570 Angstroms, while respective layer thicknesses for additional members of the top metal electrode layers may also be substantially thinner.

For example, to provide for de-tuning (e.g., tuning down) of the multi-layer bottom acoustic reflector electrode 815A, a layer thickness may be thicker for a first member layer having a relatively lower acoustic impedance of bottom metal electrode layers. For example, the first member having a low acoustic impedance of bottom metal electrode layers for the multi-layer bottom de-tuned acoustic reflector electrode 813A may be relatively thicker (e.g., thickness of the first member having the low acoustic impedance may be relatively thicker) than respective thicknesses of remainder bottom acoustic metal layers. For example, respective thicknesses of the first member of the bottom metal electrode layers may be about 60 Angstroms greater, e.g., substantially greater than an odd multiple (e.g., 1×, 3×, etc.) of a quarter of a wavelength (e.g., 60 A greater than one quarter of the acoustic wavelength) for the first member of bottom metal electrode layers. For example, if Titanium is used as the low acoustic impedance metal for a 24 GHz resonator (e.g., resonator having a main resonant frequency of about 24 GHz), thickness for the first member of the bottom metal electrode layers of the multi-layer bottom acoustic reflector electrode 815A may be about 690 Angstroms, while respective layer thicknesses for additional members of the bottom metal electrode layers may also be substantially thicker.

Additional metal electrode layers may include layer thicknesses corresponding to a quarter wavelength (e.g., one quarter of an acoustic wavelength) at a SHF or EHF wave main resonant frequency of the respective bulk acoustic SHF or EHF wave resonator 801A.

The multi-layer metal top de-tuned acoustic SHF or EHF wave reflector electrode 815A may include top metal electrode layers electrically and acoustically coupled with the four piezoelectric layer alternating axis stack arrangement (e.g., with the first normal axis piezoelectric layer 805A, e.g, with first reverse axis piezoelectric layer 807A, e.g., with another normal axis piezoelectric layer 809A, e.g., with another reverse axis piezoelectric layer 811A) to excite the piezoelectrically excitable resonance mode at the resonant frequency. For example, the de-tuned multi-layer metal top acoustic SHF or EHF wave reflector electrode 815A may include the respective first pair of top metal electrode layers, and the foregoing may have a respective quarter wavelength resonant frequency in the Super High Frequency (SHF) band or the Extremely High Frequency (EHF) band that includes the respective resonant frequency of the respective BAW resonator. Similarly, the multi-layer metal bottom de-tuned acoustic SHF or EHF wave reflector electrode 813A may include a first pair of bottom metal electrode layers electrically and acoustically coupled with the four piezoelectric layer alternating axis stack arrangement (e.g., with the first normal axis piezoelectric layer 805A, e.g, with first reverse axis piezoelectric layer 807A, e.g., with another normal axis piezoelectric layer 809A, e.g., with another reverse axis piezoelectric layer 811A) to excite the piezoelectrically excitable resonance mode at the resonant frequency. For example, the multi-layer metal bottom de-tuned acoustic SHF or EHF wave reflector electrode 813A may include the respective first pair of bottom metal electrode layers, and the foregoing may have a respective quarter wavelength resonant frequency in the Super High Frequency (SHF) band or the Extremely High Frequency (EHF) band that includes the respective resonant frequency of the respective BAW resonator.

An output 816A of the oscillator 800A may be coupled to the bulk acoustic wave resonator 801A (e.g., coupled to multi-layer metal top de-tuned acoustic SHF or EHF wave reflector electrode 815A) It should be understood that interposer layers as discussed previously herein with respect to FIG. 1A are explicitly shown in the simplified view the example resonator 801A shown in FIG. 8A. Such interposer layers may be included and interposed between adjacent piezoelectric layers. For example, a first interposer layer is arranged between first normal axis piezoelectric layer 805A and first reverse axis piezoelectric layer 807A. For example, a second interposer layer is arranged between first reverse axis piezoelectric layer 807A and another normal axis piezoelectric layer 809A. For example, a third interposer is arranged between the another normal axis piezoelectric layer 809A and another reverse axis piezoelectric layer 811A. As discussed previously herein, such interposer may be metal or dielectric, and may, but need not provide various benefits, as discussed previously herein. Alternatively or additionally, one or more (e.g., one or a plurality of) interposer layers may comprise metal and dielectric for respective interposer layers. For example, high acoustic impedance metal layer such as Tungsten (W) or Molybdenum (Mo) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts. Alternatively or additionally, one or more (e.g., one or a plurality of) interposer layers may be formed of different metal layers. For example, high acoustic impedance metal layer such as Tungsten (W) or Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited piezoelectric layer. Alternatively or additionally, one or more (e.g., one or a plurality of) interposer layers may be formed of different dielectric layers. For example, high acoustic impedance dielectric layer such as Hafnium Dioxide (HfO2) may (but need not) raise effective electromechanical coupling coefficient (Kt2). Subsequently deposited amorphous dielectric layer such as Silicon Dioxide (SiO2) may (but need not) facilitate compensating for temperature dependent frequency shifts.

A notional heavy dashed line is used in depicting an etched edge region 853A associated with example resonator 801A. The example resonator 801A may also include a laterally opposing etched edge region 854A arranged opposite from the etched edge region 853A. The etched edge region 853A (and the laterally opposing etch edge region 854A) may similarly extend through various members of the example resonator 801A of FIG. 8A, in a similar fashion as discussed previously herein with respect to the etched edge region 253D (and the laterally opposing etch edge region 254D) of example resonator 2001D shown in FIG. 2B. As shown in FIG. 8A, a first mesa structure corresponding to the stack of four piezoelectric material layers 805A, 807A, 809A, 811A may extend laterally between (e.g., may be formed between) etched edge region 853A and laterally opposing etched edge region 854A. A second mesa structure corresponding to multi-layer metal bottom de-tuned acoustic SHF or EHF wave reflector electrode 813A may extend laterally between (e.g., may be formed between) etched edge region 853A and laterally opposing etched edge region 854A. Third mesa structure corresponding to multi-layer metal top de-tuned acoustic SHF or EHF wave reflector electrode 815A may extend laterally between (e.g., may be formed between) etched edge region 853A and laterally opposing etched edge region 854A. Although not explicitly shown in the FIG. 8A simplified view of metal electrode layers, e.g., multi-layer metal top de-tuned acoustic SHF or EHF wave reflector electrode 815A, a plurality of lateral features (e.g., plurality of step features) may be sandwiched between metal electrode layers (e.g., between pairs of top metal electrode layers. The plurality of lateral features may, but need not, limit parasitic lateral acoustic modes of the example bulk acoustic wave resonator of FIG. 8A.

For example, in the multi-layer top de-tuned acoustic reflector electrode 815A, the first member having the relatively lower acoustic impedance of the first pair may be arranged nearest, e.g. may abut, first piezoelectric layer (e.g. top piezoelectric layer 811A of the resonator 801A, e.g., the piezoelectric stack of the resonator 801A). For example, in the multi-layer top de-tuned acoustic reflector electrode 815A, the first member having the relatively lower acoustic impedance of the first pair may be arranged substantially nearest, e.g. may substantially abut, the first piezoelectric layer (top piezoelectric layer 811A of the resonator 801A, e.g., the piezoelectric stack of the resonator 801A). This may facilitate suppressing parasitic lateral modes. In the multi-layer metal top de-tuned acoustic reflector electrode 815A, the first member having the relatively lower acoustic impedance may be arranged sufficiently proximate to the first layer of piezoelectric material (e.g. may be arranged sufficiently proximate to top piezoelectric layer 811A of the resonator 801A, e.g., may be arranged sufficiently proximate to the piezoelectric stack of the resonator 801A), so that the first member having the relatively lower acoustic impedance may contribute more to the multi-layer metal top acoustic reflector electrode 815A being acoustically de-tuned from the resonant frequency of the resonator 801A than is contributed by any other top metal electrode layer of the multi-layer metal top acoustic reflector electrode 815A. In the multi-layer metal top de-tuned acoustic reflector electrode 815A, the first member having the relatively lower acoustic impedance may be arranged sufficiently proximate to the first layer of piezoelectric material (e.g. may be arranged sufficiently proximate to the top piezoelectric layer 811A of the resonator 801A, e.g., may be arranged sufficiently proximate to the piezoelectric stack of the resonator 801A), so that the first member having the relatively lower acoustic impedance may contribute more, e.g., may contribute more to facilitate suppressing parasitic lateral resonances in operation of the resonator 801A than is contributed by any other top metal electrode layer of the multi-layer metal top acoustic reflector electrode 815A.

For example, in the multi-layer metal bottom de-tuned acoustic reflector electrode 813A, the first member having the relatively lower acoustic impedance of the first pair may be arranged nearest, e.g. may abut, a piezoelectric layer (e.g. bottom piezoelectric layers 805A of the resonator 801A, e.g., the piezoelectric stack of the resonator 801A). For example, in the multi-layer metal bottom de-tuned acoustic reflector electrode 813A, the first member of the first pair of layers of the multi-layer metal bottom de-tuned acoustic reflector electrode 813A having the relatively lower acoustic impedance of the first pair may be arranged substantially nearest, e.g. may substantially abut, the piezoelectric layer (e.g. bottom piezoelectric layer 805A of the resonator 801A, e.g., the piezoelectric stack of the resonator 801A). This may facilitate suppressing parasitic lateral modes. In the multi-layer metal bottom de-tuned acoustic reflector electrode, the first member having the relatively lower acoustic impedance may be arranged sufficiently proximate to the layer of piezoelectric material (e.g. may be arranged sufficiently proximate to bottom piezoelectric layer 805A, e.g. may be arranged sufficiently proximate to the piezoelectric stack of the resonator 801A), so that the first member having the relatively lower acoustic impedance may contribute more to the multi-layer metal bottom acoustic reflector electrode 813A being acoustically de-tuned from the main resonant frequency of the resonator 801A than is contributed by any other of the bottom metal electrode layers of the multi-layer metal bottom de-tuned acoustic reflector electrode 813A. In the multi-layer metal bottom de-tuned reflector electrode 813A, the first member having the relatively lower acoustic impedance may be arranged sufficiently proximate to the layer of piezoelectric material (e.g. may be arranged sufficiently proximate to the bottom piezoelectric layer 805A, e.g. may be arranged sufficiently proximate to the piezoelectric stack), so that the first member having the relatively lower acoustic impedance may contribute more, e.g., may contribute more to facilitate suppressing parasitic lateral resonances in operation of the resonator 801A than is contributed by any other bottom metal electrode layer of the multi-layer metal bottom acoustic reflector electrode 813A.

FIG. 8B shows a schematic of and example circuit implementation of the oscillator shown in FIG. 8A. Active oscillator circuitry 802B may include active elements, symbolically illustrated in FIG. 8B by alternating voltage source 804B (Vs) coupled through negative resistance 806B (Rneg), e.g., active gain element 806B, to example bulk acoustic wave resonator 801B (e.g., bulk acoustic SHF or EHF wave resonator) via phase compensation circuitry 803B (Φcomp). The representation of example bulk acoustic wave resonator 801B (e.g., bulk acoustic SHF or EHF wave resonator) may include passive elements, symbolically illustrated in FIG. 8B by electrode ohmic loss parasitic series resistance 808B (Rs), motional capacitance 810B (Cm), acoustic loss motional resistance 812B (Rm), motional inductance 814B (Lm), static or plate capacitance 816B (Co), and acoustic loss parasitic 818B (Ro). An output 816B of the oscillator 800B may be coupled to the bulk acoustic wave resonator 801B (e.g., coupled to a multi-layer metal top de-tuned acoustic SHF or EHF wave reflector electrode of bulk acoustic wave resonator 801B).

FIGS. 9A and 9B are simplified diagrams of a frequency spectrum illustrating application frequencies and application frequency bands of the example bulk acoustic wave resonators shown in FIG. 1A and FIGS. 4A through 4G, and the example filters shown in FIGS. 5 through 7, and the example oscillators shown in FIGS. 8A and 8B. A widely used standard to designate frequency bands in the microwave range by letters is established by the United States Institute of Electrical and Electronic Engineers (IEEE). In accordance with standards published by the IEEE, as defined herein, and as shown in FIGS. 9A and 9B are application bands as follows: S Band (2 GHz-4 GHz), C Band (4 GHz-8 GHz), X Band (8 GHz-12 GHz), Ku Band (12 GHz-18 GHz), K Band (18 GHz-27 GHz), Ka Band (27 GHz-40 GHz), V Band (40 GHz-75 GHz), and W Band (75 GHz-110 GHz). FIG. 9A shows a first frequency spectrum portion 9000A in a range from three Gigahertz (3 GHz) to eight Gigahertz (8 GHz), including application bands of S Band (2 GHz-4 GHz) and C Band (4 GHz-8 GHz). As described subsequently herein, the 3rd Generation Partnership Project standards organization (e.g., 3GPP) has standardized various 5G frequency bands. For example, included is a first application band 9010 (e.g., 3GPP 5G n77 band) (3.3 GHz-4.2 GHz) configured for fifth generation broadband cellular network (5G) applications. As described subsequently herein, the first application band 9010 (e.g., 5G n77 band) includes a 5G sub-band 9011 (3.3 GHz-3.8 GHz). The 3GPP 5G sub-band 9011 includes Long Term Evolution broadband cellular network (LTE) application sub-bands 9012 (3.4 GHz-3.6 GHz), 9013 (3.6 GHz-3.8 GHz), and 9014 (3.55 GHz-3.7 GHz). A second application band 9020 (4.4 GHz-5.0 GHz) includes a sub-band 9021 for China specific applications. Discussed next are Unlicensed National Information Infrastructure (UNII) bands. A third application band 9030 includes a UNII-1 band 9031 (5.15 GHz-5.25 GHz) and a UNII-2A band 9032 (5.25 GHz 5.33 GHz). An LTE band 9033 (LTE Band 252) overlaps the same frequency range as the UNII-1 band 6031. A fourth application band 9040 includes a UNII-2C band 9041 (5.490 GHz-5.735 GHz), a UNII-3 band 9042 (5.735 GHz-5.85 GHz), a UNII-4 band 9043 (5.85 GHz-5.925 GHz), a UNII-5 band 9044 (5.925 GHz-6.425 GHz), a UNII-6 band 9045 (6.425 GHz-6.525 GHz), a UNII-7 band 9046 (6.525 GHz-6.875 GHz), and a UNII-8 band 9047 (6.875 GHz-7125 GHz). An LTE band 9048 overlaps the same frequency range (5.490 GHz-5.735 GHz) as the UNII-3 band 9042. A sub-band 9049A shares the same frequency range as the UNII-4 band 9043. An LTE band 9049B shares a subsection of the same frequency range (5.855 GHz-5.925 GHz).

FIG. 9B shows a second frequency spectrum portion 9000B in a range from eight Gigahertz (8 GHz) to one-hundred and ten Gigahertz (110 GHz), including application bands of X Band (8 GHz-12 GHz), Ku Band (12 GHz-18 GHz), K Band (18 GHz-27 GHz), Ka Band (27 GHz-40 GHz), V Band (40 GHz-75 GHz), and W Band (75 GHz-110 GHz). A fifth application band 9050 includes 3GPP 5G bands configured for fifth generation broadband cellular network (5G) applications, e.g., 3GPP 5G n258 band 9051 (24.25 GHz-27.5 GHz), e.g., 3GPP 5G n261 band 9052 (27.5 GHz-28.35 GHz), e.g., 3GPP 5G n257 band 9053 (26.5 GHz-29.5). FIG. 9B shows an EESS (Earth Exploration Satellite Service) band 9051A (23.6 GHz-24 GHz) adjacent to the 3GPP 5G n258 band 9051 (24.25 GHz-27.5 GHz). As will be discussed in greater detail subsequently herein, an example EESS notch filter of the present disclosure may facilitate protecting the EESS (Earth Exploration Satellite Service) band 9051A (23.6 GHz-24 GHz) from energy leakage from the adjacent 3GPP 5G n258 band 9051 (24.25 GHz-27.5 GHz). For example, this may facilitate satisfying (e.g., facilitate compliance with) a specification of a standards setting organization, e.g., International Telecommunications Union (ITU) specifications, e.g., ITU-R SM.329 Category A/B levels of −20 db W/200 MHz, e.g., 3rd Generation Partnership Project (3GPP) 5G specifications, e.g., 3GPP 5G, unwanted (out-of-band & spurious) emission levels, worst case of −20 db W/200 MHz. Alternatively or additionally, this may facilitate satisfying (e.g., facilitate compliance with) a regulatory requirement, e.g., a government regulatory requirement, e.g., a Federal Communications Commission (FCC) decision or requirement, e.g., a European Commission decision or requirement of −42 db W/200 MHz for 200 MHz for Base Stations (BS) and −38 db W/200 MHz for User Equipment (UE), e.g., European Commission Decision (EU) 2019/784 of 14 May 2019 on harmonization of the 24.25-27.5 GHz frequency band for terrestrial systems capable of providing wireless broadband electronic communications services in the Union, published May 16, 2019, which is hereby incorporated by reference in its entirety, e.g., a European Organization for the Exploitation of Meteorological Satellites (EUMETSAT) decision, requirement, recommendation or study, e.g., a ESA/EUMETSAT/EUMETNET study result of −54.2 db W/200 MHz for Base Stations (BS) and 50.4 db W/200 MHz for User Equipment (UE), e.g., the United Nations agency of the World Meteorological Organization (WMO) decision, requirement, recommendation or study, e.g., the WMO decision of −55 db W/200 MHz for Base Stations (BS) and −51 db W/200 MHz for User Equipment (UE). These specifications and/or decisions and/or requirements may be directed to suppression of energy leakage from an adjacent band, e.g., energy leakage from an adjacent 3GPP 5G band, e.g., suppression of transmit energy leakage from the adjacent 3GPP 5G n258 band 9051 (24.250 GHz-27.500 GHz), e.g. limiting of spurious out of n258 band emissions. A sixth application band 9060 includes the 3GPP 5G n260 band 9060 (37 GHz-40 GHz). A seventh application band 9070 includes United States WiGig Band for IEEE 802.11ad and IEEE 802.11ay 9071 (57 GHz-71 GHz), European Union and Japan WiGig Band for IEEE 802.11ad and IEEE 802.11ay 9072 (57 GHz-66 GHz), South Korea WiGig Band for IEEE 802.11ad and IEEE 802.11ay 9073 (57 GHz-64 GHz), and China WiGig Band for IEEE 802.11ad and IEEE 802.11ay 9074 (59 GHz-64 GHz). An eighth application band 9080 includes an automobile radar band 9080 (76 GHz-81 GHz).

Accordingly, it should be understood from the foregoing that the acoustic wave devices (e.g., resonators, e.g., filters, e.g., oscillators) of this disclosure may be implemented in the respective application frequency bands just discussed. For example, the layer thicknesses of the de-tuned acoustic reflector electrodes and piezoelectric layers in alternating axis arrangement for the example acoustic wave devices (e.g., the example 24 GHz bulk acoustic wave resonators) of this disclosure may be scaled up and down as needed to be implemented in the respective application frequency bands just discussed. This is likewise applicable to the example filters (e.g., bulk acoustic wave resonator based filters) and example oscillators (e.g., bulk acoustic wave resonator based oscillators) of this disclosure to be implemented in the respective application frequency bands just discussed. The following examples pertain to further embodiments for acoustic wave devices, including but not limited to, e.g., bulk acoustic wave resonators, e.g., bulk acoustic wave resonator based filters, e.g., bulk acoustic wave resonator based oscillators, and from which numerous permutations and configurations will be apparent.

A first example is an acoustic wave device comprising a substrate, a first layer of piezoelectric material having a first piezoelectric axis orientation, and a multi-layer top acoustic reflector including a first pair of top acoustic layers coupled with the first layer of piezoelectric material to reflect a piezoelectrically excitable resonance mode at a resonant frequency of the acoustic wave device, in which: a second member of the first pair of top acoustic layers has an acoustic impedance; a first member of the first pair of top acoustic layers has an acoustic impedance that is relatively lower than the acoustic impedance of the second member; and the first member having the relatively lower acoustic impedance is arranged nearer to the first layer of piezoelectric material than the second member.

A second example is an acoustic wave device as described in the first example, in which the resonant frequency of the acoustic wave device is in a 3rd Generation Partnership Project (3GPP) band.

A third example is an acoustic wave device as described in the first example in which the resonant frequency of the acoustic wave device is in a 3rd Generation Partnership Project (3GPP) band.

A fourth example is an acoustic wave device as the first example, in which the resonant frequency of the acoustic wave device is in a 3GPP n77 band 9010 as shown in FIG. 9A.

A fifth example is an acoustic wave device as described in the first example, in which the resonant frequency of the acoustic wave device is in a 3GPP n79 band 9020 as shown in FIG. 9A.

A sixth example is an acoustic wave device as described in the first example, in which the resonant frequency of the acoustic wave device is in a 3GPP n258 band 9051 as shown in FIG. 9B.

A seventh example is an acoustic wave device as described in the first example, in which the resonant frequency of the acoustic wave device is in a 3GPP n261 band 9052 as shown in FIG. 9B.

An eighth example is an acoustic wave device as described in the first example, in which the resonant frequency of the acoustic wave device is in a 3GPP n260 band as shown in FIG. 9B.

An ninth example is an acoustic wave device as described in the first example, in which the resonant frequency of the acoustic wave device is in an Institute of Electrical and Electronic Engineers (IEEE) C band as shown in FIG. 9A.

A tenth example is an acoustic wave device as described in the first example, in which the resonant frequency of the acoustic wave device is in an Institute of Electrical and Electronic Engineers (IEEE) X band as shown in FIG. 9B.

An eleventh example is an acoustic wave device as described in the first example, in which the resonant frequency of the acoustic wave device is in an Institute of Electrical and Electronic Engineers (IEEE) Ku band as shown in FIG. 9B.

A twelfth example is an acoustic wave device as described in the first example, in which the resonant frequency of the acoustic wave device is in an Institute of Electrical and Electronic Engineers (IEEE) X band as shown in FIG. 9B.

A thirteenth example is an acoustic wave device as described in the first example, in which the resonant frequency of the acoustic wave device is in an Institute of Electrical and Electronic Engineers (IEEE) K band as shown in FIG. 9B.

A fourteenth example is an acoustic wave device as described in the first example, in which the resonant frequency of the acoustic wave device is in an Institute of Electrical and Electronic Engineers (IEEE) Ka band as shown in FIG. 9B.

A fifteenth example is an acoustic wave device as described in the first example, in which the resonant frequency of the acoustic wave device is in an Institute of Electrical and Electronic Engineers (IEEE) V band as shown in FIG. 9B.

A sixteenth example is an acoustic wave device as described in the first example, in which the resonant frequency of the acoustic wave device is in an Institute of Electrical and Electronic Engineers (IEEE) W band as shown in FIG. 9B.

A seventeenth example is an acoustic wave device as described in the first example, in which the resonant frequency of the acoustic wave device is in UNII-1 band 9031, as shown in FIG. 9A.

An eighteenth example is an acoustic wave device as described in the first example, in which the resonant frequency of the acoustic wave device is in UNII-2A band 9032, as shown in FIG. 9A.

A nineteenth example is an acoustic wave device as described in the first example, in which the resonant frequency of the acoustic wave device is in UNII-2C band 9041, as shown in FIG. 9A.

A twentieth example is an acoustic wave device as described in the first example, in which the resonant frequency of the acoustic wave device is in UNII-3 band 9042, as shown in FIG. 9A.

A twenty first example is an acoustic wave device as described in the first example, in which the resonant frequency of the acoustic wave device is in UNII-4 band 9043, as shown in FIG. 9A.

A twenty second example is an acoustic wave device as described in the first example, in which the resonant frequency of the acoustic wave device is in UNII-5 band 9044, as shown in FIG. 9A.

A twenty third example is an acoustic wave device as described in the first example, in which the resonant frequency of the acoustic wave device is in UNII-6 band 9045, as shown in FIG. 9A.

A twenty fourth example is an acoustic wave device as described in the first example, in which the resonant frequency of the acoustic wave device is in UNII-7 band 9046, as shown in FIG. 9A.

A twenty fifth example is an acoustic wave device as described in the first example, in which the resonant frequency of the acoustic wave device is in UNII-8 band 9047, as shown in FIG. 9A.

A twenty sixth example is an acoustic wave device as described in the first example in which standing wave acoustic energy is to be coupled into the multi-layer top acoustic reflector in operation of the acoustic wave device, and the first member having the relatively lower acoustic impedance is arranged sufficiently proximate to the first layer of piezoelectric material, so that standing wave acoustic energy to be in the first member is greater than respective standing wave acoustic energy to be in other respective layers of the multi-layer top acoustic reflector in operation of the acoustic wave device.

A twenty seventh example is an acoustic wave device as described in the first example in which the first member having the relatively lower acoustic impedance is arranged nearest to the first layer of piezoelectric material, relative to other top acoustic layers of the multi-layer top acoustic reflector.

A twenty eighth example is an acoustic wave device as described in the first example in which the first member having the relatively lower acoustic impedance abuts the first layer of piezoelectric material.

A twenty ninth example is an acoustic wave device as described in the first example in which the first member having the relatively lower acoustic impedance substantially abuts the first layer of piezoelectric material.

A thirtieth example is an acoustic wave device as described in the first example in which the first member having the relatively lower acoustic impedance is arranged sufficiently proximate to the first layer of piezoelectric material, so that the first member having the relatively lower acoustic impedance contributes more to facilitate suppressing parasitic lateral resonances in operation of the acoustic wave device than is contributed by any other top acoustic layer of the multi-layer top acoustic reflector.

A thirty first example is an acoustic wave device as described in the first example in which the first pair of top acoustic layers has a frequency of a quarter wavelength resonant frequency in a Super High Frequency (SHF) band or an Extremely High Frequency (EHF) band.

A thirty second example is an acoustic wave device as described in the first example in which the multi-layer top acoustic reflector is acoustically de-tuned from the resonant frequency of the acoustic wave device.

A thirty third example is an acoustic wave device as described in the first example in which the multi-layer top acoustic reflector is acoustically de-tuned from the resonant frequency of the acoustic wave device to facilitate suppressing parasitic lateral resonances in operation of the acoustic wave device.

A thirty fourth example is an acoustic wave device as described in the first example in which the multi-layer top acoustic reflector has a quarter wavelength resonant frequency that is acoustically de-tuned from the resonant frequency of the acoustic wave device.

A thirty fifth example is an acoustic wave device as described in the first example in which the first pair of acoustic layers has a quarter wavelength resonant frequency that is acoustically de-tuned from the resonant frequency of the acoustic wave device.

A thirty sixth example is an acoustic wave device as described in the first example in which: the top acoustic reflector comprises a second pair of top acoustic layers; the first pair of top acoustic layers have respective layer thicknesses to be acoustically de-tuned by a first amount from the resonant frequency of the acoustic wave device; the second pair of top acoustic layers have respective layer thicknesses to be acoustically de-tuned by a second amount from the resonant frequency of the acoustic wave device; and the first amount is different than the second amount.

A thirty seventh example is an acoustic wave device as described in the first example in which the multi-layer top acoustic reflector is acoustically coupled over an active region of the first layer of piezoelectric material; and the first layer of piezoelectric material is mass loaded by a mass load layer arranged over a peripheral region of the first layer of piezoelectric material that is adjacent to the active region of the first layer of piezoelectric material.

A thirty eighth example is an acoustic wave device as described in the first example in which: the multi-layer top acoustic reflector is acoustically coupled over an active region of the first layer of piezoelectric material; and the first layer of piezoelectric material is mass loaded by a mass load layer arranged over a peripheral region of the first layer of piezoelectric material that is adjacent to the active region of the first layer of piezoelectric material to facilitate suppressing parasitic lateral resonances in operation of the acoustic wave device.

A thirty ninth example is an acoustic wave device as described in the first example in which: the multi-layer top acoustic reflector is acoustically coupled over an active region of the first layer of piezoelectric material; the first layer of piezoelectric material includes a peripheral region arranged adjacent to the active region and having a mechanical resonant frequency; in operation the acoustic wave device is to have a parallel electrical resonance frequency; and the first member of the first pair of top metal electrode layers having the relatively lower acoustic impedance is arranged sufficiently near to the first layer of piezoelectric material so that the mechanical resonance frequency of the peripheral region of the first layer of piezoelectric material approximately matches or is below the parallel electrical resonance frequency in operation the acoustic wave device.

A fortieth example is an acoustic wave device as described in the thirty seventh example in which the multi-layer metal top acoustic reflector electrode is sufficiently de-tuned from the resonant frequency of the acoustic wave device so that the mechanical resonance frequency of the peripheral region of the first layer of piezoelectric material is below the parallel electrical resonance frequency in operation of the acoustic wave device.

A forty first example is an acoustic wave device as described in the first example in which: the multi-layer top acoustic reflector is acoustically coupled over an active region of the first layer of piezoelectric material; the first layer of piezoelectric material includes a peripheral region arranged adjacent to the active region and having a mechanical resonant frequency; and the multi-layer metal top acoustic reflector electrode is sufficiently de-tuned from the resonant frequency of the acoustic wave device so that a mechanical resonance frequency of the peripheral region of the first layer of piezoelectric material is below a parallel electrical resonance frequency in operation the acoustic wave device.

A forty second example is an acoustic wave device as described in the first example in which the multi-layer top acoustic reflector approximates a top distributed Bragg acoustic reflector.

A forty third example is an acoustic wave device as described in the first example in which the multi-layer top acoustic reflector approximates a top de-tuned distributed Bragg acoustic reflector that is de-tuned from the resonant frequency of the acoustic wave device.

A forty fourth example is an acoustic wave device as described in the first example in which the multi-layer top acoustic reflector is acoustically de-tuned from the resonant frequency of the acoustic wave device by a substantial amount.

A forty fifth example is an acoustic wave device as described in the first example in which the multi-layer top acoustic reflector is acoustically de-tuned from the resonant frequency of the acoustic wave device by up to about 5% of the resonant frequency of the acoustic wave device.

A forty sixth example is an acoustic wave device as described in the first example in which the multi-layer top acoustic reflector is acoustically de-tuned from the resonant frequency of the acoustic wave device by up to about 12% of the resonant frequency of the acoustic wave device.

A forty seventh example is an acoustic wave device as described in the first example in which the multi-layer top acoustic reflector is acoustically de-tuned from the resonant frequency of the acoustic wave device by up to about 36% of the resonant frequency of the acoustic wave device.

A forty eighth example is an acoustic wave device as described in the first example in which the multi-layer top acoustic reflector is acoustically de-tuned higher in frequency from the resonant frequency of the acoustic wave device.

A forty ninth example is an acoustic wave device as described in the first example in which the acoustic wave device comprises a second layer of piezoelectric material in which the first and second layers of piezoelectric material are acoustically coupled with one another to have the piezoelectrically excitable resonance mode, and in which the second layer of piezoelectric material has a second piezoelectric axis orientation that substantially opposes the first piezoelectric axis orientation of the first layer of piezoelectric material.

A fiftieth example is an acoustic wave device as described in the first example in which: the acoustic wave device comprises a second layer of piezoelectric material; the first and second layers of piezoelectric material are acoustically coupled with one another to have the piezoelectrically excitable resonance mode; the second layer of piezoelectric material has a second piezoelectric axis orientation that substantially opposes the first piezoelectric axis orientation of the first layer of piezoelectric material; and the first and second layers of piezoelectric material have respective thicknesses so that the resonant frequency of the acoustic wave device is in a super high frequency band or an extremely high frequency band.

A fifty first example is an acoustic wave device as described in the first example in which: the acoustic wave device comprises a second layer of piezoelectric material; the first and second layers of piezoelectric material are acoustically coupled with one another to have the piezoelectrically excitable resonance mode; the first and second layers of piezoelectric material is a monolithic layer of piezoelectric material having first and second regions; the first region has the first piezoelectric axis orientation; and the second region has the second piezoelectric axis orientation that substantially opposes the first piezoelectric axis orientation.

A fifty second example is an acoustic wave device as described in the first example in which: the acoustic wave device comprises second and third layers of piezoelectric material; and the first, second and third layers of piezoelectric material have respective first, second and third piezoelectric axis orientations that substantially oppose one another in an alternating arrangement.

A fifty third example is an acoustic wave device as described in the first example in which: the acoustic wave device comprises second, third and fourth layers of piezoelectric material; and the first, second, third and fourth layers of piezoelectric material have respective first, second, third and fourth piezoelectric axis orientations that substantially oppose one another in an alternating arrangement.

A fifty fourth example is an acoustic wave device as described in the first example in which: the second member of the first pair of acoustic layers has a second layer thickness; and the first member of the first pair of acoustic layers has a first layer thickness that substantially thinner than the second layer thickness of the second member of the first pair of acoustic layers.

A fifty fifth example is an acoustic wave device as described in the first example in which the multi-layer top acoustic reflector comprises a first multi-layer acoustic reflector comb.

A fifty sixth example is an acoustic wave device as described in the fifty fifth example in which the first multi-layer acoustic reflector comb comprises a first bar coupled with a first plurality of fingers extending in a first direction away from the first bar.

A fifty seventh example is an acoustic wave device as described in the fifty sixth example in which the multi-layer top acoustic reflector comprises a second multi-layer acoustic reflector comb including a second bar coupled with a second plurality of fingers extending in a second direction away from the second bar.

A fifty eighth example is an acoustic wave device as described in the fifty sixth example in which the multi-layer top acoustic reflector comprises a second multi-layer acoustic reflector comb including a second bar coupled with a second plurality of fingers, in which the second plurality of fingers of the second multi-layer acoustic reflector comb is in an interdigitated arrangement with the first plurality of fingers of the first multi-layer acoustic reflector comb.

A fifty ninth example is an acoustic wave device as described in the fifty eighth example in which the first layer of piezoelectric material is interposed between the substrate and the interdigitated arrangement of the first and second multi-layer acoustic reflector combs. A sixtieth example is an acoustic wave device as described in the fifty fourth example in which the first multi-layer acoustic reflector comb approximates a distributed Bragg acoustic reflector.

A sixty first example is an acoustic wave device as described in the first example in which the multi-layer top acoustic reflector comprises a first multi-layer metal acoustic reflector comb electrode.

A sixty second example is an acoustic wave device as described in the sixty first example in which the first multi-layer metal acoustic reflector comb electrode comprises a first bus bar coupled with a first plurality of multi-layer metal fingers extending in a first direction away from the first bus bar.

A sixty third example is an acoustic wave device as described in the sixty second example in which the multi-layer top acoustic reflector comprises a second multi-layer metal acoustic reflector comb electrode including a second bus bar coupled with a second plurality of multi-layer metal fingers extending in a second direction away from the second bus bar.

A sixty fourth example is an acoustic wave device as described in the sixty second example in which the multi-layer top acoustic reflector comprises a second multi-layer metal acoustic reflector comb electrode including a second bus bar coupled with a second plurality of multi-layer metal fingers, in which the second plurality of multi-layer metal fingers of the second multi-layer metal acoustic reflector comb electrode is in an interdigitated arrangement with the first plurality of multi-layer metal fingers of the first multi-layer metal acoustic reflector comb electrode.

A sixty fifth example is an acoustic wave device as described in the sixty fourth example in which the first layer of piezoelectric material is interposed between the substrate and the interdigitated arrangement of the first and second multi-layer metal acoustic reflector comb electrodes.

A sixty sixth example is an acoustic wave device as described in the sixty first example in which the first multi-layer metal acoustic reflector comb electrode approximates a distributed Bragg acoustic reflector.

A sixty seventh example is an acoustic wave device as described in the sixty first example in which the first multi-layer metal acoustic reflector comb electrode approximates a distributed Bragg acoustic reflector that is de-tuned from the resonant acoustic frequency of the acoustic wave device.

A sixty eighth example is an acoustic wave device as described in the fifty fifth example in which the first multi-layer acoustic reflector comb approximates a distributed Bragg acoustic reflector that is de-tuned from the resonant acoustic frequency of the acoustic wave device.

A sixty ninth example is an acoustic wave device as described in any one of the first example through the sixty eighth example comprising at least two additional layers of piezoelectric material with alternating piezoelectric axis orientations.

A seventieth example is an acoustic wave device as described in any one of the first example through the sixty eighth example comprising at least two additional layers of piezoelectric material with alternating piezoelectric axis orientations to facilitate suppressing parasitic lateral resonances.

A seventy first example is an acoustic wave device as described in any one of the first example through the sixty eighth example in which the acoustic wave device comprises a bulk acoustic wave (BAW) resonator.

A seventy second example is an acoustic wave device as described in any one of the first example through the sixty eighth example in which the acoustic wave device comprises a contour mode resonator.

A seventy third example is an acoustic wave device as described in any one of the first example through the sixty eighth example in which the acoustic wave device comprises at least a portion of an electrical filter.

A seventy fourth example is an acoustic wave device as described in any one of the first example through the sixty eighth example in which the acoustic wave device comprises at least a portion of a laterally coupled resonator filter.

A seventy fifth example is an acoustic wave device as described in any one of the first example through the sixty eighth example in which the acoustic impedance of the second member of the first pair of top acoustic layers is at least about twice as high as the acoustic impedance of the first member.

A seventy sixth example is an acoustic wave device as described in any one of the first example through the sixty eighth example in which the multi-layer top acoustic reflector comprises a multi-layer metal top acoustic reflector electrode.

A seventy seventh example is an acoustic wave device as described in any one of the first example through the sixty eighth example in which: the first pair of top acoustic layers comprises a first pair of top metal electrode; a second member of the first pair of top metal electrode layers has the acoustic impedance; and a first member of the first pair of top metal electrode layers has the acoustic impedance that is relatively lower than the acoustic impedance of the second member.

A seventy eighth example is an acoustic wave device as described in any one of the first example through the sixty eighth example in which members of the first pair are consecutively arranged from the first layer of piezoelectric material.

A seventy ninth example is an acoustic wave device as described in any one of the first example through the sixty eighth example in which: the top acoustic reflector comprises a second pair of top acoustic layers; and members of the first and second pairs are consecutively arranged from the first layer of piezoelectric material.

An eightieth example is an acoustic wave device as described in any one of the first example through the sixty eighth example in which: the top acoustic reflector comprises a second pair of top acoustic layers and a third pair of top acoustic layers; and members of the first, second and third pairs are consecutively arranged from the first layer of piezoelectric material.

An eighty first example is an acoustic wave device as described in any one of the first example through the sixty eighth example in which: the top acoustic reflector comprises a second pair of top acoustic layers and a third pair of top acoustic layers and a fourth pair of top acoustic layers; and members of the first, second, third and fourth pairs are consecutively arranged from the first layer of piezoelectric material.

An eighty second example is an acoustic wave device as described in any one of the first example through the sixty eighth example in which the acoustic wave device comprises electrical coupling nodes to facilitate electrical coupling of the acoustic wave device with oscillator circuitry.

An eighty third example is an acoustic wave device as described in any one of the first example through the sixty eighth example in which: the acoustic wave device comprises a multi-layer bottom acoustic reflector including a first pair of bottom acoustic layers coupled with the first layer of piezoelectric material to reflect the piezoelectrically excitable resonance mode at the resonant frequency of the acoustic wave device; a second member of the first pair of bottom acoustic layers has a second bottom acoustic impedance; a first member of the first pair of bottom acoustic layers has a first bottom acoustic impedance that is relatively lower than the second bottom acoustic impedance of the second member; and the first member having the relatively lower first bottom acoustic impedance is arranged nearer to the first layer of piezoelectric material than the second member.

An eighty fourth example is an acoustic wave device as described in the eighty third example in which the first layer of piezoelectric material is interposed between the multi-layer top acoustic reflector and the multi-layer bottom acoustic reflector.

An eighty fifth example is an acoustic wave device as described in the eighty third example in which standing wave acoustic energy is to be coupled into the multi-layer bottom acoustic reflector in operation of the acoustic wave device, and the first member of the first pair of bottom acoustic layers having the relatively lower first bottom acoustic impedance is arranged sufficiently proximate to the first layer of piezoelectric material, so that standing wave acoustic energy to be in the first member of the first pair of bottom acoustic layers is greater than respective standing wave acoustic energy to be in other respective layers of the multi-layer bottom acoustic reflector in operation of the acoustic wave device.

An eighty sixth example is an acoustic wave device as described in the eighty third example in which the first member of the first pair of bottom acoustic layers having the relatively lower first bottom acoustic impedance is arranged nearest to the first layer of piezoelectric material, relative to other bottom acoustic layers of the multi-layer bottom acoustic reflector.

An eighty seventh example is an acoustic wave device as described in the eighty third example in which the first member of the first pair of bottom acoustic layers having the relatively lower first bottom acoustic impedance abuts the first layer of piezoelectric material.

An eighty eighth example is an acoustic wave device as described in the eighty third example in which the first member of the first pair of bottom acoustic layers having the relatively lower first bottom acoustic impedance substantially abuts the first layer of piezoelectric material.

An eighty ninth example is an acoustic wave device as described in the eighty third example in which the first member of the first pair of bottom acoustic layers having the relatively lower first bottom acoustic impedance is arranged sufficiently proximate to the first layer of piezoelectric material, so that the first member having the relatively lower first bottom acoustic impedance contributes more to facilitate suppressing parasitic lateral resonances in operation of the acoustic wave device than is contributed by any other bottom acoustic layer of the multi-layer bottom acoustic reflector.

A ninetieth example is an acoustic wave device as described in the eighty third example in which the first pair of bottom acoustic layers has a quarter wavelength resonant frequency in a Super High Frequency (SHF) band or an Extremely High Frequency (EHF) band.

A ninety first example is an acoustic wave device as described in the eighty third example in which the multi-layer bottom acoustic reflector is acoustically de-tuned from the resonant frequency of the acoustic wave device.

A ninety second example is an acoustic wave device as described in the eighty third example in which the multi-layer bottom acoustic reflector is acoustically de-tuned from the resonant frequency of the acoustic wave device to facilitate suppressing parasitic lateral resonances in operation of the acoustic wave device.

A ninety third example is an acoustic wave device as described in the eighty third example in which the multi-layer bottom acoustic reflector has a quarter wavelength resonant frequency that is acoustically de-tuned from the resonant frequency of the acoustic wave device.

A ninety fourth example is an acoustic wave device as described in the eighty third example in which the first pair of acoustic layers of the multi-layer bottom acoustic reflector has a quarter wavelength resonant frequency that is acoustically de-tuned from the resonant frequency of the acoustic wave device.

A ninety fifth example is an acoustic wave device as described in the eighty third example in which: the bottom acoustic reflector comprises a second pair of bottom acoustic layers; the first pair of bottom acoustic layers have respective layer thicknesses to be acoustically de-tuned by a first bottom amount from the resonant frequency of the acoustic wave device; the second pair of bottom acoustic layers have respective layer thicknesses to be acoustically de-tuned by a second bottom amount from the resonant frequency of the acoustic wave device; and the first bottom amount is different than the second bottom amount.

A ninety sixth example is an acoustic wave device as described in the eighty third example in which the multi-layer bottom acoustic reflector is acoustically de-tuned from the resonant frequency of the acoustic wave device by a substantial amount.

A ninety seventh example is an acoustic wave device as described in the eighty third example in which the multi-layer bottom acoustic reflector is acoustically de-tuned from the resonant frequency of the acoustic wave device by up to about 5% of the resonant frequency of the acoustic wave device.

A ninety eighth example is an acoustic wave device as described in the eighty third example in which the multi-layer bottom acoustic reflector is acoustically de-tuned from the resonant frequency of the acoustic wave device by up to about 12% of the resonant frequency of the acoustic wave device.

An ninety ninth example is an acoustic wave device as described in the eighty third example in which the multi-layer bottom acoustic reflector is acoustically de-tuned from the resonant frequency of the acoustic wave device by up to about 36% of the resonant frequency of the acoustic wave device.

A one hundredth example is an acoustic wave device as described in the eighty third example in which the multi-layer bottom acoustic reflector is acoustically de-tuned lower in frequency from the resonant frequency of the acoustic wave device.

A one hundred and first example is an acoustic wave device as described in the eighty third example in which the multi-layer bottom acoustic reflector comprises a multi-layer metal bottom acoustic reflector electrode.

A one hundred and second example is an acoustic wave device as described in the eighty third example in which: the first pair of bottom acoustic layers comprises a first pair of bottom metal electrode layers; a second member of the first pair of bottom metal electrode layers has the acoustic impedance; a first member of the first pair bottom metal electrode layers has the acoustic impedance that is relatively lower than the acoustic impedance of the second member of the first pair of bottom metal electrode layers.

A one hundred and third example is an acoustic wave device as described in the eighty third example in which members of the first pair of bottom acoustic layers are consecutively arranged from the first layer of piezoelectric material or from a stack of layers of piezoelectric material.

A one hundred and fourth example is an acoustic wave device as described in the eighty third example in which: the bottom acoustic reflector comprises a second pair of bottom acoustic layers; and members of the first and second pairs are consecutively arranged from the first layer of piezoelectric material or from a stack of layers of piezoelectric material.

A one hundred and fifth example is an acoustic wave device as described in the eighty third example in which: the bottom acoustic reflector comprises a second pair of bottom acoustic layers and a third pair of bottom acoustic layers; and members of the first, second and third pairs are consecutively arranged from the first layer of piezoelectric material or from a stack of layers of piezoelectric material.

A one hundred and sixth example is an acoustic wave device as described in the eighty third example in which: the bottom acoustic reflector comprises a second pair of bottom acoustic layers and a third pair of bottom acoustic layers and a fourth pair of bottom acoustic layers; and members of the first, second, third and fourth pairs are consecutively arranged from the first layer of piezoelectric material or from a stack of layers of piezoelectric material.

A one hundred and seventh example is an acoustic wave device as described in the eighty third example in which the multi-layer bottom acoustic reflector approximates a bottom distributed Bragg acoustic reflector.

A one hundred and eighth example is an acoustic wave device as described in the eighty third example in which the multi-layer bottom acoustic reflector approximates a bottom de-tuned distributed Bragg acoustic reflector that is de-tuned from the resonant frequency of the acoustic wave device.

Figure 9C:
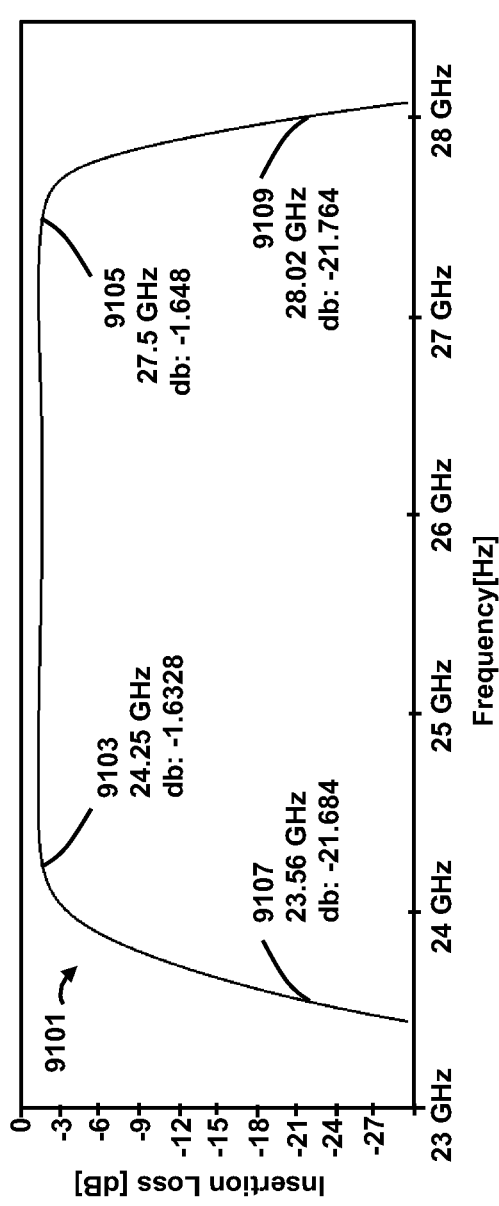
FIGS. 9C and 9D are diagrams illustrating respective simulated bandpass characteristics of insertion loss versus frequency for example filters.
Figure 9D:
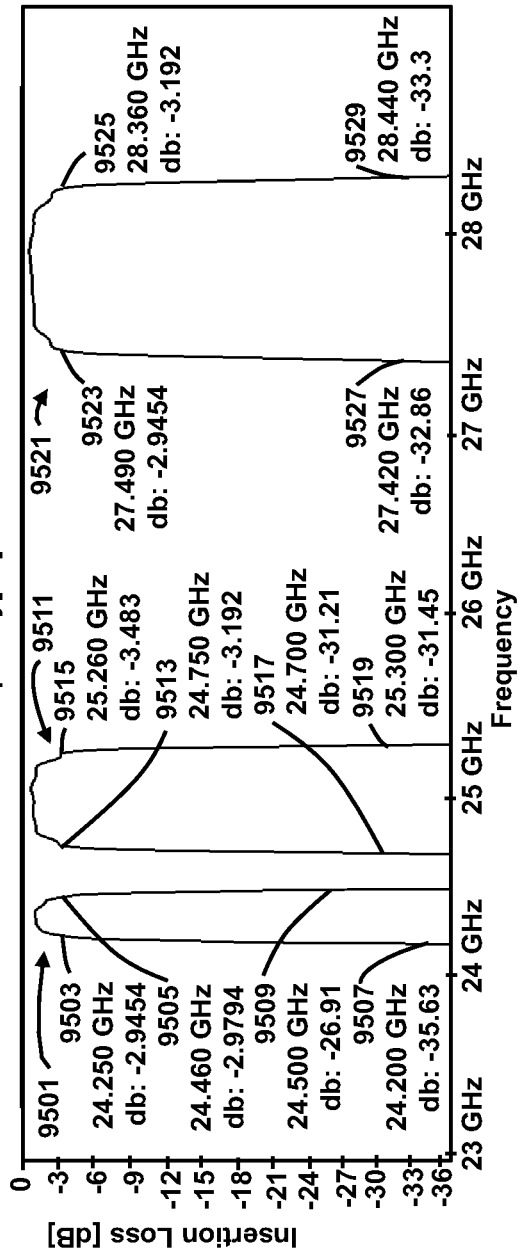

FIGS. 9C and 9D are first and second diagrams 9100, 9200 illustrating respective simulated bandpass characteristics 9101, 9201 of insertion loss versus frequency for example SHF wave filters. For example, FIG. 9C is a first diagram 9100 illustrating a first simulated bandpass characteristic 9101 of insertion loss versus frequency for a first example SHF wave filter configured as in FIG. 7A (e.g., inductors modifying an example lattice filter using a first pair of series resonators of the bulk acoustic wave resonator structure of FIG. 1A, a second pair of series resonators of the bulk acoustic wave resonator structure of FIG. 1A and two pairs of cross coupled mass loaded shunt resonators of the bulk acoustic wave resonator structure of FIG. 1A). For example, the first example SHF wave filter having the simulated bandpass characteristic 9101 may be a 3GPP 5G n258 band filter (e.g., filter corresponding to the FIG. 9B 3GPP 5G n258 band 9051 (24.25 GHz-27.5 GHz)). For example, the first example SHF wave filter having the simulated bandpass characteristic 9101 may have a fractional bandwidth of about twelve percent (12%), and may include resonators having electromechanical coupling coefficient (Kt2) of about six and a half percent (6.5%). For example, the simulated bandpass characteristic 9101 of FIG. 9C shows a first 3GPP 5G n258 band edge feature 9103 having an insertion loss of −1.6328 decibels (dB) at an initial 24.25 GHz extremity of the 3GPP 5G n258 band. For example, the simulated bandpass characteristic 9101 of FIG. 9C shows an opposing 3GPP 5G n258 band edge feature 9105 having an insertion loss of −1.648 decibels (dB) at an opposing 27.5 GHz extremity of the 3GPP 5G n258 band. The first example SHF wave filter having the simulated bandpass characteristic 9101 may have a pass band that is configured for 3GPP 5G n258 applications. For example, the simulated bandpass characteristic 9101 of FIG. 9C shows a first 3GPP 5G n258 band roll off feature 9107 having an insertion loss of −21.684 decibels (dB) at an initial 23.56 GHz roll off extremity of the 3GPP 5G n258 band. At the initial 23.56 GHz roll off extremity of the 3GPP 5G n258 band, the first 3GPP 5G n258 band roll off feature 9107 may provide about twenty dB of roll off at about 690 MHz from the first 3GPP 5G n258 band edge feature 9103 at the initial 24.25 GHz extremity of the 3GPP 5G n258 band. For example, the simulated bandpass characteristic 9101 FIG. 9C shows an opposing 3GPP 5G n258 band roll off feature 9109 having an insertion loss of −21.764 decibels (dB) at an opposing 28.02 GHz roll off extremity of the 3GPP 5G n258 band. At the opposing 28.02 GHz roll off extremity of the 3GPP 5G n258 band, the opposing 3GPP 5G n258 band roll off feature 9109 may provide about twenty dB of roll off at about 580 MHz from the opposing 3GPP 5G n258 band edge feature 9105 at the opposing 27.5 GHz extremity of the 3GPP 5G n258 band.

For example, FIG. 9D is a diagram 9500 illustrating simulated band pass characteristics 9501, 9511, 9521 of insertion loss versus frequency for three example millimeter wave band pass filters configured as two external shunt inductors modifying the example ladder filter similar to the one shown in FIG. 6 (e.g., an input port shunt inductor and an output port shunt inductor modifying the ladder configuration using four series resonators of the bulk acoustic wave resonator structure of FIG. 1A, and four mass loaded shunt resonators of the bulk acoustic wave resonator structure of FIG. 1A). The shunt inductors may be, for example, about 1 nanohenry inductors having a quality factor of twenty (Q of 20). For example, the three example millimeter wave filters respectively associated with the simulated band pass characteristics 9501, 9511, 9521 may be a 3GPP 5G n258 band channel filters (e.g., filters corresponding to channels in the FIG. 9B 3GPP 5G n258 band 9051 (24.25 GHz-27.5 GHz)). For example, a first example millimeter wave filter associated with the simulated band pass characteristic 9501 may be a two hundred Megahertz (200 MHz) channel filter of the 3GPP 5G n258, e.g., the filter may have a fractional bandwidth of about nine tenths of a percent (0.9%), and may include resonators having electromechanical coupling coefficient (Kt2) of about one and seven tenths percent (1.7%). For example, the simulated band pass characteristic 9501 of FIG. 9D shows a first 3GPP 5G n258 band channel edge feature 9503 having an insertion loss of −2.9454 decibels (dB) at an initial 24.25 GHz channel extremity of the 3GPP 5G n258 band. For example, the simulated band pass characteristic 9501 of FIG. 9D shows an opposing 3GPP 5G n258 band channel edge feature 9505 having an insertion loss of −2.9794 decibels (dB) at an opposing 24.460 GHz extremity of the 3GPP 5G n258 band channel. The first example millimeter wave filter associated with the simulated band pass characteristic 9501 may have a channel pass band that is configured for 3GPP 5G n258 applications. For example, the simulated band pass characteristic 9501 of FIG. 9D shows a first 3GPP 5G n258 band channel roll off feature 9507 having an insertion loss of −35.63 decibels (dB) at an initial 24.200 GHz roll off extremity of the 3GPP 5G n258 band channel. At the initial 24.200 GHz roll off extremity of the 3GPP 5G n258 band channel, the first 3GPP 5G n258 band channel roll off feature 9507 may provide about thirty five dB of roll off at about 50 MHz from the first 3GPP 5G n258 band channel edge feature 9503 at the initial 24.25 GHz extremity of the 3GPP 5G n258 band channel. For example, the simulated band pass characteristic 9501 of FIG. 9D shows an opposing 3GPP 5G n258 band channel roll off feature 9509 having an insertion loss of −26.91 decibels (dB) at an opposing 24.500 GHz channel roll off extremity of the 3GPP 5G n258 band channel. At the opposing 24.500 GHz channel roll off extremity of the 3GPP 5G n258 band channel, the opposing 3GPP 5G n258 band roll off channel feature 9509 may provide about twenty dB of roll off at about 50 MHz (e.g., 40 MHz) from the opposing 3GPP 5G n258 band channel edge feature 9505 at the opposing 24.460 GHz extremity of the 3GPP 5G n258 band channel.

For example, a second example millimeter wave filter associated with the simulated band pass characteristic 9511 may be a 500 hundred Megahertz (500 MHz) channel filter of the 3GPP 5G n258, e.g., the filter may have a fractional bandwidth of about two percent (2%), and may include resonators having electromechanical coupling coefficient (Kt2) of about three and three tenths percent (3.3%). For example, the simulated band pass characteristic 9511 of FIG. 9D shows a first 3GPP 5G n258 band channel edge feature 9513 having an insertion loss of −3.192 decibels (dB) at an initial 24.750 GHz channel extremity of the 3GPP 5G n258 band. For example, the simulated band pass characteristic 9511 of FIG. 9D shows an opposing 3GPP 5G n258 band channel edge feature 9515 having an insertion loss of −3.483 decibels (dB) at an opposing 25.260 GHz extremity of the 3GPP 5G n258 band channel. The second example millimeter wave filter associated with the simulated band pass characteristic 9511 may have a channel pass band that is configured for 3GPP 5G n258 applications. For example, the simulated band pass characteristic 9511 of FIG. 9D shows a first 3GPP 5G n258 band channel roll off feature 9517 having an insertion loss of −31.21 decibels (dB) at an initial 24.700 GHz roll off extremity of the 3GPP 5G n258 band channel. At the initial 24.700 GHz roll off extremity of the 3GPP 5G n258 band channel, the first 3GPP 5G n258 band channel roll off feature 9517 may provide about thirty five dB of roll off at about 50 MHz from the first 3GPP 5G n258 band channel edge feature 9513 at the initial 24.750 GHz extremity of the 3GPP 5G n258 band channel. For example, the simulated band pass characteristic 9511 of FIG. 9D shows an opposing 3GPP 5G n258 band channel roll off feature 9519 having an insertion loss of −31.45 decibels (dB) at an opposing 25.300 GHz channel roll off extremity of the 3GPP 5G n258 band channel. At the opposing 25.300 GHz channel roll off extremity of the 3GPP 5G n258 band channel, the opposing 3GPP 5G n258 band roll off channel feature 9519 may provide about thirty decibels (dB) of roll off at about 50 MHz (e.g., 40 MHz) from the opposing 3GPP 5G n258 band channel edge feature 9515 at the opposing 25.260 GHz extremity of the 3GPP 5G n258 band channel.

For example, a third example millimeter wave filter associated with the simulated band pass characteristic 9521 as shown in FIG. 9D may be a 900 hundred Megahertz (900 MHz) channel filter of the 3GPP 5G n258, e.g., the filter may have a fractional bandwidth of about three percent (3%), and may include resonators having electromechanical coupling coefficient (Kt2) of about five percent (5%). For example, the simulated band pass characteristic 9521 of FIG. 9D shows a first 3GPP 5G n258 band channel edge feature 9523 having an insertion loss of −2.9454 decibels (dB) at an initial 27.490 GHz channel extremity of the 3GPP 5G n258 band. For example, the simulated band pass characteristic 9521 of FIG. 9D shows an opposing 3GPP 5G n258 band channel edge feature 9525 having an insertion loss of −3.192 decibels (dB) at an opposing 28.360 GHz extremity of the 3GPP 5G n258 band channel. The third example millimeter wave filter associated with the simulated band pass characteristic 9521 may have a channel pass band that is configured for 3GPP 5G n258 applications. For example, the simulated band pass characteristic 9521 of FIG. 9D shows a first 3GPP 5G n258 band channel roll off feature 9527 having an insertion loss of −32.86 decibels (dB) at an initial 27.420 GHz roll off extremity of the 3GPP 5G n258 band channel. At the initial 27.420 GHz roll off extremity of the 3GPP 5G n258 band channel, the first 3GPP 5G n258 band channel roll off feature 9527 may provide about thirty dB of roll off (e.g., −32.86 dB) at about 50 MHz (e.g., 70 MHz) from the first 3GPP 5G n258 band channel edge feature 9523 at the initial 27.490 GHz extremity of the 3GPP 5G n258 band channel. For example, the simulated band pass characteristic 9521 FIG. 9D shows an opposing 3GPP 5G n258 band channel roll off feature 9529 having an insertion loss of −33.3 decibels (dB) at an opposing 28.440 GHz channel roll off extremity of the 3GPP 5G n258 band channel. At the opposing 28.440 GHz channel roll off extremity of the 3GPP 5G n258 band channel, the opposing 3GPP 5G n258 band roll off channel feature 9529 may provide about thirty dB of roll off at about 80 MHz from the opposing 3GPP 5G n258 band channel edge feature 9525 at the opposing 28.360 GHz extremity of the 3GPP 5G n258 band channel.

Embodiments of band pass filters of this disclosure, for example band pass filters corresponding to one or more simulated band pass characteristics 9501, 9511, 9521 of insertion loss versus frequency as shown in FIG. 9D, may have pass band characterized by a band edge on each side of the pass band having −3 decibel width of less than about 5 percent of a center frequency of the pass band. Embodiments of band pass filters of this disclosure, for example band pass filters corresponding to one or more simulated band pass characteristics 9501, 9511, 9521 of insertion loss versus frequency as shown in FIG. 9D, may have pass band characterized by a band edge on each side of the pass band having −3 decibel width of less than about 4 percent of a center frequency of the pass band. Embodiments of band pass filters of this disclosure, for example band pass filters corresponding to one or more simulated band pass characteristics 9501, 9511, 9521 of insertion loss versus frequency as shown in FIG. 9D, may have pass band characterized by a band edge on each side of the pass band having −3 decibel width of less than about 3 percent of a center frequency of the pass band.

Figure 9E:
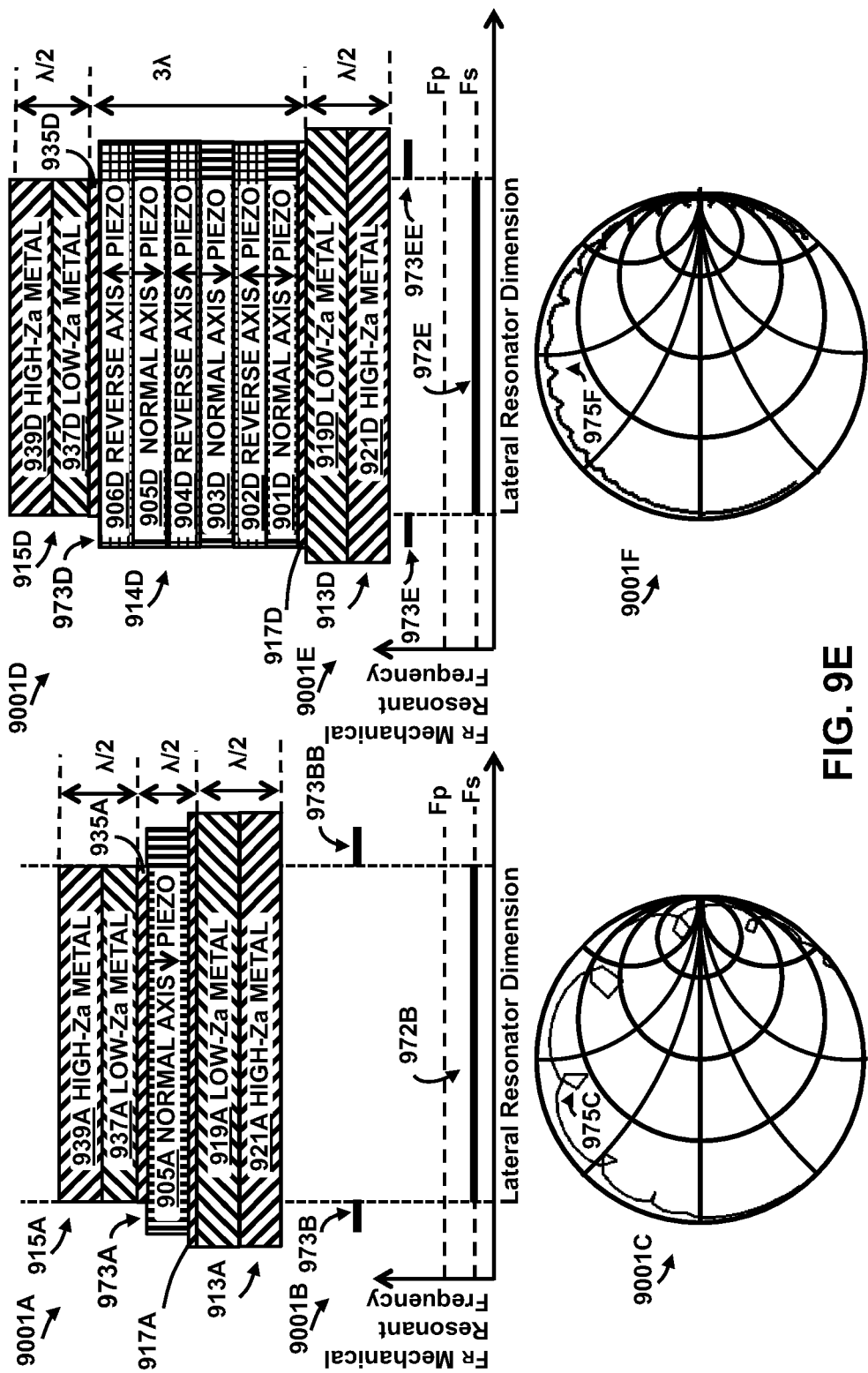
FIGS. 9E through 9G are simplified diagrams of various resonators of this disclosure, along with respective diagrams of respective mechanical resonant frequencies versus respective lateral resonator dimensions corresponding to the various resonators, and along with Smith charts corresponding to the various resonators showing Scattering-parameters (S-parameters) at various operating frequencies.
Figure 9F:
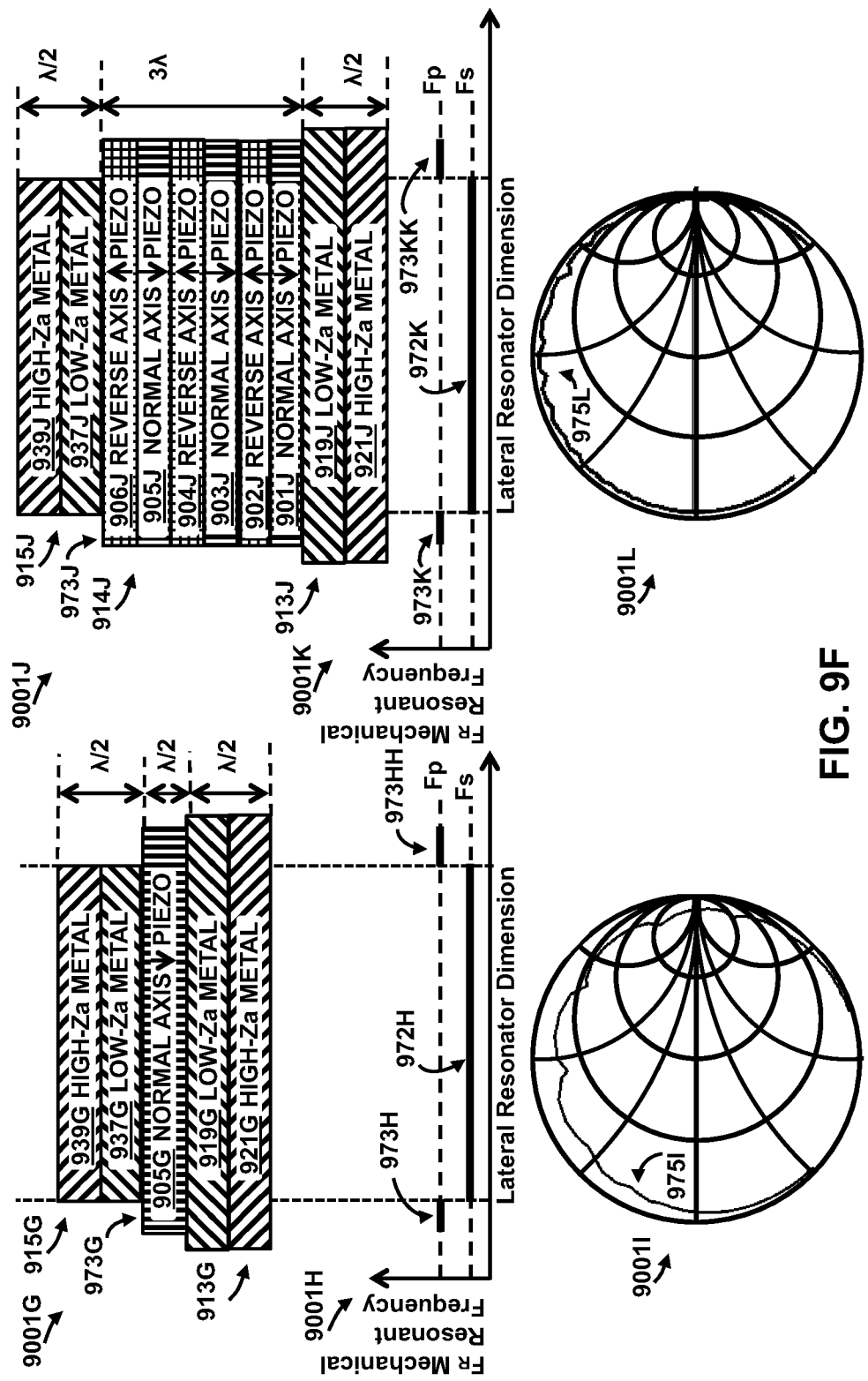
Figure 9G:
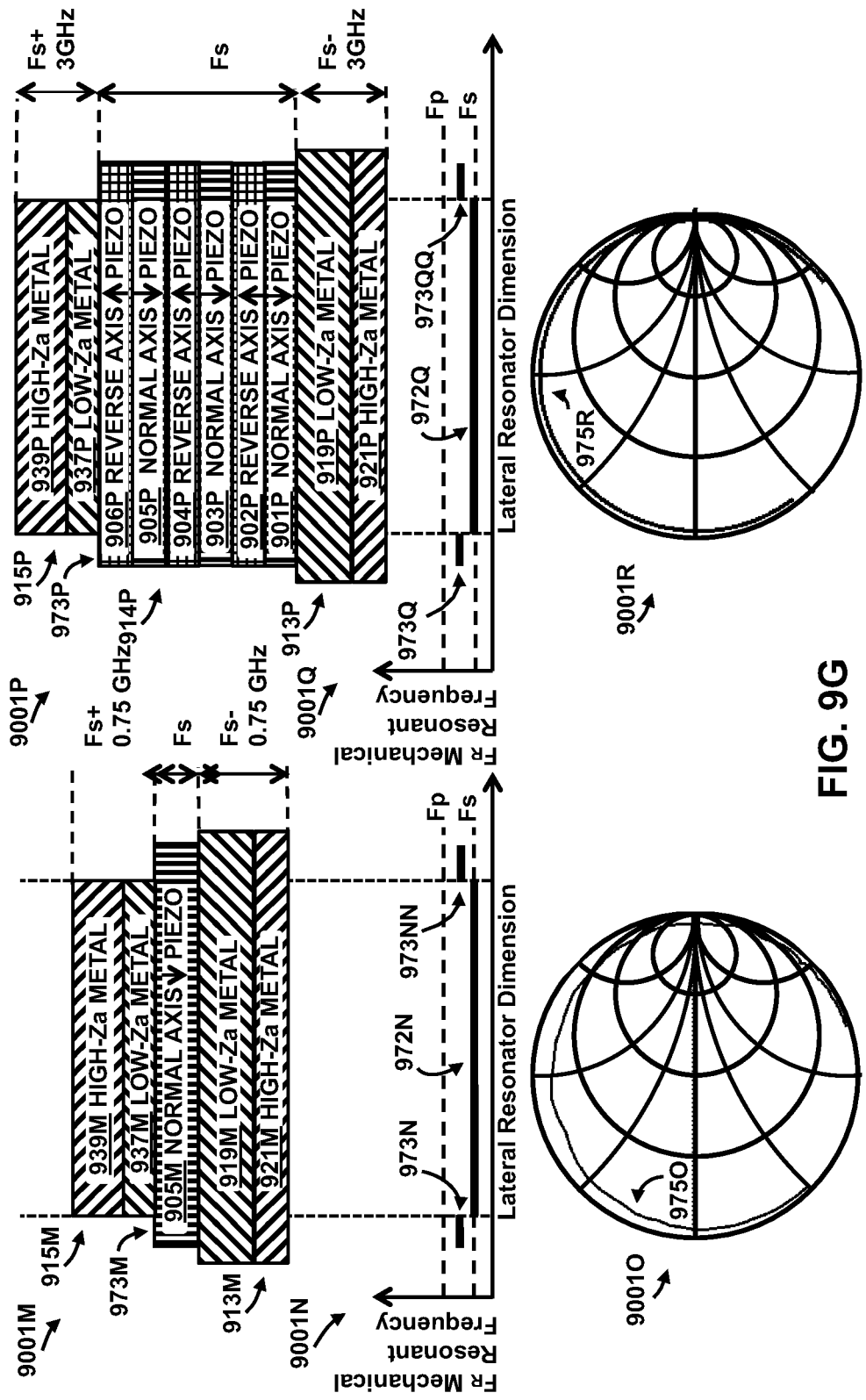

FIGS. 9E through 9G are simplified diagrams of various resonators of this disclosure, along with respective diagrams of respective mechanical resonant frequencies versus respective lateral resonator dimensions corresponding to the various resonators, and along with Smith charts corresponding to the various resonators showing Scattering-parameters (e.g., S-parameters, e.g., S11) at various operating frequencies. Interposer layers that interpose between adjacent piezoelectric layers have be discussed previously herein, and so are not discussed further relative to those resonators having adjacent piezoelectric layers in FIGS. 9E through 9G. Although such interposer layers are not shown in resonators having adjacent piezoelectric layer in FIGS. 9E through 9G, in additional embodiments, interposers may be included. An upper left section of FIG. 9E shows a simplified view of example bulk acoustic wave (BAW) resonator 9001A, which may comprise a first layer of piezoelectric material 905A having a normal piezoelectric axis orientation sandwiched between a multi-layer metal bottom acoustic reflector electrode 913A and a multi-layer metal top acoustic reflector electrode 915A.

The multi-layer metal bottom acoustic reflector electrode 913A may comprise a first pair of bottom metal electrode layers, 919A, 921A. A first member 919A of the first pair of bottom metal electrode layers may be a low acoustic impedance bottom metal electrode layer 919A (e.g., titanium bottom metal electrode layer 919A). A second member 921A of the first pair of bottom metal electrode layers may be a high acoustic impedance bottom metal electrode layer 921A (e.g., tungsten bottom metal electrode layer 921A). In the multi-layer metal bottom acoustic reflector electrode 913A of BAW resonator 9001A, the first member 919A of the first pair of bottom metal electrode layers having the low acoustic impedance (e.g., low acoustic impedance bottom metal electrode layer 919A) may be arranged nearer to the first layer of piezoelectric material 905A than the second member 921A of the first pair of bottom metal electrode layers having the high acoustic impedance (e.g., high acoustic impedance bottom metal electrode layer 921A). Further, although in the simplified view of BAW resonator 9001A only a first pair of bottom metal electrode layers 919A, 921A are explicitly shown, multi-layer metal bottom acoustic reflector electrode 913A may comprise many more pairs of alternating low acoustic impedance/high acoustic impedance of bottom metal electrode layers (not shown). Multi-layer metal bottom acoustic reflector electrode 913A may approximate a bottom metal distributed Bragg acoustic reflector 913A. The first member 919A of the first pair of bottom metal electrode layers 919A, 921A, and the second member 921A of the first pair of bottom metal electrode layers 919A, 921A, may have respective thicknesses selected to be about a quarter acoustic wavelength $\lambda/4$ of the main resonant frequency of the BAW resonator 9001A. Aggregating together the respective thicknesses of the first member 921A and the second member 919A, may provide a thickness of the first pair of bottom metal electrode layers 921A, 919A selected to be about a half acoustic wavelength $\lambda/2$ of the main resonant frequency of the BAW resonator 9001A.

The multi-layer metal bottom acoustic reflector electrode 913A may further comprise an intervening thin high acoustic impedance bottom metal electrode layer 917A, for example, intervening between the first layer of piezoelectric material 905A and the first pair of bottom metal electrode layers, 919A, 921A (e.g., intervening between the first layer of piezoelectric material 905A and the first member 919A having the low acoustic impedance of first pair of bottom metal electrode layers, 919A, 921A, e.g., intervening between the first layer of piezoelectric material 905A and low acoustic impedance bottom metal electrode layer 919A (e.g., titanium bottom metal electrode layer 919A)). The intervening thin high acoustic impedance bottom metal electrode layer 917A may comprise a relatively high acoustic impedance metal (e.g., intervening thin tungsten bottom electrode layer 917A, e.g., intervening thin molybdenum bottom electrode layer 917A). The intervening thin high acoustic impedance bottom metal electrode layer 917A may be relatively thinner than respective thicknesses of members of the first pair of bottom metal electrode layers, 919A, 921A. For example, whereas members of the first pair of bottom metal electrode layers, 919A, 921A may have respective thicknesses of about a quarter acoustic wavelength $\lambda/4$ of the main resonant frequency of the BAW resonator 9001A, the intervening thin high acoustic impedance bottom metal electrode layer 917A may be relatively thinner, e.g., may have a thickness of about a tenth of an acoustic wavelength $\lambda/10$ or less of the main resonant frequency of the BAW resonator 9001A. The first member 919A having the low acoustic impedance of the first pair of bottom metal electrode layers, 919A, 921A may substantially abut the first layer of piezoelectric material 905A. The intervening thin high acoustic impedance bottom metal electrode layer 917A may increase the reflectivity of the multi-layer metal bottom acoustic reflector electrode 913A and it may increase the electromechanical coupling coefficient Kt2 of example bulk acoustic wave (BAW) resonator 9001A The multi-layer metal top acoustic reflector electrode 915A may comprise a first pair of top metal electrode layers, 937A, 939A. A first member 937A of the first pair of top metal electrode layers may be low acoustic impedance top metal electrode layer 937A (e.g., titanium top metal electrode layer 937A). A second member 939A of the first pair of top metal electrode layers may be a high acoustic impedance top metal electrode layer 939A (e.g., tungsten top metal electrode layer 939A). In the multi-layer metal top acoustic reflector electrode 915A of BAW resonator 9001A, the first member 937A of the first pair of top metal electrode layers having the low acoustic impedance (e.g., low acoustic impedance top metal electrode layer 937A) may be arranged nearer to the first layer of piezoelectric material 905A than the second member 939A of the first pair of top metal electrode layers having the high acoustic impedance (e.g., high acoustic impedance top metal electrode layer 939A). Further, although in the simplified view of BAW resonator 9001A only a first pair of top metal electrode layers 937A, 939A are explicitly shown, multi-layer metal top acoustic reflector electrode 915A may comprise many more pairs of alternating low acoustic impedance/high acoustic impedance top metal electrode layers (not shown). Multi-layer metal top acoustic reflector electrode 915A may approximate a top metal distributed Bragg acoustic reflector 915A. The first member 937A of the first pair of top metal electrode layers 937A, 939A, and the second member 939A of the first pair of top metal electrode layers 937A, 939A, may have respective thicknesses selected to be about a quarter acoustic wavelength $\lambda/4$ of a main resonant frequency of the BAW resonator 9001A. Aggregating together the respective thicknesses of the first member 937A and the second member 939A, may provide a thickness of the first pair of top metal electrode layers 937A, 939A selected to be about a half acoustic wavelength λ/2 of the main resonant frequency of the BAW resonator 9001A.

The multi-layer metal top acoustic reflector electrode 915A may further comprise an intervening thin high acoustic impedance top metal electrode layer 935A, for example, intervening between the first layer of piezoelectric material 905A and the first pair of top metal electrode layers, 937A, 939A (e.g., intervening between the first layer of piezoelectric material 905A and the first member 937A having the low acoustic impedance of the first pair of top metal electrode layers, 937A, 939A, e.g., intervening between the first layer of piezoelectric material 905A and low acoustic impedance top metal electrode layer 937A (e.g., titanium top metal electrode layer 937A)). The intervening thin high acoustic impedance top metal electrode layer 935A may comprise a relatively high acoustic impedance metal (e.g., intervening thin tungsten top electrode layer 935A, e.g., intervening thin molybdenum top electrode layer 935A). The intervening thin high acoustic impedance top metal electrode layer 935A may be relatively thinner than respective thicknesses of members of the first pair of top metal electrode layers, 937A, 939A. For example, whereas members of the first pair of top metal electrode layers, 937A, 939A may have respective thicknesses of about a quarter acoustic wavelength λ/4 of the main resonant frequency of the BAW resonator 9001A, the intervening thin high acoustic impedance top metal electrode layer 935A may be relatively thinner, e.g., may have a thickness of about a tenth of an acoustic wavelength λ/10 or less of the main resonant frequency of the BAW resonator 9001A. The first member 937A having the low acoustic impedance of the first pair of top metal electrode layers, 937A, 939A may substantially abut the first layer of piezoelectric material 905A. The intervening thin high acoustic impedance top metal electrode layer 935A may increase the reflectivity of the multi-layer metal top acoustic reflector electrode 915A and it may increase the electromechanical coupling coefficient Kt2 of example bulk acoustic wave (BAW) resonator 9001A.

The first layer of piezoelectric material 905A together with both intervening thin high acoustic impedance metal layers 917A, 935A may have a thickness of about a half acoustic wavelength λ/2 of a main resonant frequency of the BAW resonator 9001A (e.g., twenty-four Gigahertz, e.g., 24 GHz main resonant frequency, e.g., 24 GHz main series resonant frequency, Fs, of the BAW resonator 9001A). The first layer of piezoelectric material 905A may have an active region where the multi-layer metal top acoustic reflector electrode 915A may overlap multi-layer metal bottom acoustic reflector electrode 913A. For example, in operation of BAW resonator 9001A, an oscillating electric field may be applied via multi-layer metal top acoustic reflector electrode 915A and multi-layer metal bottom acoustic reflector electrode 913A, so as to activate responsive piezoelectric acoustic oscillations in the active region of the first layer of piezoelectric material 905A, where the multi-layer metal top acoustic reflector electrode 915A may overlap multi-layer metal bottom acoustic reflector electrode 913A. Further, FIG. 9E particularly shows a peripheral region 973A of the first layer of piezoelectric material 905A where the multi-layer metal top acoustic reflector electrode 915A may avoid overlapping multi-layer metal bottom acoustic reflector electrode 913A (e.g., where the multi-layer metal top acoustic reflector electrode 915A may not overlap multi-layer metal bottom acoustic reflector electrode 913A.) The peripheral region 973A of the first layer of piezoelectric material 905A may be relatively inactive (e.g., a relatively inactive region 973A), relative to the active region of first layer of piezoelectric material 905A where the multi-layer metal top acoustic reflector electrode 915A may overlap multi-layer metal bottom acoustic reflector electrode 913A. The peripheral region 973A of the first layer of piezoelectric material 905A may be a remainder region 973A of the first layer of piezoelectric material 905A. The peripheral region 973A of the first layer of piezoelectric material 905A may be an extremity region 973A of the first layer of piezoelectric material 905A. The peripheral region 973A of the first layer of piezoelectric material 905A may be a lateral fringing electric field region of the first layer of piezoelectric material 905A, since there may be a lateral fringing electric field extending into an extremity of the first layer of piezoelectric material 905A in operation of the BAW resonator 9001A, e.g., the lateral fringing electric field may extend laterally from multi-layer metal top acoustic reflector electrode 915A, when the oscillating electric field may be applied thereto.

A middle left section of FIG. 9E shows a diagram 9001B of mechanical resonant frequency Fr versus lateral resonator dimension corresponding to the BAW resonator 9001A, as predicted by simulation. As shown in diagram 9001B, a thick line 972B depicts mechanical resonant frequency Fr corresponding to the active region of BAW resonator 9001A where the multi-layer metal top acoustic reflector electrode 915A may overlap multi-layer metal bottom acoustic reflector electrode 913A. In diagram 9001B, notional vertical dashed lines show alignment of thick line 972B depicting mechanical resonant frequency Fr for the active region with the lateral resonator dimension for the active region of BAW resonator 9001A. In diagram 9001B, a lower horizontal dashed line depicts electrical series resonant frequency Fs for BAW resonator 9001A. The mechanical resonant frequency Fr corresponding to the active region of BAW resonator 9001A may be about the same as electrical series resonant frequency Fs for BAW resonator 9001A. This is depicted in diagram 9001B by thick line 972B depicting mechanical resonant frequency Fr for the active region approximately overlapping the lower horizontal dashed line for electrical series resonant frequency Fs. In diagram 9001B, an upper horizontal dashed line depicts electrical parallel resonant frequency Fp of BAW resonator 9001A. Thick lines 973B, 973BB depict mechanical resonant frequency Fr corresponding to the peripheral region 973A (e.g., relatively inactive region 973A, e.g. remainder region 973A, e.g., extremity region 973A, e.g. lateral fringing electric field region 973A) of the first layer of piezoelectric material 905A, where the multi-layer metal top acoustic reflector electrode 915A may avoid overlapping (e.g., may not overlap) multi-layer metal bottom acoustic reflector electrode 913A. The mechanical resonant frequency Fr corresponding to the peripheral region 973A (e.g., relatively inactive region 973A, e.g. remainder region 973A, e.g., extremity region 973A, e.g. lateral fringing electric field region 973A) may be substantially higher than the electrical parallel resonant frequency Fp for BAW resonator 9001A. This is depicted in diagram 9001B by thick lines 973B, 973BB depicting mechanical resonant frequency Fr for peripheral region 973A (e.g., relatively inactive region 973A, e.g. remainder region 973A, e.g., extremity region 973A, e.g. lateral fringing electric field region 973A) as substantially higher than the upper horizontal dashed line for electrical parallel resonant frequency Fp.

As will be discussed next, it is theorized that the mechanical resonant frequency Fr corresponding to the peripheral region 973A (e.g., relatively inactive region 973A, e.g. remainder region 973A, e.g., extremity region 973A, e.g. lateral fringing electric field region 973A) being substantially higher than the electrical parallel resonant frequency Fp for BAW resonator 9001A may contribute to generation of unwanted parasitic lateral resonances in operation of the BAW resonator 9001A. It is theorized that BAW resonator designs for Super High Frequencies or higher (e.g., 24 GHz main series resonant frequency, Fs, of the BAW resonator 9001A or higher) may be particularly sensitive to generating parasitic lateral resonances.

A bottom left section of FIG. 9E shows a Smith chart 9001C showing a simulation of Scattering-parameters (e.g., S-parameters, e.g., S11) over frequencies 975C for BAW resonator 9001A (e.g., over frequencies including twenty-four Gigahertz, e.g., over frequencies including the 24 GHz main resonant frequency of BAW resonator 9001A, e.g., over frequencies including the 24 GHz main series resonant frequency, Fs, of BAW resonator 9001A). Uneven artifacts in the Smith chart depiction of electrical reflection coefficient S-parameters over frequencies 975C may be described in various ways such as epicycles, lobes and/or rattles, which may be indicative of the presence of parasitic lateral resonances in operation of the BAW resonator 9001A. It is theorized that the presence of unwanted parasitic lateral resonances in operation of the BAW resonator 9001A as indicated by the uneven artifacts in the Smith chart depiction of electrical reflection coefficient S-parameters over frequencies 975C may be explained by the mechanical resonant frequency Fr corresponding to the peripheral region 973A (e.g., relatively inactive region 973A, e.g. remainder region 973A, e.g., extremity region 973A, e.g. lateral fringing electric field region 973A) being substantially higher than the electrical parallel resonant frequency Fp (and substantially higher than the electrical series resonance Fs) for BAW resonator 9001A. It is theorized that intervening thin high acoustic impedance metal layers 917A, 935A being so thin (e.g. respective thickness of about a tenth of an acoustic wavelength $\lambda/10$ or less of the main resonant frequency of the BAW resonator 9001A) may facilitate suppression of parasitic lateral resonances. It is theorized that if the intervening high acoustic impedance metal layers 917A, 935A were substantially thicker (e.g. respective thickness substantially greater than the tenth of an acoustic wavelength $\lambda/10$ of the main resonant frequency of the BAW resonator 9001A), then: 1) parasitic lateral resonances may be substantially worse than the uneven artifacts in the Smith chart depiction of electrical reflection coefficient S-parameters over frequencies 975C; and 2) the mechanical resonant frequency Fr corresponding to the peripheral region 973A may become, relatively speaking, even higher, and may contribute to generation of even greater parasitic lateral resonances in operation of the BAW resonator 9001A.

An upper right section of FIG. 9E shows a simplified view of example bulk acoustic wave (BAW) resonator 9001D, which may comprise six layers of piezoelectric material 901D, 902D, 903D, 904D, 905D, 906D in a piezoelectric stack arrangement 914D of alternating normal/reverse piezoelectric axis orientation layers. This piezoelectric stack arrangement 914D may be sandwiched between a multi-layer metal bottom acoustic reflector electrode 913D and a multi-layer metal top acoustic reflector electrode 915D.

The multi-layer metal bottom acoustic reflector electrode 913D may comprise a first pair of bottom metal electrode layers, 919D, 921D. A first member 919D of the first pair of bottom metal electrode layers may be a low acoustic impedance bottom metal electrode layer 919D (e.g., titanium bottom metal electrode layer 919D). A second member 921D of the first pair of bottom metal electrode layers may be a high acoustic impedance bottom metal electrode layer 921D (e.g., tungsten bottom metal electrode layer 921D). In the multi-layer metal bottom acoustic reflector electrode 913D of BAW resonator 9001D, the first member 919D of the first pair of bottom metal electrode layers having the low acoustic impedance (e.g., low acoustic impedance bottom metal electrode layer 919D) may be arranged nearer to a layer of piezoelectric material (e.g., nearer to bottom layer of piezoelectric material 901D, e.g., nearer to the piezoelectric stack 914D) than the second member 921D of the first pair of bottom metal electrode layers having the high acoustic impedance (e.g., high acoustic impedance bottom metal electrode layer 921D). Further, although in the simplified view of BAW resonator 9001D only a first pair of bottom metal electrode layers 919D, 921D are explicitly shown, multi-layer metal bottom acoustic reflector electrode 913D may comprise many more pairs of alternating low acoustic impedance/high acoustic impedance of bottom metal electrode layers (not shown). Multi-layer metal bottom acoustic reflector electrode 913D may approximate a bottom metal distributed Bragg acoustic reflector 913D. The first member 919D of the first pair of bottom metal electrode layers 919D, 921D, and the second member 921D of the first pair of bottom metal electrode layers 919D, 921D, may have respective thicknesses selected to be about a quarter acoustic wavelength $\lambda/4$ of the main resonant frequency of the BAW resonator 9001D. Aggregating together the respective thicknesses of the first member 919D and the second member 921D, may provide a thickness of the first pair of bottom metal electrode layers 919D, 921D selected to be about a half acoustic wavelength $\lambda/2$ of the main resonant frequency of the BAW resonator 9001D.

The multi-layer metal bottom acoustic reflector electrode 913D may further comprise an intervening thin high acoustic impedance bottom metal electrode layer 917D, for example, intervening between the piezoelectric stack arrangement 914D and the first pair of bottom metal electrode layers, 919D, 921D (e.g., intervening between the piezoelectric stack arrangement 914D and the first member 919D having the low acoustic impedance of first pair of bottom metal electrode layers, 919D, 921D, e.g., intervening between the piezoelectric stack arrangement 914D and low acoustic impedance bottom metal electrode layer 919D (e.g., titanium bottom metal electrode layer 919D)). The intervening thin high acoustic impedance bottom metal electrode layer 917D may comprise a relatively high acoustic impedance metal (e.g., intervening thin tungsten bottom electrode layer 917D, e.g., intervening thin molybdenum bottom electrode layer 917D). The intervening thin high acoustic impedance bottom metal electrode layer 917D may be relatively thinner than respective thicknesses of members of the first pair of bottom metal electrode layers, 919D, 921D. For example, whereas members of the first pair of bottom metal electrode layers, 919D, 921D may have respective thicknesses of about a quarter acoustic wavelength $\lambda/4$ of the main resonant frequency of the BAW resonator 9001D, the intervening thin high acoustic impedance bottom metal electrode layer 917D may be relatively thinner, e.g., may have a thickness of about a tenth of an acoustic wavelength $\lambda/10$ or less of the main resonant frequency of the BAW resonator 9001D. The first member 919D having the low acoustic impedance of the first pair of bottom metal electrode layers, 919D, 921D may substantially abut the piezoelectric stack arrangement 914D. The intervening thin high acoustic impedance bottom metal electrode layer 917D may increase the reflectivity of the multi-layer metal bottom acoustic reflector electrode 913D and it may increase the electromechanical coupling coefficient Kt2 of example bulk acoustic wave (BAW) resonator 9001D.

The multi-layer metal top acoustic reflector electrode 915D may comprise a first pair of top metal electrode layers, 937D, 939D. A first member 937D of the first pair of top metal electrode layers may be low acoustic impedance top metal electrode layer 937D (e.g., titanium top metal electrode layer 937D). A second member 939D of the first pair of top metal electrode layers may be high acoustic impedance top metal electrode layer 939D (e.g., tungsten top metal electrode layer 939D). In the multi-layer metal top acoustic reflector electrode 915D of BAW resonator 9001D, the first member 937D of the first pair of top metal electrode layers having the low acoustic impedance (e.g., low acoustic impedance top metal electrode layer 937D) may be arranged nearer to the first layer of piezoelectric material (e.g., nearer to top layer of piezoelectric material 906D, e.g., nearer to the piezoelectric stack 914D) than the second member 939D of the first pair of top metal electrode layers having the high acoustic impedance (e.g., high acoustic impedance top metal electrode layer 939D). Further, although in the simplified view of BAW resonator 9001D only a first pair of top metal electrode layers 937D, 939D are explicitly shown, multi-layer metal top acoustic reflector electrode 915D may comprise many more pairs of alternating low acoustic impedance/high acoustic impedance top metal electrode layers (not shown). Multi-layer metal top acoustic reflector electrode 915D may approximate a top metal distributed Bragg acoustic reflector 915D. The first member 937D of the first pair of top metal electrode layers 937D, 939D and the second member 939D of the first pair of top metal electrode layers 937D, 939D may have respective thicknesses selected to be about a quarter acoustic wavelength $\lambda/4$ of a main resonant frequency of the BAW resonator 9001D. Aggregating together the respective thicknesses of the first member 937D and the second member 939D may provide a thickness of the first pair of top metal electrode layers 937D, 939D selected to be about a half acoustic wavelength $\lambda/2$ of the main resonant frequency of the BAW resonator 9001D.

The multi-layer metal top acoustic reflector electrode 915D may further comprise an intervening thin high acoustic impedance top metal electrode layer 935D, for example, intervening between the piezoelectric stack arrangement 914D and the first pair of top metal electrode layers, 937D, 939D (e.g., intervening between the piezoelectric stack arrangement 914D and the first member 937D having the low acoustic impedance of first pair of top metal electrode layers, 937D, 939D, e.g., intervening between the piezoelectric stack arrangement 914D and low acoustic impedance top metal electrode layer 937D (e.g., titanium top metal electrode layer 937D)). The intervening thin high acoustic impedance top metal electrode layer 935D may comprise a relatively high acoustic impedance metal (e.g., intervening thin tungsten top electrode layer 935D, e.g., intervening thin molybdenum top electrode layer 935D). The intervening thin high acoustic impedance top metal electrode layer 935D may be relatively thinner than respective thicknesses of members of the first pair of top metal electrode layers, 937D, 939D. For example, whereas members of the first pair of top metal electrode layers, 937D, 939D may have respective thicknesses of about a quarter acoustic wavelength $\lambda/4$ of the main resonant frequency of the BAW resonator 9001D, the intervening thin high acoustic impedance top metal electrode layer 935D may be relatively thinner, e.g., may have a thickness of about a tenth of an acoustic wavelength $\lambda/10$ or less of the main resonant frequency of the BAW resonator 9001D. The first member 937D having the low acoustic impedance of the first pair of top metal electrode layers, 937D, 939D may substantially abut the piezoelectric stack arrangement 914D. The intervening thin high acoustic impedance top metal electrode layer 935D may increase the reflectivity of the multi-layer metal top acoustic reflector electrode 915D and it may increase the electromechanical coupling coefficient Kt2 of example bulk acoustic wave (BAW) resonator 9001D.

Aggregating thicknesses of the six layers of piezoelectric material 901D, 902D, 903D, 904D, 905D, 906D (e.g., piezoelectric stack arrangement 914D) together with both intervening thin high acoustic impedance metal layers 917D, 935D may have a may have a selected thickness of about three acoustic wavelengths $3\lambda$ of the main resonant frequency of the BAW resonator 9001D (e.g., twenty-four Gigahertz, e.g., 24 GHz main resonant frequency, e.g., 24 GHz main series resonant frequency, Fs, of the BAW resonator 9001D). Because both intervening thin high acoustic impedance metal layers 917D, 935D are so thin, the respective layers of piezoelectric material may still have respective thicknesses of about a half acoustic wavelength $\lambda/2$ of the main resonant frequency of the BAW resonator 9001D. The six layer piezoelectric stack 914D may have an active region where the multi-layer metal top acoustic reflector electrode 915D may overlap multi-layer metal bottom acoustic reflector electrode 913D. Further, FIG. 9E particularly shows a peripheral region 973D of the six layer piezoelectric stack 914D where the multi-layer metal top acoustic reflector electrode 915D may avoid overlapping multi-layer metal bottom acoustic reflector electrode 913D (e.g., where the multi-layer metal top acoustic reflector electrode 915D may not overlap multi-layer metal bottom acoustic reflector electrode 913D). The peripheral region 973D of the six layer piezoelectric stack 914D may be relatively inactive (e.g., a relatively inactive region 973D), relative to the active region of the six layer piezoelectric stack 914D where the multi-layer metal top acoustic reflector electrode 915D may overlap multi-layer metal bottom acoustic reflector electrode 913D. The peripheral region 973D of the six layer piezoelectric stack 914D may be a remainder region 973D of the six layer piezoelectric stack 914D. The peripheral region 973D of the six layer piezoelectric stack 914D may be an extremity region 973D of the six layer piezoelectric stack 914D. The peripheral region 973D of the six layer piezoelectric stack 914D may be a lateral fringing electric field region of the six layer piezoelectric stack 914D, since there may be a lateral fringing electric field extending into an extremity of the six layer piezoelectric stack 914D in operation of the BAW resonator 9001D, e.g., the lateral fringing electric field may extend laterally from multi-layer metal top acoustic reflector electrode 915D, when the oscillating electric field may be applied thereto.

A middle right section of FIG. 9E shows a diagram 9001E of mechanical resonant frequency Fr versus lateral resonator dimension corresponding to the BAW resonator 9001D, as predicted by simulation. As shown in diagram 9001E, a thick line 972E depicts mechanical resonant frequency Fr corresponding to the active region of BAW resonator 9001D where the multi-layer metal top acoustic reflector electrode 915D may overlap multi-layer metal bottom acoustic reflector electrode 913D. In diagram 9001E, notional vertical dashed lines show alignment of thick line 972E depicting mechanical resonant frequency Fr for the active region with the lateral resonator dimension for the active region of BAW resonator 9001D. In diagram 9001E, a lower horizontal dashed line depicts electrical series resonant frequency Fs for BAW resonator 9001D. The mechanical resonant frequency Fr corresponding to the active region of BAW resonator 9001D may be about the same as electrical series resonant frequency Fs for BAW resonator 9001D. This is depicted in diagram 9001E by thick line 972E depicting mechanical resonant frequency Fr for the active region approximately overlapping the lower horizontal dashed line for electrical series resonant frequency Fs.

In diagram 9001E, an upper horizontal dashed line depicts electrical parallel resonant frequency Fp of BAW resonator 9001D. Thick lines 973E, 973EE depict mechanical resonant frequency Fr corresponding to the peripheral region 973D (e.g., relatively inactive region 973D, e.g. remainder region 973D, e.g., extremity region 973D, e.g. lateral fringing electric field region 973D) of the six layer piezoelectric stack 914D, where the multi-layer metal top acoustic reflector electrode 915D may avoid overlapping (e.g., may not overlap) multi-layer metal bottom acoustic reflector electrode 913D. The mechanical resonant frequency Fr corresponding to the peripheral region 973D (e.g., relatively inactive region 973D, e.g. remainder region 973D, e.g., extremity region 973D, e.g. lateral fringing electric field region 973D) may be relatively nearer to the electrical series resonant frequency Fs for BAW resonator 9001D, and may be relatively nearer to the electrical parallel resonant frequency Fp for BAW resonator 9001D. This is depicted in diagram 9001E by thick lines 973E, 973EE depicting mechanical resonant frequency Fr for peripheral region 973D (e.g., relatively inactive region 973D, e.g. remainder region 973D, e.g., extremity region 973D, e.g. lateral fringing electric field region 973D) as being relatively nearer to the lower horizontal dashed line for electrical series resonant frequency Fs, and being relatively nearer to the upper horizontal dashed line for electrical parallel resonant frequency Fp.

It is theorized that the mechanical resonant frequency Fr corresponding to the peripheral region 973D (e.g., relatively inactive region 973D, e.g. remainder region 973D, e.g., extremity region 973D, e.g. lateral fringing electric field region 973D) still being relatively nearer to the electrical parallel resonant frequency Fp for BAW resonator 9001D may facilitate suppressing parasitic lateral resonances in operation of the BAW resonator 9001D. It is theorized that the mechanical resonant frequency Fr corresponding to the peripheral region 973D (e.g., relatively inactive region 973D, e.g. remainder region 973D, e.g., extremity region 973D, e.g. lateral fringing electric field region 973D) being relatively nearer to the electrical series resonant frequency Fs for BAW resonator 9001D may facilitate suppressing unwanted parasitic lateral resonances in operation of the BAW resonator 9001D Comparing diagram 9001E to diagram 9001B, it can be seen that the mechanical resonant frequency Fr corresponding to the peripheral region 973D of the six layer piezoelectric stack 914D in BAW resonator 9001D and depicted in diagram 9001E by thick lines 973E, 973EE is substantially lower than the mechanical resonant frequency Fr corresponding to the peripheral region 973A of the first layer of piezoelectric material 905A in BAW resonator 9001A and depicted in diagram 9001B by thick lines 973B, 973BB. Comparing diagram 9001E to diagram 9001B, it can be seen that the mechanical resonant frequency Fr corresponding to the peripheral region 973D of the six layer piezoelectric stack 914D and depicted in diagram 9001E by thick lines 973E, 973EE is relatively nearer to the electrical parallel resonant frequency Fp for the BAW resonator than the mechanical resonant frequency Fr corresponding to the peripheral region 973A of the first layer of piezoelectric material 905A in BAW resonator and depicted in diagram 9001B by thick lines 973B, 973BB. Comparing diagram 9001E to diagram 9001B, it can be seen that the mechanical resonant frequency Fr corresponding to the peripheral region 973D of the six layer piezoelectric stack 914D and depicted in diagram 9001E by thick lines 973E, 973EE is relatively nearer to the electrical series resonant frequency Fs for the BAW resonator than the mechanical resonant frequency Fr corresponding to the peripheral region 973A of the first layer of piezoelectric material 905A in BAW resonator and depicted in diagram 9001B by thick lines 973B, 973BB.

Accordingly, it is theorized that the mechanical resonant frequency Fr corresponding to the peripheral region 973D of the six layer piezoelectric stack 914D and depicted in diagram 9001E by thick lines 973E, 973EE being relatively nearer to the electrical parallel resonant frequency Fp for the BAW resonator 9001D may at least partially facilitate suppressing parasitic lateral resonances. It is theorized that the mechanical resonant frequency Fr corresponding to the peripheral region 973D of the six layer piezoelectric stack 914D and depicted in diagram 9001E by thick lines 973E, 973EE being relatively nearer to the electrical series resonant frequency Fs for the BAW resonator 9001D may at least partially facilitate suppressing parasitic lateral resonances.

A bottom right section of FIG. 9E shows a Smith chart 9001F showing a simulation of Scattering-parameters (e.g., S-parameters, e.g., S11) over frequencies 975F for BAW resonator 9001D (e.g., over frequencies including twenty-four Gigahertz, e.g., over frequencies including the 24 GHz main resonant frequency of BAW resonator 9001D, e.g., over frequencies including the 24 GHz main series resonant frequency, Fs, of BAW resonator 9001D). Uneven artifacts in the Smith chart depiction of electrical reflection coefficient S-parameters over frequencies 975F may be described in various ways such as bumps, humps and/or rattles, which may be indicative of the presence of some, albeit relatively fewer/relatively weaker, unwanted parasitic lateral resonances in operation of the BAW resonator 9001D. It is theorized that BAW resonator designs for Super High Frequencies or higher (e.g., 24 GHz main series resonant frequency, Fs, of the BAW resonator 9001D or higher) may be particularly sensitive to generating parasitic lateral resonances.

Comparing Smith chart 9001C for BAW resonator 9001A to Smith chart 9001F for BAW resonator 9001D shows that uneven artifacts in the Smith chart depiction of electrical reflection coefficient S-parameters over frequencies 975F for BAW resonator 9001D may be significantly less/significantly weaker than uneven artifacts in the Smith chart depiction of impedance over frequencies 975C for BAW resonator 9001C. This may indicate that the six layer piezoelectric stack 914D in BAW resonator 9001D may substantially facilitate suppressing parasitic lateral resonances in operation of BAW resonator 9001D, for example, in comparison to the single piezoelectric layer 905A of BAW resonator 9001D. Accordingly, in BAW resonator 9001D, suppressing parasitic lateral resonances in operation of BAW resonator 9001D may be facilitated by: second piezoelectric layer 902D; third piezoelectric layer 903D; fourth piezoelectric layer 904D; fifth piezoelectric layer 905D; and/or sixth piezoelectric layer 906D. In BAW resonator 9001D, suppressing parasitic lateral resonances in operation of BAW resonator 9001D may be facilitated by at least two additional piezoelectric layers, e.g., second piezoelectric layer 902D and third piezoelectric layer 903D. In BAW resonator 9001D, suppressing parasitic lateral resonances in operation of BAW resonator 9001D may be facilitated by second piezoelectric layer, e.g., second piezoelectric layer 902D. In BAW resonator 9001D, suppressing parasitic lateral resonances in operation of BAW resonator 9001D may be facilitated by second and third piezoelectric layers, e.g., second and third piezoelectric layers 902D, 903D. In BAW resonator 9001D, suppressing parasitic lateral resonances in operation of BAW resonator 9001D may be facilitated by second, third and fourth piezoelectric layers, e.g., second, third and fourth piezoelectric layers 902D, 903D, 904D.

An upper left section of FIG. 9F shows a simplified view of example bulk acoustic wave (BAW) resonator 9001G, which may comprise a first layer of piezoelectric material 905G having a normal piezoelectric axis orientation sandwiched between a multi-layer metal bottom acoustic reflector electrode 913G and a multi-layer metal top acoustic reflector electrode 915G. The first layer of piezoelectric material 905G may have a thickness of about a half acoustic wavelength λ/2 of a main resonant frequency of the BAW resonator 9001G. The multi-layer metal bottom acoustic reflector electrode 913G may comprise a first pair of bottom metal electrode layers, 919G, 921G. A first member 919G of the first pair of bottom metal electrode layers may be a low acoustic impedance bottom metal electrode layer 919G (e.g., titanium bottom metal electrode layer 919G). A second member 921G of the first pair of bottom metal electrode layers may be high acoustic impedance bottom metal electrode layer 921G (e.g., tungsten bottom metal electrode layer 921G). In the multi-layer metal bottom acoustic reflector electrode 913G of BAW resonator 9001G, the first member 919G of the first pair of bottom metal electrode layers having the low acoustic impedance (e.g., low acoustic impedance bottom metal electrode layer 919G) may be arranged nearer to the first layer of piezoelectric material 905G than the second member 921G of the first pair of bottom metal electrode layers having the high acoustic impedance (e.g., high acoustic impedance bottom metal electrode layer 921G). Further, although in the simplified view of BAW resonator 9001G only a first pair of bottom metal electrode layers 919G, 921G are explicitly shown, multi-layer metal bottom acoustic reflector electrode 913G may comprise many more pairs of alternating low acoustic impedance/high acoustic impedance of bottom metal electrode layers (not shown). Multi-layer metal bottom acoustic reflector electrode 913G may approximate a bottom metal distributed Bragg acoustic reflector 913G. The first member 919G of the first pair of bottom metal electrode layers 919G, 921G, and the second member 921G of the first pair of bottom metal electrode layers 919G, 921G, may have respective thicknesses selected to be about a quarter acoustic wavelength λ/4 of the main resonant frequency of the BAW resonator 9001G. Aggregating together the respective thicknesses of the first member 921G and the second member 919G, may provide a thickness of the first pair of bottom metal electrode layers 919G, 921G selected to be about a half acoustic wavelength λ/2 of the main resonant frequency of the BAW resonator 9001G.

The multi-layer metal top acoustic reflector electrode 915G may comprise a first pair of top metal electrode layers, 937G, 939G. A first member 937G of the first pair of top metal electrode layers may be a low acoustic impedance top metal electrode layer 937G (e.g., titanium top metal electrode layer 937G). A second member 939G of the first pair of top metal electrode layers may be a high acoustic impedance top metal electrode layer 939G (e.g., tungsten top metal electrode layer 939G). In the multi-layer metal top acoustic reflector electrode 915G of BAW resonator 9001G, the first member 937G of the first pair of top metal electrode layers having the low acoustic impedance (e.g., low acoustic impedance top metal electrode layer 937G) may be arranged nearer to the first layer of piezoelectric material 905G than the second member 939G of the first pair of top metal electrode layers having the high acoustic impedance (e.g., high acoustic impedance top metal electrode layer 939G). Further, although in the simplified view of BAW resonator 9001G only a first pair of top metal electrode layers 937G, 939G are explicitly shown, multi-layer metal top acoustic reflector electrode 915G may comprise many more pairs of alternating low acoustic impedance/high acoustic impedance top metal electrode layers (not shown). Multi-layer metal top acoustic reflector electrode 915G may approximate a top metal distributed Bragg acoustic reflector 915G. The first member 937G of the first pair of top metal electrode layers 937G, 939G, and the second member 939G of the first pair of top metal electrode layers 937G, 939G, may have respective thicknesses selected to be about a quarter acoustic wavelength λ/4 of a main resonant frequency of the BAW resonator 9001G. Aggregating together the respective thicknesses of the first member 937G and the second member 939G, may provide a thickness of the first pair of top metal electrode layers 937G, 939G selected to be about a half acoustic wavelength λ/2 of the main resonant frequency of the BAW resonator 9001G.

The first layer of piezoelectric material 905G may have an active region where the multi-layer metal top acoustic reflector electrode 915G may overlap multi-layer metal bottom acoustic reflector electrode 913G. FIG. 9F particularly shows a peripheral region 973G of the first layer of piezoelectric material 905G where the multi-layer metal top acoustic reflector electrode 915G may avoid overlapping multi-layer metal bottom acoustic reflector electrode 913G (e.g., where the multi-layer metal top acoustic reflector electrode 915G may not overlap multi-layer metal bottom acoustic reflector electrode 913G.) The peripheral region 973G of the first layer of piezoelectric material 905G may be relatively inactive (e.g., a relatively inactive region 973G), relative to the active region of first layer of piezoelectric material 905G where the multi-layer metal top acoustic reflector electrode 915G may overlap multi-layer metal bottom acoustic reflector electrode 913G. The peripheral region 973G of the first layer of piezoelectric material 905G may be a remainder region 973G of the first layer of piezoelectric material 905G. The peripheral region 973G of the first layer of piezoelectric material 905G may be an extremity region 973G of the first layer of piezoelectric material 905G. The peripheral region 973G of the first layer of piezoelectric material 905G may be a lateral fringing electric field region of the first layer of piezoelectric material 905G, since there may be a lateral fringing electric field extending into an extremity of the first layer of piezoelectric material 905G in operation of the BAW resonator 9001G, e.g., the lateral fringing electric field may extend laterally from multi-layer metal top acoustic reflector electrode 915G, when the oscillating electric field may be applied thereto.

A middle left section of FIG. 9F shows a diagram 9001H of mechanical resonant frequency Fr versus lateral resonator dimension corresponding to the BAW resonator 9001G, as predicted by simulation. As shown in diagram 9001H, a thick line 972H depicts mechanical resonant frequency Fr corresponding to the active region of BAW resonator 9001G where the multi-layer metal top acoustic reflector electrode 915G may overlap multi-layer metal bottom acoustic reflector electrode 913G. In diagram 9001H, notional vertical dashed lines show alignment of thick line 972H depicting mechanical resonant frequency Fr for the active region with the lateral resonator dimension for the active region of BAW resonator 9001G. In diagram 9001H, a lower horizontal dashed line depicts electrical series resonant frequency Fs for BAW resonator 9001G. The mechanical resonant frequency Fr corresponding to the active region of BAW resonator 9001G may be about the same as electrical series resonant frequency Fs for BAW resonator 9001G. This is depicted in diagram 9001H by thick line 972H depicting mechanical resonant frequency Fr for the active region approximately overlapping the lower horizontal dashed line for electrical series resonant frequency Fs.

In diagram 9001H, an upper horizontal dashed line depicts electrical parallel resonant frequency Fp for of BAW resonator 9001G. Thick lines 973H, 973HH depict mechanical resonant frequency Fr corresponding to the peripheral region 973G (e.g., relatively inactive region 973G, e.g. remainder region 973G, e.g., extremity region 973G, e.g. lateral fringing electric field region 973G) of the first layer of piezoelectric material 905G, where the multi-layer metal top acoustic reflector electrode 915G may avoid overlapping multi-layer metal bottom acoustic reflector electrode 913G. The mechanical resonant frequency Fr corresponding to the peripheral region 973G (e.g., relatively inactive region 973G, e.g. remainder region 973G, e.g., extremity region 973G, e.g. lateral fringing electric field region 973G) may be about the same as the electrical parallel resonant frequency Fp for BAW resonator 9001G, and may be relatively nearer to the electrical series resonant frequency Fs for BAW resonator 9001G. This is depicted in diagram 9001H by thick lines 973H, 973HH depicting mechanical resonant frequency Fr for peripheral region 973G (e.g., relatively inactive region 973G, e.g. remainder region 973G, e.g., extremity region 973G, e.g. lateral fringing electric field region 973G) as arranged relatively nearer to the lower horizontal dashed line for electrical series resonant frequency Fs and as approximately overlapping the upper horizontal dashed line for electrical parallel resonant frequency Fp.

It is theorized that the mechanical resonant frequency Fr corresponding to the peripheral region 973G (e.g., relatively inactive region 973G, e.g. remainder region 973G, e.g., extremity region 973G, e.g. lateral fringing electric field region 973G) being about the same the electrical parallel resonant frequency Fp for BAW resonator 9001G may facilitate suppressing parasitic lateral resonances in operation of the BAW resonator 9001G. It is theorized that the mechanical resonant frequency Fr corresponding to the peripheral region 973G (e.g., relatively inactive region 973G, e.g. remainder region 973G, e.g., extremity region 973G, e.g. lateral fringing electric field region 973G) being relatively nearer to the electrical series resonant frequency Fs for BAW resonator 9001G may facilitate suppressing parasitic lateral resonances in operation of the BAW resonator 9001G.

A bottom left section of FIG. 9F shows a Smith chart 9001I showing a simulation of electrical reflection coefficient S-parameters over frequencies 975I for BAW resonator 9001G (e.g., over frequencies including twenty-four Gigahertz, e.g., over frequencies including the 24 GHz main resonant frequency of BAW resonator 9001G, e.g., over frequencies including the 24 GHz main series resonant frequency, Fs, of BAW resonator 9001G). Uneven artifacts in the Smith chart depiction of S-parameters over frequencies 975I may be described in various ways such as bumps, humps and/or rattles, which may be indicative of the presence of unwanted parasitic lateral resonances in operation of the BAW resonator 9001G.

Design performance of BAW resonator 9001G having—low-acoustic impedance top and bottom metal electrode layers 937G, 919G, nearest to the first piezoelectric layer 905G as shown in FIG. 9F may be compared with BAW resonator 9001A having intervening—high-acoustic impedance top and bottom metal electrode layers 935A, 917A nearest to first piezoelectric layer 905A as shown in FIG. 9E by comparing the Smith chart depiction of electrical reflection coefficient S-parameters over frequencies 975I for BAW resonator 9001G shown in FIG. 9F to the Smith chart depiction of electrical reflection coefficient S-parameters over frequencies 975C for BAW resonator 9001A shown in FIG. 9E. As shown by this comparison, relatively lesser/fewer/weaker uneven artifacts in the Smith chart depiction of electrical reflection coefficient S-parameters over frequencies 975I for BAW resonator 9001G (relative to greater/more/stronger uneven artifacts in the Smith chart depiction of electrical reflection coefficient S-parameters over frequencies 975C for BAW resonator 9001A) indicates relatively less uneven artifacts in Smith chart depiction of electrical reflection coefficient S-parameters over frequencies 975I for BAW resonator 9001G and less parasitic lateral resonances in operation of BAW resonator 9001G, in which—low-acoustic impedance top and bottom metal electrode layers 937G, 919G, are nearest to the first piezoelectric layer 905G. Accordingly, based on this comparison of this disclosure, it is apparent that to facilitate suppression of parasitic lateral resonances in operation of the BAW resonators: relatively lower acoustic impedance metal electrode layers (e.g., relatively lower acoustic impedance top metal electrode layer, e.g., relatively lower acoustic impedance bottom metal electrode layer) may be arranged nearest, e.g., may be arranged substantially nearest, e.g. may abut, e.g., may substantially abut, a first piezoelectric layer of the BAW resonator. Accordingly, relatively lower acoustic impedance metal electrode layers (e.g., relatively lower acoustic impedance top metal electrode layer, e.g., relatively lower acoustic impedance bottom metal electrode layer) may be arranged sufficiently proximate to the first layer of piezoelectric material, so that the relatively lower acoustic impedance metal electrode layers (e.g., relatively lower acoustic impedance top metal electrode layer, e.g., relatively lower acoustic impedance bottom metal electrode layer) may contribute more to facilitate suppressing parasitic lateral resonances in operation of the BAW resonator than is contributed by any other metal electrode layer of the multi-layer metal acoustic reflector electrodes. The relatively lower acoustic impedance metal electrode layers (e.g., relatively lower acoustic impedance top metal electrode layer, e.g., relatively lower acoustic impedance bottom metal electrode layer) may be arranged sufficiently proximate to the first layer of piezoelectric material, so that standing wave acoustic energy to be in the relatively lower acoustic impedance metal electrode layers (e.g., relatively lower acoustic impedance top metal electrode layer, e.g., relatively lower acoustic impedance bottom metal electrode layer) is greater than respective standing wave acoustic energy to be in other respective layers of the multi-layer acoustic reflectors in operation of the BAW resonator. This may at least partially facilitate suppression of parasitic lateral resonances in operation of the BAW resonator.

An upper right section of FIG. 9F shows a simplified view of example bulk acoustic wave (BAW) resonator 9001J may comprise six layers of piezoelectric material 901J, 902J, 903J, 904J, 905J, 906J in a piezoelectric stack arrangement 914J of alternating normal/reverse piezoelectric axis orientation layers. This piezoelectric stack arrangement 914J may be sandwiched between a multi-layer metal bottom acoustic reflector electrode 913J and a multi-layer metal top acoustic reflector electrode 915J. The respective layers of piezoelectric material may have respective thicknesses of about a half acoustic wavelength $\lambda/2$ of a main resonant frequency of the BAW resonator 9001J. Aggregating thicknesses of the six layers of piezoelectric material 901J, 902J, 903J, 904J, 905J, 906J, piezoelectric stack arrangement 914J may have a thickness of about three acoustic wavelengths $3\lambda$ of the main resonant frequency of the BAW resonator 9001J. The multi-layer metal bottom acoustic reflector electrode 913J may comprise a first pair of bottom metal electrode layers, 919J, 921J. A first member 919J of the first pair of bottom metal electrode layers may be a low acoustic impedance bottom metal electrode layer 919J (e.g., titanium bottom metal electrode layer 919J). A second member 921J of the first pair of bottom metal electrode layers may be a high acoustic impedance bottom metal electrode layer 921J (e.g., tungsten bottom metal electrode layer 921J). In the multi-layer metal bottom acoustic reflector electrode 913J of BAW resonator 9001J, the first member 919J of the first pair of bottom metal electrode layers having the low acoustic impedance (e.g., low acoustic impedance bottom metal electrode layer 919J) may be arranged nearer to a layer of piezoelectric material (e.g., nearer to bottom layer of piezoelectric material 901J, e.g., nearer to the piezoelectric stack 914J) than the second member 921J of the first pair of bottom metal electrode layers having the high acoustic impedance (e.g., high acoustic impedance bottom metal electrode layer 921J). Further, although in the simplified view of BAW resonator 9001J only a first pair of bottom metal electrode layers 919J, 921J are explicitly shown, multi-layer metal bottom acoustic reflector electrode 913J may comprise many more pairs of alternating low acoustic impedance/high acoustic impedance of bottom metal electrode layers (not shown). Multi-layer metal bottom acoustic reflector electrode 913J may approximate a bottom metal distributed Bragg acoustic reflector 913J. The first member 919J of the first pair of bottom metal electrode layers 919J, 921J, and the second member 921J of the first pair of bottom metal electrode layers 919J, 921J, may have respective thicknesses selected to be about a quarter acoustic wavelength $\lambda/4$ of the main resonant frequency of the BAW resonator 9001J. Aggregating together the respective thicknesses of the first member 919J and the second member 921J, may provide a thickness of the first pair of bottom metal electrode layers 919J, 921J selected to be about a half acoustic wavelength $\lambda/2$ of the main resonant frequency of the BAW resonator 9001J.

The multi-layer metal top acoustic reflector electrode 915J may comprise a first pair of top metal electrode layers, 937J, 939J. A first member 937J of the first pair of top metal electrode layers may be a low acoustic impedance top metal electrode layer 937J (e.g., titanium top metal electrode layer 937J). A second member 939J of the first pair of top metal electrode layers may be a high acoustic impedance top metal electrode layer 939J (e.g., tungsten top metal electrode layer 939J). In the multi-layer metal top acoustic reflector electrode 915J of BAW resonator 9001J, the first member 937J of the first pair of top metal electrode layers having the low acoustic impedance (e.g., low acoustic impedance top metal electrode layer 937J) may be arranged nearer to the first layer of piezoelectric material (e.g., nearer to top layer of piezoelectric material 906J, e.g., nearer to the piezoelectric stack 914J) than the second member 939J of the first pair of top metal electrode layers having the high acoustic impedance (e.g., high acoustic impedance top metal electrode layer 939J). Further, although in the simplified view of BAW resonator 9001J only a first pair of top metal electrode layers 937J, 939J are explicitly shown, multi-layer metal top acoustic reflector electrode 915J may comprise many more pairs of alternating low acoustic impedance/high acoustic impedance top metal electrode layers (not shown). Multi-layer metal top acoustic reflector electrode 915J may approximate a top metal distributed Bragg acoustic reflector 915J. The first member 939J of the first pair of top metal electrode layers 937J, 939J and the second member 939J of the first pair of top metal electrode layers 937J, 939J may have respective thicknesses selected to be about a quarter acoustic wavelength $\lambda/4$ of a main resonant frequency of the BAW resonator 9001J. Aggregating together the respective thicknesses of the first member 937J and the second member 939J may provide a thickness of the first pair of top metal electrode layers 937J, 939J selected to be about a half acoustic wavelength $\lambda/2$ of the main resonant frequency of the BAW resonator 9001J.

The six layer piezoelectric stack 914J may have an active region where the multi-layer metal top acoustic reflector electrode 915J may overlap multi-layer metal bottom acoustic reflector electrode 913J. Further, FIG. 9F particularly shows a peripheral region 973J of the six layer piezoelectric stack 914J where the multi-layer metal top acoustic reflector electrode 915J may avoid overlapping multi-layer metal bottom acoustic reflector electrode 913J (e.g., where the multi-layer metal top acoustic reflector electrode 915J may not overlap multi-layer metal bottom acoustic reflector electrode 913J). The peripheral region 973J of the six layer piezoelectric stack 914J may be relatively inactive (e.g., a relatively inactive region 973J), relative to the active region of the six layer piezoelectric stack 914J where the multi-layer metal top acoustic reflector electrode 915J may overlap multi-layer metal bottom acoustic reflector electrode 913J. The peripheral region 973J of the six layer piezoelectric stack 914J may be a remainder region 973J of the six layer piezoelectric stack 914J. The peripheral region 973J of the six layer piezoelectric stack 914J may be an extremity region 973J of the six layer piezoelectric stack 914J. The peripheral region 973J of the six layer piezoelectric stack 914J may be a lateral fringing electric field region of the six layer piezoelectric stack 914J, since there may be a lateral fringing electric field extending into an extremity of the six layer piezoelectric stack 914J in operation of the BAW resonator 9001J, e.g., the lateral fringing electric field may extend laterally from multi-layer metal top acoustic reflector electrode 915J, when the oscillating electric field may be applied thereto.

A middle right section of FIG. 9F shows a diagram 9001K of mechanical resonant frequency Fr versus lateral resonator dimension corresponding to the BAW resonator 9001J, as predicted by simulation. As shown in diagram 9001K, a thick line 972K depicts mechanical resonant frequency Fr corresponding to the active region of BAW resonator 9001J where the multi-layer metal top acoustic reflector electrode 915J may overlap multi-layer metal bottom acoustic reflector electrode 913J. In diagram 9001K, notional vertical dashed lines show alignment of thick line 972K depicting mechanical resonant frequency Fr for the active region with the lateral resonator dimension for the active region of BAW resonator 9001J. In diagram 9001K, a lower horizontal dashed line depicts electrical series resonant frequency Fs for BAW resonator 9001J. The mechanical resonant frequency Fr corresponding to the active region of BAW resonator 9001J may be about the same as electrical series resonant frequency Fs for BAW resonator 9001J. This is depicted in diagram 9001K by thick line 972K depicting mechanical resonant frequency Fr for the active region approximately overlapping the lower horizontal dashed line for electrical series resonant frequency Fs.

In diagram 9001K, an upper horizontal dashed line depicts electrical parallel resonant frequency Fp of BAW resonator 9001J. Thick lines 973K, 973KK depict mechanical resonant frequency Fr corresponding to the peripheral region 973J (e.g., relatively inactive region 973J, e.g. remainder region 973J, e.g., extremity region 973J, e.g. lateral fringing electric field region 973J) of the six layer piezoelectric stack 914J, where the multi-layer metal top acoustic reflector electrode 915J may avoid overlapping (e.g., may not overlap) multi-layer metal bottom acoustic reflector electrode 913J. The mechanical resonant frequency Fr corresponding to the peripheral region 973J (e.g., relatively inactive region 973J, e.g. remainder region 973J, e.g., extremity region 973J, e.g. lateral fringing electric field region 973J) may be about the same as the electrical parallel resonant frequency Fp for BAW resonator 9001J, and may be relatively nearer to the electrical series resonant frequency Fs for BAW resonator 9001J. This is depicted in diagram 9001K by thick lines 973K, 973KK depicting mechanical resonant frequency Fr for peripheral region 973J (e.g., relatively inactive region 973J, e.g. remainder region 973J, e.g., extremity region 973J, e.g. lateral fringing electric field region 973J) as approximately overlapping the upper horizontal dashed line for electrical parallel resonant frequency Fp, and being relatively nearer to the lower horizontal dashed line for electrical series resonant frequency Fs.

It is theorized that the mechanical resonant frequency Fr corresponding to the peripheral region 973J (e.g., relatively inactive region 973J, e.g. remainder region 973J, e.g., extremity region 973J, e.g. lateral fringing electric field region 973J) being about the same as the electrical parallel resonant frequency Fp for BAW resonator 9001J may facilitate suppressing parasitic lateral resonances in operation of the BAW resonator 9001J. It is theorized that the mechanical resonant frequency Fr corresponding to the peripheral region 973J (e.g., relatively inactive region 973J, e.g., remainder region 973J, e.g., extremity region 973J, e.g., lateral fringing electric field region 973J) being relatively nearer to the electrical series resonant frequency Fs for BAW resonator 9001J may facilitate suppressing parasitic lateral resonances in operation of the BAW resonator 9001J.

A bottom right section of FIG. 9F shows a Smith chart 9001L showing a simulation of electrical reflection coefficient S-parameters over frequencies 975L for BAW resonator 9001J (e.g., over frequencies including twenty-four Gigahertz, e.g., over frequencies including the 24 GHz main resonant frequency of BAW resonator 9001J, e.g., over frequencies including the 24 GHz main series resonant frequency, Fs, of BAW resonator 9001J). Uneven artifacts in the Smith chart depiction of electrical reflection coefficient S-parameters over frequencies 975F may be described in various ways such as bumps, humps and/or rattles, which may be indicative of the presence of unwanted parasitic lateral resonances in operation of the BAW resonator 9001J.

Design performance of BAW resonator 9001J having— low-acoustic impedance top and bottom metal electrode layers 937J, 919J, nearest to the stack of piezoelectric stack 914J as shown in FIG. 9F may be compared with BAW resonator 9001D having intervening—high-acoustic impedance top and bottom metal electrode layers 935D, 917D nearest to piezoelectric stack 914D as shown in FIG. 9E by comparing the Smith chart depiction of electrical reflection coefficient S-parameters over frequencies 975L for BAW resonator 9001J shown in FIG. 9F to the Smith chart depiction of electrical reflection coefficient S-parameters over frequencies 975F for BAW resonator 9001D shown in FIG. 9E. As shown by this comparison, relatively lesser and fewer uneven artifacts in the Smith chart depiction of electrical reflection coefficient S-parameters over frequencies 975L for BAW resonator 9001J (relative to greater and more uneven artifacts in the Smith chart depiction of electrical reflection coefficient S-parameters over frequencies 975F for BAW resonator 9001D) indicates relatively less uneven artifacts in Smith chart depiction of electrical reflection coefficient S-parameters over frequencies 975L for BAW resonator 9001J and less parasitic lateral resonances in operation of BAW resonator 9001J, in which—low-acoustic impedance top and bottom metal electrode layers 937J, 919J, are nearest to the piezoelectric stack 914J. Accordingly, based on this comparison of this disclosure, it is apparent that to facilitate suppression of parasitic lateral resonances in operation of BAW resonators having stacks of piezoelectric layers: relatively lower acoustic impedance metal electrode layers (e.g., relatively lower acoustic impedance top metal electrode layer, e.g., relatively lower acoustic impedance bottom metal electrode layer) may be arranged nearest, e.g., may be arranged substantially nearest, e.g. may abut, e.g., may substantially abut, a stack of piezoelectric layers of the BAW resonator. Accordingly, relatively lower acoustic impedance metal electrode layers (e.g., relatively lower acoustic impedance top metal electrode layer, e.g., relatively lower acoustic impedance bottom metal electrode layer) may be arranged sufficiently proximate to the stack of piezoelectric layers, so that the relatively lower acoustic impedance metal electrode layers (e.g., relatively lower acoustic impedance top metal electrode layer, e.g., relatively lower acoustic impedance bottom metal electrode layer) may contribute more to facilitate suppressing parasitic lateral resonances in operation of the BAW resonator than is contributed by any other metal electrode layer of the multi-layer metal acoustic reflector electrodes. The relatively lower acoustic impedance metal electrode layers (e.g., relatively lower acoustic impedance top metal electrode layer, e.g., relatively lower acoustic impedance bottom metal electrode layer) may be arranged sufficiently proximate to the stack of piezoelectric layers, so that standing wave acoustic energy to be in the relatively lower acoustic impedance metal electrode layers (e.g., relatively lower acoustic impedance top metal electrode layer, e.g., relatively lower acoustic impedance bottom metal electrode layer) is greater than respective standing wave acoustic energy to be in other respective layers of the multi-layer acoustic reflectors in operation of the BAW resonator. This may facilitate suppression of parasitic lateral resonances in operation of the BAW resonator.

An upper left section of FIG. 9G shows a simplified view of example bulk acoustic wave (BAW) resonator 9001M, which may comprise a first layer of piezoelectric material 905M having a normal piezoelectric axis orientation sandwiched between a multi-layer metal bottom acoustic reflector electrode 913M and a multi-layer metal top acoustic reflector electrode 915M. The first layer of piezoelectric material 905M may have a thickness of about a half acoustic wavelength $\lambda/2$ of a main resonant frequency of the BAW resonator 9001M. The multi-layer metal bottom acoustic reflector electrode 913M may comprise a first pair of bottom metal electrode layers, 919M, 921M. A first member 919M of the first pair of bottom metal electrode layers may be a low acoustic impedance bottom metal electrode layer 919M (e.g., titanium bottom metal electrode layer 919M). A second member 921M of the first pair of bottom metal electrode layers may be high acoustic impedance bottom metal electrode layer 921M (e.g., tungsten bottom metal electrode layer 921M). In the multi-layer metal bottom acoustic reflector electrode 913M of BAW resonator 9001M, the first member 919M of the first pair of bottom metal electrode layers having the low acoustic impedance (e.g., low acoustic impedance bottom metal electrode layer 919M) may be arranged nearer to the first layer of piezoelectric material 905M than the second member 921M of the first pair of bottom metal electrode layers having the high acoustic impedance (e.g., high acoustic impedance bottom metal electrode layer 921M). Further, although in the simplified view of BAW resonator 9001M only a first pair of bottom metal electrode layers 919M, 921M are explicitly shown, multi-layer metal bottom acoustic reflector electrode 913M may comprise many more pairs of alternating low acoustic impedance/high acoustic impedance of bottom metal electrode layers (not shown). Thickness of bottom metal electrode layers may be related to wavelength of a main resonant frequency of the BAW resonator 9001M. The multi-layer metal bottom acoustic reflector electrode 913M of BAW resonator 9001M may be de-tuned (e.g. tuned down) from the main resonant frequency of the BAW resonator 9001M. The second member 921M of the first pair of bottom metal electrode layers 919M, 921M may have a thickness selected to be approximately a quarter acoustic wavelength $\lambda/4$ of a main resonant frequency of the BAW resonator 9001M or thicker. The first member 919M of the first pair of bottom metal electrode layers 919M, 921M may have a thickness selected to be thicker, e.g. tuned to be about 3% lower than a main resonant frequency of the BAW resonator 9001M, e.g., tuned to be about 0.75 GHz lower than a main resonant frequency of the BAW resonator 9001M, e.g., tuned to be about 0.75 GHz lower than an example 24 GHz main resonant frequency of the BAW resonator 9001M. Multi-layer metal bottom acoustic reflector electrode 913M may approximate a bottom metal de-tuned distributed Bragg acoustic reflector 913M. Multi-layer metal bottom acoustic reflector electrode 913M may be a multi-layer metal bottom de-tuned acoustic reflector electrode 913M.

The multi-layer metal top acoustic reflector electrode 915M may comprise a first pair of top metal electrode layers, 937M, 939M. A first member 937M of the first pair of top metal electrode layers may be a low acoustic impedance top metal electrode layer 937A (e.g., titanium top metal electrode layer 937M). A second member 939M of the first pair of top metal electrode layers may be a high acoustic impedance top metal electrode layer 939M (e.g., tungsten top metal electrode layer 939M). In the multi-layer metal top acoustic reflector electrode 915M of BAW resonator 9001M, the first member 937M of the first pair of top metal electrode layers having the low acoustic impedance (e.g., low acoustic impedance top metal electrode layer 937M) may be arranged nearer to the first layer of piezoelectric material 905M than the second member 939M of the first pair of top metal electrode layers having the high acoustic impedance (e.g., high acoustic impedance top metal electrode layer 939M). Further, although in the simplified view of BAW resonator 9001M only a first pair of top metal electrode layers 937M, 939M are explicitly shown, multi-layer metal top acoustic reflector electrode 915M may comprise many more pairs of alternating low acoustic impedance/high acoustic impedance of top metal electrode layers (not shown). Thickness of top metal electrode layers may be related to wavelength of a main resonant frequency of the BAW resonator 9001M. The multi-layer metal top acoustic reflector electrode 915M of BAW resonator 9001M may be de-tuned (e.g. tuned up) from the main resonant frequency of the BAW resonator 9001M. The second member 939M of the first pair of top metal electrode layers 937M, 939M may have a thickness selected to be about a quarter acoustic wavelength $\lambda/4$ of a main resonant frequency of the BAW resonator 9001M. The first member 937M of the first pair of top metal electrode layers 937M, 939M may have a thickness selected to be thinner, e.g. tuned to be about 3% higher than a main resonant frequency of the BAW resonator 9001M, e.g., tuned to be about 0.75 GHz higher than a main resonant frequency of the BAW resonator 9001M, e.g., tuned to be about 0.75 GHz higher than an example 24 GHz main resonant frequency of the BAW resonator 9001M. Multi-layer metal top acoustic reflector electrode 915M may approximate a top metal de-tuned distributed Bragg acoustic reflector 915M. Multi-layer metal top acoustic reflector electrode 915M may be a multi-layer metal top de-tuned acoustic reflector electrode 915M.

The first layer of piezoelectric material 905M may have an active region where the multi-layer metal top acoustic reflector electrode 915M may overlap multi-layer metal bottom acoustic reflector electrode 913M. FIG. 9G particularly shows a peripheral region 973M of the first layer of piezoelectric material 905M where the multi-layer metal top acoustic reflector electrode 915M may avoid overlapping multi-layer metal bottom acoustic reflector electrode 913M (e.g., where the multi-layer metal top acoustic reflector electrode 915M may not overlap multi-layer metal bottom acoustic reflector electrode 913M). The peripheral region 973M of the first layer of piezoelectric material 905M may be relatively inactive (e.g., a relatively inactive region 973M), relative to the active region of first layer of piezoelectric material 905M where the multi-layer metal top acoustic reflector electrode 915M may overlap multi-layer metal bottom acoustic reflector electrode 913M. The peripheral region 973M of the first layer of piezoelectric material 905M may be a remainder region 973M of the first layer of piezoelectric material 905M. The peripheral region 973M of the first layer of piezoelectric material 905M may be an extremity region 973M of the first layer of piezoelectric material 905M. The peripheral region 973M of the first layer of piezoelectric material 905M may be a lateral fringing electric field region of the first layer of piezoelectric material 905M, since there may be a lateral fringing electric field extending into an extremity of the first layer of piezoelectric material 905M in operation of the BAW resonator 9001M, e.g., the lateral fringing electric field may extend laterally from multi-layer metal top acoustic reflector electrode 915M, when the oscillating electric field may be applied thereto.

A middle left section of FIG. 9G shows a diagram 9001N of mechanical resonant frequency Fr versus lateral resonator dimension corresponding to the BAW resonator 9001M, as predicted by simulation. As shown in diagram 9001N, a thick line 972N depicts mechanical resonant frequency Fr corresponding to the active region of BAW resonator 9001M where the multi-layer metal top acoustic reflector electrode 915M may overlap multi-layer metal bottom acoustic reflector electrode 913M. In diagram 9001N, notional vertical dashed lines show alignment of thick line 972N depicting mechanical resonant frequency Fr for the active region with the lateral resonator dimension for the active region of BAW resonator 9001M. In diagram 9001N, a lower horizontal dashed line depicts electrical series resonant frequency Fs for BAW resonator 9001M. The mechanical resonant frequency Fr corresponding to the active region of BAW resonator 9001M may be about the same as electrical series resonant frequency Fs for BAW resonator 9001M. This is depicted in diagram 9001N by thick line 972N depicting mechanical resonant frequency Fr for the active region approximately overlapping the lower horizontal dashed line for electrical series resonant frequency Fs.

In diagram 9001N, an upper horizontal dashed line depicts electrical parallel resonant frequency Fp of BAW resonator 9001M. Thick lines 973N, 973NN depict mechanical resonant frequency Fr corresponding to the peripheral region 973M (e.g., relatively inactive region 973M, e.g. remainder region 973M, e.g., extremity region 973M, e.g. lateral fringing electric field region 973M) of the first layer of piezoelectric material 905M, where the multi-layer metal top acoustic reflector electrode 915M may avoid overlapping multi-layer metal bottom acoustic reflector electrode 913M. The mechanical resonant frequency Fr corresponding to the peripheral region 973M (e.g., relatively inactive region 973M, e.g. remainder region 973M, e.g., extremity region 973M, e.g. lateral fringing electric field region 973M) may be lower (e.g. approximately lower) than the electrical parallel resonant frequency Fp for BAW resonator 9001M. The mechanical resonant frequency Fr corresponding to the peripheral region 973M (e.g., relatively inactive region 973M, e.g. remainder region 973M, e.g., extremity region 973M, e.g. lateral fringing electric field region 973M) may be near (e.g. relatively nearer) the electrical series resonant frequency Fs for BAW resonator 9001M. The mechanical resonant frequency Fr corresponding to the peripheral region 973M (e.g., relatively inactive region 973M, e.g. remainder region 973M, e.g., extremity region 973M, e.g. lateral fringing electric field region 973M) may approximately match the electrical series resonant frequency Fs for BAW resonator 9001M.

The foregoing is depicted in diagram 9001N by thick lines 973H, 973HH depicting mechanical resonant frequency Fr for peripheral region 973M (e.g., relatively inactive region 973M, e.g. remainder region 973M, e.g., extremity region 973M, e.g. lateral fringing electric field region 973M) as arranged below (e.g., significantly below) the upper horizontal dashed line for electrical parallel resonant frequency Fp. Diagram 9001N shows thick lines 973H, 973HH depicting mechanical resonant frequency Fr for peripheral region 973M (e.g., relatively inactive region 973M, e.g. remainder region 973M, e.g., extremity region 973M, e.g. lateral fringing electric field region 973M) as arranged near (e.g., relatively nearer) the lower horizontal dashed line for electrical series resonant frequency Fs. Diagram 9001N shows thick lines 973H, 973HH depicting mechanical resonant frequency Fr for peripheral region 973M (e.g., relatively inactive region 973M, e.g. remainder region 973M, e.g., extremity region 973M, e.g. lateral fringing electric field region 973M) as arranged approximately matching (e.g., approximately overlapping) the lower horizontal dashed line for electrical series resonant frequency Fs.

It is theorized that de-tuning of the multi-layer metal de-tuned acoustic reflector electrodes (e.g., tuning up the multi-layer metal top de-tuned acoustic reflector electrode 915M to be above the main resonant frequency of the BAW resonator 9001M, e.g., tuning down the multi-layer metal bottom de-tuned acoustic reflector electrode 913M to be below the main resonant frequency of the BAW resonator 9001M) may facilitate the mechanical resonant frequency Fr corresponding to the peripheral region 973M (e.g., relatively inactive region 973M, e.g. remainder region 973M, e.g., extremity region 973M, e.g. lateral fringing electric field region 973M) being below the electrical parallel resonant frequency Fp for BAW resonator 9001M, which in turn may facilitate suppressing unwanted parasitic lateral resonances in operation of the BAW resonator 9001M.

It is theorized that de-tuning of the multi-layer metal de-tuned acoustic reflector electrodes (e.g., tuning up the multi-layer metal top de-tuned acoustic reflector electrode 915M to be above the main resonant frequency of the BAW resonator 9001M, e.g., tuning down the multi-layer metal bottom de-tuned acoustic reflector electrode 913M to be below the main resonant frequency of the BAW resonator 9001M) may facilitate the mechanical resonant frequency Fr corresponding to the peripheral region 973M (e.g., relatively inactive region 973M, e.g. remainder region 973M, e.g., extremity region 973M, e.g. lateral fringing electric field region 973M) being near (e.g. relatively nearer) the electrical series resonant frequency Fs for BAW resonator 9001M, which in turn may facilitate suppressing unwanted parasitic lateral resonances in operation of the BAW resonator 9001M.

It is theorized that de-tuning of the multi-layer metal de-tuned acoustic reflector electrodes (e.g., tuning up the multi-layer metal top de-tuned acoustic reflector electrode 915M to be above the main resonant frequency of the BAW resonator 9001M, e.g., tuning down the multi-layer metal bottom de-tuned acoustic reflector electrode 913M to be below the main resonant frequency of the BAW resonator 9001M) may facilitate the mechanical resonant frequency Fr corresponding to the peripheral region 973M (e.g., relatively inactive region 973M, e.g. remainder region 973M, e.g., extremity region 973M, e.g. lateral fringing electric field region 973M) approximately matching the electrical series resonant frequency Fs for BAW resonator 9001M, which in turn may facilitate suppressing unwanted parasitic lateral resonances in operation of the BAW resonator 9001M.

A bottom left section of FIG. 9G shows a Smith chart 90010 showing a simulation of electrical reflection coefficient S-parameters over frequencies 975O for BAW resonator 9001M (e.g., over frequencies including twenty-four Gigahertz, e.g., over frequencies including the 24 GHz main resonant frequency of BAW resonator 9001M, e.g., over frequencies including the 24 GHz main series resonant frequency, Fs, of BAW resonator 9001M). Uneven artifacts in the Smith chart depiction of electrical reflection coefficient S-parameters over frequencies 975O may be described in various ways such as bumps, humps and/or rattles, which may be indicative of the presence of unwanted parasitic lateral resonances in operation of the BAW resonator 9001M.

Design performance of BAW resonator 9001M having the multi-layer metal—de-tuned-acoustic reflector electrodes (e.g., the multi-layer metal top—de-tuned-acoustic reflector electrode 915M, e.g., the multi-layer metal bottom—de-tuned-acoustic reflector electrode 913M) in FIG. 9G may be compared with BAW resonator 9001G having multi-layer metal acoustic reflector electrodes 913G, 915G (e.g., not de-tuned) as shown in FIG. 9F by comparing the Smith chart depiction of electrical reflection coefficient S-parameters over frequencies 975O for BAW resonator 9001M shown in FIG. 9G to the Smith chart depiction of electrical reflection coefficient S-parameters over frequencies 975I for BAW resonator 9001G shown in FIG. 9F. As shown by this comparison, relatively lesser and fewer uneven artifacts in the Smith chart depiction of electrical reflection coefficient S-parameters over frequencies 975O for BAW resonator 9001M (relative to greater and more uneven artifacts in the Smith chart depiction of electrical reflection coefficient S-parameters over frequencies 975I for BAW resonator 9001G) indicates relatively less uneven artifacts in Smith chart depiction of electrical reflection coefficient S-parameters over frequencies 975O for BAW resonator 9001M. This indicates suppression of parasitic lateral resonances in operation of BAW resonator 9001M as facilitated by multi-layer metal—de-tuned-acoustic reflector electrodes. Accordingly, based on this comparison of this disclosure, it is apparent that to facilitate suppression of parasitic lateral resonances in operation of the BAW resonators: the multi-layer metal top acoustic reflector electrode may be acoustically de-tuned from the resonant frequency of the BAW resonator; the first pair of top metal electrode layers may have respective layer thicknesses selected to be acoustically de-tuned from the resonant frequency of the BAW resonator; the multi-layer metal top acoustic reflector electrode may acoustically de-tuned higher in frequency from the resonant frequency of the BAW resonator; the multi-layer metal bottom acoustic reflector electrode may be acoustically de-tuned from the resonant frequency of the BAW resonator; the first pair of bottom metal electrode layers may have respective layer thicknesses selected to be acoustically de-tuned from the resonant frequency of the BAW resonator; and the multi-layer metal bottom acoustic reflector electrode may acoustically de-tuned lower in frequency from the resonant frequency of the BAW resonator.

An upper right section of FIG. 9G shows a simplified view of example bulk acoustic wave (BAW) resonator 9001P may comprise six layers of piezoelectric material 901P, 902P, 903P, 904P, 905P, 906P in a piezoelectric stack arrangement 914P of alternating normal/reverse piezoelectric axis orientation layers. This piezoelectric stack arrangement 914P may be sandwiched between a multi-layer metal bottom acoustic reflector electrode 913P and a multi-layer metal top acoustic reflector electrode 915P. The respective layers of piezoelectric material may have respective thicknesses of about a half acoustic wavelength $\lambda/2$ of a main resonant frequency of the BAW resonator 9001P. Aggregating thicknesses of the six layers of piezoelectric material 901P, 902P, 903P, 904P, 905P, 906P, piezoelectric stack arrangement 914P may have a thickness of about three acoustic wavelengths $3\lambda$ of the main resonant frequency of the BAW resonator 9001P.

The multi-layer metal bottom acoustic reflector electrode 913P may comprise a first pair of bottom metal electrode layers, 919P, 921P. A first member 919P of the first pair of bottom metal electrode layers may be a low acoustic impedance bottom metal electrode layer 919P (e.g., titanium bottom metal electrode layer 919P). A second member 921P of the first pair of bottom metal electrode layers may be high acoustic impedance bottom metal electrode layer 921P (e.g., tungsten bottom metal electrode layer 921P). In the multi-layer metal bottom acoustic reflector electrode 913P of BAW resonator 9001P, the first member 919P of the first pair of bottom metal electrode layers having the low acoustic impedance (e.g., low acoustic impedance bottom metal electrode layer 919P) may be arranged nearer to a layer of piezoelectric material (e.g., nearer to bottom layer of piezoelectric material 901P, e.g., nearer to the piezoelectric stack 914P) than the second member 921P of the first pair of bottom metal electrode layers having the high acoustic impedance (e.g., high acoustic impedance bottom metal electrode layer 921P). Further, although in the simplified view of BAW resonator 9001P only a first pair of bottom metal electrode layers 919P, 921P are explicitly shown, multi-layer metal bottom acoustic reflector electrode 913P may comprise many more pairs of alternating low acoustic impedance/high acoustic impedance of bottom metal electrode layers (not shown). Thickness of bottom metal electrode layers may be related to wavelength of a main resonant frequency of the BAW resonator 9001P. The multi-layer metal bottom acoustic reflector electrode 913P of BAW resonator 9001P may be de-tuned (e.g. tuned down) from the main resonant frequency of the BAW resonator 9001P. The second member 921P of the first pair of bottom metal electrode layers 919P, 921P may have a thickness selected to be about a quarter acoustic wavelength $\lambda/4$ of a main resonant frequency of the BAW resonator 9001P. The first member 919P of the first pair of bottom metal electrode layers 919P, 921P may have a thickness selected to be thicker, e.g. tuned to be about 12% lower than a main resonant frequency of the BAW resonator 9001P, e.g., tuned to be about 3 GHz lower than a main resonant frequency of the BAW resonator 9001P, e.g., tuned to be about 3 GHz lower than an example 24 GHz main resonant frequency of the BAW resonator 9001P. Multi-layer metal bottom acoustic reflector electrode 913P may approximate a bottom metal de-tuned distributed Bragg acoustic reflector 913P. Multi-layer metal bottom acoustic reflector electrode 913P may be a multi-layer metal bottom de-tuned acoustic reflector electrode 913P.

The multi-layer metal top acoustic reflector electrode 915P may comprise a first pair of top metal electrode layers, 937P, 939P. A first member 937P of the first pair of top metal electrode layers may be a low acoustic impedance top metal electrode layer 937P (e.g., titanium top metal electrode layer 937P). A second member 939P of the first pair of top metal electrode layers may be a high acoustic impedance top metal electrode layer 939P (e.g., tungsten top metal electrode layer 939P). In the multi-layer metal top acoustic reflector electrode 915P of BAW resonator 9001P, the first member 937P of the first pair of top metal electrode layers having the low acoustic impedance (e.g., low acoustic impedance top metal electrode layer 937P) may be arranged nearer to the first layer of piezoelectric material (e.g., nearer to top layer of piezoelectric material 906P, e.g., nearer to the piezoelectric stack 914P) than the second member 939P of the first pair of top metal electrode layers having the high acoustic impedance (e.g., high acoustic impedance top metal electrode layer 939P). Further, although in the simplified view of BAW resonator 9001P only a first pair of top metal electrode layers 937P, 939P are explicitly shown, multi-layer metal top acoustic reflector electrode 915P may comprise many more pairs of alternating low acoustic impedance/high acoustic impedance top metal electrode layers (not shown).

Thickness of top metal electrode layers may be related to wavelength of a main resonant frequency of the BAW resonator 9001P. The multi-layer metal top acoustic reflector electrode 915P of BAW resonator 9001P may be de-tuned (e.g. tuned up) from the main resonant frequency of the BAW resonator 9001P. The second member 939P of the first pair of top metal electrode layers 937P, 939P may have a thickness selected to be about a quarter acoustic wavelength $\lambda/4$ of a main resonant frequency of the BAW resonator 9001P. The first member 937P of the first pair of top metal electrode layers 937P, 939P may have a thickness selected to be thinner, e.g. tuned to be about 12% higher than a main resonant frequency of the BAW resonator 9001P, e.g., tuned to be about 3 GHz higher than a main resonant frequency of the BAW resonator 9001P, e.g., tuned to be about 3 GHz higher than an example 24 GHz main resonant frequency of the BAW resonator 9001P. Multi-layer metal top acoustic reflector electrode 915P may approximate a top metal detuned distributed Bragg acoustic reflector 915P. Multi-layer metal top acoustic reflector electrode 915P may be a multi-layer metal top de-tuned acoustic reflector electrode 915P.

The six layer piezoelectric stack 914P may have an active region where the multi-layer metal top acoustic reflector electrode 915P may overlap multi-layer metal bottom acoustic reflector electrode 913P. Further, FIG. 9G particularly shows a peripheral region 973P of the six layer piezoelectric stack 914P where the multi-layer metal top acoustic reflector electrode 915P may avoid overlapping multi-layer metal bottom acoustic reflector electrode 913P (e.g., where the multi-layer metal top acoustic reflector electrode 915P may not overlap multi-layer metal bottom acoustic reflector electrode 913P). The peripheral region 973P of the six layer piezoelectric stack 914P may be relatively inactive (e.g., a relatively inactive region 973P), relative to the active region of the six layer piezoelectric stack 914P where the multi-layer metal top acoustic reflector electrode 915P may overlap multi-layer metal bottom acoustic reflector electrode 913P. The peripheral region 973P of the six layer piezoelectric stack 914P may be a remainder region 973P of the six layer piezoelectric stack 914P. The peripheral region 973P of the six layer piezoelectric stack 914P may be an extremity region 973P of the six layer piezoelectric stack 914P. The peripheral region 973P of the six layer piezoelectric stack 914P may be a lateral fringing electric field region of the six layer piezoelectric stack 914P, since there may be a lateral fringing electric field extending into an extremity of the six layer piezoelectric stack 914P in operation of the BAW resonator 9001P, e.g., the lateral fringing electric field may extend laterally from multi-layer metal top acoustic reflector electrode 915P, when the oscillating electric field may be applied thereto.

A middle right section of FIG. 9G shows a diagram 9001Q of mechanical resonant frequency Fr versus lateral resonator dimension corresponding to the BAW resonator 9001P, as predicted by simulation. As shown in diagram 9001Q, a thick line 972Q depicts mechanical resonant frequency Fr corresponding to the active region of BAW resonator 9001P where the multi-layer metal top acoustic reflector electrode 915P may overlap multi-layer metal bottom acoustic reflector electrode 913P. In diagram 9001Q, notional vertical dashed lines show alignment of thick line 972Q depicting mechanical resonant frequency Fr for the active region with the lateral resonator dimension for the active region of BAW resonator 9001P. In diagram 9001Q, a lower horizontal dashed line depicts electrical series resonant frequency Fs for BAW resonator 9001P. The mechanical resonant frequency Fr corresponding to the active region of BAW resonator 9001P may be about the same as electrical series resonant frequency Fs for BAW resonator 9001P. This is depicted in diagram 9001Q by thick line 972Q depicting mechanical resonant frequency Fr for the active region approximately overlapping the lower horizontal dashed line for electrical series resonant frequency Fs.

In diagram 9001Q, an upper horizontal dashed line depicts electrical parallel resonant frequency Fp for of BAW resonator 9001P. Thick lines 973Q, 973QQ depict mechanical resonant frequency Fr corresponding to the peripheral region 973P (e.g., relatively inactive region 973P, e.g. remainder region 973P, e.g., extremity region 973P, e.g. lateral fringing electric field region 973P) of the stack of piezoelectric layers 914P, where the multi-layer metal top acoustic reflector electrode 915P may avoid overlapping multi-layer metal bottom acoustic reflector electrode 913P. The mechanical resonant frequency Fr corresponding to the peripheral region 973P (e.g., relatively inactive region 973P, e.g. remainder region 973P, e.g., extremity region 973P, e.g. lateral fringing electric field region 973P) may be lower (e.g. significantly lower) than the electrical parallel resonant frequency Fp for BAW resonator 9001P. The mechanical resonant frequency Fr corresponding to the peripheral region 973P (e.g., relatively inactive region 973P, e.g. remainder region 973P, e.g., extremity region 973P, e.g. lateral fringing electric field region 973P) may be near (e.g. relatively nearer) the electrical series resonant frequency Fs for BAW resonator 9001P. The mechanical resonant frequency Fr corresponding to the peripheral region 973P (e.g., relatively inactive region 973P, e.g. remainder region 973P, e.g., extremity region 973P, e.g. lateral fringing electric field region 973P) may approximately match the electrical series resonant frequency Fs for BAW resonator 9001P.

The foregoing is depicted in diagram 9001Q by thick lines 973Q, 973QQ depicting mechanical resonant frequency Fr for peripheral region 973P (e.g., relatively inactive region 973P, e.g. remainder region 973P, e.g., extremity region 973P, e.g. lateral fringing electric field region 973P) as arranged below (e.g., approximately below) the upper horizontal dashed line for electrical parallel resonant frequency Fp. Diagram 9001Q shows thick lines 973Q, 973QQ depicting mechanical resonant frequency Fr for peripheral region 973P (e.g., relatively inactive region 973P, e.g. remainder region 973P, e.g., extremity region 973P, e.g. lateral fringing electric field region 973P) as arranged near (e.g., relatively nearer) the lower horizontal dashed line for electrical series resonant frequency Fs. Diagram 9001Q shows thick lines 973Q, 973QQ depicting mechanical resonant frequency Fr for peripheral region 973P (e.g., relatively inactive region 973P, e.g. remainder region 973P, e.g., extremity region 973P, e.g. lateral fringing electric field region 973P) as arranged approximately matching (e.g., approximately overlapping) the lower horizontal dashed line for electrical series resonant frequency Fs.

It is theorized that de-tuning of the multi-layer metal de-tuned acoustic reflector electrodes (e.g., tuning up the multi-layer metal top de-tuned acoustic reflector electrode 915P to be above the main resonant frequency of the BAW resonator 9001P, e.g., tuning down the multi-layer metal bottom de-tuned acoustic reflector electrode 913P to be below the main resonant frequency of the BAW resonator 9001P) may facilitate the mechanical resonant frequency Fr corresponding to the peripheral region 973P (e.g., relatively inactive region 973P, e.g. remainder region 973P, e.g., extremity region 973P, e.g. lateral fringing electric field region 973P) being below the electrical parallel resonant frequency Fp for BAW resonator 9001P, which in turn may facilitate suppressing unwanted parasitic lateral resonances in operation of the BAW resonator 9001P.

It is theorized that de-tuning of the multi-layer metal de-tuned acoustic reflector electrodes (e.g., tuning up the multi-layer metal top de-tuned acoustic reflector electrode 915P to be above the main resonant frequency of the BAW resonator 9001P, e.g., tuning down the multi-layer metal bottom de-tuned acoustic reflector electrode 913P to be below the main resonant frequency of the BAW resonator 9001P) may facilitate the mechanical resonant frequency Fr corresponding to the peripheral region 973P (e.g., relatively inactive region 973P, e.g. remainder region 973P, e.g., extremity region 973P, e.g. lateral fringing electric field region 973P) being near (e.g. relatively nearer) the electrical series resonant frequency Fs for BAW resonator 9001P, which in turn may facilitate suppressing unwanted parasitic lateral resonances in operation of the BAW resonator 9001P.

It is theorized that de-tuning of the multi-layer metal de-tuned acoustic reflector electrodes (e.g., tuning up the multi-layer metal top de-tuned acoustic reflector electrode 915P to be above the main resonant frequency of the BAW resonator 9001P, e.g., tuning down the multi-layer metal bottom de-tuned acoustic reflector electrode 913P to be below the main resonant frequency of the BAW resonator 9001P) may facilitate the mechanical resonant frequency Fr corresponding to the peripheral region 973P (e.g., relatively inactive region 973P, e.g. remainder region 973P, e.g., extremity region 973P, e.g. lateral fringing electric field region 973P) approximately matching the electrical series resonant frequency Fs for BAW resonator 9001P, which in turn may facilitate suppressing unwanted parasitic lateral resonances in operation of the BAW resonator 9001P.

A bottom right section of FIG. 9G shows a Smith chart 9001R showing a simulation of electrical reflection coefficient S-parameters over frequencies 975R for BAW resonator 9001P (e.g., over frequencies including twenty-four Gigahertz, e.g., over frequencies including the 24 GHz main resonant frequency of BAW resonator 9001P, e.g., over frequencies including the 24 GHz main series resonant frequency, Fs, of BAW resonator 9001P). In the Smith chart depiction of electrical reflection coefficient S-parameters over frequencies 975R may be described in various ways such as smooth (e.g., relatively smooth, e.g., substantially smooth), even (e.g., relatively even, e.g., substantially even), which may be indicative of an absence of unwanted parasitic lateral resonances in operation of the BAW resonator 9001P.

Design performance of BAW resonator 9001P having the multi-layer metal—d de-tuned-acoustic reflector electrodes (e.g., the multi-layer metal top—de-tuned-acoustic reflector electrode 915P, e.g., the multi-layer metal bottom—de-tuned—acoustic reflector electrode 913P) in FIG. 9G may be compared with BAW resonator 9001J having multi-layer metal acoustic reflector electrodes 913J, 915J (e.g., not de-tuned) as shown in FIG. 9F by comparing the Smith chart depiction of electrical reflection coefficient S-parameters over frequencies 975R for BAW resonator 9001P shown in FIG. 9G to the Smith chart depiction of electrical reflection coefficient S-parameters over frequencies 975L for BAW resonator 9001J shown in FIG. 9F. As shown by this comparison, an absence of uneven artifacts is shown in the smooth (e.g., relatively smooth, e.g., substantially smooth), even (e.g., relatively even, e.g., substantially even) Smith chart depiction of electrical reflection coefficient S-parameters over frequencies 975R for BAW resonator 9001P (relative to greater and more uneven artifacts in the Smith chart depiction of electrical reflection coefficient S-parameters over frequencies 975L for BAW resonator 9001J). This indicates suppression of parasitic lateral resonances in operation of BAW resonator 9001P, a facilitated by multi-layer metal—de-tuned-acoustic reflector electrodes. Accordingly, based on this comparison of this disclosure, it is apparent that to facilitate suppression of parasitic lateral resonances in operation of the BAW resonators: the multi-layer metal top acoustic reflector electrode may be acoustically de-tuned from the resonant frequency of the BAW resonator; the first pair of top metal electrode layers may have respective layer thicknesses selected to be acoustically de-tuned from the resonant frequency of the BAW resonator; the multi-layer metal top acoustic reflector electrode may acoustically de-tuned higher in frequency from the resonant frequency of the BAW resonator; the multi-layer metal bottom acoustic reflector electrode may be acoustically de-tuned from the resonant frequency of the BAW resonator; the first pair of bottom metal electrode layers may have respective layer thicknesses selected to be acoustically de-tuned from the resonant frequency of the BAW resonator; and the multi-layer metal bottom acoustic reflector electrode may acoustically de-tuned lower in frequency from the resonant frequency of the BAW resonator.

Figure 9H:
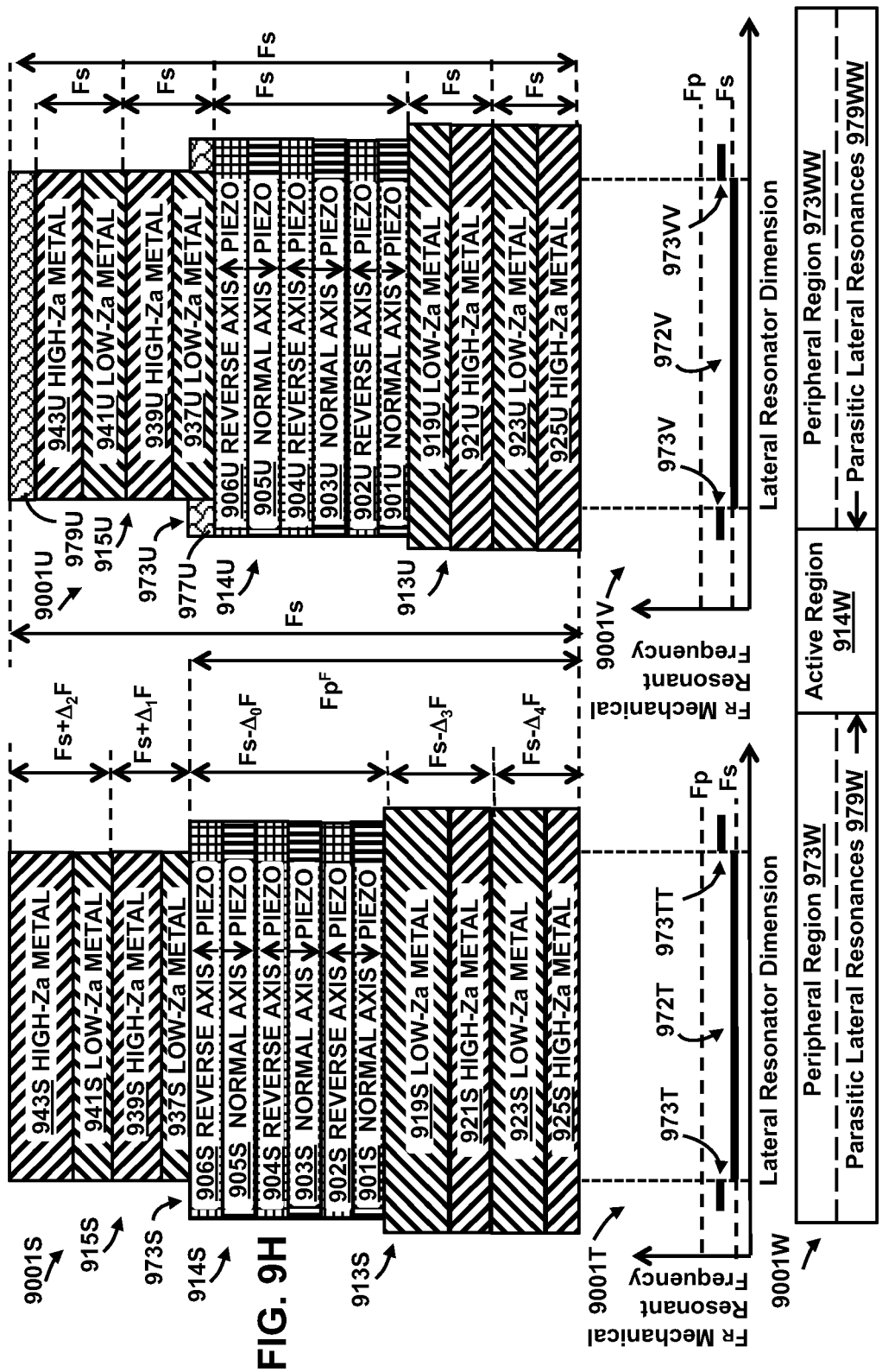
FIG. 9H shows simplified diagrams of two resonators of this disclosure, along with respective diagrams of respective mechanical resonant frequencies versus respective lateral resonator dimensions corresponding to the two resonators, and also a simplified block diagram of active and peripheral piezoelectric regions.

FIG. 9H shows simplified diagrams of two resonators 9001S, 9001U of this disclosure, along with respective diagrams 9001T, 9001V of respective mechanical resonant frequencies versus respective lateral resonator dimensions corresponding to the two resonators, and also a simplified block diagram 9001W of active and peripheral piezoelectric regions.

An upper left section of FIG. 9H shows a simplified view of example bulk acoustic wave (BAW) resonator 9001S may comprise six layers of piezoelectric material 901S, 902S, 903S, 904S, 905S, 906S in a piezoelectric stack arrangement 914S of alternating normal/reverse piezoelectric axis orientation layers. This piezoelectric stack arrangement 914S may be sandwiched between a multi-layer metal bottom acoustic reflector electrode 913S and a multi-layer metal top acoustic reflector electrode 915S (e.g., sandwiched between multi-layer metal bottom de-tuned acoustic reflector electrode 913S and multi-layer metal top de-tuned acoustic reflector electrode 915S).

The respective layers of piezoelectric material may have respective thicknesses approximating a half acoustic wavelength $\lambda/2$ of a main resonant frequency of the BAW resonator 9001S, but de-tuned therefrom (e.g., tuned down from the main resonant frequency of the BAW resonator 9001S by approximately 1%). Aggregating thicknesses of the six layers of piezoelectric material 901S, 902S, 903S, 904S, 905S, 906S, piezoelectric stack arrangement 914S may have a thickness of approximating three acoustic wavelengths $3\lambda$ of the main resonant frequency of the BAW resonator 9001S but de-tuned therefrom (e.g., tuned down from the main resonant frequency of the BAW resonator 9001S by approximately 250 MHz). Layer thicknesses may be selected so that the main resonant frequency of the BAW resonator 9001S may be about twenty-four Gigahertz, e.g., 24 GHz main resonant frequency, e.g., 24 GHz main series resonant frequency, Fs, of the BAW resonator 9001S)

The multi-layer metal bottom acoustic reflector electrode 913S may comprise a first pair of bottom metal electrode layers, 919S, 921S. A first member 919S of the first pair of bottom metal electrode layers may be a low acoustic impedance bottom metal electrode layer 919S (e.g., titanium bottom metal electrode layer 919S). A second member 921S of the first pair of bottom metal electrode layers may be high acoustic impedance bottom metal electrode layer 921S (e.g., tungsten bottom metal electrode layer 921S). In the multi-layer metal bottom acoustic reflector electrode 913S of BAW resonator 9001S, the first member 919S of the first pair of bottom metal electrode layers having the low acoustic impedance (e.g., low acoustic impedance bottom metal electrode layer 919S) may be arranged nearer to a layer of piezoelectric material (e.g., nearer to bottom layer of piezoelectric material 901S, e.g., nearer to the piezoelectric stack 914S) than the second member 921S of the first pair of bottom metal electrode layers having the high acoustic impedance (e.g., high acoustic impedance bottom metal electrode layer 921S).

The multi-layer metal bottom acoustic reflector electrode 913S may further comprise a second pair of bottom metal electrode layers, 923S, 925S. A first member 923S of the second pair of bottom metal electrode layers may be a low acoustic impedance bottom metal electrode layer 923S (e.g., titanium bottom metal electrode layer 923S). A second member 925S of the second pair of bottom metal electrode layers may be high acoustic impedance bottom metal electrode layer 925S (e.g., tungsten bottom metal electrode layer 925S). In the multi-layer metal bottom acoustic reflector electrode 913S of BAW resonator 9001S, the first member 923S of the second pair of bottom metal electrode layers having the low acoustic impedance (e.g., low acoustic impedance bottom metal electrode layer 923S) may be arranged nearer to a layer of piezoelectric material (e.g., nearer to bottom layer of piezoelectric material 901S, e.g., nearer to the piezoelectric stack 914S) than the second member 925S of the second pair of bottom metal electrode layers having the high acoustic impedance (e.g., high acoustic impedance bottom metal electrode layer 925S). Further, although in the simplified view of BAW resonator 9001S only the first pair of bottom metal electrode layers 919S, 921S and the second pair of bottom metal electrode layers 923S, 925S are explicitly shown, multi-layer metal bottom acoustic reflector electrode 913S may comprise additional pairs of alternating low acoustic impedance/high acoustic impedance of bottom metal electrode layers (not shown).

Thickness of bottom metal electrode layers may be related to wavelength of a main resonant frequency of the BAW resonator 9001S. The multi-layer metal bottom acoustic reflector electrode 913S of BAW resonator 9001S may be de-tuned (e.g. tuned down) from the main resonant frequency of the BAW resonator 9001S. The second member 921S of the first pair of bottom metal electrode layers 919S, 921S may have a thickness selected to be about a quarter acoustic wavelength $\lambda/4$ of a main resonant frequency of the BAW resonator 9001S. The first member 919S of the first pair of bottom metal electrode layers 919S, 921S may have a thickness selected to be thicker, e.g. tuned to be about 1% lower than a main resonant frequency of the BAW resonator 9001S, e.g., tuned to be about 240 MHz lower than a main resonant frequency of the BAW resonator 9001S, e.g., tuned to be about 240 MHz lower than an example 24 GHz main resonant frequency of the BAW resonator 9001S.

The second member 925S of the second pair of bottom metal electrode layers 923S, 925S may have a thickness selected to be about a quarter acoustic wavelength $\lambda/4$ of the main resonant frequency of the BAW resonator 9001S. The first member 923S of the second pair of bottom metal electrode layers 923S, 925S may have a thickness selected to be thicker, e.g. tuned to be about 2% lower than a main resonant frequency of the BAW resonator 9001S, e.g., tuned to be about 480 MHz lower than a main resonant frequency of the BAW resonator 9001S, e.g., tuned to be about 480 MHz lower than an example 24 GHz main resonant frequency of the BAW resonator 9001S. Multi-layer metal bottom acoustic reflector electrode 913S may approximate a bottom metal de-tuned distributed Bragg acoustic reflector 913S. Multi-layer metal bottom acoustic reflector electrode 913S may be a multi-layer metal bottom de-tuned acoustic reflector electrode 913S.

The multi-layer metal top acoustic reflector electrode 915S may comprise a first pair of top metal electrode layers, 937S, 939S. A first member 937S of the first pair of top metal electrode layers may be a low acoustic impedance top metal electrode layer 937S (e.g., titanium top metal electrode layer 937S). A second member 939S of the first pair of top metal electrode layers may be a high acoustic impedance top metal electrode layer 939S (e.g., tungsten top metal electrode layer 939S). In the multi-layer metal top acoustic reflector electrode 915S of BAW resonator 9001S, the first member 937S of the first pair of top metal electrode layers having the low acoustic impedance (e.g., low acoustic impedance top metal electrode layer 937S) may be arranged nearer to the first layer of piezoelectric material (e.g., nearer to top layer of piezoelectric material 906S, e.g., nearer to the piezoelectric stack 914S) than the second member 939S of the first pair of top metal electrode layers having the high acoustic impedance (e.g., high acoustic impedance top metal electrode layer 939S).

The multi-layer metal top acoustic reflector electrode 915S may further comprise a second pair of top metal electrode layers, 941S, 943S. A first member 941S of the second pair of top metal electrode layers may be a low acoustic impedance top metal electrode layer 941S (e.g., titanium top metal electrode layer 941S). A second member 943S of the second pair of top metal electrode layers may be high acoustic impedance top metal electrode layer 943S (e.g., tungsten top metal electrode layer 943S). In the multi-layer metal top acoustic reflector electrode 915S of BAW resonator 9001S, the first member 941S of the second pair of top metal electrode layers having the low acoustic impedance (e.g., low acoustic impedance top metal electrode layer 941S) may be arranged nearer to a layer of piezoelectric material (e.g., nearer to top layer of piezoelectric material 906S, e.g., nearer to the piezoelectric stack 914S) than the second member 943S of the second pair of top metal electrode layers having the high acoustic impedance (e.g., high acoustic impedance top metal electrode layer 943S). Further, although in the simplified view of BAW resonator 9001S only first and second pairs of top metal electrode layers 937S, 939S, 941S, 943S are explicitly shown, multi-layer metal top acoustic reflector electrode 915S may comprise many more pairs of alternating low acoustic impedance/high acoustic impedance top metal electrode layers (not shown).

Thickness of top metal electrode layers may be related to wavelength of a main resonant frequency of the BAW resonator 9001S. The multi-layer metal top acoustic reflector electrode 915S of BAW resonator 9001S may be de-tuned (e.g. tuned up) from the main resonant frequency of the BAW resonator 9001S. The second member 939S of the first pair of top metal electrode layers 937S, 939S may have a thickness selected to be about a quarter acoustic wavelength $\lambda/4$ of a main resonant frequency of the BAW resonator 9001S. The first member 937S of the first pair of top metal electrode layers 937S, 939S may have a thickness selected to be thinner, e.g. tuned to be about 12% higher than a main resonant frequency of the BAW resonator 9001S, e.g., tuned to be about 3 GHz higher than a main resonant frequency of the BAW resonator 9001S, e.g., tuned to be about 3 GHz higher than an example 24 GHz main resonant frequency of the BAW resonator 9001S. The second member 943S of the second pair of top metal electrode layers 941S, 943S may have a thickness selected to be about a quarter acoustic wavelength $\lambda/4$ of the main resonant frequency of the BAW resonator 9001S. The first member 941S of the second pair of top metal electrode layers 941S, 943S may have a thickness selected to be thinner, e.g. tuned to be about 15% higher than a main resonant frequency of the BAW resonator 9001S, e.g., tuned to be about 3.6 GHz higher than a main resonant frequency of the BAW resonator 9001S, e.g., tuned to be about 3.6 GHz higher than an example 24 GHz main resonant frequency of the BAW resonator 9001S. Multi-layer metal top acoustic reflector electrode 915S may approximate a top metal de-tuned distributed Bragg acoustic reflector 915S. Multi-layer metal top acoustic reflector electrode 915S may be a multi-layer metal top de-tuned acoustic reflector electrode 915S.

The six layer piezoelectric stack 914S may have an active region where the multi-layer metal top acoustic reflector electrode 915S may overlap multi-layer metal bottom acoustic reflector electrode 913S. Further, FIG. 9H particularly shows a peripheral region 973S of the six layer piezoelectric stack 914S where the multi-layer metal top acoustic reflector electrode 915S may avoid overlapping multi-layer metal bottom acoustic reflector electrode 913S (e.g., where the multi-layer metal top acoustic reflector electrode 915S may not overlap multi-layer metal bottom acoustic reflector electrode 913S). The peripheral region 973S of the six layer piezoelectric stack 914S may be relatively inactive (e.g., a relatively inactive region 973S), relative to the active region of the six layer piezoelectric stack 914S where the multi-layer metal top acoustic reflector electrode 915S may overlap multi-layer metal bottom acoustic reflector electrode 913S. The peripheral region 973S of the six layer piezoelectric stack 914S may be a remainder region 973S of the six layer piezoelectric stack 914S. The peripheral region 973S of the six layer piezoelectric stack 914S may be an extremity region 973S of the six layer piezoelectric stack 914S. The peripheral region 973S of the six layer piezoelectric stack 914S may be a lateral fringing electric field region of the six layer piezoelectric stack 914S, since there may be a lateral fringing electric field extending into an extremity of the six layer piezoelectric stack 914S in operation of the BAW resonator 9001S, e.g., the lateral fringing electric field may extend laterally from multi-layer metal top acoustic reflector electrode 915S, when the oscillating electric field may be applied thereto.

A lower middle left section of FIG. 9H shows a diagram 9001T of mechanical resonant frequency Fr versus lateral resonator dimension corresponding to the BAW resonator 9001S, as predicted by simulation. As shown in diagram 9001T, a thick line 972T depicts mechanical resonant frequency Fr corresponding to the active region of BAW resonator 9001S where the multi-layer metal top acoustic reflector electrode 915S may overlap multi-layer metal bottom acoustic reflector electrode 913S. In diagram 9001T, notional vertical dashed lines show alignment of thick line 972T depicting mechanical resonant frequency Fr for the active region with the lateral resonator dimension for the active region of BAW resonator 9001S. In diagram 9001T, a lower horizontal dashed line depicts electrical series resonant frequency Fs for BAW resonator 9001S. The mechanical resonant frequency Fr corresponding to the active region of BAW resonator 9001S may be about the same as electrical series resonant frequency Fs for BAW resonator 9001S. This is depicted in diagram 9001T by thick line 972T depicting mechanical resonant frequency Fr for the active region approximately overlapping the lower horizontal dashed line for electrical series resonant frequency Fs.

In diagram 9001T, an upper horizontal dashed line depicts electrical parallel resonant frequency Fp for of BAW resonator 9001S. Thick lines 973T, 973TT depict mechanical resonant frequency Fr corresponding to the peripheral region 973S (e.g., relatively inactive region 973S, e.g. remainder region 973S, e.g., extremity region 973S, e.g. lateral fringing electric field region 973S) of the stack of piezoelectric layers 914S, where the multi-layer metal top acoustic reflector electrode 915S may avoid overlapping multi-layer metal bottom acoustic reflector electrode 913S. The mechanical resonant frequency Fr corresponding to the peripheral region 973S (e.g., relatively inactive region 973S, e.g. remainder region 973S, e.g., extremity region 973S, e.g. lateral fringing electric field region 973S) may be lower (e.g. approximately lower) than the electrical parallel resonant frequency Fp for BAW resonator 9001S. The mechanical resonant frequency Fr corresponding to the peripheral region 973S (e.g., relatively inactive region 973S, e.g. remainder region 973S, e.g., extremity region 973S, e.g. lateral fringing electric field region 973S) may be near (e.g. relatively nearer) the electrical series resonant frequency Fs for BAW resonator 9001S. The mechanical resonant frequency Fr corresponding to the peripheral region 973S (e.g., relatively inactive region 973S, e.g. remainder region 973S, e.g., extremity region 973S, e.g. lateral fringing electric field region 973S) may approximately match the electrical series resonant frequency Fs for BAW resonator 9001S. A parallel resonance frequency for field region Fp comprising stack of piezoelectric layers 914S together with multi-layer metal bottom acoustic reflector electrode 913S may approximately match a series resonant frequency Fs for BAW resonator 9001S.

The foregoing is depicted in diagram 9001T by thick lines 973T, 973TT depicting mechanical resonant frequency Fr for peripheral region 973S (e.g., relatively inactive region 973S, e.g. remainder region 973S, e.g., extremity region 973S, e.g. lateral fringing electric field region 973S) as arranged below (e.g., approximately below) the upper horizontal dashed line for electrical parallel resonant frequency Fp. Diagram 9001T shows thick lines 973T, 973TT depicting mechanical resonant frequency Fr for peripheral region 973S (e.g., relatively inactive region 973S, e.g. remainder region 973S, e.g., extremity region 973S, e.g. lateral fringing electric field region 973S) as arranged near (e.g., relatively nearer) the lower horizontal dashed line for electrical series resonant frequency Fs. Diagram 9001T shows thick lines 973T, 973TT depicting mechanical resonant frequency Fr for peripheral region 973S (e.g., relatively inactive region 973S, e.g. remainder region 973S, e.g., extremity region 973S, e.g. lateral fringing electric field region 973S) as arranged approximately matching (e.g., approximately overlapping) the lower horizontal dashed line for electrical series resonant frequency Fs.

It is theorized that de-tuning of the stack of piezoelectric layers 914S (e.g., tuning down the stack of piezoelectric layers 914S to be below the main resonant frequency of the BAW resonator 9001S, e.g., tuning down a first piezoelectric layer 901S to be below the main resonant frequency of the BAW resonator 9001S, e.g., de-tuning a first piezoelectric layer 901S) may facilitate the mechanical resonant frequency Fr corresponding to the peripheral region 973S (e.g., relatively inactive region 973S, e.g. remainder region 973S, e.g., extremity region 973S, e.g. lateral fringing electric field region 973S) being below the electrical parallel resonant frequency Fp for BAW resonator 9001S, which in turn may facilitate suppressing unwanted parasitic lateral resonances in operation of the BAW resonator 9001S.

It is theorized that de-tuning of the multi-layer metal de-tuned acoustic reflector electrodes may facilitate the mechanical resonant frequency Fr corresponding to the peripheral region 973S (e.g., relatively inactive region 973S, e.g. remainder region 973S, e.g., extremity region 973S, e.g. lateral fringing electric field region 973S) being below the electrical parallel resonant frequency Fp for BAW resonator 9001S, which in turn may facilitate suppressing unwanted parasitic lateral resonances in operation of the BAW resonator 9001S. This may comprise the following: e.g., tuning up the multi-layer metal top de-tuned acoustic reflector electrode 915S to be above the main resonant frequency of the BAW resonator 9001S, e.g., tuning down the multi-layer metal bottom de-tuned acoustic reflector electrode 913S to be below the main resonant frequency of the BAW resonator 9001S; e.g., de-tuning a first pair of top metal electrode layers, 937S, 939S by a first amount; e.g., de-tuning a second pair of top metal electrode layers, 941S, 943S by a second amount (in which the second amount may be different than the first amount); e.g., tuning down the multi-layer metal bottom de-tuned acoustic reflector electrode 913S to be below the main resonant frequency of the BAW resonator 9001S; e.g., de-tuning a first pair of bottom metal electrode layers, 919S, 921S by a third amount; e.g., de-tuning a second pair of bottom metal electrode layers, 923S, 925S by a fourth amount (in which the third amount may be different than the fourth amount). The foregoing may facilitate the mechanical resonant frequency Fr corresponding to the peripheral region 973S (e.g., relatively inactive region 973S, e.g. remainder region 973S, e.g., extremity region 973S, e.g. lateral fringing electric field region 973S) being below the electrical parallel resonant frequency Fp for BAW resonator 9001S, which in turn may facilitate suppressing unwanted parasitic lateral resonances in operation of the BAW resonator 9001S.

It is theorized that de-tuning of the multi-layer metal de-tuned acoustic reflector electrodes (e.g., tuning up the multi-layer metal top de-tuned acoustic reflector electrode 915S to be above the main resonant frequency of the BAW resonator 9001S, e.g., tuning down the multi-layer metal bottom de-tuned acoustic reflector electrode 913S to be below the main resonant frequency of the BAW resonator 9001S; e.g., de-tuning a first pair of top metal electrode layers, 937S, 939S by a first amount; e.g., de-tuning a second pair of top metal electrode layers, 941S, 943S by a second amount (in which the second amount may be different than the first amount); e.g., tuning down the multi-layer metal bottom de-tuned acoustic reflector electrode 913S to be below the main resonant frequency of the BAW resonator 9001S e.g., de-tuning a first pair of bottom metal electrode layers, 919S, 921S by a third amount; e.g., de-tuning a second pair of bottom metal electrode layers, 923S, 925S by a fourth amount (in which the third amount may be different than the fourth amount)) may facilitate the mechanical resonant frequency Fr corresponding to the peripheral region 973S (e.g., relatively inactive region 973S, e.g. remainder region 973S, e.g., extremity region 973S, e.g. lateral fringing electric field region 973S) being near (e.g. relatively nearer) the electrical series resonant frequency Fs for BAW resonator 9001S, which in turn may facilitate suppressing unwanted parasitic lateral resonances in operation of the BAW resonator 9001S.

It is theorized that de-tuning of the multi-layer metal de-tuned acoustic reflector electrodes (e.g., tuning up the multi-layer metal top de-tuned acoustic reflector electrode 915S to be above the main resonant frequency of the BAW resonator 9001S, e.g., tuning down the multi-layer metal bottom de-tuned acoustic reflector electrode 913S to be below the main resonant frequency of the BAW resonator 9001S; e.g., de-tuning a first pair of top metal electrode layers, 937S, 939S by a first amount; e.g., de-tuning a second pair of top metal electrode layers, 941S, 943S by a second amount (in which the second amount may be different than the first amount); e.g., tuning down the multi-layer metal bottom de-tuned acoustic reflector electrode 913S to be below the main resonant frequency of the BAW resonator 9001S e.g., de-tuning a first pair of bottom metal electrode layers, 919S, 921S by a third amount; e.g., de-tuning a second pair of bottom metal electrode layers, 923S, 925S by a fourth amount (in which the third amount may be different than the fourth amount)) may facilitate the mechanical resonant frequency Fr corresponding to the peripheral region 973S (e.g., relatively inactive region 973S, e.g. remainder region 973S, e.g., extremity region 973S, e.g. lateral fringing electric field region 973S) approximately matching the electrical series resonant frequency Fs for BAW resonator 9001S, which in turn may facilitate suppressing unwanted parasitic lateral resonances in operation of the BAW resonator 9001S.

An upper right section of FIG. 9H shows a simplified view of example bulk acoustic wave (BAW) resonator multi-layer metal bottom acoustic reflector electrode 913U may comprise six layers of piezoelectric material 901U, 902U, 903U, 904U, 905U, 906U in a piezoelectric stack arrangement 914U of alternating normal/reverse piezoelectric axis orientation layers. This piezoelectric stack arrangement 914U may be sandwiched between a multi-layer metal bottom acoustic reflector electrode 913U and a multi-layer metal top acoustic reflector electrode 915U.

The multi-layer metal bottom acoustic reflector electrode 913U may comprise a first pair of bottom metal electrode layers, 919U, 921U. A first member 919U of the first pair of bottom metal electrode layers may be a low acoustic impedance bottom metal electrode layer 919U (e.g., titanium bottom metal electrode layer 919U). A second member 921U of the first pair of bottom metal electrode layers may be high acoustic impedance bottom metal electrode layer 921U (e.g., tungsten bottom metal electrode layer 921U). In the multi-layer metal bottom acoustic reflector electrode 913U of BAW resonator 9001U, the first member 919U of the first pair of bottom metal electrode layers having the low acoustic impedance (e.g., low acoustic impedance bottom metal electrode layer 919U) may be arranged nearer to a layer of piezoelectric material (e.g., nearer to bottom layer of piezoelectric material 901U, e.g., nearer to the piezoelectric stack 914U) than the second member 921U of the first pair of bottom metal electrode layers having the high acoustic impedance (e.g., high acoustic impedance bottom metal electrode layer 921U).

The multi-layer metal bottom acoustic reflector electrode 913U may further comprise a second pair of bottom metal electrode layers, 923U, 925U. A first member 923U of the second pair of bottom metal electrode layers may be a low acoustic impedance bottom metal electrode layer 923U (e.g., titanium bottom metal electrode layer 923U). A second member 925U of the second pair of bottom metal electrode layers may be high acoustic impedance bottom metal electrode layer 925U (e.g., tungsten bottom metal electrode layer 925U). In the multi-layer metal bottom acoustic reflector electrode 913U of BAW resonator 9001U, the first member 923U of the second pair of bottom metal electrode layers having the low acoustic impedance (e.g., low acoustic impedance bottom metal electrode layer 923U) may be arranged nearer to a layer of piezoelectric material (e.g., nearer to bottom layer of piezoelectric material 901U, e.g., nearer to the piezoelectric stack 914U) than the second member 925S of the second pair of bottom metal electrode layers having the high acoustic impedance (e.g., high acoustic impedance bottom metal electrode layer 925S). Further, although in the simplified view of BAW resonator 9001U only the first pair of bottom metal electrode layers 919S, 921S and the second pair of bottom metal electrode layers 923S, 925S are explicitly shown, multi-layer metal bottom acoustic reflector electrode 913U may comprise additional pairs of alternating low acoustic impedance/high acoustic impedance of bottom metal electrode layers (not shown).

Thickness of bottom metal electrode layers may be related to wavelength of a main resonant frequency of the BAW resonator 9100U. Bottom metal electrode layers 919U, 921U, 923U, 925U may have a thickness selected to be about a quarter acoustic wavelength λ/4 of the main resonant frequency of the BAW resonator 9100U. Multi-layer metal bottom acoustic reflector electrode 913U may approximate a bottom metal distributed Bragg acoustic reflector 913U.

The multi-layer metal top acoustic reflector electrode 915U may comprise a first pair of top metal electrode layers, 937U, 939U. A first member 937U of the first pair of top metal electrode layers may be a low acoustic impedance top metal electrode layer 937U (e.g., titanium top metal electrode layer 937U). A second member 939U of the first pair of top metal electrode layers may be a high acoustic impedance top metal electrode layer 939U (e.g., tungsten top metal electrode layer 939U). In the multi-layer metal top acoustic reflector electrode 915U of BAW resonator 9001U, the first member 937U of the first pair of top metal electrode layers having the low acoustic impedance (e.g., low acoustic impedance top metal electrode layer 937U) may be arranged nearer to the first layer of piezoelectric material (e.g., nearer to top layer of piezoelectric material 906U, e.g., nearer to the piezoelectric stack 914U) than the second member 939U of the first pair of top metal electrode layers having the high acoustic impedance (e.g., high acoustic impedance top metal electrode layer 939U).

The multi-layer metal top acoustic reflector electrode 915U may further comprise a second pair of top metal electrode layers, 941U, 943U. A first member 941U of the second pair of top metal electrode layers may be a low acoustic impedance top metal electrode layer 941U (e.g., titanium top metal electrode layer 941U). A second member 943U of the second pair of top metal electrode layers may be high acoustic impedance top metal electrode layer 943U (e.g., tungsten top metal electrode layer 943U). In the multi-layer metal top acoustic reflector electrode 915U of BAW resonator 9001U, the first member 941U of the second pair of top metal electrode layers having the low acoustic impedance (e.g., low acoustic impedance top metal electrode layer 941U) may be arranged nearer to a layer of piezoelectric material (e.g., nearer to top layer of piezoelectric material 906U, e.g., nearer to the piezoelectric stack 914U) than the second member 943U of the second pair of top metal electrode layers having the high acoustic impedance (e.g., high acoustic impedance top metal electrode layer 943U). Further, although in the simplified view of BAW resonator 9001U only first and second pairs of top metal electrode layers 937U, 939U, 941U, 943U are explicitly shown, multi-layer metal top acoustic reflector electrode 915U may comprise many more pairs of alternating low acoustic impedance/high acoustic impedance top metal electrode layers (not shown).

Thickness of top metal electrode layers may be related to wavelength of a main resonant frequency of the BAW resonator 9001U. Top metal electrode layers 937U, 939U, 941U, 943U may have a thickness selected to be about a quarter acoustic wavelength λ/4 of the main resonant frequency of the BAW resonator 9100U. Multi-layer metal top acoustic reflector electrode 915U may approximate a top metal distributed Bragg acoustic reflector 915U.

The six layer piezoelectric stack 914U may have an active region where the multi-layer metal top acoustic reflector electrode 915U may overlap multi-layer metal bottom acoustic reflector electrode 913U. Further, FIG. 9H particularly shows a peripheral region 973U of the six layer piezoelectric stack 914U where the multi-layer metal top acoustic reflector electrode 915U may avoid overlapping multi-layer metal bottom acoustic reflector electrode 913U (e.g., where the multi-layer metal top acoustic reflector electrode 915U may not overlap multi-layer metal bottom acoustic reflector electrode 913U). The peripheral region 973U of the six layer piezoelectric stack 914U may be relatively inactive (e.g., a relatively inactive region 973U), relative to the active region of the six layer piezoelectric stack 914U where the multi-layer metal top acoustic reflector electrode 915U may overlap multi-layer metal bottom acoustic reflector electrode 913U. The peripheral region 973U of the six layer piezoelectric stack 914U may be a remainder region 973U of the six layer piezoelectric stack 914U. The peripheral region 973U of the six layer piezoelectric stack 914U may be an extremity region 973U of the six layer piezoelectric stack 914U. The peripheral region 973U of the six layer piezoelectric stack 914U may be a lateral fringing electric field region of the six layer piezoelectric stack 914U, since there may be a lateral fringing electric field extending into an extremity of the six layer piezoelectric stack 914U in operation of the BAW resonator 9001U, e.g., the lateral fringing electric field may extend laterally from multi-layer metal top acoustic reflector electrode 915U, when the oscillating electric field may be applied thereto.

The peripheral region 973U of the six layer piezoelectric stack 914U may be mass loaded by a peripheral region mass load layer 977U. The peripheral regions mass load layer 977U may comprise a high acoustic impedance metal layer 977U (e.g., tungsten layer 977U). The peripheral regions mass load layer 977U may have a layer thickness of up to about 2000 Angstroms. When the peripheral region mass load layer 977U is deposited on the peripheral region 973U, a mass load layer 979U may likewise be deposited on multi-layer metal top acoustic reflector electrode 915U. The respective layers of piezoelectric material may have respective thicknesses approximating a half acoustic wavelength λ/2 of a main resonant frequency of the BAW resonator 9001U. Aggregating thicknesses of the six layers of piezoelectric material 901U, 902U, 903U, 904U, 905U, 906U, piezoelectric stack arrangement 914U may have a thickness of approximating three acoustic wavelengths 3λ of the main resonant frequency of the BAW resonator 9001U Layer thicknesses may be selected so that the main resonant frequency of the BAW resonator 9001U may be about twenty-four Gigahertz, e.g., 24 GHz main resonant frequency, e.g., 24 GHz main series resonant frequency, Fs, of the BAW resonator 9001U).

The peripheral region mass load layer 977U may effectively de-tune (e.g., tune down) the peripheral region 973U of the six layer piezoelectric stack 914U. The peripheral region mass load layer 977U may effectively tune the peripheral region 973U of the six layer piezoelectric stack 914U to be near the main resonant frequency of the active region of the six layer piezoelectric stack 914U. The peripheral region mass load layer 977U may effectively tune the peripheral region 973U of the six layer piezoelectric stack 914U to be near the main resonant frequency of BAW resonator 9100U.

A lower middle right section of FIG. 9H shows a diagram 9001V of mechanical resonant frequency Fr versus lateral resonator dimension corresponding to the BAW resonator 9001U, as predicted by simulation. As shown in diagram 9001V, a thick line 972V depicts mechanical resonant frequency Fr corresponding to the active region of BAW resonator 9001U where the multi-layer metal top acoustic reflector electrode 915U may overlap multi-layer metal bottom acoustic reflector electrode 913U. In diagram 9001V, notional vertical dashed lines show alignment of thick line 972V depicting mechanical resonant frequency Fr for the active region with the lateral resonator dimension for the active region of BAW resonator 9001U. In diagram 9001V, a lower horizontal dashed line depicts electrical series resonant frequency Fs for BAW resonator 9001U. The mechanical resonant frequency Fr corresponding to the active region of BAW resonator 9001U may be about the same as electrical series resonant frequency Fs for BAW resonator 9001U. This is depicted in diagram 9001V by thick line 972V depicting mechanical resonant frequency Fr for the active region approximately overlapping the lower horizontal dashed line for electrical series resonant frequency Fs.

In diagram 9001V, an upper horizontal dashed line depicts electrical parallel resonant frequency Fp for of BAW resonator 9001U. Thick lines 973V, 973VV depict mechanical resonant frequency Fr corresponding to mass loading by peripheral region mass load layer 977U of the peripheral region 973U (e.g., relatively inactive region 973U, e.g. remainder region 973U, e.g., extremity region 973U, e.g. lateral fringing electric field region 973U) of the stack of piezoelectric layers 914U. The mechanical resonant frequency Fr corresponding to mass loading by peripheral region mass load layer 977U of the peripheral region 973U (e.g., relatively inactive region 973U, e.g. remainder region 973U, e.g., extremity region 973U, e.g. lateral fringing electric field region 973U) may be lower (e.g. significantly lower) than the electrical parallel resonant frequency Fp for BAW resonator 9001U. The mechanical resonant frequency Fr corresponding to mass loading by peripheral region mass load layer 977U of the peripheral region 973U (e.g., relatively inactive region 973U, e.g. remainder region 973U, e.g., extremity region 973U, e.g. lateral fringing electric field region 973U) may be near (e.g. relatively nearer) the electrical series resonant frequency Fs for BAW resonator 9001U. The mechanical resonant frequency Fr corresponding to mass loading by peripheral region mass load layer 977U of the peripheral region 973U (e.g., relatively inactive region 973U, e.g. remainder region 973U, e.g., extremity region 973U, e.g. lateral fringing electric field region 973U) may approximately match the electrical series resonant frequency Fs for BAW resonator 9001U.

The foregoing is depicted in diagram 9001V by thick lines 973V, 973VV depicting mechanical resonant frequency Fr for mass loading by peripheral region mass load layer 977U of peripheral region 973U (e.g., relatively inactive region 973U, e.g. remainder region 973U, e.g., extremity region 973U, e.g. lateral fringing electric field region 973U) as arranged below (e.g., approximately below) the upper horizontal dashed line for electrical parallel resonant frequency Fp. Diagram 9001V shows thick lines 973V, 973VV depicting mechanical resonant frequency Fr for mass loading by peripheral region mass load layer 977U of peripheral region 973U (e.g., relatively inactive region 973U, e.g. remainder region 973U, e.g., extremity region 973U, e.g. lateral fringing electric field region 973U) as arranged near (e.g., relatively nearer) the lower horizontal dashed line for electrical series resonant frequency Fs. Diagram 9001V shows thick lines 973V, 973VV depicting mechanical resonant frequency Fr for mass loading by peripheral region mass load layer 977U of peripheral region 973U (e.g., relatively inactive region 973U, e.g. remainder region 973U, e.g., extremity region 973U, e.g. lateral fringing electric field region 973U) as arranged approximately matching (e.g., approximately overlapping) the lower horizontal dashed line for electrical series resonant frequency Fs.

It is theorized that employing the peripheral region mass load layer 977U to mass load/de-tune the peripheral region 973U of the stack of piezoelectric layers 914U (e.g., employing the peripheral region mass load layer 977U to mass load/tune down the peripheral region 973U of the stack of piezoelectric layers 914U) may facilitate the mechanical resonant frequency Fr corresponding to the mass loaded peripheral region 973U (e.g., relatively inactive region 973U, e.g. remainder region 973U, e.g., extremity region 973U, e.g. lateral fringing electric field region 973U) being below the electrical parallel resonant frequency Fp of the BAW resonator 9001U, which in turn may facilitate suppressing unwanted parasitic lateral resonances in operation of the BAW resonator 9001U.

It is theorized that employing the peripheral region mass load layer 977U to mass load/de-tune the peripheral region 973U of the stack of piezoelectric layers 914U (e.g., employing the peripheral region mass load layer 977U to mass load/tune down the peripheral region 973U of the stack of piezoelectric layers 914U) may facilitate the mechanical resonant frequency Fr corresponding to the mass loaded peripheral region 973U (e.g., relatively inactive region 973U, e.g. remainder region 973U, e.g., extremity region 973U, e.g. lateral fringing electric field region 973U) being near (e.g. relatively nearer) the electrical series resonant frequency Fs for BAW resonator 9001U, which in turn may facilitate suppressing unwanted parasitic lateral resonances in operation of the BAW resonator 9001U.

It is theorized that employing the peripheral region mass load layer 977U to mass load/de-tune the peripheral region 973U of the stack of piezoelectric layers 914U (e.g., employing the peripheral region mass load layer 977U to mass load/tune down the peripheral region 973U of the stack of piezoelectric layers 914U) may facilitate the mechanical resonant frequency Fr corresponding to the mass loaded peripheral region 973U (e.g., relatively inactive region 973U, e.g. remainder region 973U, e.g., extremity region 973U, e.g. lateral fringing electric field region 973U) approximately matching the electrical series resonant frequency Fs for BAW resonator 9001U, which in turn may facilitate suppressing unwanted parasitic lateral resonances in operation of the BAW resonator 9001U.

Arranged along a bottom section of FIG. 9H is a simplified block diagram 9001W of a an active piezoelectric region 914W interposed between peripheral piezoelectric regions 973W, 973WW. It is theorized that parasitic lateral resonances 979W, 979WW may be generated at respective interfaces between the active region 914W and respective peripheral piezoelectric regions 973W, 973WW for continuity of mechanical displacements and stresses between these respective regions. In simplified block diagram 9001W, notional arrows highlight respective interfaces between the active region 914W and respective peripheral piezoelectric regions 973W, 973WW. It is theorized that this may be due, at least in part, to mismatches between a mechanical resonant frequency of peripheral piezoelectric regions 973W, 973WW and a series electrical resonance Fs of a BAW resonator employing the active piezoelectric region 914W. As discussed previously herein, it is theorized that bringing the mechanical resonant frequency of peripheral piezoelectric regions 973W, 973WW nearer (e.g., approximately matching) the series electrical resonance Fs of the BAW resonator employing the active piezoelectric region 914W may facilitate matching electrically driven mechanical displacements and stresses in the active region 914W with evanescently electrically driven mechanical displacements and stresses in the peripheral regions 973W and 973WW without exciting lateral modes at the interfaces between these regions. This may facilitate suppressing the parasitic lateral resonances 979W, 979WW shown, for example, in simplified block diagram 9001W, and likewise facilitate suppressing parasitic lateral resonances (not shown) in electrical response of, for example, bulk acoustic wave resonators 9001S, 9001U shown in FIG. 9H, and bulk acoustic wave resonators 9001M, 9001P shown in FIG. 9G.

Figure 9I:
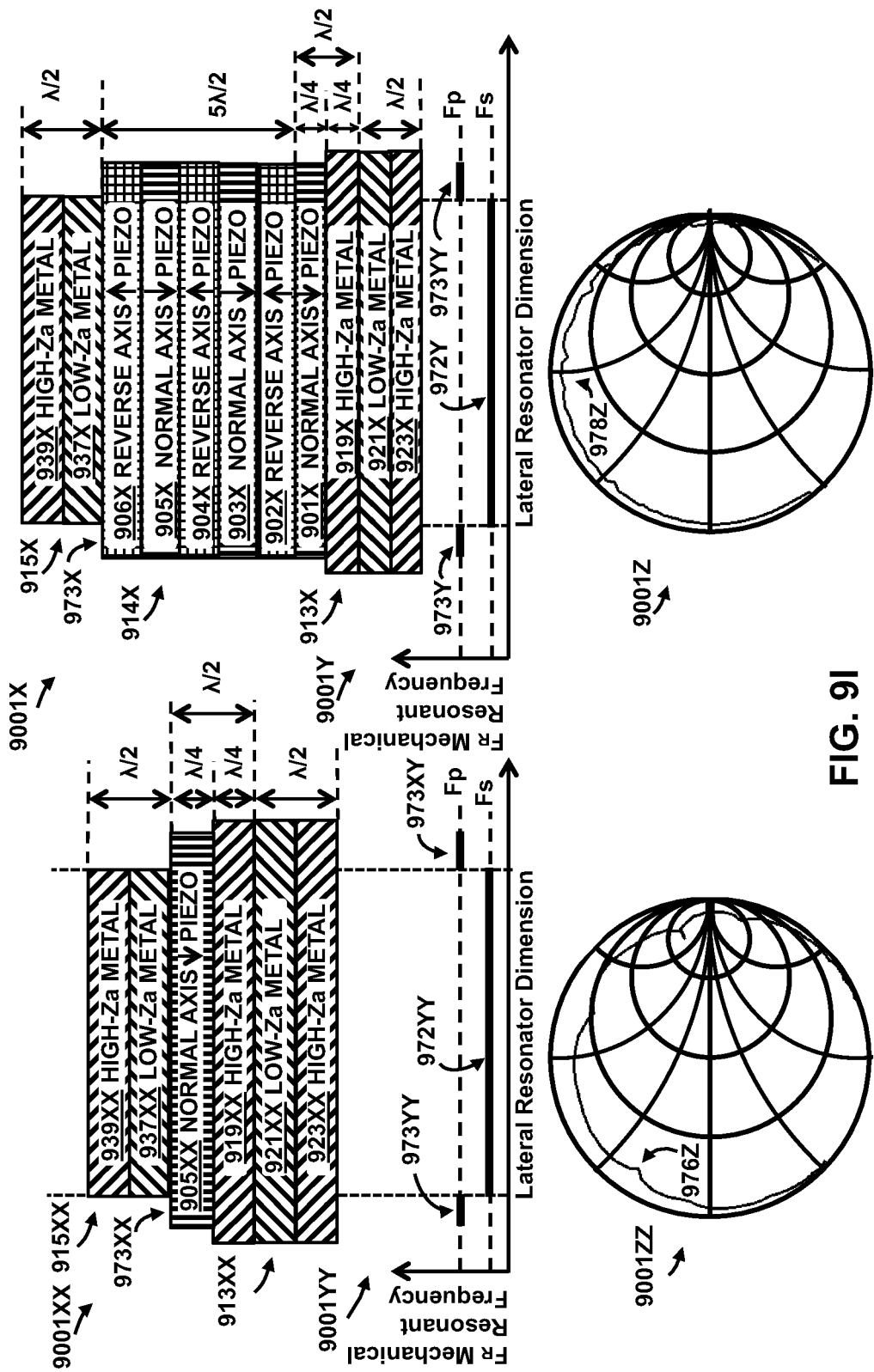
FIG. 9I shows simplified diagrams of another two resonators of this disclosure, along with respective diagrams of respective mechanical resonant frequencies versus respective lateral resonator dimensions corresponding to the another two resonators, and also a simplified block diagram of active and peripheral piezoelectric regions.

FIG. 9I shows simplified diagrams of another two resonators of this disclosure, along with respective diagrams of respective mechanical resonant frequencies versus respective lateral resonator dimensions corresponding to the another two resonators, and also a simplified block diagram of active and peripheral piezoelectric regions. An upper left section of FIG. 9I shows a simplified view of example bulk acoustic wave (BAW) resonator 9001XX, which may comprise a first layer of piezoelectric material 905XX having a normal piezoelectric axis orientation sandwiched between a multi-layer metal bottom acoustic reflector electrode 913XX and a multi-layer metal top acoustic reflector electrode 915XX. The first layer of piezoelectric material 905XX may have a thickness of about a quarter acoustic wavelength $\lambda/4$ of a main resonant frequency of the BAW resonator 9001XX. The multi-layer metal bottom acoustic reflector electrode 913XX may comprise a first pair of bottom metal electrode layers, 919XX, 921XX, and an additional bottom metal electrode layer 923XX (e.g., high acoustic impedance metal electrode layer 923XX, e.g., tungsten electrode layer 923XX). A first member 919XX of the first pair of bottom metal electrode layers may be a high acoustic impedance bottom metal electrode layer 919XX (e.g., tungsten bottom metal electrode layer 919XX). A second member 921XX of the first pair of bottom metal electrode layers may be low acoustic impedance bottom metal electrode layer 921XX (e.g., titanium bottom metal electrode layer 921XX). In the multi-layer metal bottom acoustic reflector electrode 913XX of BAW resonator 9001XX, the first member 919XX of the first pair of bottom metal electrode layers having the high acoustic impedance (e.g., high acoustic impedance bottom metal electrode layer 919XX) may be arranged nearer to the first layer of piezoelectric material 905XX than the second member 921XX of the first pair of bottom metal electrode layers having the low acoustic impedance (e.g., low acoustic impedance bottom metal electrode layer 921XX). Further, although in the simplified view of BAW resonator 9001XX only the first pair of bottom metal electrode layers 919XX, 921XX having the alternating high acoustic impedance/low acoustic impedance are explicitly shown, multi-layer metal bottom acoustic reflector electrode 913XX may comprise many pairs of alternating high acoustic impedance/low acoustic impedance of bottom metal electrode layers (not shown). For example, additional high acoustic impedance metal electrode layer 923XX may be a first member of a second pair of alternating high acoustic impedance/low acoustic impedance of bottom metal electrode layers. Multi-layer metal bottom acoustic reflector electrode 913XX may approximate a bottom metal distributed Bragg acoustic reflector 913XX. The first member 919XX of the first pair of bottom metal electrode layers 919XX, 921XX, and the second member 921XX of the first pair of bottom metal electrode layers 919XX, 921XX, and the additional bottom metal electrode layer 923XX may have respective thicknesses selected to be about a quarter acoustic wavelength $\lambda/4$ of the main resonant frequency of the BAW resonator 9001XX. Aggregating together the respective thicknesses of the first member 921XX and the second member 919XX, and the additional bottom metal electrode layer 923XX may provide a thickness selected to be about three quarters of an acoustic wavelength $3\lambda/4$ of the main resonant frequency of the BAW resonator 9001XX.

The multi-layer metal top acoustic reflector electrode 915XX may comprise a first pair of top metal electrode layers, 937XX, 939XX. A first member 937XX of the first pair of top metal electrode layers may be a low acoustic impedance top metal electrode layer 937XX (e.g., titanium top metal electrode layer 937XX). A second member 939XX of the first pair of top metal electrode layers may be a high acoustic impedance top metal electrode layer 939XX (e.g., tungsten top metal electrode layer 939XX). In the multi-layer metal top acoustic reflector electrode 915XX of BAW resonator 9001XX, the first member 937XX of the first pair of top metal electrode layers having the low acoustic impedance (e.g., low acoustic impedance top metal electrode layer 937XX) may be arranged nearer to the first layer of piezoelectric material 905XX than the second member 939XX of the first pair of top metal electrode layers having the high acoustic impedance (e.g., high acoustic impedance top metal electrode layer 939XX). Further, although in the simplified view of BAW resonator 9001XX only a first pair of top metal electrode layers 937XX, 939XX are explicitly shown, multi-layer metal top acoustic reflector electrode 915XX may comprise many more pairs of alternating low acoustic impedance/high acoustic impedance top metal electrode layers (not shown). Multi-layer metal top acoustic reflector electrode 915XX may approximate a top metal distributed Bragg acoustic reflector 915XX. The first member 937XX of the first pair of top metal electrode layers 937XX, 939XX, and the second member 939XX of the first pair of top metal electrode layers 937XX, 939XX, may have respective thicknesses selected to be about a quarter acoustic wavelength $\lambda/4$ of a main resonant frequency of the BAW resonator 9001XX. Aggregating together the respective thicknesses of the first member 937XX and the second member 939XX, may provide a thickness of the first pair of top metal electrode layers 937XX, 939XX selected to be about a half acoustic wavelength $\lambda/2$ of the main resonant frequency of the BAW resonator 9001XX.

The first layer of piezoelectric material 905XX may have an active region where the multi-layer metal top acoustic reflector electrode 915XX may overlap multi-layer metal bottom acoustic reflector electrode 913XX. FIG. 9I particularly shows a peripheral region 973XX of the first layer of piezoelectric material 905XX where the multi-layer metal top acoustic reflector electrode 915XX may avoid overlapping multi-layer metal bottom acoustic reflector electrode 913XX (e.g., where the multi-layer metal top acoustic reflector electrode 915XX may not overlap multi-layer metal bottom acoustic reflector electrode 913XX.) The peripheral region 973XX of the first layer of piezoelectric material 905XX may be relatively inactive (e.g., a relatively inactive region 973XX), relative to the active region of first layer of piezoelectric material 905XX where the multi-layer metal top acoustic reflector electrode 915XX may overlap multi-layer metal bottom acoustic reflector electrode 913XX. The peripheral region 973XX of the first layer of piezoelectric material 905XX may be a remainder region 973XX of the first layer of piezoelectric material 905XX. The peripheral region 973XX of the first layer of piezoelectric material 905XX may be an extremity region 973XX of the first layer of piezoelectric material 905XX. The peripheral region 973XX of the first layer of piezoelectric material 905XX may be a lateral fringing electric field region of the first layer of piezoelectric material 905XX, since there may be a lateral fringing electric field extending into an extremity of the first layer of piezoelectric material 905XX in operation of the BAW resonator 9001XX, e.g., the lateral fringing electric field may extend laterally from multi-layer metal top acoustic reflector electrode 915XX, when the oscillating electric field may be applied thereto.

A middle left section of FIG. 9I shows a diagram 9001YY of mechanical resonant frequency Fr versus lateral resonator dimension corresponding to the BAW resonator 9001XX, as predicted by simulation. As shown in diagram 9001YY, a thick line 972YY depicts mechanical resonant frequency Fr corresponding to the active region of BAW resonator 9001XX where the multi-layer metal top acoustic reflector electrode 915XX may overlap multi-layer metal bottom acoustic reflector electrode 913XX. In diagram 9001YY, notional vertical dashed lines show alignment of thick line 972YY depicting mechanical resonant frequency Fr for the active region with the lateral resonator dimension for the active region of BAW resonator 9001XX. In diagram 9001YY, a lower horizontal dashed line depicts electrical series resonant frequency Fs for BAW resonator 9001XX. The mechanical resonant frequency Fr corresponding to the active region of BAW resonator 9001XX may be about the same as electrical series resonant frequency Fs for BAW resonator 9001XX. This is depicted in diagram 9001YY by thick line 972YY depicting mechanical resonant frequency Fr for the active region approximately overlapping the lower horizontal dashed line for electrical series resonant frequency Fs.

In diagram 9001YY, an upper horizontal dashed line depicts electrical parallel resonant frequency Fp for of BAW resonator 9001XX. Thick lines 973YY, 973XY depict mechanical resonant frequency Fr corresponding to the peripheral region 973XX (e.g., relatively inactive region 973XX, e.g. remainder region 973XX, e.g., extremity region 973XX, e.g. lateral fringing electric field region 973XX) of the first layer of piezoelectric material 905XX, where the multi-layer metal top acoustic reflector electrode 915XX may avoid overlapping multi-layer metal bottom acoustic reflector electrode 913XX. The mechanical resonant frequency Fr corresponding to the peripheral region 973XX (e.g., relatively inactive region 973XX, e.g. remainder region 973XX, e.g., extremity region 973XX, e.g. lateral fringing electric field region 973XX) may be about the same as the electrical parallel resonant frequency Fp for BAW resonator 9001XX, and may be relatively nearer to the electrical series resonant frequency Fs for BAW resonator 9001XX. This is depicted in diagram 9001YY by thick lines 973YY, 973XY depicting mechanical resonant frequency Fr for peripheral region 973XX (e.g., relatively inactive region 973XX, e.g. remainder region 973XX, e.g., extremity region 973XX, e.g. lateral fringing electric field region 973XX) as arranged relatively nearer to the lower horizontal dashed line for electrical series resonant frequency Fs and as approximately overlapping the upper horizontal dashed line for electrical parallel resonant frequency Fp.

It is theorized that the mechanical resonant frequency Fr corresponding to the peripheral region 973XX (e.g., relatively inactive region 973XX, e.g. remainder region 973XX, e.g., extremity region 973XX, e.g. lateral fringing electric field region 973XX) being about the same the electrical parallel resonant frequency Fp for BAW resonator 9001XX may facilitate suppressing parasitic lateral resonances in operation of the BAW resonator 9001XX. It is theorized that the mechanical resonant frequency Fr corresponding to the peripheral region 973XX (e.g., relatively inactive region 973XX, e.g. remainder region 973XX, e.g., extremity region 973XX, e.g. lateral fringing electric field region 973XX) being relatively nearer to the electrical series resonant frequency Fs for BAW resonator 9001XX may facilitate suppressing parasitic lateral resonances in operation of the BAW resonator 9001XX.

A bottom left section of FIG. 9I shows a Smith chart 9001Z showing a simulation of electrical reflection coefficient S-parameters over frequencies 976Z for BAW resonator 9001XX (e.g., over frequencies including twenty-four Gigahertz, e.g., over frequencies including the 24 GHz main resonant frequency of BAW resonator 9001XX, e.g., over frequencies including the 24 GHz main series resonant frequency, Fs, of BAW resonator 9001XX). Uneven artifacts in the Smith chart depiction of S-parameters over frequencies 976Z may be described in various ways such as bumps, humps and/or rattles, which may be indicative of the presence of unwanted parasitic lateral resonances in operation of the BAW resonator 9001XX.

Design performance of BAW resonator 9001XX having—low-acoustic impedance top metal electrode layer 937XX nearest to the first piezoelectric layer 905XX as shown in FIG. 9I may be compared with BAW resonator 9001A having intervening—high-acoustic impedance top metal electrode layers 935A nearest to first piezoelectric layer 905A as shown in FIG. 9E by comparing the Smith chart depiction of electrical reflection coefficient S-parameters over frequencies 976Z for BAW resonator 9001XX shown in FIG. 9I to the Smith chart depiction of electrical reflection coefficient S-parameters over frequencies 975C for BAW resonator 9001A shown in FIG. 9E. As shown by this comparison, relatively lesser/fewer/weaker uneven artifacts in the Smith chart depiction of electrical reflection coefficient S-parameters over frequencies 976Z for BAW resonator 9001XX (relative to greater/more/stronger uneven artifacts in the Smith chart depiction of electrical reflection coefficient S-parameters over frequencies 975C for BAW resonator 9001A) indicates relatively less uneven artifacts in Smith chart depiction of electrical reflection coefficient S-parameters over frequencies 976Z for BAW resonator 9001XX and less parasitic lateral resonances in operation of BAW resonator 9001XX, in which—low-acoustic impedance top metal electrode layer 937XX is nearest to the first piezoelectric layer 905XX. Accordingly, based on this comparison of this disclosure, it is apparent that to facilitate suppression of parasitic lateral resonances in operation of the BAW resonators: relatively lower acoustic impedance top metal electrode layer may be arranged nearest, e.g., may be arranged substantially nearest, e.g. may abut, e.g., may substantially abut, a first piezoelectric layer of the BAW resonator.

Accordingly, relatively lower acoustic impedance top metal electrode layer may be arranged sufficiently proximate to the first layer of piezoelectric material, so that the relatively lower acoustic impedance top metal electrode layer may contribute more to facilitate suppressing parasitic lateral resonances in operation of the BAW resonator than is contributed by any other top metal electrode layer of the top multi-layer metal acoustic reflector electrode. The relatively lower acoustic impedance top metal electrode layer may be arranged sufficiently proximate to the first layer of piezoelectric material, so that standing wave acoustic energy to be in the relatively lower acoustic impedance top metal electrode layer is greater than respective standing wave acoustic energy to be in other respective layers of the top multi-layer acoustic reflectors in operation of the BAW resonator. This may at least partially facilitate suppression of parasitic lateral resonances in operation of the BAW resonator.

An upper right section of FIG. 9I shows a simplified view of example bulk acoustic wave (BAW) resonator 9001X may comprise six layers of piezoelectric material 901X, 902X, 903X, 904X, 905X, 906X in a piezoelectric stack arrangement 914X of alternating normal/reverse piezoelectric axis orientation layers. This piezoelectric stack arrangement 914X may be sandwiched between a multi-layer metal bottom acoustic reflector electrode 913X and a multi-layer metal top acoustic reflector electrode 915X. A first layer 901X of piezoelectric material may have thicknesses of about a quarter acoustic wavelength $\lambda/4$ of a main resonant frequency of the BAW resonator 9001X. Remaining respective layers 902X through 906X of piezoelectric material may have respective thicknesses of about a half acoustic wavelength $\lambda/2$ of the main resonant frequency of the BAW resonator 9001X. Aggregating thicknesses of these five remaining layers of piezoelectric material 902X, 903X, 904X, 905X, 906X, may have a thickness of about five halves of an acoustic wavelength $5\lambda/2$ of the main resonant frequency of the BAW resonator 9001X. Aggregating thicknesses of the six layers of piezoelectric material 901X, 902X, 903X, 904X, 905X, 906X, piezoelectric stack arrangement 914X may have a thickness of about eleven quarters of an acoustic wavelength $11\lambda/4$ of the main resonant frequency of the BAW resonator 9001X. The multi-layer metal bottom acoustic reflector electrode 913X may comprise a first pair of bottom metal electrode layers, 919X, 921X and an additional bottom metal electrode layer 923X (e.g., high acoustic impedance metal electrode layer 923X, e.g., tungsten metal electrode layer 923X). A first member 919X of the first pair of bottom metal electrode layers may be a high acoustic impedance bottom metal electrode layer 919X (e.g., tungsten bottom metal electrode layer 919X). A second member 921X of the first pair of bottom metal electrode layers may be a low acoustic impedance bottom metal electrode layer 921X (e.g., titanium bottom metal electrode layer 921X). In the multi-layer metal bottom acoustic reflector electrode 913X of BAW resonator 9001X, the first member 919X of the first pair of bottom metal electrode layers having the high acoustic impedance (e.g., high acoustic impedance bottom metal electrode layer 919X) may be arranged nearer to a layer of piezoelectric material (e.g., nearer to bottom layer of piezoelectric material 901X, e.g., nearer to the piezoelectric stack 914X) than the second member 921X of the first pair of bottom metal electrode layers having the low acoustic impedance (e.g., low acoustic impedance bottom metal electrode layer 921X). Further, although in the simplified view of BAW resonator 9001X only the first pair of bottom metal electrode layers 919X, 921X having the alternating high acoustic impedance/low acoustic impedance are explicitly shown, multi-layer metal bottom acoustic reflector electrode 913X may comprise many pairs of alternating high acoustic impedance/low acoustic impedance of bottom metal electrode layers (not shown). For example, additional high acoustic impedance metal electrode layer 923X may be a first member of a second pair of alternating high acoustic impedance/low acoustic impedance of bottom metal electrode layers. Multi-layer metal bottom acoustic reflector electrode 913X may approximate a bottom metal distributed Bragg acoustic reflector 913X. The first member 919X of the first pair of bottom metal electrode layers 919X, 921X, and the second member 921X of the first pair of bottom metal electrode layers 919X, 921X, and the additional bottom metal electrode layer 923X may have respective thicknesses selected to be about a quarter acoustic wavelength $\lambda/4$ of the main resonant frequency of the BAW resonator 9001X. Aggregating together the respective thicknesses of the first member 919X and the second member 921X, and the additional bottom metal electrode layer 923X may provide a thickness selected to be about three quarters of an acoustic wavelength $3\lambda/4$ of the main resonant frequency of the BAW resonator 9001X.

The multi-layer metal top acoustic reflector electrode 915X may comprise a first pair of top metal electrode layers, 937X, 939X. A first member 937X of the first pair of top metal electrode layers may be a low acoustic impedance top metal electrode layer 937X (e.g., titanium top metal electrode layer 937X). A second member 939X of the first pair of top metal electrode layers may be a high acoustic impedance top metal electrode layer 939X (e.g., tungsten top metal electrode layer 939X). In the multi-layer metal top acoustic reflector electrode 915X of BAW resonator 9001X, the first member 937X of the first pair of top metal electrode layers having the low acoustic impedance (e.g., low acoustic impedance top metal electrode layer 937X) may be arranged nearer to the first layer of piezoelectric material (e.g., nearer to top layer of piezoelectric material 906X, e.g., nearer to the piezoelectric stack 914X) than the second member 939X of the first pair of top metal electrode layers having the high acoustic impedance (e.g., high acoustic impedance top metal electrode layer 939X). Further, although in the simplified view of BAW resonator 9001X only a first pair of top metal electrode layers 937X, 939X are explicitly shown, multi-layer metal top acoustic reflector electrode 915X may comprise many more pairs of alternating low acoustic impedance/high acoustic impedance top metal electrode layers (not shown). Multi-layer metal top acoustic reflector electrode 915X may approximate a top metal distributed Bragg acoustic reflector 915X. The first member 939X of the first pair of top metal electrode layers 937X, 939X and the second member 939X of the first pair of top metal electrode layers 937X, 939X may have respective thicknesses selected to be about a quarter acoustic wavelength $\lambda/4$ of a main resonant frequency of the BAW resonator 9001X. Aggregating together the respective thicknesses of the first member 937X and the second member 939X may provide a thickness of the first pair of top metal electrode layers 937X, 939X selected to be about a half acoustic wavelength $\lambda/2$ of the main resonant frequency of the BAW resonator 9001X.

The six layer piezoelectric stack 914X may have an active region where the multi-layer metal top acoustic reflector electrode 915X may overlap multi-layer metal bottom acoustic reflector electrode 913X. Further, FIG. 9I particularly shows a peripheral region 973X of the six layer piezoelectric stack 914X where the multi-layer metal top acoustic reflector electrode 915X may avoid overlapping multi-layer metal bottom acoustic reflector electrode 913X (e.g., where the multi-layer metal top acoustic reflector electrode 915X may not overlap multi-layer metal bottom acoustic reflector electrode 913X). The peripheral region 973X of the six layer piezoelectric stack 914X may be relatively inactive (e.g., a relatively inactive region 973X), relative to the active region of the six layer piezoelectric stack 914X where the multi-layer metal top acoustic reflector electrode 915X may overlap multi-layer metal bottom acoustic reflector electrode 913X. The peripheral region 973X of the six layer piezoelectric stack 914X may be a remainder region 973X of the six layer piezoelectric stack 914X. The peripheral region 973X of the six layer piezoelectric stack 914X may be an extremity region 973X of the six layer piezoelectric stack 914X. The peripheral region 973X of the six layer piezoelectric stack 914X may be a lateral fringing electric field region of the six layer piezoelectric stack 914X, since there may be a lateral fringing electric field extending into an extremity of the six layer piezoelectric stack 914X in operation of the BAW resonator 9001X, e.g., the lateral fringing electric field may extend laterally from multi-layer metal top acoustic reflector electrode 915X, when the oscillating electric field may be applied thereto.

A middle right section of FIG. 9I shows a diagram 9001Y of mechanical resonant frequency Fr versus lateral resonator dimension corresponding to the BAW resonator 9001X, as predicted by simulation. As shown in diagram 9001Y, a thick line 973Y depicts mechanical resonant frequency Fr corresponding to the active region of BAW resonator 9001X where the multi-layer metal top acoustic reflector electrode 915X may overlap multi-layer metal bottom acoustic reflector electrode 913X. In diagram 9001Y, notional vertical dashed lines show alignment of thick line 973Y depicting mechanical resonant frequency Fr for the active region with the lateral resonator dimension for the active region of BAW resonator 9001X. In diagram 9001Y, a lower horizontal dashed line depicts electrical series resonant frequency Fs for BAW resonator 9001X. The mechanical resonant frequency Fr corresponding to the active region of BAW resonator 9001X may be about the same as electrical series resonant frequency Fs for BAW resonator 9001X. This is depicted in diagram 9001Y by thick line 973Y depicting mechanical resonant frequency Fr for the active region approximately overlapping the lower horizontal dashed line for electrical series resonant frequency Fs.

In diagram 9001Y, an upper horizontal dashed line depicts electrical parallel resonant frequency Fp of BAW resonator 9001X. Thick lines 973Y, 973YY depict mechanical resonant frequency Fr corresponding to the peripheral region 973X (e.g., relatively inactive region 973X, e.g. remainder region 973X, e.g., extremity region 973X, e.g. lateral fringing electric field region 973X) of the six layer piezoelectric stack 914X, where the multi-layer metal top acoustic reflector electrode 915X may avoid overlapping (e.g., may not overlap) multi-layer metal bottom acoustic reflector electrode 913X. The mechanical resonant frequency Fr corresponding to the peripheral region 973X (e.g., relatively inactive region 973X, e.g. remainder region 973X, e.g., extremity region 973X, e.g. lateral fringing electric field region 973X) may be about the same as the electrical parallel resonant frequency Fp for BAW resonator 9001X, and may be relatively nearer to the electrical series resonant frequency Fs for BAW resonator 9001X. This is depicted in diagram 9001Y by thick lines 973Y, 973YY depicting mechanical resonant frequency Fr for peripheral region 973X (e.g., relatively inactive region 973X, e.g. remainder region 973X, e.g., extremity region 973X, e.g. lateral fringing electric field region 973X) as approximately overlapping the upper horizontal dashed line for electrical parallel resonant frequency Fp, and being relatively nearer to the lower horizontal dashed line for electrical series resonant frequency Fs.

It is theorized that the mechanical resonant frequency Fr corresponding to the peripheral region 973X (e.g., relatively inactive region 973X, e.g. remainder region 973X, e.g., extremity region 973X, e.g. lateral fringing electric field region 973X) being about the same as the electrical parallel resonant frequency Fp for BAW resonator 9001X may facilitate suppressing parasitic lateral resonances in operation of the BAW resonator 9001X. It is theorized that the mechanical resonant frequency Fr corresponding to the peripheral region 973X (e.g., relatively inactive region 973X, e.g., remainder region 973X, e.g., extremity region 973X, e.g., lateral fringing electric field region 973X) being relatively nearer to the electrical series resonant frequency Fs for BAW resonator 9001X may facilitate suppressing parasitic lateral resonances in operation of the BAW resonator 9001X.

A bottom right section of FIG. 9I shows a Smith chart 9001Z showing a simulation of electrical reflection coefficient S-parameters over frequencies 978Z for BAW resonator 9001X (e.g., over frequencies including twenty-four Gigahertz, e.g., over frequencies including the 24 GHz main resonant frequency of BAW resonator 9001X, e.g., over frequencies including the 24 GHz main series resonant frequency, Fs, of BAW resonator 9001X). Uneven artifacts in the Smith chart depiction of electrical reflection coefficient S-parameters over frequencies 975F may be described in various ways such as bumps, humps and/or rattles, which may be indicative of the presence of unwanted parasitic lateral resonances in operation of the BAW resonator 9001X.

Design performance of BAW resonator 9001X having—low-acoustic impedance top metal electrode layers 937X nearest to the stack of piezoelectric stack 914X as shown in FIG. 9I may be compared with BAW resonator 9001D having intervening—high-acoustic impedance top metal electrode layers 935D nearest to piezoelectric stack 914D as shown in FIG. 9E by comparing the Smith chart depiction of electrical reflection coefficient S-parameters over frequencies 978Z for BAW resonator 9001X shown in FIG. 9I to the Smith chart depiction of electrical reflection coefficient S-parameters over frequencies 975F for BAW resonator 9001D shown in FIG. 9E. As shown by this comparison, relatively lesser and fewer uneven artifacts in the Smith chart depiction of electrical reflection coefficient S-parameters over frequencies 978Z for BAW resonator 9001X (relative to greater and more uneven artifacts in the Smith chart depiction of electrical reflection coefficient S-parameters over frequencies 975F for BAW resonator 9001D) indicates relatively less uneven artifacts in Smith chart depiction of electrical reflection coefficient S-parameters over frequencies 978Z for BAW resonator 9001X and less parasitic lateral resonances in operation of BAW resonator 9001X, in which—low-acoustic impedance top metal electrode layer 937X is nearest to the piezoelectric stack 914X. Accordingly, based on this comparison of this disclosure, it is apparent that to facilitate suppression of parasitic lateral resonances in operation of BAW resonators having stacks of piezoelectric layers: relatively lower acoustic impedance top metal electrode layer may be arranged nearest, e.g., may be arranged substantially nearest, e.g. may abut, e.g., may substantially abut, a stack of piezoelectric layers of the BAW resonator. Accordingly, relatively lower acoustic impedance top metal electrode layer may be arranged sufficiently proximate to the stack of piezoelectric layers, so that the relatively lower acoustic impedance top metal electrode layer may contribute more to facilitate suppressing parasitic lateral resonances in operation of the BAW resonator than is contributed by any other metal electrode layer of the multi-layer metal acoustic reflector electrodes. The relatively lower acoustic impedance top metal electrode layer may be arranged sufficiently proximate to the stack of piezoelectric layers, so that standing wave acoustic energy to be in the relatively lower acoustic impedance top metal electrode layer is greater than respective standing wave acoustic energy to be in other respective layers of the top multi-layer acoustic reflector in operation of the BAW resonator. This may facilitate suppression of parasitic lateral resonances in operation of the BAW resonator. It is further theorized that applying detuning techniques disclosed in relation to BAW resonators 9001M and 9001P shown in FIG. 9G, and BAW resonators 9001S and 9001U shown in FIG. 9H, further suppression of parasitic lateral resonances in operation of the BAW resonators 9001S and 900U may be achieved, as should be appreciated by one skilled in the art, e.g., upon reading this disclosure.

Figure 10:
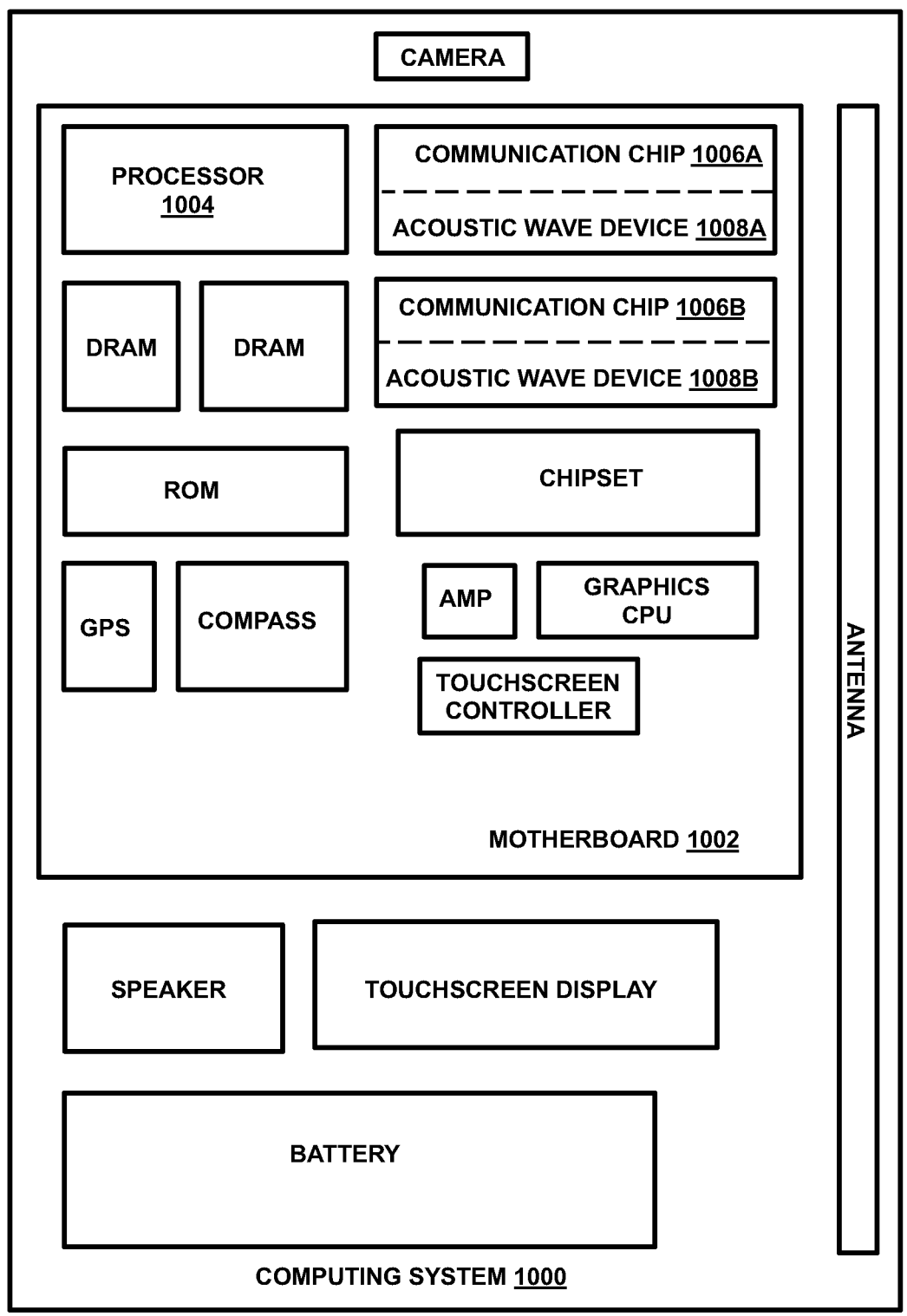
FIG. 10 illustrates a computing system implemented with integrated circuit structures or devices formed using the techniques disclosed herein, in accordance with an embodiment of the present disclosure.

FIG. 10 illustrates a computing system implemented with integrated circuit structures or devices formed using the techniques disclosed herein, in accordance with an embodiment of the present disclosure. As may be seen, the computing system 1000 houses a motherboard 1002. The motherboard 1002 may include a number of components, including, but not limited to, a processor 1004 and at least one communication chip 1006A, 1006B each of which may be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions may be integrated into one or more chips (e.g., for instance, note that the communication chips 1006A, 1006B may be part of or otherwise integrated into the processor 1004).

The communication chips 1006A, 1006B enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chips 1006A, 1006B may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006A, 1006B. For instance, a first communication chip 1006A may be dedicated to shorter range wireless communications such as Wi-Fi and Bluetooth and a second communication chip 1006B may be dedicated to longer range wireless communications such as GPS, EDGE, GPRS, CDMA, WiMAX, LTE, Ev-DO, 5G and others. In some embodiments, communication chips 1006A, 1006B may include one or more acoustic wave devices 1008A, 1008B (e.g., resonators, filters and/or oscillators 1008A, 1008B) as variously described herein (e.g., acoustic wave devices including a stack of alternating axis piezoelectric material). Acoustic wave devices 1008A, 1008B may be included in various ways, e.g., one or more resonators, e.g., one or more filters, e.g., one or more oscillators. Further, such acoustic wave devices 1008A, 1008B, e.g., resonators, e.g., filters, e.g., oscillators may be configured to be Super High Frequency (SHF) acoustic wave devices 1008A, 1008B or Extremely High Frequency (EHF) acoustic wave devices 1008A, 1008B, e.g., resonators, filters, and/or oscillators (e.g., operating at greater than 3, 4, 5, 6, 7, or 8 GHz, e.g., operating at greater than 23, 24, 25, 26, 27, 28, 29, or 30 GHz, e.g., operating at greater than 36, 37, 38, 39, or 40 GHz). Further still, such Super High Frequency (SHF) acoustic wave devices or Extremely High Frequency (EHF) resonators, filters, and/or oscillators may be included in the RF front end of computing system 1000 and they may be used for 5G wireless standards or protocols, for example.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chips 1006A, 1006B also may include an integrated circuit die packaged within the communication chips 1006A, 1006B. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any communication chips 1006A, 1006B is integrated into processor 1004, rather than having separate communication chips). Further note that processor 1004 may be a chip set having such wireless capability. In short, any number of processor 1004 and/or communication chips 1006A, 1006B may be used. Likewise, any one chip or chip set may have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent. The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A bulk acoustic wave resonator comprising:
a substrate;
a first piezoelectric layer having a first piezoelectric axis orientation;
a second piezoelectric layer having a second piezoelectric axis orientation that substantially opposes the first piezoelectric axis orientation; and
a multi-layer metal top acoustic reflector electrode including a first pair of top metal electrode layers electrically and acoustically coupled with the first and second piezoelectric layers to excite a piezoelectrically excitable resonance mode at a main resonant frequency of the bulk acoustic wave resonator; and
an etched edge region extending through the first piezoelectric layer, the second piezoelectric layer, and the first pair of top metal electrode layers.

2. The bulk acoustic wave resonator as in claim 1 including at least a multi-layer metal bottom acoustic reflector electrode, in which the multi-layer metal bottom acoustic reflector electrode includes at least a first pair of bottom metal electrode layers electrically and acoustically coupled with the first piezoelectric layer and the second piezoelectric layer, in which the etched edge region extends through the first pair of bottom metal electrode layers, the first piezoelectric layer, the second piezoelectric layer, and the first pair of top metal electrode layers.

3. The bulk acoustic wave resonator as in claim 1 in which the first pair of top metal electrode layers is acoustically de-tuned from the main resonant frequency of the bulk acoustic wave resonator to facilitate suppressing a plurality of parasitic lateral resonances in operation of the bulk acoustic wave resonator.

4. The bulk acoustic wave resonator as in claim 1 in which the multi-layer metal top acoustic reflector electrode includes at least a second pair of top metal electrode layers electrically and acoustically coupled with the first piezoelectric layer and the second piezoelectric layer, in which the etched edge region extends through the first piezoelectric layer, the second piezoelectric layer, the first pair of top metal electrode layers, and the second pair of top metal electrode layers.

5. The bulk acoustic wave resonator as in claim 4 in which the multi-layer metal top acoustic reflector electrode includes at least a third pair of top metal electrode layers.

6. The bulk acoustic wave resonator as in claim 5 in which the multi-layer metal top acoustic reflector electrode comprises a fourth pair of top metal electrode layers.

7. The bulk acoustic wave resonator as in claim 1 in which:
the multi-layer metal top acoustic reflector electrode includes at least a second pair of top metal electrode layers;
the first pair of top metal electrode layers have respective layer thicknesses to be acoustically de-tuned by a first amount from the main resonant frequency;
the second pair of top metal electrode layers have respective layer thicknesses to be acoustically de-tuned by a second amount from the main resonant frequency; and
the first amount is different than the second amount.

8. The bulk acoustic wave resonator as in claim 1 in which:
the multi-layer metal top acoustic reflector electrode is acoustically coupled over an active region of the first piezoelectric layer; and
the first piezoelectric layer is mass loaded by a mass load layer arranged over a peripheral region of the first piezoelectric layer that is adjacent to the active region of the first piezoelectric layer to facilitate suppressing a plurality of parasitic lateral resonances in operation of the bulk acoustic wave resonator.

9. The bulk acoustic wave resonator as in claim 1 in which the multi-layer metal top acoustic reflector electrode is acoustically de-tuned higher in frequency from the main resonant frequency of the bulk acoustic wave resonator.

10. The bulk acoustic wave resonator as in claim 1 in which:
a second member of the first pair of top metal electrode layers has an acoustic impedance;
a first member of the first pair of top metal electrode layers has a first acoustic impedance that is lower than the acoustic impedance of the second member; and
the first member having the first acoustic impedance substantially abuts the first piezoelectric layer.

11. The bulk acoustic wave resonator as in claim 1 in which:
a second member of the first pair of top metal electrode layers has a second acoustic impedance;
a first member of the first pair of top metal electrode layers has a first acoustic impedance that is lower than the second acoustic impedance of the second member; and
the first member having the relatively lower first acoustic impedance is arranged nearest to the first piezoelectric layer, relative to other top metal electrode layers of the multi-layer metal top acoustic reflector electrode, to facilitate suppressing a plurality of parasitic lateral resonances in operation of the bulk acoustic wave.

12. The bulk acoustic wave resonator as in claim 1 in which:
a standing wave acoustic energy is to be coupled into the multi-layer metal top acoustic reflector electrode in operation of the bulk acoustic wave resonator;
a second member of the first pair of top metal electrode layers has a second acoustic impedance;
a first member of the first pair of top metal electrode layers has a first acoustic impedance that is lower than the second acoustic impedance of the second member; and
the first member having the first acoustic impedance is arranged sufficiently proximate to the first piezoelectric layer, to facilitate a first portion of the standing wave acoustic energy in the first member being greater than respective portions of the standing wave acoustic energy in other layers of the multi-layer metal top acoustic reflector electrode.

13. The bulk acoustic wave resonator as in claim 1 including at least a bottom electrode, in which the first piezoelectric layer is interposed between the bottom electrode and the multi-layer metal top acoustic reflector electrode, the first piezoelectric layer including at least an active region where the bottom electrode and the multi-layer metal top acoustic reflector electrode overlap, and the first piezoelectric layer including at least a peripheral region where the bottom electrode and the multi-layer metal top acoustic reflector electrode avoid overlapping, in which:
- a second member of the first pair of top metal electrode layers has a second acoustic impedance;
- a first member of the first pair of top metal electrode layers has a first acoustic impedance that is lower than the second acoustic impedance of the second member;
- the peripheral region of the first piezoelectric layer has a mechanical resonance frequency;
- in operation, the bulk acoustic wave resonator is to have a parallel electrical resonance frequency; and
- the first member of the first pair of top metal electrode layers having the first acoustic impedance is arranged sufficiently near to the first piezoelectric layer to facilitate the mechanical resonance frequency of the peripheral region approximately matching or being below the parallel electrical resonance frequency.

14. The bulk acoustic wave resonator as in claim 13 in which the multi-layer metal top acoustic reflector electrode is sufficiently de-tuned from the main resonant frequency to facilitate the mechanical resonance frequency of the peripheral region being below the parallel electrical resonance frequency.

15. The bulk acoustic wave resonator as in claim 1 including at least a bottom electrode, in which:
- the first piezoelectric layer is interposed between the bottom electrode and the multi-layer metal top acoustic reflector electrode;
- the first piezoelectric layer includes at least an active region where the bottom electrode and the multi-layer metal top acoustic reflector electrode overlap;
- the first piezoelectric layer includes at least a peripheral region where the bottom electrode and the multi-layer metal top acoustic reflector electrode avoid overlapping; and
- the multi-layer metal top acoustic reflector electrode is sufficiently de-tuned from the main resonant frequency to facilitate a mechanical resonance frequency of the peripheral region being below a parallel electrical resonance frequency in operation of the bulk acoustic wave resonator.

16. The bulk acoustic wave resonator as in claim 1 comprising a multi-layer metal bottom acoustic reflector electrode including a first pair of bottom metal electrode layers, a second pair of bottom metal electrode layers, and a third pair of bottom metal electrode layers electrically and acoustically coupled with the first piezoelectric layer and the second piezoelectric layer to excite the piezoelectrically excitable resonance mode at the main resonant frequency.

17. The bulk acoustic wave resonator as in claim 16 in which at least one of the first pair of bottom metal electrode layers, the second pair of bottom metal electrode layers, and the third pair of bottom metal electrode layers is acoustically de-tuned from the main resonant frequency.

18. The bulk acoustic wave resonator as in claim 16 in which:
- the first pair of bottom metal electrode layers have respective layer thicknesses to be acoustically de-tuned by a first amount from the main resonant frequency;
- the second pair of bottom metal electrode layers have respective layer thicknesses to be acoustically de-tuned by a second amount from the main resonant frequency; and
- the first amount is different than the second amount.

19. The bulk acoustic wave resonator as in claim 16 in which the at least one of the first pair of bottom metal electrode layers, the second pair of bottom metal electrode layers, and the third pair of bottom metal electrode layers is acoustically de-tuned lower in frequency from the main resonant frequency.

20. The bulk acoustic wave resonator as in claim 1 including at least a second pair of piezoelectric layers and at least one or more of: a third pair of piezoelectric layers, a fourth pair of piezoelectric layers, a fifth pair of piezoelectric layers, a sixth pair of piezoelectric layers, a seventh pair of piezoelectric layers, an eighth pair of piezoelectric layers and a ninth pair of piezoelectric layers.

21. The bulk acoustic wave resonator as in claim 1 in which the main resonant frequency is in at least one of a 3GPP n257 band, a 3GPP n258 band, a 3GPP n260 band, and a 3GPP n261 band.

22. The bulk acoustic wave resonator as in claim 1 in which the main resonant frequency is in an Earth Exploration Satellite Service (EESS) band.

23. The bulk acoustic wave resonator as in claim 1 in which the main resonant frequency is in one of a Ku band, a K band, a Ka band, a V band, and a W band.

24. The bulk acoustic wave resonator as in claim 1 in which the main resonant frequency of the bulk acoustic wave resonator is in one of an X band, a Ku band, a K band, a Ka band, a V band, and a W band.

25. An apparatus comprising:
- a bulk acoustic wave resonator including at least:
  - a first piezoelectric layer having a first piezoelectric axis orientation;
  - a second piezoelectric layer having a second piezoelectric axis orientation that substantially opposes the first piezoelectric axis orientation;
  - a top acoustic reflector electrode including a first pair of top metal electrode layers electrically and acoustically coupled with the first piezoelectric layer and the second piezoelectric layer to excite a main resonant frequency of the bulk acoustic wave resonator;
  - an etched edge region extending through the first piezoelectric layer, the second piezoelectric layer, and the first pair of top metal electrode layers; and
- electrical coupling nodes to facilitate electrical coupling of the bulk acoustic wave resonator with an oscillator circuitry.

26. The apparatus as in claim 25 in which the first pair of top metal electrode layers is acoustically de-tuned from the main resonant frequency.

27. A bulk acoustic wave resonator comprising:
- a substrate;
- a first piezoelectric layer having a first piezoelectric axis orientation;
- a second piezoelectric layer acoustically coupled to the first piezoelectric layer, the second piezoelectric layer having a second piezoelectric axis orientation that is antiparallel to the first piezoelectric axis orientation; and
- a top metal acoustic wave reflector electrically interfacing with the first piezoelectric layer, the top metal acoustic wave reflector including at least a first pair of top metal layers and a second pair of top metal layers, in which the first piezoelectric layer is coupled between the top metal acoustic wave reflector and the substrate.

28. The bulk acoustic wave resonator of claim 27, including at least an etched edge region extending through the first piezoelectric layer, the second piezoelectric layer, and the first pair of top metal layers.

29. The bulk acoustic wave resonator of claim 27 in which the top metal acoustic wave reflector includes at least a third pair of top metal layers acoustically coupled to the first and second piezoelectric layers.

30. The bulk acoustic wave resonator of claim 27 including at least a bottom metal acoustic wave reflector electrically interfacing with the second piezoelectric layer.

31. A resonator filter comprising:
- a plurality of acoustic wave resonators, in which a first acoustic wave resonator of the plurality of acoustic wave resonators includes at least:
- a substrate;
- a first plurality of piezoelectric layers having alternating parallel and antiparallel piezoelectric axis orientations, the first plurality of piezoelectric layers having respective thicknesses, the respective thicknesses to facilitate a main acoustic resonance frequency of the first acoustic wave resonator; and
- a top metal acoustic wave reflector electrically interfacing with a first layer of the first plurality of piezoelectric layers, the top metal acoustic wave reflector including at least a first plurality of top metal layers and a second plurality of top metal layers, in which the first plurality of piezoelectric layers is coupled between the top metal acoustic wave reflector and the substrate.

32. The resonator filter of claim 31 in which the first acoustic wave resonator includes at least a bottom metal acoustic wave reflector electrically interfacing with a second piezoelectric layer of the first plurality of piezoelectric layers, the bottom metal acoustic wave reflector including at least a first plurality of bottom metal layers.

\* \* \* \* \*